United States Patent
Saji

(10) Patent No.: US 9,184,664 B2
(45) Date of Patent: Nov. 10, 2015

(54) SEMICONDUCTOR DEVICE PROVIDED WITH SWITCHING POWER SUPPLY DEVICE WITH INTERMITTENT OSCILLATION CONTROL

(71) Applicant: PANASONIC CORPORATION, Osaka (JP)

(72) Inventor: Takashi Saji, Shiga (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 46 days.

(21) Appl. No.: 14/051,167

(22) Filed: Oct. 10, 2013

(65) Prior Publication Data

US 2014/0036552 A1    Feb. 6, 2014

Related U.S. Application Data

(63) Continuation of application No. PCT/JP2011/002218, filed on Apr. 14, 2011.

(51) Int. Cl.
| | |
|---|---|
| *H02M 3/338* | (2006.01) |
| *H02M 3/335* | (2006.01) |
| *H02M 1/44* | (2007.01) |
| *H03K 3/84* | (2006.01) |

(Continued)

(52) U.S. Cl.
CPC ............ *H02M 3/33507* (2013.01); *H02M 1/44* (2013.01); *H03K 3/84* (2013.01); *H03K 7/08* (2013.01); *H02M 2001/0035* (2013.01); *Y02B 70/16* (2013.01)

(58) Field of Classification Search
CPC ............................ H02M 3/338; H02M 3/335
USPC .............................. 363/18, 19, 21.12–21.18, 97
See application file for complete search history.

(56) References Cited

U.S. PATENT DOCUMENTS

| | | |
|---|---|---|
| 7,471,530 B2 | 12/2008 | Balakrishnan et al. |
| 7,733,673 B2 | 6/2010 | Balakrishnan et al. |
| 7,965,524 B2 | 6/2011 | Balakrishnan et al. |

(Continued)

FOREIGN PATENT DOCUMENTS

| | | | |
|---|---|---|---|
| JP | 7-163143 A | 6/1995 | |
| JP | H07-245942 A | 9/1995 | |

(Continued)

OTHER PUBLICATIONS

International Preliminary Report on Patentability (Chapter I) with Full English Translation issued in International Application No. PCT/JP2011/002218 mailed Oct. 24, 2013.

(Continued)

*Primary Examiner* — Gary L Laxton
*Assistant Examiner* — Kyle J Moody
(74) *Attorney, Agent, or Firm* — McDermott Will & Emery LLP

(57) ABSTRACT

A control circuit varies an intermittent oscillation frequency using a period signal. A period signal period signal frequency is set to a frequency lower than the intermittent oscillation frequency, or is set to be higher than the intermittent oscillation frequency and to a frequency other than integer multiples of the intermittent oscillation frequency. The phase difference of the period signal with respect to an intermittent oscillation control signal is set so that the distribution of the intermittent oscillation frequency is dispersed.

43 Claims, 74 Drawing Sheets

(51) Int. Cl.
*H03K 7/08* (2006.01)
*H02M 1/00* (2007.01)

(56) References Cited

U.S. PATENT DOCUMENTS

| | | |
|---|---|---|
| 8,194,423 B2 | 6/2012 | Balakrishnan et al. |
| 8,537,570 B2 | 9/2013 | Balakrishnan et al. |
| 2002/0067629 A1 | 6/2002 | Koike |
| 2008/0084723 A1* | 4/2008 | Balakrishnan et al. ......... 363/97 |
| 2009/0073733 A1 | 3/2009 | Balakrishnan et al. |
| 2010/0202175 A1 | 8/2010 | Balakrishnan et al. |
| 2010/0315841 A1* | 12/2010 | Saji ........................... 363/21.12 |
| 2010/0321963 A1 | 12/2010 | Yamashita |
| 2011/0211373 A1 | 9/2011 | Balakrishnan et al. |
| 2012/0224399 A1 | 9/2012 | Balakrishnan et al. |
| 2013/0051088 A1* | 2/2013 | Yamashita ................. 363/21.13 |
| 2014/0328090 A1* | 11/2014 | Takahashi et al. ......... 363/21.17 |

FOREIGN PATENT DOCUMENTS

| | | |
|---|---|---|
| JP | 3391384 B2 | 3/2003 |
| JP | 2008092793 A | 4/2008 |
| JP | 2011-004550 A | 1/2011 |

OTHER PUBLICATIONS

International Search Report issued in PCT/JP2011/002218, dated Jul. 19, 2011.

Japanese Office Action issued in Japanese Application No. 2013-509666, dated Mar. 31, 2015.

* cited by examiner

INTERMITTENT OSCILLATION CONTROL CIRCUIT 202

TURN-ON CONTROL CIRCUIT 203

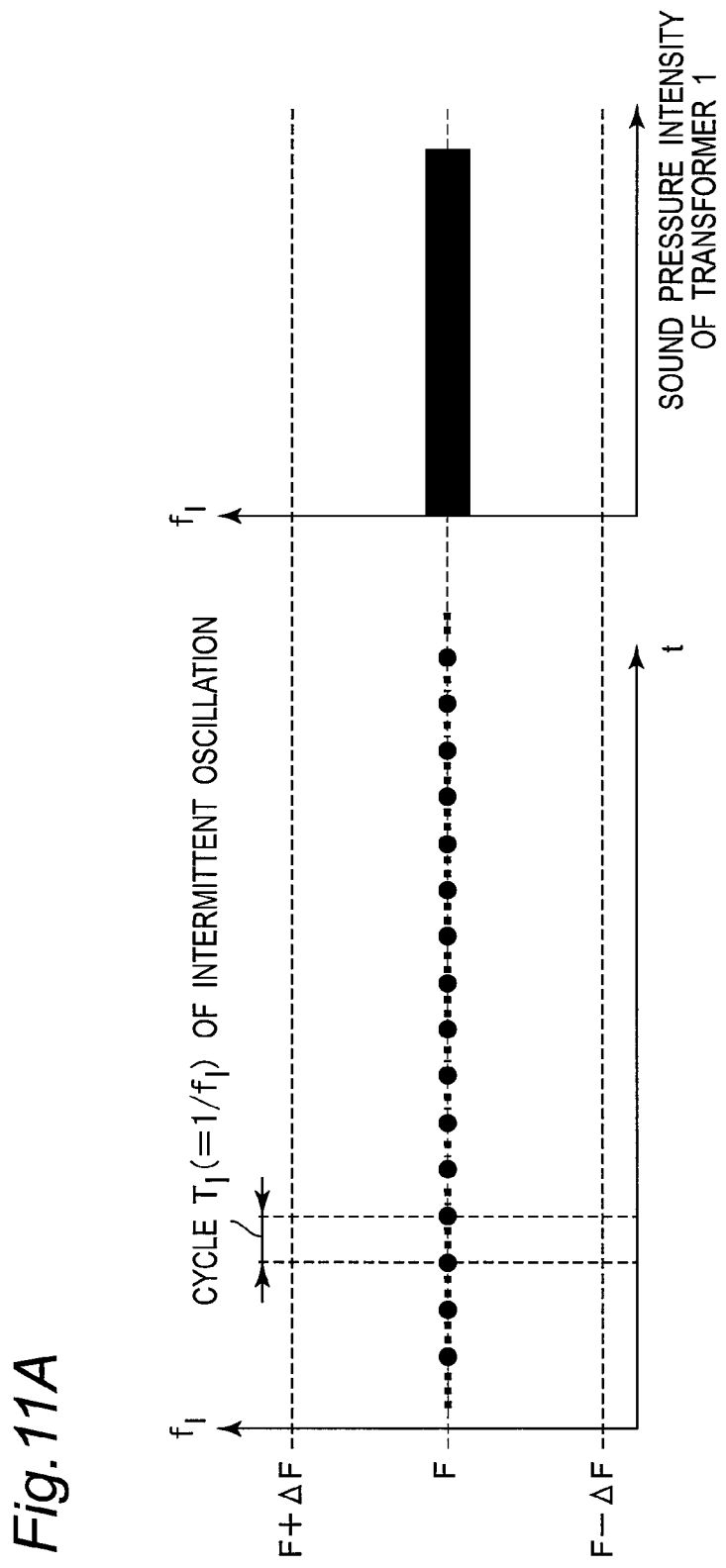

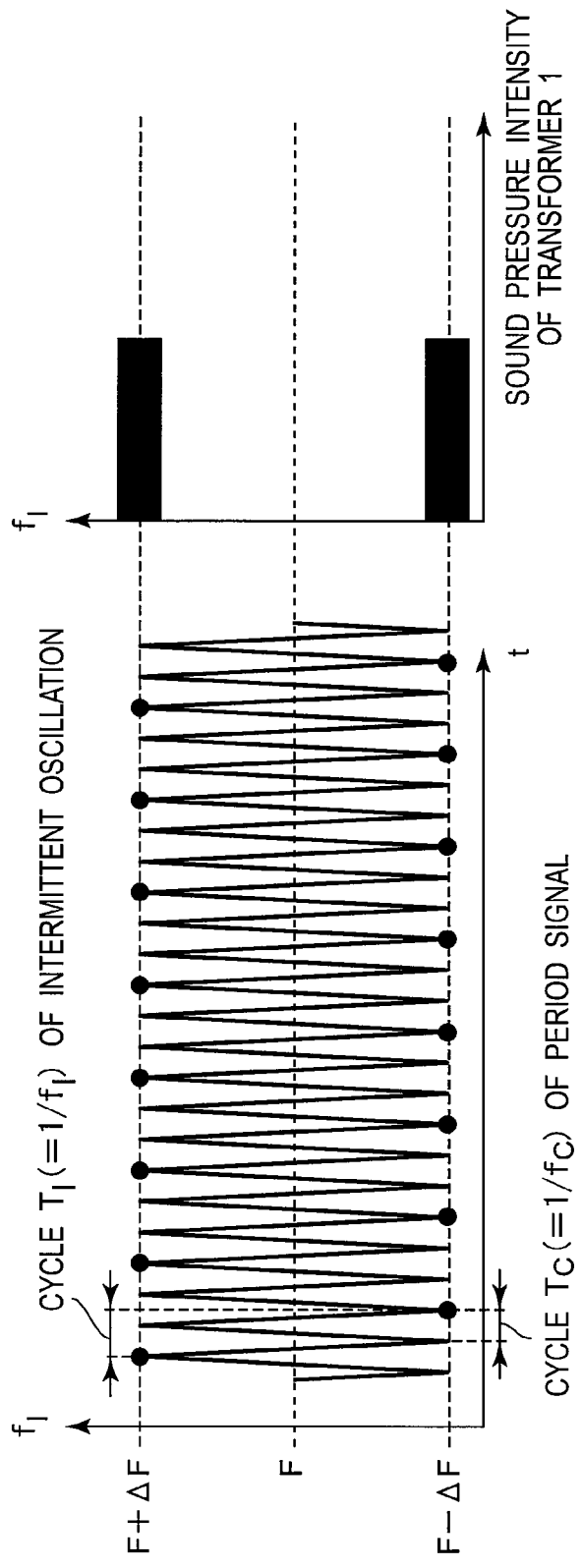

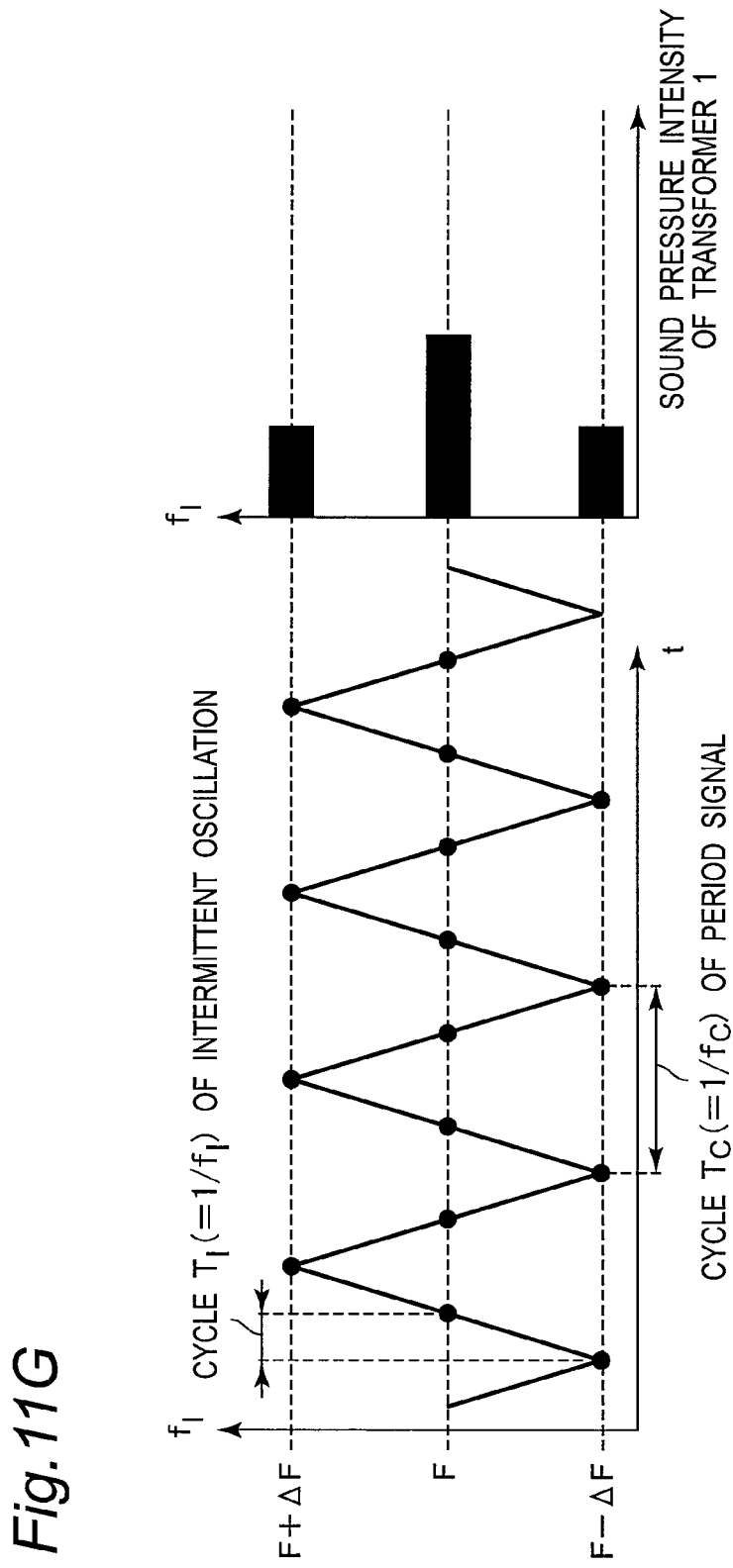

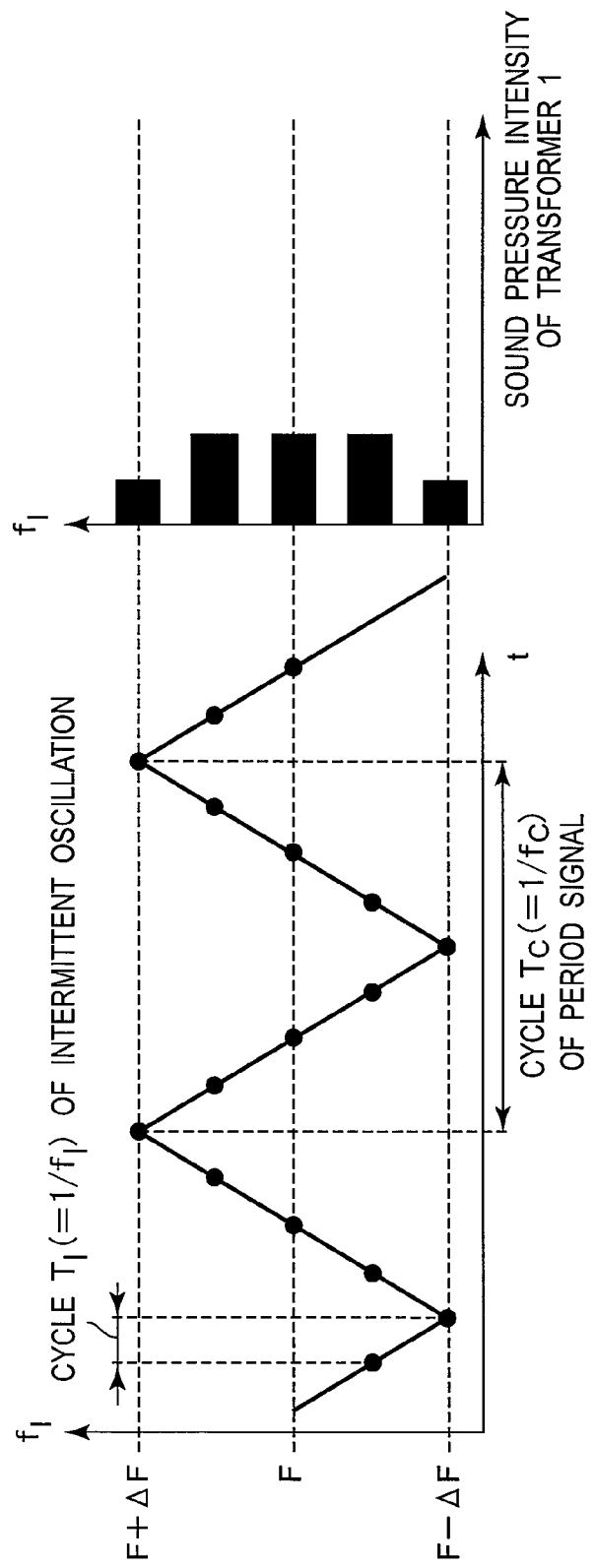

PERIOD SIGNAL GENERATOR CIRCUIT 607a

PERIOD SIGNAL GENERATOR CIRCUIT 607b

SETTING SIGNAL GENERATOR CIRCUIT 8070d

SEMICONDUCTOR DEVICE PROVIDED WITH SWITCHING POWER SUPPLY DEVICE WITH INTERMITTENT OSCILLATION CONTROL

CROSS-REFERENCE TO RELATED APPLICATIONS

This is a continuation application of International Application No. PCT/JP2011/002218, as filed on an international filing date of Apr. 14, 2011.

BACKGROUND OF THE INVENTION

1. Field of the Invention

The present invention relates to a switching power supply device, which converts an input voltage to an output voltage by controlling a switching element to be turned on and off and supplies a load with an output power corresponding to the output voltage, and relates to a semiconductor device provided with such a switching power supply device.

2. Description of the Related Art

Conventionally, for the purpose of improving power efficiency by lowering a power consumption in a power supply device for use in general household devices such as home appliances a switching power supply device including a semiconductor device, which controls an output voltage by controlling a switching element such as a transistor to be turned on and off, have been widely utilized. In recent years, it has been strongly required to reduce the power consumption during a standby state for the devices such as the home appliances in order to prevent global warming.

In general, under a light load such as the standby state, energy loss of the switching power supply device is dominated by a switching loss due to a switching operation. There are well-known techniques for improving a power supply efficiency (a ratio of output power to input power) during the light load. One of these techniques is an intermittent oscillation control, which controls the switching element during the light load to repeat an oscillation interval when the switching element is turned on and off and a stop interval when the switching element stops turning on and off.

For example, when a load current supplied from the switching power supply device to the load becomes smaller as the load becomes lighter, the output voltage of the switching power supply device increases, thus a current flowing through the switching element is controlled to be smaller. Further, when the load current becomes small, under a predetermined condition, the switching element is controlled to perform an intermittent oscillation, which repeats the oscillation interval when the switching element is turned on and off and the stop interval when the switching element stops turning on and off. In this way, the intermittent oscillation control during the light load allows a number of times of switching to be reduced, and therefore, the supply efficiency during the light load can be improved.

In general, a cycle of intermittent oscillation, which repeats the oscillation interval and the stop interval, is controlled to be longer with an increasing output voltage due to a lightness of the load, and therefore, an intermittent oscillation frequency corresponding to the cycle of intermittent oscillation is lowered. Because of this, even in the case of controlling the switching element to be turned on and off at a frequency of 100 kHz in a normal operation other than the light load, the intermittent oscillation frequency possibly falls into an audible-frequency range below 20 kHz during the light load. In particular, when a variation of the load current becomes relatively smaller in standby or the like, the intermittent oscillation frequency is fixed to a constant frequency. However, when this constant frequency concentrates toward a particular frequency within the audible-frequency range, there could have a big problem of occurring a sound ringing (it is called a transformer sound or a magnetostrictive sound) from a transformer and a capacitor generally used in the switching power supply device.

As described above, the intermittent oscillation control during the light load is an effective means for improving the power supply efficiency during the light load. However, there is a drawback of occurring the transformer sound from the transformer or the like when the intermittent oscillation frequency falls within the audible-frequency range. In order to solve the problem of the transformer sound, it has been well-known that a peak current of the switching element upon controlling the intermittent oscillation is reduced. However, in this case, since the number of times of switching increases, the power supply efficiency is worse. Accordingly, there was a trade-off relationship between the problem of the transformer sound and the power supply efficiency. In addition, although there is such a well-known method that the transformer is adhered or impregnated, this method becomes more expensive. Accordingly, the intermittent oscillation control method for improving the above trade-off has been required.

On the other hand, a DC-DC converter according to Patent Literature 1 of Japanese Patent No. JP3391384 B can perform an intermittent oscillation control with a saw-tooth voltage, and the DC-DC converter can perform a soft-start for limiting the peak of the current flowing through the switching element upon starting the ON-interval of the switching element, and therefore, the DC-DC converter can control the transformer sound.

In addition, a switching power supply according to Patent Literature 2 of Japanese Patent Laid-open Publication No. JP2008-92793 A can determine the highest intermittent oscillation frequency upon controlling the intermittent oscillation based on the basic oscillation frequency for turning on and off the switching element and the number of times of switching at the time of restarting the switching operation upon controlling the intermittent oscillation. In particular, for example, the basic oscillation frequency in the normal operation is set to 30 kHz, and the number of times of switching upon restarting the switching operation when controlling the intermittent oscillation is set to at least four or more. In this case, when the forth-consecutive oscillation is performed at the time of restarting the switching operation upon controlling the intermittent oscillation, and thereafter, the oscillation is stopped for one cycle, or when the oscillation cycle has one set comprising of five cycles, the intermittent oscillation frequency has the maximum frequency. Accordingly, the upper limit of the intermittent oscillation frequency becomes 6 kHz. In this way, the transformer sound upon controlling the intermittent oscillation can be suppressed by determining the upper limit of the intermittent oscillation frequency.

However, since the DC-DC converter according to the Patent Literature 1 limits the peak value of the current flowing through the switching element at the time of restarting the oscillation upon controlling the intermittent oscillation, there is a problem of increasing the number of times of switching. In addition, since the intermittent oscillation frequency concentrates toward a predetermined frequency set within the control circuit, it is difficult to significantly improve the trade-off between the transformer sound upon controlling the intermittent oscillation and the power supply efficiency.

In addition, the switching power supply according to Patent Literature 2 can determine the minimum cycle of the intermittent oscillation cycles by controlling the number of times of switching within the period of restarting the switching operation upon controlling the intermittent oscillation based on the basic oscillation frequency of the switching element. In other word, the switching power supply according to Patent Literature 2 can reduce the transformer sound by setting the maximum of the intermittent oscillation frequency so that the switching element can not operate within the frequency area where the transformer sound becomes larger. However, the harmonic frequency of the intermittent oscillation frequency possibly falls into the audible-frequency area, and therefore, there is a problem of occurring the transformer sound. In that case, in consideration of the harmonic frequency, it is required that the upper limit of the intermittent oscillation frequency is set to be much smaller than the lower limit of the audible-frequency area. In addition, if the bandwidth of the intermittent oscillation frequency becomes wider, in viewing of a feedback control, the operation of the switching power supply is intended to become unstable. Therefore, it is undesirable to easily lower the upper limit of the intermittent oscillation frequency. Accordingly, the flexibility of setting the upper limit of the intermittent oscillation frequency is low, then it is difficult to apply to a broad range of the switching power supply.

SUMMARY OF THE INVENTION

An object of the present invention is to solve the above-described problems, and to provide an a switching power supply device, which can reduce a sound occurring in parts such as transformers and ceramic capacitors without making a power supply efficiency lower than that of the prior art, and a semiconductor device provided with such a switching power supply.

According to a first aspect of the present invention, there is provided a semiconductor device for a switching power supply device configured to convert a predetermined input voltage to an output voltage by controlling a switching element to be turned on and off, and supply a load with an output power corresponding to the output voltage. The semiconductor device includes a control circuit configured to control an operation of the switching element by using an intermittent oscillation control signal representing a start timing and an end timing of an oscillation interval, so that the oscillation interval when the switching element is turned on and off and a stop interval when turning on and off of the switching element is stopped are alternately repeated with a predetermined intermittent oscillation frequency. The control circuit varies the intermittent oscillation frequency by using a changing signal generated by using a period signal having a predetermined period signal frequency. When the changing signal is the period signal and the period signal is generated so that a frequency, a local maximum value of an amplitude, and a local minimum value of the amplitude for each of cycle intervals of the period signal are constant respectively, the period signal frequency is set to a frequency lower than the intermittent oscillation frequency, or the period signal frequency is set to a frequency higher than the intermittent oscillation frequency and other than integer multiples of the intermittent oscillation frequency, and a phase difference of the changing signal with respect to the intermittent oscillation control signal is set so that a distribution of the intermittent oscillation frequency is dispersed. When the changing signal is the period signal and the period signal is generated so that (a) the local maximum value of the amplitude and the local minimum value of the amplitude for each of the cycle intervals of the period signal are constant respectively, and (b) a plurality of signals having respective different frequencies that are one-half or the integer multiples of the intermittent oscillation frequency for each of the cycle intervals of the period signal are sequentially generated, the phase difference between the plurality of signals for each of the cycle intervals is set so that the distribution of the intermittent oscillation frequency is dispersed.

In the semiconductor device, the control circuit varies the intermittent oscillation frequency by varying a peak value of a current flowing through the switching element using the changing signal.

In addition, in the semiconductor device, the control circuit includes a turn-off control circuit configured to generate a turn-off control signal, that turns off the switching element when a voltage level of a first signal generated by using a current detection signal corresponding to the current flowing through the switching element exceeds a voltage level of a second signal generated by using a feedback control signal corresponding to the output power. The turn-off control circuit varies the peak value of the current flowing through the switching element by varying a timing of generating the turn-off control signal by using the changing signal.

Further, in the semiconductor device, the second signal is generated by modulating the feedback control signal according to the changing signal.

Furthermore, in the semiconductor device, the feedback control signal has a predetermined limit value for setting a lower limit of the peak value. The second signal is generated by modulating the limit value according to the changing signal.

In addition, in the semiconductor device, the first signal is generated by modulating the current detection signal according to the changing signal.

Further, in the semiconductor device, the turn-off control circuit includes a delay circuit configured to delay the turn-off control signal by a predetermined delay time and output a delayed turn-off control signal. The turn-off control circuit varies the timing of generating the turn-off control signal by modulating the delay time according to the changing signal.

Furthermore, in the semiconductor device, the control circuit includes a switching control circuit configured to generate a switching control signal representing a start timing and an end timing of an ON-interval of the switching element during the oscillation interval by using the intermittent oscillation control signal, a third signal generated by using a first triangle wave signal having a predetermined triangle wave frequency, and a fourth signal generated by using the feedback control signal corresponding to the output power. The switching control circuit varies the peak value of the current flowing through the switching element by varying a timing of generating the switching control signal using the changing signal.

In addition, in the semiconductor device, the fourth signal is generated by modulating the feedback control signal according to the changing signal.

Further, in the semiconductor device, the feedback control signal has a predetermined limit value for setting the lower limit of the peak value. The fourth signal is generated by modulating the limit value according to the changing signal.

Furthermore, in the semiconductor device, the switching control circuit varies the timing of generating the switching control signal by modulating at least one of an upper limit and a lower limit of the first triangle wave signal according to the changing signal.

In addition, in the semiconductor device, the switching control circuit varies the timing of generating the switching control signal by modulating a voltage change rate of first triangle wave signal with respect to time according to the changing signal.

Further, in the semiconductor device, the switching control circuit includes a delay circuit configured to delay a start timing of the ON-interval of the switching element in the switching control signal by a predetermined delay time and output a delayed start timing. The switching control circuit varies the timing of generating the switching control signal by modulating the delay time according to the changing signal.

Furthermore, in the semiconductor device, the switching control circuit includes a delay circuit configured to delay an end timing of the ON-interval of the switching element in the switching control signal by a predetermined delay time and output a delayed end timing. The switching control circuit varies the timing of generating the switching control signal by modulating the delay time according to the changing signal.

In addition, in the semiconductor device, an amount of variation of the peak value of the current flowing through the switching element is controlled to be smaller as the output power becomes larger.

Further, in the semiconductor device, the peak value of the current flowing through the switching element varies for an interval from the start timing of the oscillation interval to a timing when the switching element is controlled to be turned on and off a predetermined number of times.

Furthermore, in the semiconductor device, the control circuit varies the intermittent oscillation frequency by varying the intermittent oscillation control signal using the changing signal.

In addition, in the semiconductor device, the control circuit includes an intermittent oscillation control circuit. The intermittent oscillation control circuit generates the intermittent oscillation control signal for terminating the oscillation interval when a voltage level of a fifth signal generated by using the feedback control signal corresponding to the output power falls below a predetermined first threshold voltage, and for starting the oscillation interval when the voltage level of the fifth signal exceeds a predetermined second threshold voltage higher than the first threshold voltage for the stop interval.

Further, in the semiconductor device, the fifth signal is generated by modulating the feedback control signal according to the changing signal.

Furthermore, in the semiconductor device, the intermittent oscillation control circuit varies the intermittent oscillation control signal by modulating the first threshold voltage according to the changing signal.

In addition, in the semiconductor device, the intermittent oscillation control circuit includes a delay circuit configured to delay the end timing of the oscillation interval in the intermittent oscillation control signal by a predetermined delay time and output a delayed end timing. The intermittent oscillation control circuit varies the intermittent oscillation control signal by modulating the delay time according to the changing signal.

Further, in the semiconductor device, the intermittent oscillation control circuit varies the intermittent oscillation control signal by modulating the second threshold voltage according to the changing signal.

Furthermore, in the semiconductor device, the intermittent oscillation control circuit includes a delay circuit configured to delay the start timing of the oscillation interval in the intermittent oscillation control signal by a predetermined delay time and output a delayed start timing. The intermittent oscillation control circuit varies the intermittent oscillation control signal by modulating the delay time according to the changing signal.

In addition, in the semiconductor device, the intermittent oscillation control signal is generated by using a predetermined first oscillation signal.

Further, in the semiconductor device, the first oscillation signal is a second triangle wave signal. The intermittent oscillation control circuit varies the intermittent oscillation control signal by modulating at least one of an upper limit and a lower limit of the second triangle wave signal according to the changing signal.

Furthermore, in the semiconductor device, the first oscillation signal is a second triangle wave signal. The intermittent oscillation control circuit varies the intermittent oscillation control signal by modulating a voltage change rate of second triangle wave signal with respect to time according to the changing signal.

In addition, in the semiconductor device, the changing signal is generated by modulating one of a frequency and a phase of the period signal according to a predetermined modulation pattern setting signal.

Further, in the semiconductor device, at least one of the changing signal and the modulation pattern setting signal is generated by using a count value of a timing when the switching element is turned on.

Furthermore, in the semiconductor device, at least one of the changing signal and the modulation pattern setting signal is generated by using at least one of a count value of the start timing of the oscillation interval and a count value of a start timing of the stop interval.

In addition, in the semiconductor device, at least one of the changing signal and the modulation pattern setting signal is generated by frequency-modulating a predetermined second oscillation signal according to the intermittent oscillation control signal.

Further, in the semiconductor device, at least one of the changing signal and the modulation pattern setting signal is generated by using an alternating-current voltage signal having a predetermined alternating-current frequency from an alternating-current power supply.

A semiconductor device according to a second aspect of the present invention is further provided with the switching element.

A switching power supply device according to a third aspect of the present invention is provided with the semiconductor device.

According to the semiconductor device and switching power supply device of the present invention, since the control circuit varies the intermittent oscillation frequency by using the changing signal generated by using the period signal having the predetermined period signal frequency, in the switching power supply device, which performs the intermittent oscillation control without using control methods such as pulse modulation controls, pulse frequency modulation controls, or pseudo-resonance controls, it is possible to reduce a sound generated from parts such as transformers or ceramic capacitors without making a power supply efficiency worse than that of the prior art.

BRIEF DESCRIPTION OF THE DRAWINGS

FIG. 7(a) is a graph showing a period signal PS generated by the period signal generator circuit 207a of FIG. 6, FIG. 7(b) is a graph showing an intermittent oscillation control signal Enable generated by the intermittent oscillation control circuit 202 of FIG. 3, and FIG. 7(c) is a graph showing an input signal S73na inputted to a non-inverting input terminal of the turn-off control circuit 205a of FIG. 5, and an input signal S73ia inputted to an inverting input terminal of the turn-off control circuit 205a of FIG. 5.

FIG. 8(a) is a graph showing an output current Iout of FIG. 1, FIG. 8(b) is a graph showing an output voltage Vout of FIG. 1, FIG. 8(c) is a graph showing a feedback terminal outflowing current IFB of FIG. 1, FIG. 8(d) is a graph showing a feedback control signal EAO inputted as an input signal S34n to a non-inverting input terminal of a comparator 34 of the intermittent oscillation control circuit 202 of FIG. 3, threshold voltages VR1 and VR2 inputted to an inverting input terminal of the comparator 34 of the intermittent oscillation control circuit 202 of FIG. 3, and the input signal S73ia inputted to an inverting input terminal of a comparator 73 of the turn-off control circuit 205a of FIG. 5, FIG. 8(e) is a graph showing the intermittent oscillation signal Enable of FIG. 1, and FIG. 8(f) is a graph showing the input signals S73na and S73ia to the comparator 73 of the turn-off control circuit 205a of FIG. 5.

FIG. 11A is a graph showing a time change of the intermittent oscillation frequency $f_I$, and the sound pressure intensity of the transformer 1 with respect to the intermittent oscillation frequency $f_I$ of the switching power supply device according to a comparative example, without period signal generator circuit 207 of FIG. 1.

FIG. 11C is a graph showing a time change of the intermittent oscillation frequency $f_I$, and the sound pressure intensity of the transformer 1 with respect to the intermittent oscillation frequency $f_I$, when the period signal frequency $f_c$ is set to two-thirds of the intermittent oscillation frequency $f_I$ in the switching power supply device of FIG. 1.

FIG. 11G is a graph showing a time change of the intermittent oscillation frequency $f_I$, and the sound pressure intensity of the transformer 1 with respect to the intermittent oscillation frequency $f_I$, when the period signal frequency $f_c$ is set to one-fourth of the intermittent oscillation frequency $f_I$ in the switching power supply device of FIG. 1.

FIG. 11H is a graph showing a time change of the intermittent oscillation frequency $f_I$, and the sound pressure intensity of the transformer 1 with respect to the intermittent oscillation frequency $f_I$, when the period signal frequency $f_c$ is set to one-eighth of the intermittent oscillation frequency $f_I$ in the switching power supply device of FIG. 1.

FIG. 19(a) is a graph showing the period signal PS generated by the period, signal generator circuit 207b of FIG. 18, FIG. 19(b) is a graph showing the intermittent oscillation control signal Enable generated by the intermittent oscillation, control circuit 202 of FIG. 3, and FIG. 19(c) is a graph showing the input signal S73na inputted to the non-inverting input terminal of the turn-off control circuit 205a of FIG. 5 and the input signal S73ia inputted to the inverting input terminal of the turn-off control circuit 205a of FIG. 5.

FIG. 22(a) is a graph showing the period signal PS generated by the period signal generator circuit 307 of FIG. 21, FIG. 22(b) is a graph showing an intermittent oscillation control signal Enable generated by an intermittent oscillation control circuit 202 of FIG. 20, and FIG. 22(c) is a graph showing the input signal S73na inputted to the non-inverting input terminal of the turn-off control circuit 205a of FIG. 20, and the input signal S73ia inputted to the inverting input terminal of the turn-off control circuit 205a of FIG. 20 (See FIG. 5).

FIG. 25(a) is a graph showing the period signal PS generated by the period signal generator circuit 407a of FIG. 24, FIG. 25(b) is a graph showing the intermittent oscillation control signal Enable generated by the intermittent oscillation control circuit 202 of FIG. 23, and FIG. 25(c) is a graph showing the input signal S73na inputted to the non-inverting input terminal of the turn-off control circuit 205a of FIG. 23, and the input signal S73ia inputted to the inverting input terminal of the turn-off control circuit 205a of FIG. 23 (See FIG. 5).

FIG. 28(a) is a graph showing the period signal PS generated by the period signal generator circuit 407b of FIG. 27, FIG. 28(b) is a graph showing the intermittent oscillation control signal Enable generated by the intermittent oscillation control circuit 202 of FIG. 23, and FIG. 28(c) is a graph showing the input signal S73na inputted to the non-inverting input terminal of the turn-off control circuit 205a of FIG. 23, and the input signal S73ia inputted to the inverting input terminal of the turn-off control circuit 205a of FIG. 23 (See FIG. 5).

FIG. 31(a) is a graph showing a full-wave-rectification signal SLS inputted to a voltage-to-current converter circuit 5071 of FIG. 29, and the period signal PS generated by the period signal generator circuit 507 of FIG. 29, FIG. 31(b) is a graph showing the intermittent oscillation control signal Enable generated by the intermittent oscillation control circuit 202 of FIG. 28, and FIG. 31(c) is a graph showing the input signal S73na inputted to the non-inverting input terminal of the turn-off control circuit 205a of FIG. 28, and the input signal S73ia inputted to the inverting input terminal of the turn-off control circuit 205a of FIG. 28.

FIG. 35(a) is a graph showing an output current Iout of FIG. 32, FIG. 35(b) is a graph showing an output voltage Vout of FIG. 32, FIG. 35(c) is a graph showing a feedback terminal outflowing current IFB of FIG. 32, FIG. 35(d) is a graph showing a feedback control signal EAO inputted to an operational amplifier 37 of FIG. 33, threshold voltages VR1 and VR2 inputted to the inverting input terminal of the comparator 34 of FIG. 33, and an input signal S34na inputted to the non-inverting input terminal of the comparator 34 of FIG. 33, FIG. 35(e) is a graph showing the intermittent oscillation control signal Enable generated by the intermittent oscillation control circuit 602a of FIG. 33, and FIG. 35(f) is a graph showing a current detection signal VIS inputted to a non-inverting input terminal of the turn-off control circuit 605 of FIG. 34 and the feedback control signal EAO inputted to an inverting input terminal of the turn-off control circuit 605 of FIG. 34.

FIG. 42(a) is a graph showing an output current Iout of FIG. 40, FIG. 42(b) is a graph showing an output voltage Vout of FIG. 40, FIG. 42(c) is a graph showing the feedback terminal outflowing current IFB of FIG. 40, FIG. 42(d) is a graph showing the feedback control signal EAO inputted to the non-inverting input terminal of the comparator 34 of the intermittent oscillation control circuit 602f of FIG. 41, and the threshold voltages VR1 and VR2 inputted to the inverting input terminal of the comparator 34 of FIG. 41, FIG. 42(e) is a graph showing a triangle wave signal OSC generated by a low-frequency wave oscillator circuit 6023 of FIG. 41, FIG. 42(f) is a graph showing the intermittent oscillation control signal Enable generated by the intermittent oscillation control circuit 602f of FIG. 41, and FIG. 42(g) is a graph showing the current detection signal VIS inputted to a non-inverting input terminal of the turn-off control circuit 605 of FIG. 40, and the feedback control signal EAO inputted to an inverting input terminal of the turn-off control circuit 605 of FIG. 40 (See FIG. 34).

DESCRIPTION OF EMBODIMENTS

Embodiments of the present invention will be described below with reference to the drawings. Note that like components are denoted by the same reference signs in each of the embodiments described below.

First Embodiment

Figure 1:
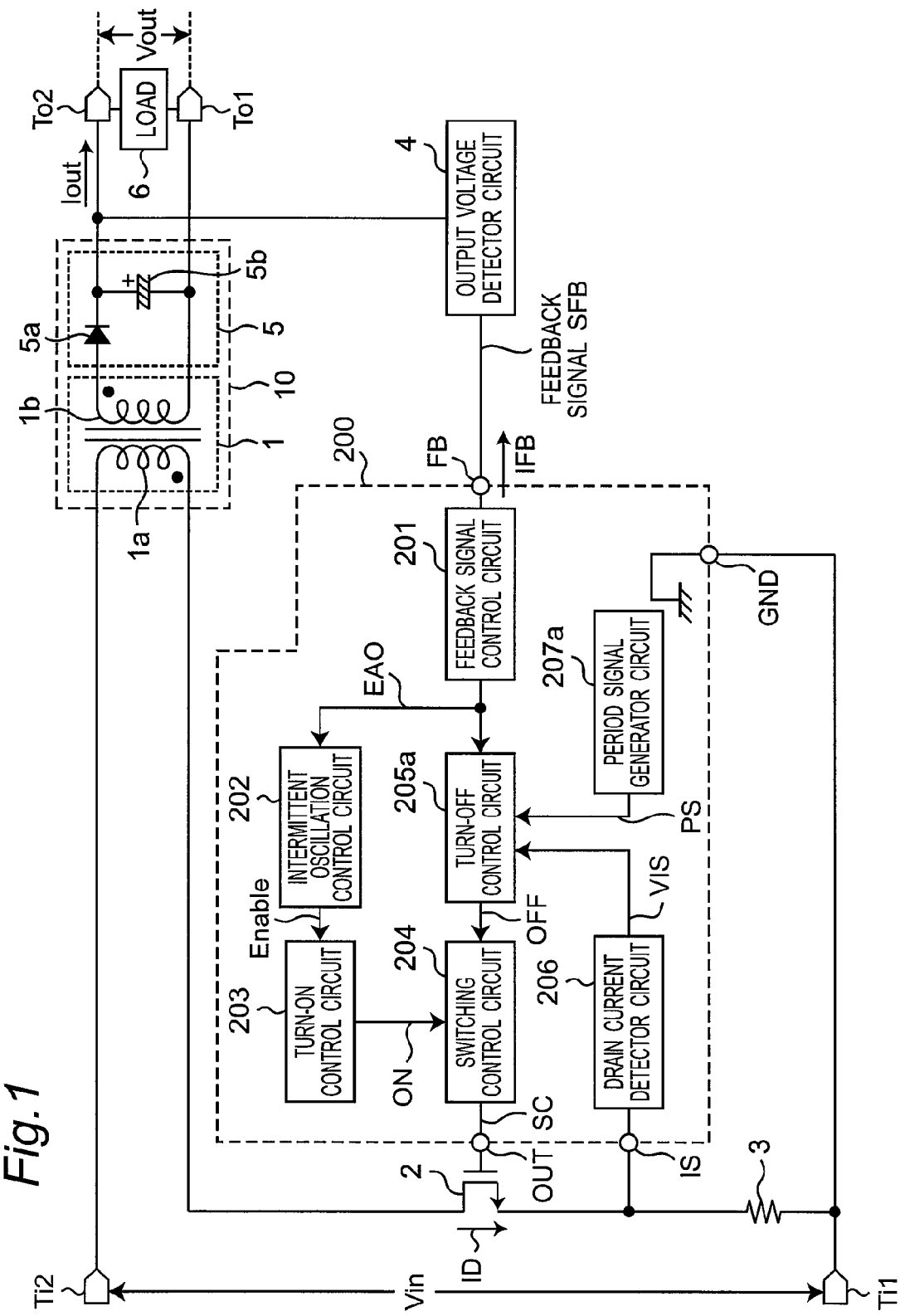
FIG. 1 is a block diagram showing a configuration of a switching power supply device provided with a control circuit 200 according to a first embodiment of the present invention.
Figure 2:
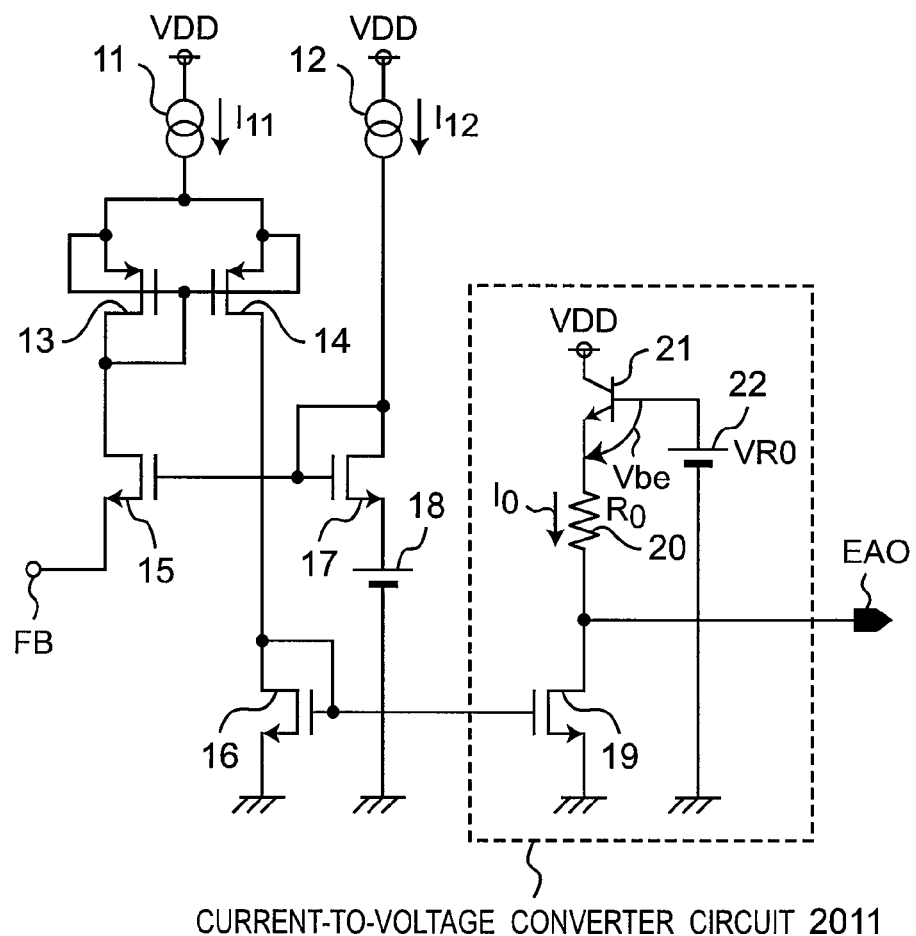
FIG. 2 is a circuit diagram of a feedback signal control circuit 201 of FIG. 1.
Figure 3:
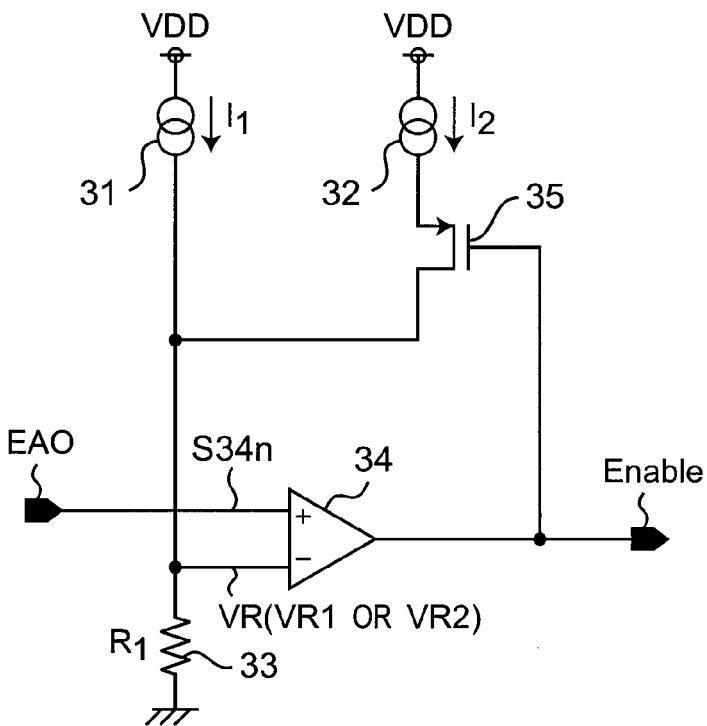
FIG. 3 is a circuit diagram of an intermittent oscillation control circuit 202 of FIG. 1.
Figure 4:
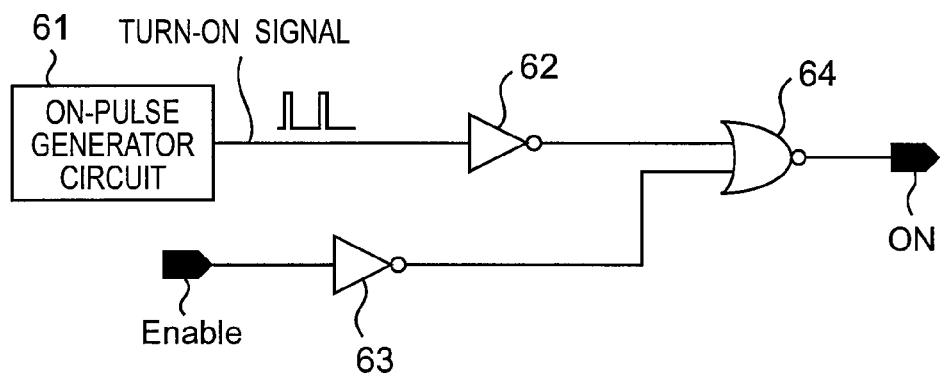
FIG. 4 is a circuit diagram of a turn-on control circuit 203 of FIG. 1.
Figure 5:
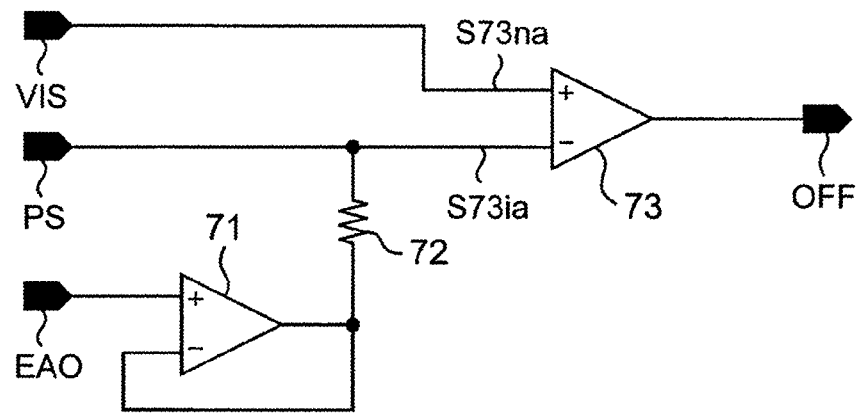
FIG. 5 is a circuit diagram of a turn-off control circuit 205a of FIG. 1.
Figure 6:
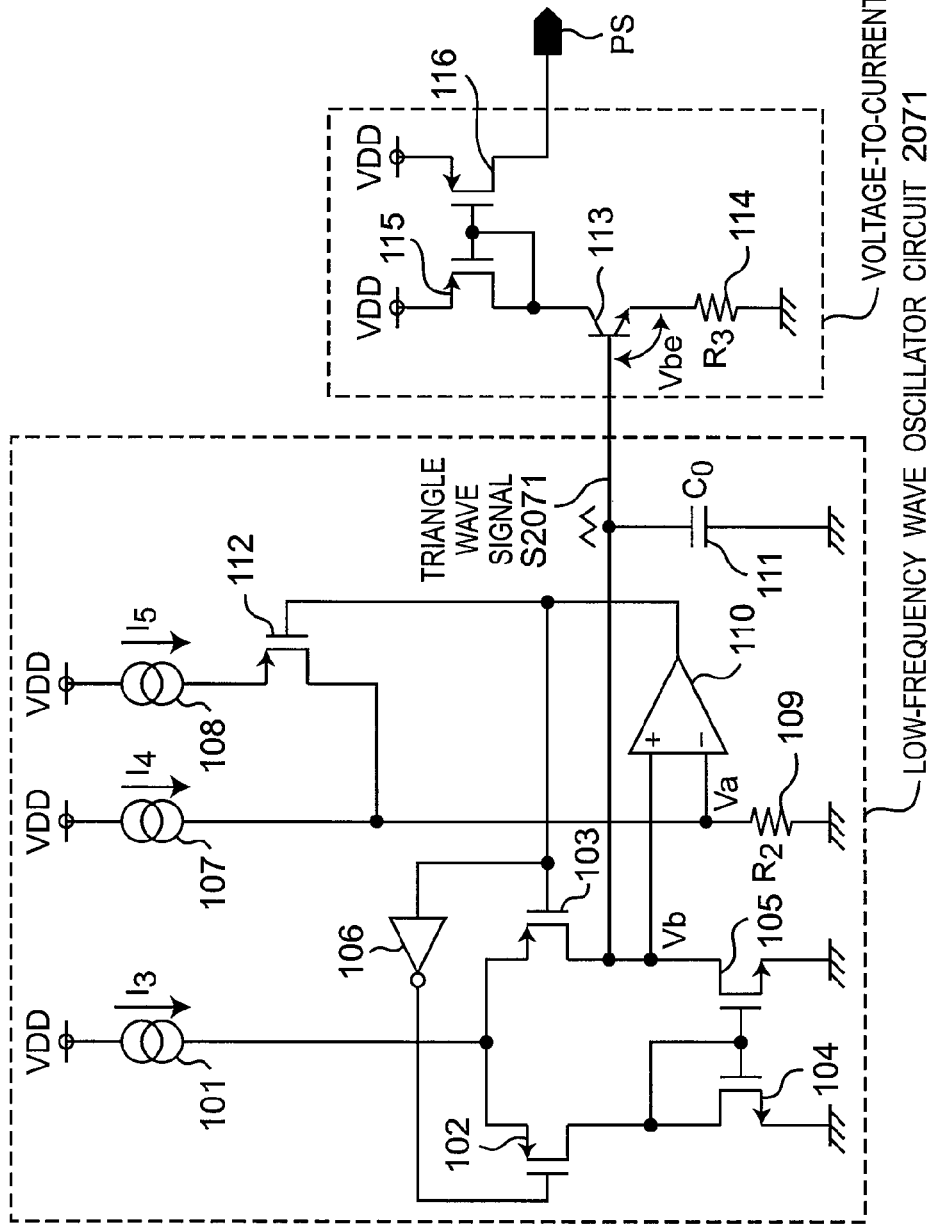
FIG. 6 is a circuit diagram of a period signal generator circuit 207a of FIG. 1.

FIG. 1 is a block diagram showing a configuration of a switching power supply device provided with a control circuit 200 according to a first embodiment of the present invention. In addition, FIG. 2 is a circuit diagram of a feedback signal control circuit 201 of FIG. 1, FIG. 3 is a circuit diagram of an intermittent oscillation control circuit 202 of FIG. 1, and FIG. 4 is a circuit diagram of a turn-on control circuit 203 of FIG. 1. Further, FIG. 5 is a circuit diagram of a turn-off control circuit 205a of FIG. 1, and FIG. 6 is a circuit diagram of a period signal generator circuit 207a of FIG. 1.

The switching power supply device of FIG. 1 is a flyback type switching power supply device. As described in detail below, the switching power supply devices according to the present embodiment and each of the embodiments described below perform an intermittent oscillation operation, which alternately repeats an oscillation interval and a stop interval under a light load. The switching power supply device of FIG. 1 is configured to include a switching element 2 such as a power MOS field-effect transistor, a drain current detection resistance 3, input terminals Ti1 and Ti2, an input-to-output converter circuit 10, output terminals To1 and To2, an output voltage detector circuit 4, and a control circuit 200, which is a semiconductor device for controlling the switching element 2 to be turned on and off. In addition, the input-to-output converter circuit 10 is configured to include a transformer 1 for use in power conversion including a primary winding 1a and a secondary winding 1b having polarities opposite to each other, and an output voltage generator circuit 5 including a rectifier diode 5a and a capacitor 5b. In this case, an alternating-current voltage from a commercial alternating-current power supply is rectified by a rectifier such as a diode bridge rectifier, is smoothed by an input capacitor, and is outputted to the input terminals Ti1 and Ti2 as a direct current input voltage Vin. The low-potential side input terminal Ti1 of the input terminals Ti1 and Ti2 is connected to a source of the switching element 2 and a current detection terminal IS via the drain current detection resistance 3, and The low-potential side input terminal Ti1 is connected to a grand terminal GND of the current circuit 200. In addition, the high-potential side input terminal Ti2 of the input terminals Ti1 and Ti2 is connected to one end of the primary winding 1a, while the other end of the primary winding 1a is connected to a drain of the switching element 2.

In addition, referring to FIG. 1, one end of the secondary winding 1b is connected to one electrode of the capacitor 5b and the output terminal To2 via the rectifier diode 5a, while the other end of the secondary winding 1b is connected to the other electrode of the capacitor 5b and the output terminal To1. Then, an alternating-current voltage induced by the secondary winding 1b based on a switching operation of the switching element 2 is rectified and smoothed by the output voltage generator circuit 5 to be converted to a direct current output voltage Vout. Further, an output power corresponding to the output voltage Vout and an output current Iout flowing into the output terminal To2 is applied and supplied to a load 6 via the output terminals To1 and To2.

Further, referring to FIG. 1, for example, the output voltage detector circuit 4 is configured to include a photo coupler and a Zener diode, and the output voltage detector circuit 4 detects a voltage level of the output voltage Vout. Then, when the detected output voltage Vout is equal to or more than a predetermined threshold voltage, the output voltage detector circuit 4 generates a feedback signal SFB, and thereafter, the output voltage detector circuit 4 outputs the generated feedback signal SFB to a feedback signal input terminal FB so that a feedback terminal outflowing current IFB corresponding to the output voltage Vout outflows from the feedback signal input terminal FB of the control circuit 200. As described in detail below, the control circuit 200 generates a switching control signal SC representing a start timing and an end timing of an ON-interval of the switching element 2, and the control circuit 200 outputs the switching control signal SC to a gate of the switching element 2 via a switching control signal output terminal OUT so that the output voltage Vout is equal to the predetermined threshold voltage by using the feedback terminal outflowing current IFB and a voltage of the current detection terminal IS having a voltage corresponding to a drain current ID flowing through the switching element 2. In addition, as described in detail below, the control circuit 200 performs a current mode Pulse Width Modulation (PWM) control in a normal operation, without any intermittent oscillation control as described below.

Referring to FIG. 1, the control circuit 200 is configured to include the feedback signal control circuit 201, the period signal generator circuit 207a, a drain current detector circuit 206, the turn-off control circuit 205a, the intermittent oscillation control circuit 202, the turn-on control circuit 203, a switching control circuit 204, the input terminal Ti1 and the ground terminal GND connected to a ground potential, the current detection terminal IS, the switching control signal output terminal OUT, and the feedback signal input terminal FB. It is noted that the control circuit 200 is provided with power supply voltage terminals (not shown) and the like for supplying the control circuit 200 with a power supply voltage VDD.

Referring to FIG. 2, the feedback signal control circuit 201 is configured to include a constant current source 11 for outputting a predetermined constant current $I_{11}$, a constant current source 12 for outputting a predetermined constant current $I_{12}$, P-channel type MOS field effect transistors (hereinafter, they are referred to as pMOS transistors.) 13 and 14, N-channel type MOS field effect transistors (hereinafter, they are referred to as nMOS transistors.) 15, 16, and 17, a constant voltage source 18, and a current-to-voltage converter circuit 2011. In addition, the current-to-voltage converter circuit 2011 is configured to include a nMOS transistor 19, a resistor 20 having a resistance value $R_0$, a constant voltage source 22 for outputting a predetermined constant voltage VR0, and a npn bipolar transistor 21. In this case, the pMOS transistors 13 and 14, and the nMOS transistors 16 and 19 constitute current mirror circuits, respectively. In addition, the constant current sources 11 and 12 are configured to limit a current flowing into the control circuit 200 to a predetermined current value upon short-circuiting the feedback signal input terminal FB and the ground terminal GND.

Referring to FIG. 2, the feedback terminal outflowing current IFB outflowing from the feedback signal input terminal FB is returned by the two current mirror circuits as described above, and therefore, a current $I_0$ corresponding to the feedback terminal outflowing current IFB flows through the nMOS transistor 19 and the resistor 20. Then, the current $I_0$ is converted to a feedback control signal EAO having a voltage level VEAO given by the following equation (1), and the feedback control signal EAO is outputted to the intermittent oscillation control circuit 202 and the turn-off control circuit 205a.

$$VEAO=VR0-Vbe-R_0 \times I_0 \quad (1)$$

In the equation (1), a voltage Vbe is a voltage difference between a base and an emitter of the npn bipolar transistor 21. As defined in the equation (1), the voltage level VEAO is lowered as the current $I_0$ flowing through the resistor 20 becomes larger, while the voltage level VEAO becomes higher as the current $I_0$ flowing through the resistor 20 becomes smaller. That is, the feedback control signal EAO corresponds to the output voltage to the load 6.

Referring to FIG. 3, the intermittent oscillation control circuit 202 is configured to include constant current sources 31 and 32 for respectively outputting predetermined constant currents $I_1$ and $I_2$, a resistor 33 having a resistance value $R_1$, a comparator 34, and a pMOS transistor 35. The feedback control signal EAO is inputted to a non-inverting input terminal of the comparator 34 as an input signal S34n. In addition, an inverting input terminal of the comparator 34 is connected to the ground via the resistor 33. Further, the constant current source 31 and a series-connected circuit including the constant current source 32 and the pMOS transistor 35 are connected in parallel to a connection point between the inverting input terminal of the comparator 34 and the resistor 33. Then, an output signal from the comparator 34 is outputted to the turn-on control circuit 203 as an intermittent oscillation control signal Enable, while the output signal from the comparator 34 is outputted to a gate of the pMOS transistor 35.

Referring to FIG. 3, a reference voltage VR inputted to the inverting input terminal of the comparator 34 has a hysteresis. In particular, when a voltage level of the feedback control signal EAO of the input signal S34n is higher than the reference voltage VR, a voltage level of the intermittent oscillation control signal Enable is a high level, and therefore, the pMOS transistor 35 is in an OFF-state, and the reference voltage VR becomes a threshold voltage VR1 as described below.

$$VR1=R_1 \times I_1 \quad (2)$$

On the other hand, referring to FIG. 3, when the voltage level of the feedback control signal EAO of the input signal S34n, falls below the reference voltage VR, the voltage level of the intermittent oscillation control signal Enable is a low level, and therefore, the pMOS transistor 35 is in an ON-state, and the reference voltage VR becomes a threshold voltage VR2 as described below.

$$VR2=R_1 \times (I_1+I_2) \quad (3)$$

That is, when the voltage level of the feedback control signal EAO corresponding to the output power to the load 6 falls below the threshold voltage VR1, the intermittent oscillation control circuit 202 generates the intermittent oscillation control signal Enable having the low level. When the voltage level of the feedback control signal EAO exceeds the threshold voltage VR2 higher than the threshold voltage VR1 upon generating the intermittent oscillation control signal Enable having the low level, the intermittent oscillation control circuit 202 generates the intermittent oscillation control signal Enable having the high level.

Referring to FIG. 4, the turn-off control circuit 203 is configured to include an ON-pulse generator circuit 61 for generating a turn-on signal of a clock pulse having a predetermined frequency, inverters 62 and 63, and a NOR gate 64. The turn-on signal is inputted to a first input terminal of the NOR gate 64 via the inverter 62, and the intermittent oscillation control signal Enable is inputted to a second input terminal of the NOR gate 64 via the inverter 63. Then, an output signal from the NOR gate 64 is outputted to the switching control circuit 204 as a turn-on control signal ON for turning on the switching element 2. That is, when the voltage level of the intermittent oscillation control signal Enable becomes the high level, the turn-on control circuit 203 of FIG. 4 outputs the turn-on signal as the turn-on control signal ON, while when the voltage level of the intermittent oscillation control signal Enable becomes the low level, the turn-on control circuit 203 outputs the turn-on control signal ON having the low level. It is noted that a frequency of the turn-on signal generated by the turn-on control circuit 203 may be fixed or variable. Further, instead of the turn-on signal from the ON-pulse generator circuit 61, the turn-on signal, which is obtained by detecting a bottom timing of a drain voltage of the switching element 2, may be used in a pseudo-resonance control.

Referring to FIG. 1, the drain current ID flowing through the switching element 2 is converted to a voltage corresponding to the drain current ID by the drain current detection resistor 3 connected between the switching element 2 and the ground terminal GND, and the voltage is applied to the current detection terminal IS. The drain current detector circuit 206 detects the drain current ID by detecting the voltage of the current detection terminal IS, and generates a current detection signal VIS being proportional to a magnitude of the detected drain current ID, and outputs the current detection signal VIS to the turn-off control circuit 205. It is noted that the drain current detector circuit 206 may detect the drain current ID using the drain voltage of the switching element 2.

Referring to FIG. 6, the period signal generator circuit 207a is configured to include a low-frequency wave oscillator circuit 2071 for generating a triangle wave signal S2071 having a predetermined cycle $T_c$ of period signal, and a voltage-to-current converter circuit 2072, which voltage-to-current converts the triangle wave signal S2071 to a period signal PS of a current signal and outputs the period signal PS to the turn-off control circuit 205a. In this case, the low-frequency wave oscillator circuit 2071 is configured to include constant current sources 101, 107, and 108 for respectively outputting predetermined constant currents $I_3$, $I_4$, and $I_5$, an inverter 106, a comparator 110, a resistor 109 having a resistance value $R_2$, a capacitor 111 having a capacitance $C_0$, pMOS transistors 102, 103, and 112, and nMOS transistors 104 and 105 for constituting the current mirror circuit.

In the low-frequency wave oscillator circuit 2071 of FIG. 6, a voltage Va at an inverting input terminal of the comparator 110 is decided by the resistance value $R_2$, the constant current $I_4$ and the constant current $I_5$. In particular, when the pMOS transistor 112 is turned off, the voltage Va becomes ($I_4 \times R_2$), then when the pMOS transistor 112 is turned on, the voltage Va becomes ($I_4+I_5) \times R_2$.

Referring to FIG. 6, when a voltage level of an output signal of the comparator 110 becomes the low level, the pMOS transistors 103 and 112 are in the ON-state. Further, since the output signal of the comparator 110 is inputted to a gate of the pMOS transistor 102 via the inverter 106, the pMOS transistor 102 is in the OFF-state. Therefore, the voltage Va becomes (($I_4+I_5) \times R_2$). In addition, since the pMOS transistor 103 is in the ON-state, the constant current $I_3$ from the constant current source 101 flows into the capacitor 111 via the pMOS transistor 103. Then, a voltage Vb of a non-inverting input terminal of the comparator 110 increases, and when the voltage Vb exceeds the voltage Va ((($I_4+I_5) \times R_2$), the output signal of the comparator 110 is switched over to a high level, and therefore, the pMOS transistors 103 and 112 are in the OFF-state. Accordingly, the voltage Va is switched over to ($I_4 \times R_2$). In addition, the pMOS transistor 102 is switched over to the ON-state, and therefore, the constant current $I_3$ from the constant current source 101 flows through the nMOS transistor 104 via the pMOS transistor 102. For example, when a mirror ratio of the current mirror circuit including the nMOS transistors 104 and 105 is set to 1, a current flowing through the nMOS transistor 105 also becomes the constant current $I_3$. Accordingly, a charge stored in the capacitor 111 is pulled up by this constant current $I_3$. As a result, the voltage Vb is lowered. Thereafter, when the voltage Vb falls below the voltage Va (=$I_4 \times R_2$), the output signal of the comparator 110 becomes a low level again.

By repeating the above-described operation, the low-frequency wave oscillator circuit 2071 of FIG. 6 generates the triangle wave signal S2071, which continuously varies within a voltage range ($I_5 \times R_2$) from the voltage value ($I_4 \times R_2$) to the voltage value ((($I_4+I_5) \times R_2$) with the cycle $T_c$ of period signal given by the following equation (4).

$$T_c = 2 \times C_0 \times (I_5 \times R_2)/I_3 \qquad (4)$$

In addition, referring to FIG. 6, the voltage-to-current converter circuit 2072 is configured to include pMOS transistors 115 and 116 for constituting the current mirror circuit, a npn bipolar transistor 113, and a resistor 114 having a resistance value $R_3$. The triangle wave signal S2071 is inputted to a base of the npn bipolar transistor 113, and the triangle wave signal S2071 is converted to a current corresponding to a voltage level of the triangle wave signal S2071 by the resistor 114 connected to an emitter of the npn bipolar transistor 113. Then, the converted current is returned by the pMOS transistors 115 and 116 to be outputted to the turn-off control circuit 205a as the period signal PS.

For example, referring to FIG. 6, when a mirror ratio of the current mirror circuit including the pMOS transistors 115 and 116 is set to 1, a current value If(t) (where "t" is defined as a time.) of the period signal PS is given by the following equation (5) using the voltage Vbe between the base and the emitter of the npn bipolar transistor 113 and a voltage Vf(t) of the triangle wave signal S2071.

$$If(t) = (Vf(t) - Vbe)/R_3 \qquad (5)$$

Accordingly, in a manner similar to that of the triangle wave signal S2071, the current value If(t) of the period signal PS continuously varies within a current range from a predetermined first current value to a predetermined second current value with the cycle $T_c$ of period signal. FIG. 7(a) is a graph showing the period signal PS generated by the period signal generator circuit 207a of FIG. 6. As illustrated in FIG. 7(a), the period signal generator circuit 207a generates the period signal PS so that a frequency of each of cycle intervals of the period signal PS, and a local maximum value and a local minimum value of an amplitude are respectively constant by repeating a regular pattern signal of the triangle wave signal with a period signal frequency ($f_c = 1/T_c$).

Referring to FIG. 5, the turn-off control circuit 205a is configured to include an operational amplifier 71 configured to operate as an impedance converter, a resistor 72, and a comparator 73. In this case, the current detection signal VIS is outputted to a non-inverting input terminal of the comparator 73 as an input signal S73na. In addition, the feedback control signal EAO is impedance-converted by the operational amplifier 71 to be outputted to the resistor 72. On the other hand, the period signal PS flows through the resistor 72 as a current signal. Therefore, the period signal PS is added to a signal corresponding to the feedback control signal EAO, and the added signal is inputted to an inverting input terminal of the comparator 73 as an input signal S73ia. When a voltage level of the input signal S73na exceeds a voltage level of the input signal S73ia, the comparator 73 generates a turn-off control signal OFF having the high level, while when the voltage level of the input signal S73na falls below the voltage level of the input signal S73ia, the comparator 73 generates a turn-off control signal OFF having the low level, and outputs the turn-off control signal OFF having the low level to the switching control circuit 204.

Referring to FIG. 1, when a voltage level of the turn-on control signal ON inputted from the turn-on control circuit 203 changes from the low level to the high level, the switching control circuit 204 including a RS flip flop and the like turns on the switching element 2. Then, the switching control circuit 204 generates the switching control signal SC, and outputs to the gate of the switching element 2 via the output terminal OUT so that the switching element 2 is turned off in response to the turn-off control signal OFF having the high level from the turn-off control circuit 205 upon turning on the switching element 2. That is, the switching control signal SC represents both the start timing and the end timing of the ON-interval of the switching element 2.

Then, an operation of the switching power supply device of FIG. 1 is described. First of all, when the input terminals Ti1 and Ti2 are supplied with the input voltage Vin, the control circuit 200 is supplied with a starting current via a starting current supply terminal of the control circuit 200 (Referring to FIG. 1, it is not shown for simplification.). Thereafter, the control circuit 200 starts an ON-OFF control of the switching element 2 when it is in an operable state. Upon starting up, the output voltage Vout falls below a predetermined threshold set in the output voltage detector circuit 4, and therefore, the output voltage detector circuit 4 does not output the feedback signal SFB to the control circuit 200. Accordingly, since the feedback terminal outflowing current IFB does not outflow from the feedback signal input terminal FB, the voltage level of the feedback control signal EAO is higher than a voltage level when the feedback terminal outflowing current IFB outflows. Therefore, a voltage level of the input signal 73ia of the comparator 73 of the turn-off control circuit 205 is also configured to be higher than the voltage level when the feedback terminal outflowing current IFB outflows, where the input signal 73ia is generated by using the feedback control signal EAO and the period signal PS.

After starting up the switching power supply device of FIG. 1, during the normal operation when the voltage level of the feedback control signal EAO is higher than the threshold voltage VR2 represented by the equation (3), the control circuit 200 operates as follows. Since the voltage level of the feedback control signal EAO is higher than the threshold voltage VR2 represented by the equation (3) during the normal operation, the voltage level of the intermittent oscillation control signal Enable is high. Therefore, the turn-on control circuit 203 outputs the turn-on signal from the ON-pulse generator circuit 61 directly to the switching control circuit 204 as the turn-on control signal ON. Once the switching element 2 is turned on, the drain current ID flows through the switching element 2, and the current detection signal VIS being proportional to the magnitude of the drain current ID is inputted to the non-inverting input terminal of the comparator 73. When a voltage level of the current detection signal VIS is higher than the voltage level of the input signal S73ia, the comparator 73 generates the turn-off control signal OFF having the high level to output to the switching control circuit 204, and therefore, the switching element 2 is turned off. In addition, after turning off the switching element 2, when the voltage level of the turn-on control signal ON changes from the low level to the high level, the switching element 2 is turned on again.

As described above, during the normal operation, the output voltage Vout becomes higher by repeatedly turning on and off the switching element 2. Then, when the output voltage Vout is equal to or more than the predetermined threshold voltage, which is set in the output voltage detector circuit 4, the output voltage detector circuit 4 outputs the feedback signal SFB corresponding to the output voltage Vout to the control circuit 200. Accordingly, the feedback terminal outflowing current IFB corresponding to the output voltage Vout outflows from the feedback signal input terminal FB, and therefore, the voltage level of the feedback control signal EAO from the current-to-voltage converter circuit 2011 of the feedback signal control circuit 201 is lowered. Therefore, the voltage level of the input signal 73ia of the comparator 73 of the turn-off control circuit 205 is also lowered, where the input signal 73ia is generated by using the feedback control signal EAO and the period signal PS. As a result, in response to the turn-off control signal OFF, the ON-interval of the switching element 2 becomes shorter, and therefore, the drain current ID flowing through the switching element 2 is lowered.

As described above, during the normal operation, an on-duty of the switching element 2 can be controlled so that the output voltage Vout is equal to the predetermined threshold voltage, which is set in the output voltage detector circuit 4. That is, the switching element 2 is turned on in response to the turn-on signal included in the turn-on control signal ON from the turn-on control circuit 203, while when the current detection signal VIS corresponding to the drain current ID flowing through the switching element 2 exceeds the input signal S73ia generated by using the feedback control signal EAO corresponding to the feedback terminal outflowing current IFB and the period signal PS, the switching element 2 is turned off in response to the turn-off control signal OFF, which changes from the low level to the high level.

As described above, when the output voltage Vout becomes higher (that is, when the load 6 becomes lighter), the feedback terminal outflowing current IFB becomes larger, and therefore, the voltage level of the feedback control signal EAO is lowered. Therefore, the ON-interval of the switching element 2 is controlled to be shorter, and therefore, the drain current ID becomes smaller. On the other hand, when the output voltage Vout is lowered (that is, the load 6 becomes heavier), the feedback terminal outflowing current IFB becomes smaller, and therefore, the voltage level of the feedback control signal EAO becomes higher. Therefore, the ON-interval of the switching element 2 is controlled to be longer, and therefore, the drain current ID becomes larger. This allows a current flowing through the switching element 2 to be controlled according to a power supplied to the load 6 of the switching power supply device.

Referring to FIG. 1, when the voltage level of the feedback control signal EAO falls below the predetermined threshold voltage VR2 represented by the equation (3), the control circuit 200 performs the intermittent oscillation control as follows. The voltage level of the feedback control signal EAO falls below the threshold voltage VR2, and thereafter, when the voltage level of the feedback control signal EAO further falls below the threshold voltage VR1, the voltage level of the intermittent oscillation control signal Enable is switched from the high level to the low level. Therefore, the voltage level of the turn-on control signal ON is fixed to be the low level. Accordingly, the switching element 2 is controlled so as not to be turned on, and therefore, the stop interval starts, where the stop interval is defined as a stop interval when the switching element 2 stops turning on and off. Thereafter, when the voltage level of the feedback control signal EAO is higher than the threshold voltage VR2, the voltage level of the intermittent oscillation control signal Enable is switched from the low level to the high level. Therefore, since the turn-on signal is outputted as the turn-on control signal ON, the oscillation interval starts, where the oscillation interval is defined as an oscillation interval when the switching element 2 is controlled to be turned on and off. As described above, upon controlling the intermittent oscillation, the control circuit 200 controls the switching element 2 to alternately repeat the oscillation interval and the stop interval of the switching element 2. This allows numbers of times of switching of the switching element 2 to be smaller than that of the normal operation, and therefore, a power consumption can be reduced. In this case, a cycle for alternating between the oscillation interval and the stop interval upon controlling the intermittent oscillation is defined as a cycle $T_I$ of intermittent oscillation, and a frequency corresponding to the cycle $T_I$ of intermittent oscillation is defined as an oscillation frequency $f_I$.

Figure 8:
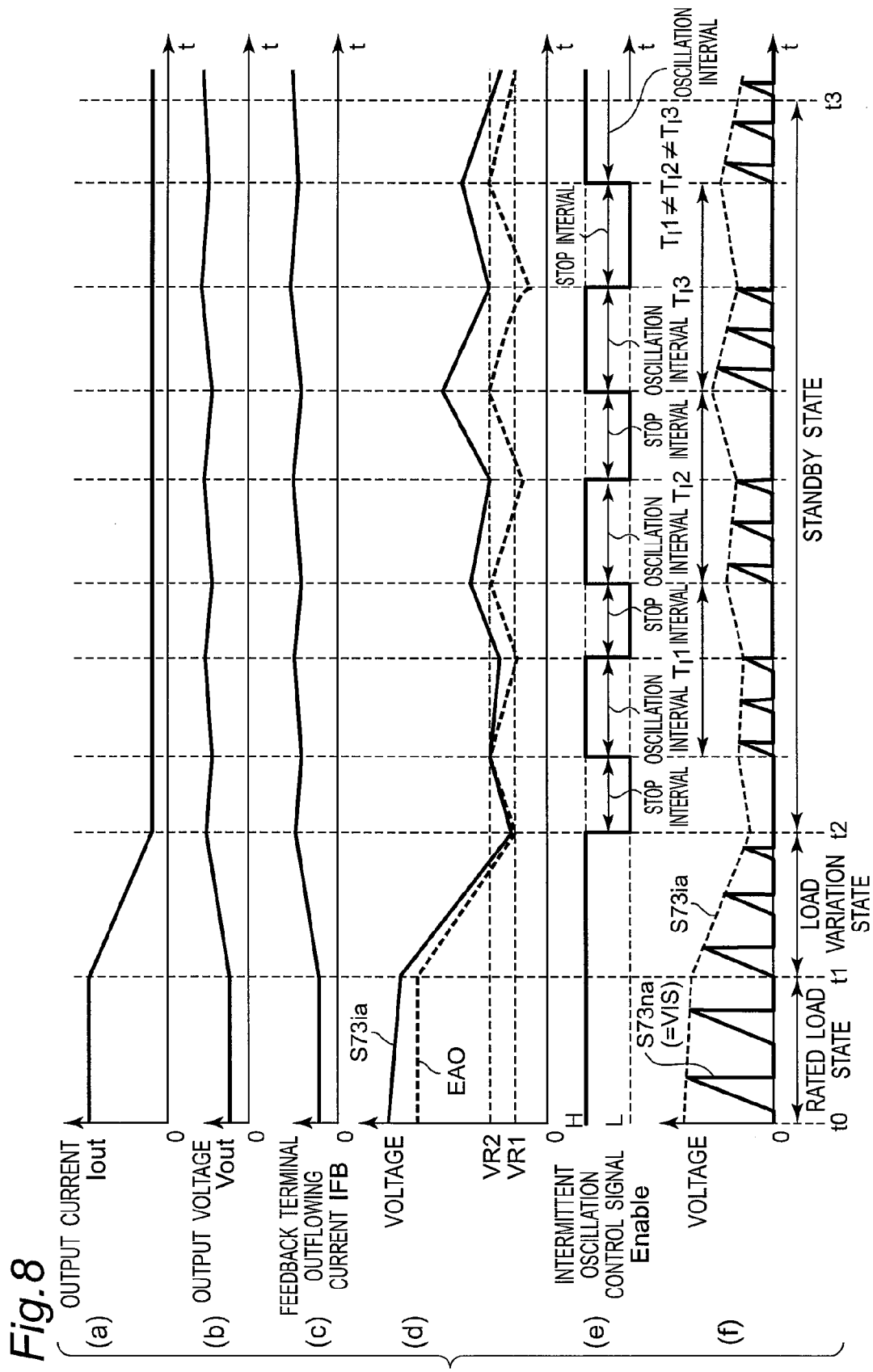
FIG. 8 is a graph, where

FIG. 8 is a graph, where FIG. 8(a) is a graph showing the output current Iout of FIG. 1, FIG. 8(b) is a graph showing the output voltage Vout of FIG. 1, FIG. 8(c) is a graph showing the feedback terminal outflowing current IFB of FIG. 1, FIG. 8(d) is a graph showing the feedback control signal EAO inputted as the input signal S34n to the non-inverting input terminal of the comparator 34 of the intermittent oscillation control circuit 202 of FIG. 3, the threshold voltages VR1 and VR2 inputted to the inverting input terminal of the comparator 34 of the intermittent oscillation control circuit 202 of FIG. 3, and the input signal S73ia inputted to the inverting input terminal of the comparator 73 of the turn-off control circuit 205a of FIG. 5, FIG. 8(e) is a graph showing the intermittent oscillation signal Enable of FIG. 1, and FIG. 8(f) is a graph showing the input signals S73na and S73ia to the comparator 73 of the turn-off control circuit 205a of FIG. 5.

Referring to FIG. 8, during an interval of a rated load state where the output voltage Vout is a rated voltage and the output current Iout is a rated current (an interval from a timing t0 to a timing t1), the voltage level of the intermittent oscillation control signal Enable becomes the high level, and therefore, the control circuit 200 performs the normal operation as described above. Then, during an interval from the timing t1 to a timing t2, a state of the load 6 varies, and therefore, an output voltage outputted to the load 6 becomes larger (the load 6 becomes lighter). Thereafter, when the voltage level of the feedback control signal EAO falls below the VR1, the voltage level of the intermittent oscillation control signal Enable becomes the low level, and therefore, the switching operation of the switching element 2 stops. Thereafter, since the output voltage Vout decreases accordingly, the feedback terminal outflowing current IFB decreases accordingly, and therefore, the voltage level of the intermittent oscillation control signal Enable is inverted from the low level to the high level. Therefore, the switching operation of the switching element 2 restarts.

In this case, as illustrated in FIG. 5, the input signal S73ia inputted to the inverting input terminal of the comparator 73 of the turn-off control circuit 205a is obtained by adding the feedback control signal EAO to the period signal PS. That is, the input signal S73ia is obtained by modulating the feedback control signal EAO according to the period signal PS. On the other hand, since a turn-off control circuit of a switching power supply device according to the prior art uses the feedback control signal EAO itself as the input signal S73ia as compared with the turn-off control circuit 205a of FIG. 5, when the load 6 does not vary in a standby state, the cycle $T_I$ of intermittent oscillation including the oscillation interval and the stop interval of the switching element 2 is fixed to a constant value. In this case, when the constant cycle $T_I$ of intermittent oscillation falls within an audible area, there was a problem of generating a transformer sound.

According to the present embodiment, the turn-off control circuit 205a of FIG. 5 generates the turn-off control signal OFF, which turns off the switching element 2 by comparing the current detection signal VIS with the input signal S73ia obtained by modulating the feedback control signal EAO according to the period signal PS, and therefore, a timing of generating the turn-off control signal OFF varies according to the period signal PS without any variation of the load 6 during the standby state. As a result, as illustrated in the current detection signal VIS of FIG. 8(f), a peak value of the drain current ID varies. Accordingly, without the variation of the load 6 during the standby state, the increased amount of the output voltage Vout varies for each of the oscillation intervals of the switching element 2. As a result, each of the intermittent oscillation intervals $T_I1$, $T_I2$, and $T_I3$ differs from each other ($T_I1 \neq T_I2 \neq T_I3$).

Figure 7:
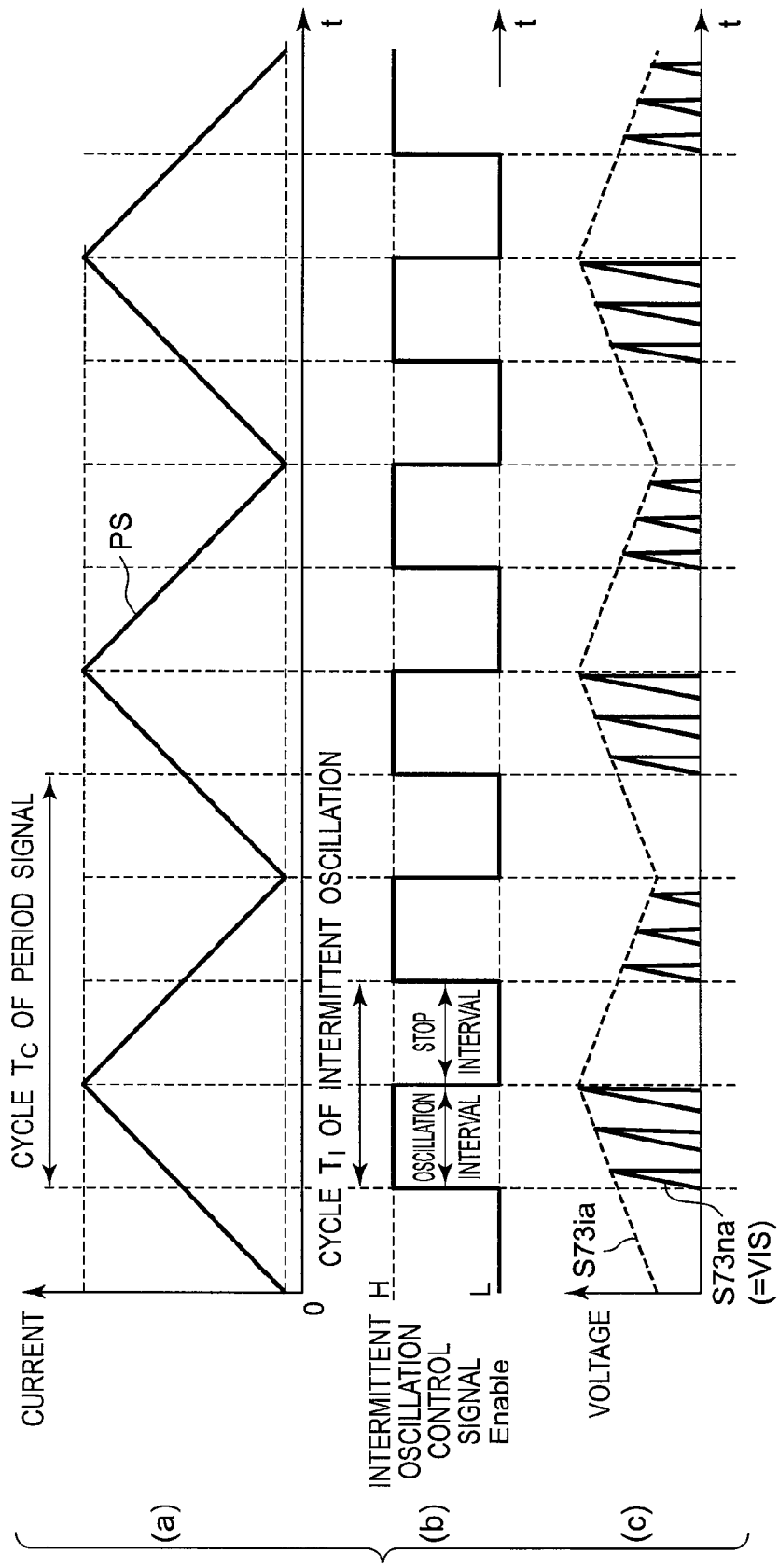
FIG. 7 is a graph, where

FIG. 7 is a graph, where FIG. 7(a) is a graph showing the period signal PS generated by the period signal generator circuit 207a of FIG. 6, FIG. 7(b) is a graph showing the intermittent oscillation control signal Enable generated by the intermittent oscillation control circuit 202 of FIG. 3, and FIG. 7(c) is a graph showing the input signal S73na inputted to a non-inverting input terminal of the turn-off control circuit 205a of FIG. 5, and the input signal S73ia inputted to an inverting input terminal of the turn-off control circuit 205a of FIG. 5. Referring to FIG. 7, for the purpose of clarifying a variation of the current detection signal VIS, it is assumed that the feedback terminal outflowing current IFB and the cycle $T_I$ of intermittent oscillation are constant, respectively. As illustrated in FIG. 7(c), for each of the oscillation intervals, a peak value of the current detection signal VIS (that is, the peak value of the drain current ID) can be varied using the period signal PS.

Then, a reduction effect of the transformer sound due to the switching power supply device according to the present embodiment is described. An energy E, which is supplied to the load 6 upon controlling the intermittent oscillation, is given by the following equation (6) using an inductance La of the primary winding 1a, a peak value IDP of the drain current ID flowing through the switching element 2 (hereinafter, it is referred to as a drain current peak value IDP.), an intermittent oscillation frequency $f_I$, and a power supply efficiency η (a ratio of input voltage Vin to output voltage Vout).

$$E = La \times IDP^2 \times f_I \times \eta / 2 \qquad (6)$$

However, for the purpose of explaining briefly in this case, it is assumed that the power supply efficiency η is constant, that the reference voltage VR inputted to the comparator 34 of the intermittent oscillation control circuit 202 has not a hysteresis, and that the intermittent oscillation frequency $f_I$ is equal to an oscillation frequency of the switching element 2 (that is, a frequency of a turn-on signal 61 of FIG. 4). Further, assuming that the variation of the load 6 is small, and that the energy E is constant, the equation (6) is transformed using a constant number k ($=2E/(La \times \eta)$), and the intermittent oscillation frequency $f_I$ is given by the following equation (7).

$$f_I = 2E/(La \times \eta \times IDP^2) = k/IDP^2 \qquad (7)$$

Figure 9:
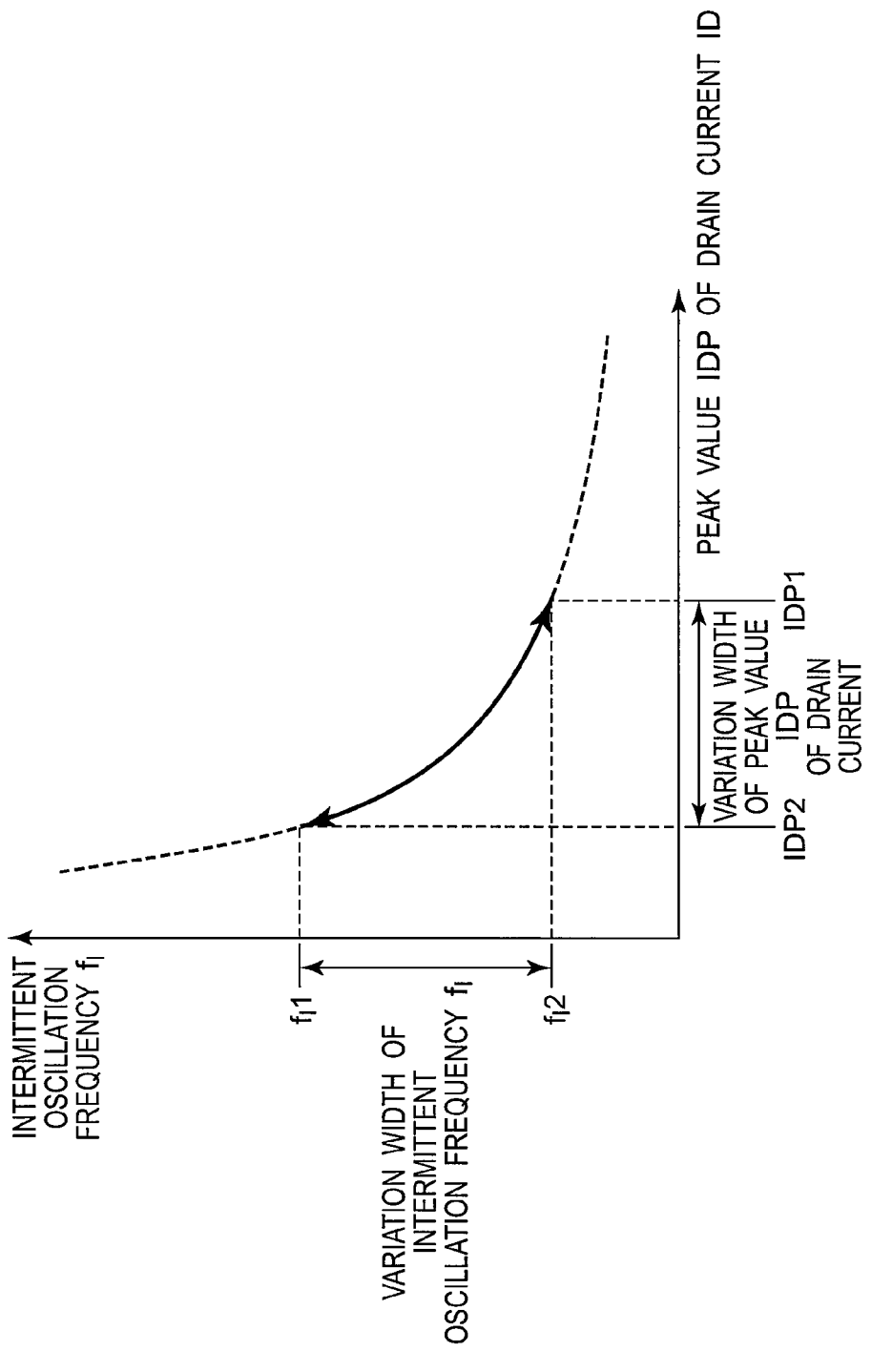
FIG. 9 is a graph showing a relationship between a peak value IDP (hereinafter, it is referred to as a drain current peak value IDP) of a drain current ID flowing through a switching element 2 of FIG. 1 and an intermittent oscillation frequency $f_I$.

That is, with reference to the equation (7), it is understood that the intermittent oscillation frequency $f_I$ is inversely proportional to a square of the drain current peak value IDP. FIG. 9 is a graph showing a relationship between the peak value IDP of the drain current ID flowing through the switching element 2 of FIG. 1 and the intermittent oscillation frequency $f_I$. As clearly shown in FIG. 9, when the drain current peak value IDP varies from a drain current peak value IDP1 to a drain current peak value IDP2, the intermittent oscillation frequency $f_I$ varies from a frequency $f_I1$ to a frequency $f_I2$.

Figure 10:
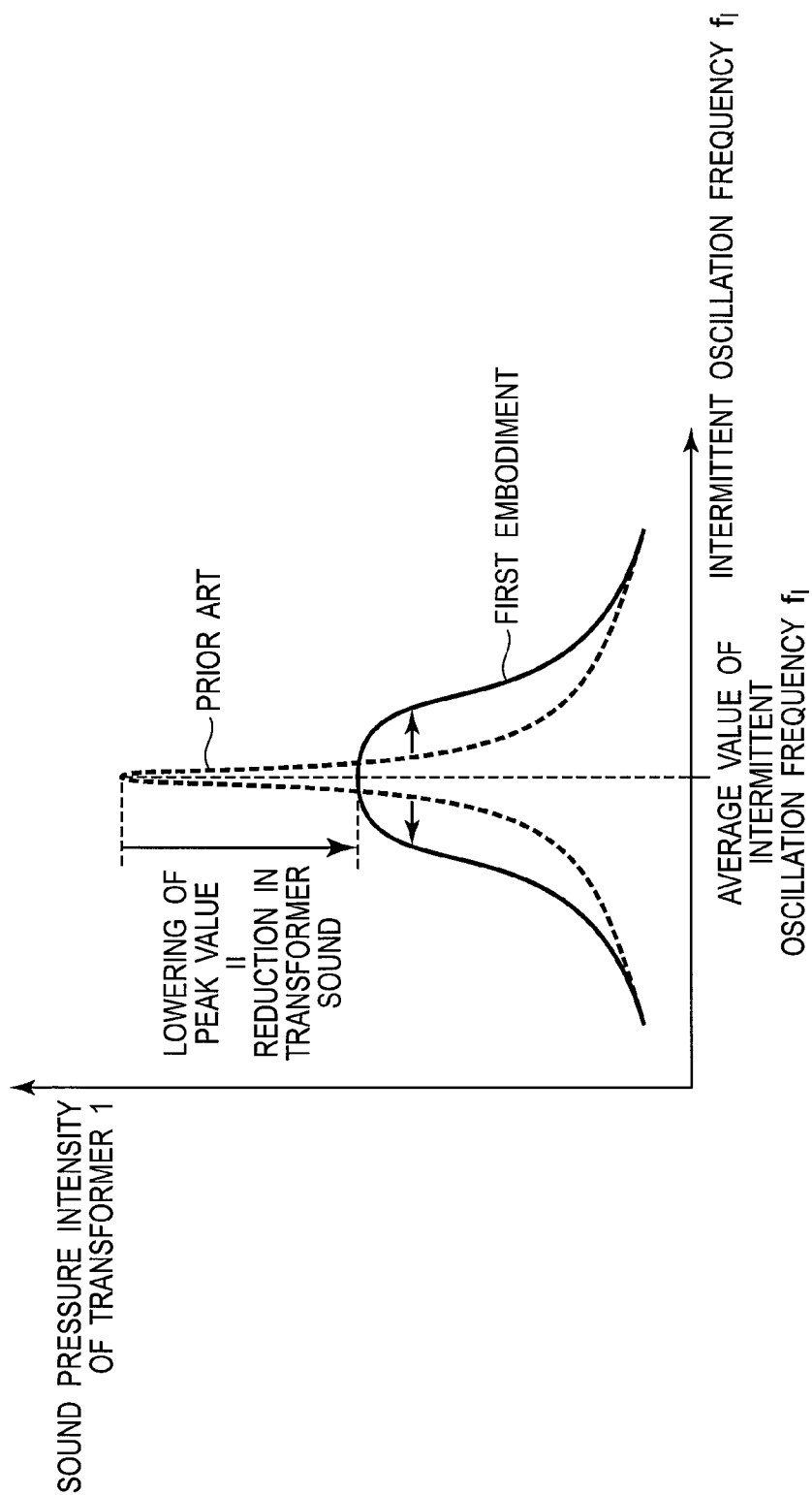
FIG. 10 is a graph showing a relationship between the intermittent oscillation frequency $f_I$ of the control circuit 200 of FIG. 1 and a sound pressure intensity of a transformer 1.

FIG. 10 is a graph showing a relationship between the intermittent oscillation frequency $f_I$ of the control circuit 200 of FIG. 1 and a sound pressure intensity of a transformer 1. As illustrated in FIG. 10, according to the present embodiment, as compared with the prior art, a distribution of the intermittent oscillation frequency $f_I$ can be dispersed, and a peak value of the sound pressure intensity of the transformer 1 is lowered. Accordingly, the transformer sound is lowered as compared with that of the prior art.

Figure 11B:
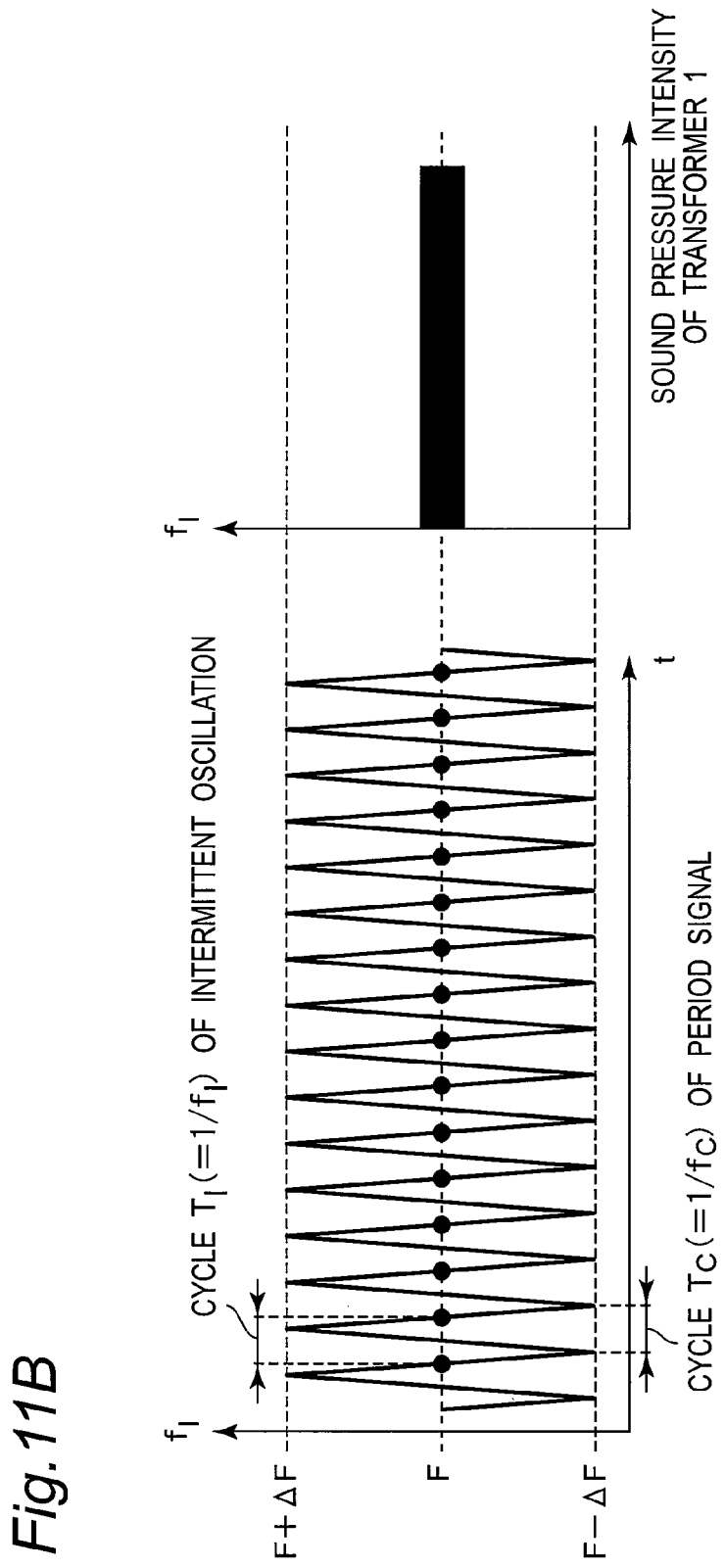
FIG. 11B is a graph showing a time change of the intermittent oscillation frequency $f_I$, and the sound pressure intensity of the transformer 1 with respect to the intermittent oscillation frequency $f_I$, when a period signal frequency $f_c$ is set to be equal to the intermittent oscillation frequency $f_I$ in the switching power supply device of FIG. 1.

Then, referring from FIGS. 11A to 11H, a method for setting a period signal frequency $f_c$ corresponding to the cycle $T_e$ of period signal is described. FIG. 11A is a graph showing a time change of the intermittent oscillation frequency $f_I$, and the sound pressure intensity of the transformer 1 with respect to the intermittent oscillation frequency $f_I$ of a switching power supply device according to a comparative example, which is not configured to include the period signal generator circuit 207 of FIG. 1. It is noted that, for example, a turn-off control circuit of the switching power supply device according to the comparative example is a turn-off control circuit 605 of FIG. 34, which is configured to include the comparator 73, where the feedback control signal EAO is inputted to the inverting input terminal of the comparator 73, while the current detection signal VIS is inputted to the non-inverting input terminal of the comparator 73. In addition, each of FIGS. 11B to 11H is a graph showing the time change of the intermittent oscillation frequency $f_I$, and the sound pressure intensity of the transformer 1 to the intermittent oscillation frequency $f_I$ of the switching power supply device, where the period signal frequency $f_c$ is set using the intermittent oscillation frequency $f_I$ as follows in the switching power supply device of FIG. 1.

Figure 11D:
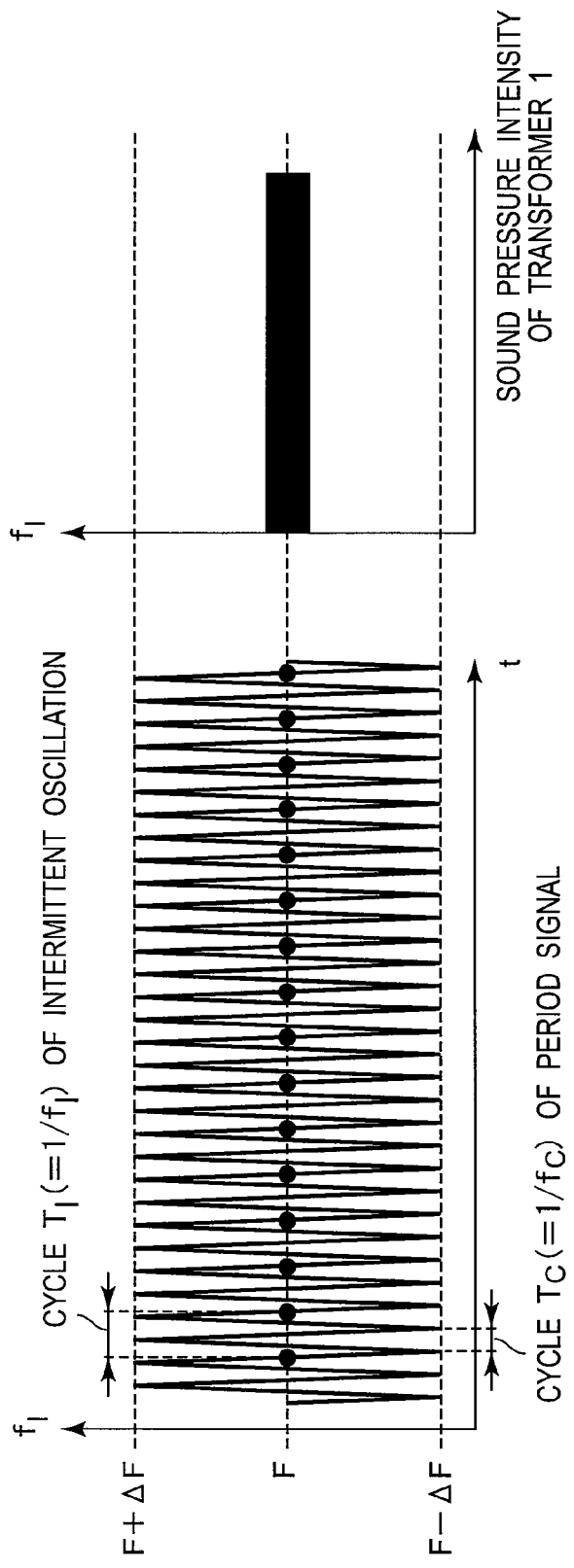
FIG. 11D is a graph showing a time change of the intermittent oscillation frequency $f_I$, and the sound pressure intensity of the transformer 1 with respect to the intermittent oscillation frequency $f_I$, when the period signal frequency $f_c$ is set to twice the intermittent oscillation frequency $f_I$ in the switching power supply device of FIG. 1.
Figure 11E:
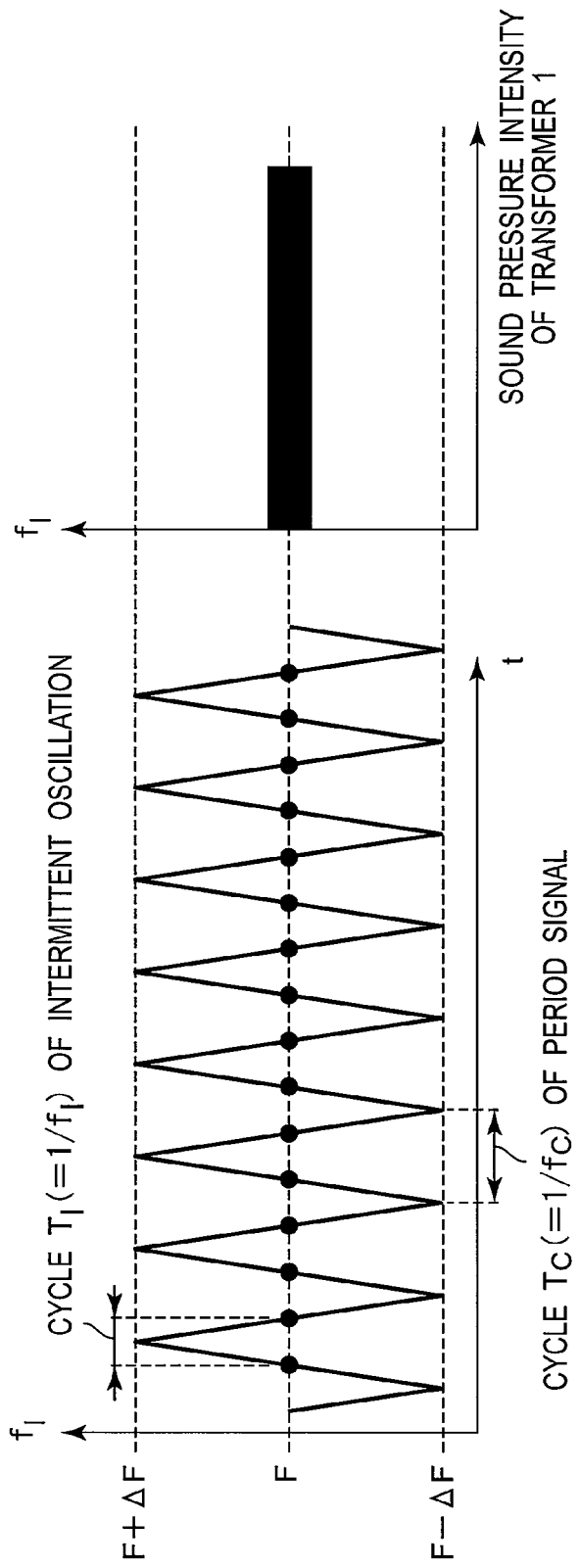
FIG. 11E is a graph showing a time change of the intermittent oscillation frequency $f_I$, and the sound pressure intensity of the transformer 1 with respect to the intermittent oscillation frequency $f_I$, when the period signal frequency $f_c$ is set to one-half of the intermittent oscillation frequency $f_I$ in the switching power supply device of FIG. 1.
Figure 11F:
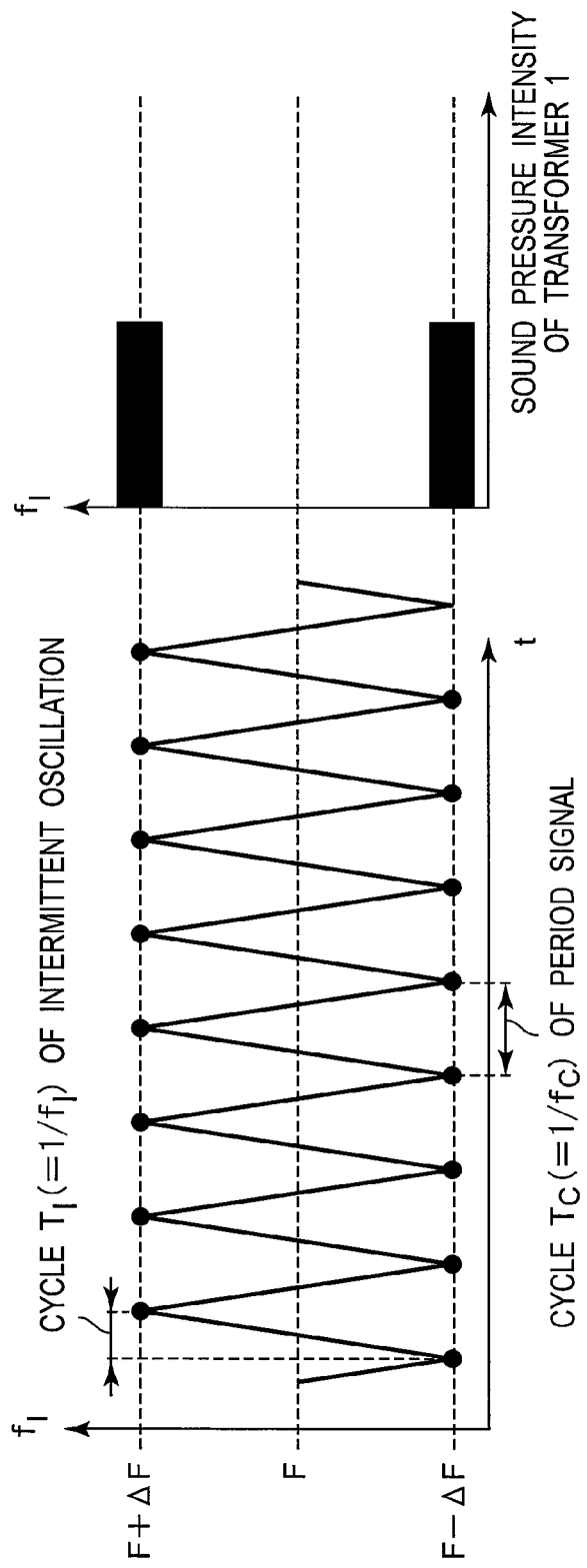
FIG. 11F is a graph showing a time change of the intermittent oscillation frequency $f_I$, and the sound pressure intensity of the transformer 1 with respect to the intermittent oscillation frequency $f_I$, when the period signal frequency $f_c$ is set to one-half of the intermittent oscillation frequency $f_I$ and when a phase of the period signal PS is shifted from the phase of the period signal PS of FIG. 11E by a phase shift amount π, in the switching power supply device of FIG. 1.

FIG. 11B shows a case where the period signal frequency $f_c$ is set to be equal to the intermittent oscillation frequency $f_I$;

FIG. 11C shows a case where the period signal frequency $f_c$ is set to two-thirds of the intermittent oscillation frequency $f_I$;

FIG. 11D shows a case where the period signal frequency $f_c$ is set to twice the intermittent oscillation frequency $f_I$;

FIG. 11E shows a case where the period signal frequency $f_c$ is set to one-half of the intermittent oscillation frequency $f_I$;

FIG. 11F shows a case where the period signal frequency $f_c$ is set to one-half of the intermittent oscillation frequency $f_I$, and the phase of the period signal PS is shifted from the phase of the period signal PS of FIG. 11E by the phase shift amount π;

FIG. 11G shows a case where the period signal frequency $f_c$ is set to one-fourth of the intermittent oscillation frequency $f_I$; and FIG. 11H shows a case where the period signal frequency $f_c$ is set to one-eighth of the intermittent oscillation frequency $f_I$.

In addition, referring to FIGS. 11A to 11H, it is assumed that each of timings denoted by a black circle, for example, indicates a timing when the voltage level of the intermittent oscillation control signal Enable changes from the low level to the high level, and that the drain current ID substantially becomes a peak value in each of the timings. Referring to FIGS. 11A to 11H, for the purpose of explaining briefly, it is assumed that each of intervals between the black circles (that is, the cycle $T_1$ of intermittent oscillation) is constant. In addition, in each of FIGS. 11A to 11H, an occurrence ratio of the intermittent oscillation frequency $f_I$ at the timing of each of the black circles is represented as the sound pressure intensity of the transformer 1. It is noted that, in fact, once the drain current peak value IDP varies, the feedback signal SFB varies, and the intermittent oscillation frequency $f_I$ also varies. Therefore, the drain current ID becomes a peak value at a timing deviated from the timing denoted by each of the black circles of FIGS. 11A to 11H.

As illustrated in FIG. 11A, according to the switching power supply in accordance with the comparative example, since the drain current peak value IDP becomes a constant value, the intermittent oscillation frequency $f_I$ becomes a constant frequency F. In addition, as illustrated in FIG. 11B and FIG. 11D, also when the period signal frequency $f_c$ is set to an integral multiple of the intermittent oscillation frequency $f_I$, the intermittent oscillation frequency $f_I$ becomes the constant frequency F. Further, as illustrated in FIG. 11C, when the period signal frequency $f_c$ is set to two-thirds of the intermittent oscillation frequency $f_I$, the distribution of the intermittent oscillation frequency $f_I$ can be dispersed. In addition, as illustrated in FIG. 11E, when the period signal frequency $f_c$ is set to one-half of the intermittent oscillation frequency $f_I$, the distribution of the intermittent oscillation frequency $f_I$ can not be dispersed. However, as illustrated in FIG. 11F, the distribution of the intermittent oscillation frequency $f_I$ can be dispersed by shifting the phase of the period signal PS from the phase of the period signal PS of FIG. 11E by the phase shift amount π. Furthermore, as illustrated in FIG. 11G and FIG. 11H, as the period signal frequency $f_e$ is lowered as compared with that of the intermittent oscillation frequency $f_I$, the distribution of the intermittent oscillation frequency $f_I$ can be dispersed. For example, as illustrated in FIG. 11G, when the period signal frequency $f_c$ is set to one-quarter the intermittent oscillation frequency $f_I$ and when the intermittent oscillation frequency $f_I$ is the F, a spectral intensity falls to one-half of the spectral intensity in the case of FIG. 11A, and the spectral intensity can be dispersed within an range from a frequency (F−ΔF) to a frequency (F+ΔF). That is, referring to FIG. 11G, the intermittent oscillation frequency $f_I$ is modulated according to an amplitude of the period signal PS.

Accordingly, with reference to FIGS. 11A to 11H, in order to lower the peak value of the sound pressure intensity of the transformer 1, it is understood that the period signal frequency $f_c$ should be set to a frequency, which is lower than the intermittent oscillation frequency $f_I$ (for example, see FIG. 11G and FIG. 11H), or which is higher than the intermittent oscillation frequency $f_I$ and other than integral multiples of the intermittent oscillation frequency $f_I$ (for example, see FIG. 11C), and that a phase difference of the period signal PS with respect to the intermittent oscillation control signal Enable should be set so that the distribution of the intermittent oscillation frequency $f_I$ can be dispersed.

Preferably, the period signal frequency $f_c$ is set to a frequency lower than the intermittent oscillation frequency $f_I$. In fact, since the intermittent oscillation frequency $f_I$ varies in accordance with the variation of the load 6, it is preferable that the period signal frequency $f_c$ is set to a frequency lower than the smallest possible value for the intermittent oscillation frequency $f_I$. That is, it is preferable that each of element values of the low-frequency wave oscillator circuit 2071 of the period signal generator circuit 207a of FIG. 6 is set so that the period signal frequency $f_c$ is set to a frequency lower than the lowest possible value for the intermittent oscillation frequency $f_I$. In particular, it is preferable that the cycle $T_c$ of period signal is set to about 1 millisecond to tens of milliseconds. As described above, the distribution of the intermittent oscillation frequency $f_I$ can be dispersed within a wider variation range of the load 6 by setting the period signal frequency $f_c$ and the phase difference of the period signal PS with respect to the intermittent oscillation control signal Enable.

As described above, according to the control circuit 200 of the present embodiment, the control circuit 200 is provided with the turn-off control circuit 205a, which generates the turn-off control signal OFF by comparing the current detection signal VIS with the input signal S73ia generated by modulating the feedback control signal EAO according to the period signal PS. Accordingly, it is possible to vary (modulate) the peak value IDP of the current flowing through the switching element 2 by varying the timing of generating the turn-off control signal OFF, and therefore, the distribution of the intermittent oscillation frequency $f_I$ can be dispersed to be more than that of the prior art. Accordingly, even if the variation of the load 6 is relatively small upon controlling the intermittent oscillation, the distribution of the intermittent oscillation frequency $f_I$ can be dispersed, and it is possible that the transformer sound from the transformer 1 is lowered as compared with that of the prior art. Further, as illustrated in FIG. 10, an average value of the intermittent oscillation frequency $f_I$ in the switching power supply device according to the present embodiment is equal to the average value of the intermittent oscillation frequency $f_I$ in the switching power supply device according to the prior art, and therefore, the power supply efficiency is not lowered as compared with that of the prior art.

In addition, in order to control the phase difference of the period signal PS with respect to the intermittent oscillation control signal Enable, a charge or discharge timing of the low-frequency wave oscillator circuit 2071 of the period signal generator circuit 207a may be controlled by utilizing the intermittent oscillation control signal Enable. In addition, in the present embodiment, the intermittent oscillation frequency $f_I$ varies by varying the peak value of the current flowing through the switching element 2 by using the period signal PS. However, the present invention is not limited thereto. As described in detail below in the fifth embodiment and the modified embodiment thereof, in the sixth embodiment and the modified embodiment thereof, and in the eighth embodiment, the intermittent oscillation frequency $f_I$ varies by varying the intermittent oscillation control signal Enable using the period signal PS. In this case, when the period signal PS is generated so that the frequency, the local maximum value of the amplitude, and the local minimum value of the amplitude for each of cycle intervals of the period signal PS are respectively constant, in a manner similar to those of the present embodiment, the period signal frequency $f_c$ may be set to a frequency, which is lower than the intermittent oscillation frequency $f_I$, or which is higher than the intermittent oscillation frequency $f_I$ and other than integral multiples of the intermittent oscillation frequency $f_I$, and the phase difference of the period signal PS with respect to the intermittent oscillation control signal Enable is set so that the distribution of the intermittent oscillation frequency $f_I$ can be dispersed.

First Modified Embodiment of the First Embodiment

Figure 12:
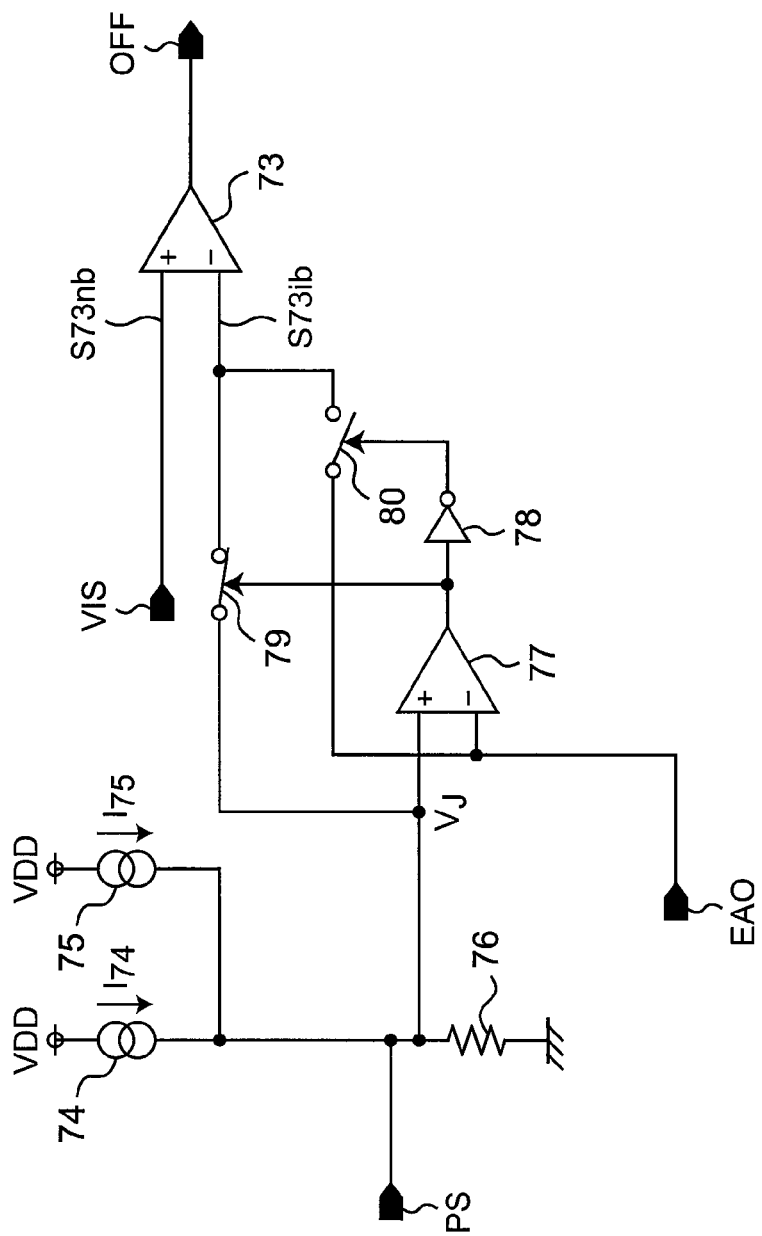
FIG. 12 is a circuit diagram of a turn-off control circuit 205b according to a first modified embodiment of the first embodiment of the present invention.
Figure 13:
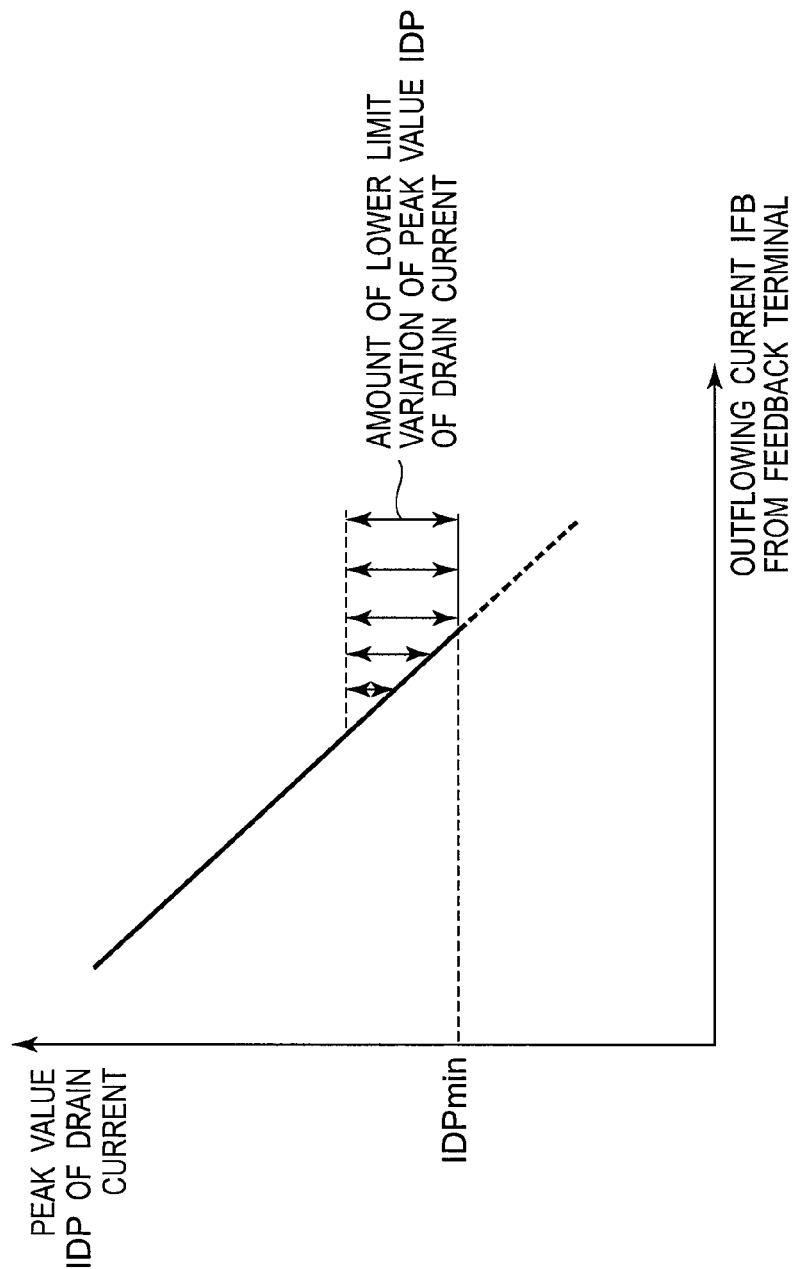
FIG. 13 is a graph showing a relationship between the feedback terminal outflowing current IFB and the drain current peak value IDP of the switching power supply device provided with the turn-off control circuit 205b of FIG. 12.

FIG. 12 is a circuit diagram of a turn-off control circuit 205b according to a first modified embodiment of the first embodiment of the present invention. In addition, FIG. 13 is a graph showing a relationship between the feedback terminal outflowing current IFB and the drain current peak value IDP of a switching power supply device provided with the turn-off control circuit 205b of FIG. 12. Referring to FIG. 12, the turn-off control circuit 205b is configured to include constant current sources 74 and 75 for respectively outputting predetermined constant currents $I_{74}$ and $I_{75}$, a resistor 76, comparators 73 and 77, an inverter 78, and switches 79 and 80 such as nMOS transistors or transmission gate circuits. The current detection signal VIS is inputted to the non-inverting input terminal of the comparator 73 as an input signal S73nb. In addition, the constant currents $I_{74}$ and $I_{75}$ are added to the period signal PS, a voltage $V_J$ obtained by multiplying the added current by a resistance value of the resistor 76 is inputted to a non-inverting input terminal of the comparator 77, and the voltage $V_J$ is outputted to the switch 79. Further, the feedback control signal EAO is inputted to the non-inverting input terminal of the comparator 77, and the feedback control signal EAO is outputted to the switch 80. An output signal from the comparator 77 is outputted to a control terminal of the switch 79, and the output signal from the comparator 77 is outputted to a control terminal of the switch 80 via the inverter 78. Then, an input signal S73ib is inputted to the inverting input terminal of the comparator 73 via the switch 79 or 80, and thereafter, the comparator 73 generates and outputs the turn-off control signal OFF. Accordingly, when the voltage $V_J$ is higher than the voltage level of the feedback control signal EAO, the comparator 73 compares the current detection signal VIS with the voltage $V_J$, while when the voltage $V_J$ is smaller than the voltage level of the feedback control signal EAO, the comparator 73 compares the current detection signal VIS with the feedback control signal EAO.

In this case, the constant currents $I_{74}$ and $I_{75}$, and the resistance value of the resistor 76 are set so that the switch 80 is turned on during the normal operation. In particular, it is preferable that the constant currents $I_{74}$ and $I_{75}$, and the resistance value of the resistor 76 are set so that a sum of the constant currents $I_{74}$ and $I_{75}$ is equal to or more than a sum of the constant currents $I_1$ and $I_2$ outputted from the constant current sources 31 and 32 of the intermittent oscillation control circuit 202 of FIG. 3.

According to the present modified embodiment, during the normal operation, the switch 80 is turned on, and the comparator 73 compares the current detection signal VIS with the feedback control signal EAO, and therefore, the turn-off control circuit 205b operates with no influence by the period signal PS in a manner similar to that of the turn-off control circuit according to the prior art. Accordingly, as compared with the first embodiment, the drain current peak value IDP is not affected by the period signal PS during the normal operation, and therefore, there is no possibility that the feedback control becomes unstable during the normal operation.

In addition, upon controlling the intermittent oscillation, the switch 79 is turned on, and the comparator 73 compares the current detection signal VIS with the voltage $V_J$. Accordingly, a lower limit (a limit value) of the voltage level of the current detection signal VIS is set to the voltage $V_J$, and therefore, as illustrated in FIG. 13, the drain current peak value IDP is set to a lower limit IDPmin corresponding to the voltage $V_J$. Further, since the voltage $V_J$ varies in a manner similar to that of the period signal PS (that is, the voltage $V_J$ is modulated according to the period signal PS), the lower limit IDPmin of the drain current peak value IDP is modulated according to the period signal PS.

Therefore, according to the present modified embodiment, since the lower limit IDPmin of the drain current peak value IDP is modulated according to the period signal PS, for example, even if the variation of the load 6 is small during the standby of the switching power supply, the distribution of the intermittent oscillation frequency $f_I$ can be dispersed in a manner similar to that of the first embodiment. Therefore, the transformer sound from the transformer 1 can be reduced without making the power supply efficiency worse than that of the prior art. Further, as compared with the first embodiment, the drain current peak value IDP is not affected by the period signal PS during the normal operation, and therefore, there is no possibility that the feedback control becomes unstable during the normal operation.

Second Modified Embodiment of the First Embodiment

Figure 14:
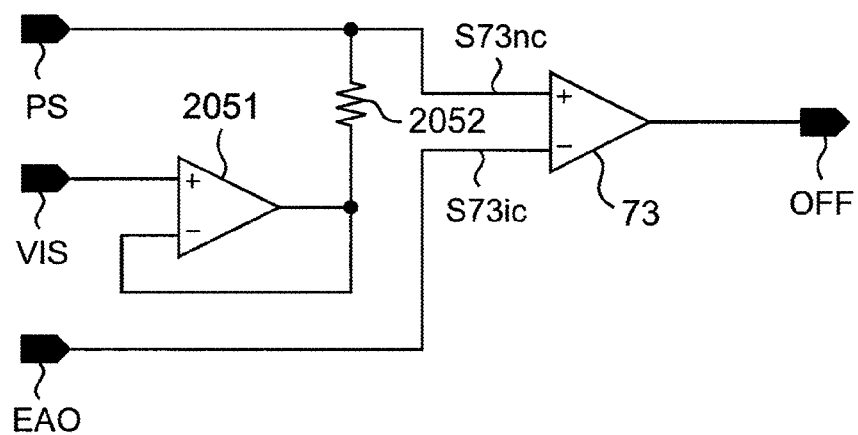
FIG. 14 is a circuit diagram of a turn-off control circuit 205c according to a second modified embodiment of the first embodiment of the present invention.

FIG. 14 is a circuit diagram of a turn-off control circuit 205c according to a second modified embodiment of the first embodiment of the present invention. Referring to FIG. 14, the turn-off control circuit 205c is configured to include an operational amplifier 2051, which operates as an impedance converter, a resistor 2052, and comparator 73. The feedback control signal EAO is inputted to the non-inverting input terminal of the comparator 73 as an input signal S73ic. In addition, the current detection signal VIS is impedance-converted by the operational amplifier 2051 to be outputted to the resistor 2052. On the other hand, the period signal PS is outputted to the resistor 2052 as a current signal. Therefore, the period signal PS is added to a signal corresponding to the current detection signal VIS, and thereafter, the added signal is inputted to the non-inverting input terminal of the comparator 73 as an input signal S73nc. When a voltage level of the input signal S73nc exceeds a voltage level of the input signal S73ic, the comparator 73 generates the turn-off control signal OFF having the high level, while when the voltage level of the input signal S73nc falls below the voltage level of the input signal S73ic, the comparator 73 generates the turn-off control signal OFF having the low level, and the comparator 73 outputs the turn-off control signal OFF having the low level to the switching control circuit 204.

Therefore, according to the present modified embodiment, the input signal S73nc inputted to the non-inverting input terminal of the comparator 73 of the turn-off control circuit 205c is obtained by adding the period signal PS to the current detection signal VIS. That is, the input signal S73nc is obtained by modulating the current detection signal VIS according to the period signal PS. Therefore, the timing of generating the turn-off control signal OFF varies in accordance with the period signal PS. As a result, the peak value of the drain current ID varies in a manner similar to that of the first embodiment. The present modified embodiment can obtain the same effect as that of the first embodiment.

Third Modified Embodiment of the First Embodiment

Figure 15:
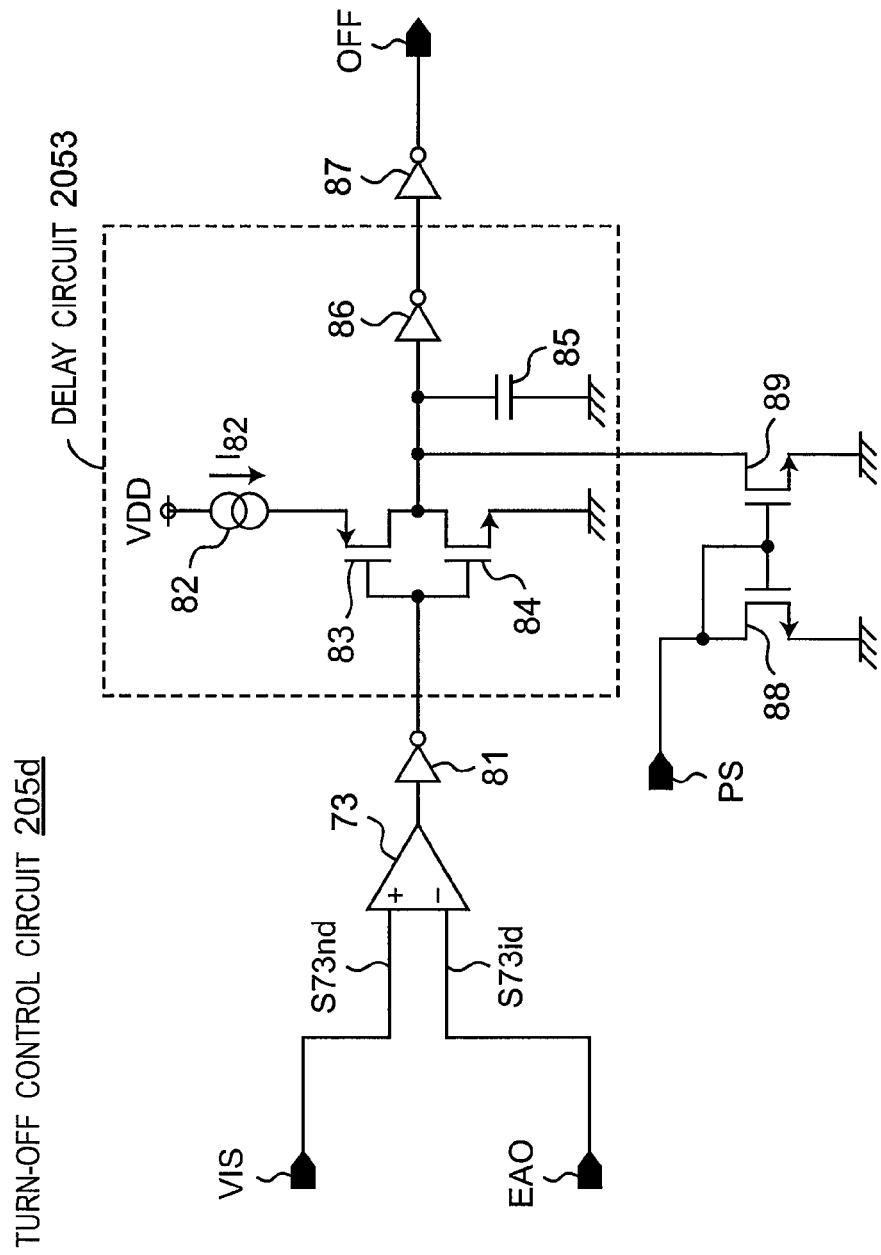
FIG. 15 is a circuit diagram of a turn-off control circuit 205d according to a third modified embodiment of the first embodiment of the present invention.

FIG. 15 is a circuit diagram of a turn-off control circuit 205d according to a third modified embodiment of the first embodiment of the present invention. Referring to FIG. 15, the turn-off control circuit 205d is configured to include the comparator 73, inverters 81 and 87, nMOS transistors 88 and 89 for constituting the current mirror circuit, and a delay circuit 2053. Further, the delay circuit 2053 is configured to include a constant current source 82 for outputting a predetermined constant current $I_{82}$, a pMOS transistor 83, a nMOS transistor 84, an inverter 86, and a capacitor 85. The current detection signal VIS is inputted to the non-inverting input terminal of the comparator 73 as an input signal S73nd, while the feedback control signal EAO is inputted to the inverting input terminal of the comparator 73 as an input signal S73id. An output signal from the comparator 73 is outputted to the delay circuit 2053 via the inverter 81.

In addition, referring to FIG. 15, the pMOS transistor 83 of the delay circuit 2053 has a source connected to the power supply voltage VDD via the constant current source 82, a drain connected to a drain of the nMOS transistor 84, and a gate connected to an output terminal of the inverter 81. In addition, the nMOS transistor 84 has a source connected to the ground, and a gate connected to the output terminal of the inverter 81. A connection point between the drain of the nMOS transistor 84 and the drain of the pMOS transistor 83 is connected to the ground via the capacitor 85, and the connection point is connected to the inverter 87 via the inverter 86. Further, an output signal from the inverter 87 is outputted as the turn-off control signal OFF.

Further, referring to FIG. 15, the period signal PS is returned by the current mirror circuit including the nMOS transistors 88 and 89, and a current corresponding to the period signal PS is subtracted from a current flowing through the connection point between the drain of the nMOS transistor 84 and the drain of the pMOS transistor 83.

Then, an operation of the turn-off control circuit 205d is described. When the voltage level of the current detection signal VIS is higher than the voltage level of the feedback control signal EAO, the comparator 73 outputs the output signal having the high level to the inverter 81. Accordingly, the pMOS transistor 83 is turned on, a charge current, which is subtracted the current corresponding to the period signal PS from the constant current $I_{82}$, flows through the capacitor 85. Thereafter, an output signal from the inverter 86 is inverted, and the turn-off control signal OFF having the high level is outputted. That is, the drain current ID flowing through the switching element 2 reaches a value corresponding to the feedback control signal EAO, and the comparator 73 outputs the output signal having the high level, and thereafter, after the output signal having the high level is delayed by a delay time corresponding to the capacitance and the charge current of the capacitor 85, the turn-off control signal OFF having the high level is outputted. Therefore, the switching element 2 is turned off.

Referring to FIG. 15, since the charge current of the capacitor 85 varies according to the period signal PS, a delay time of the delay circuit 2053 also varies according to the period signal PS. That is, the delay time of the delay circuit 2053 is modulated according to the period signal PS, and therefore, the timing of generating the turn-off control signal OFF varies according to the period signal PS. As a result, the peak value of the drain current ID varies in a manner similar to that of the first embodiment. The present modified embodiment can obtain the same effect as that of the first embodiment.

Fourth Modified Embodiment of the First Embodiment

Figure 16:
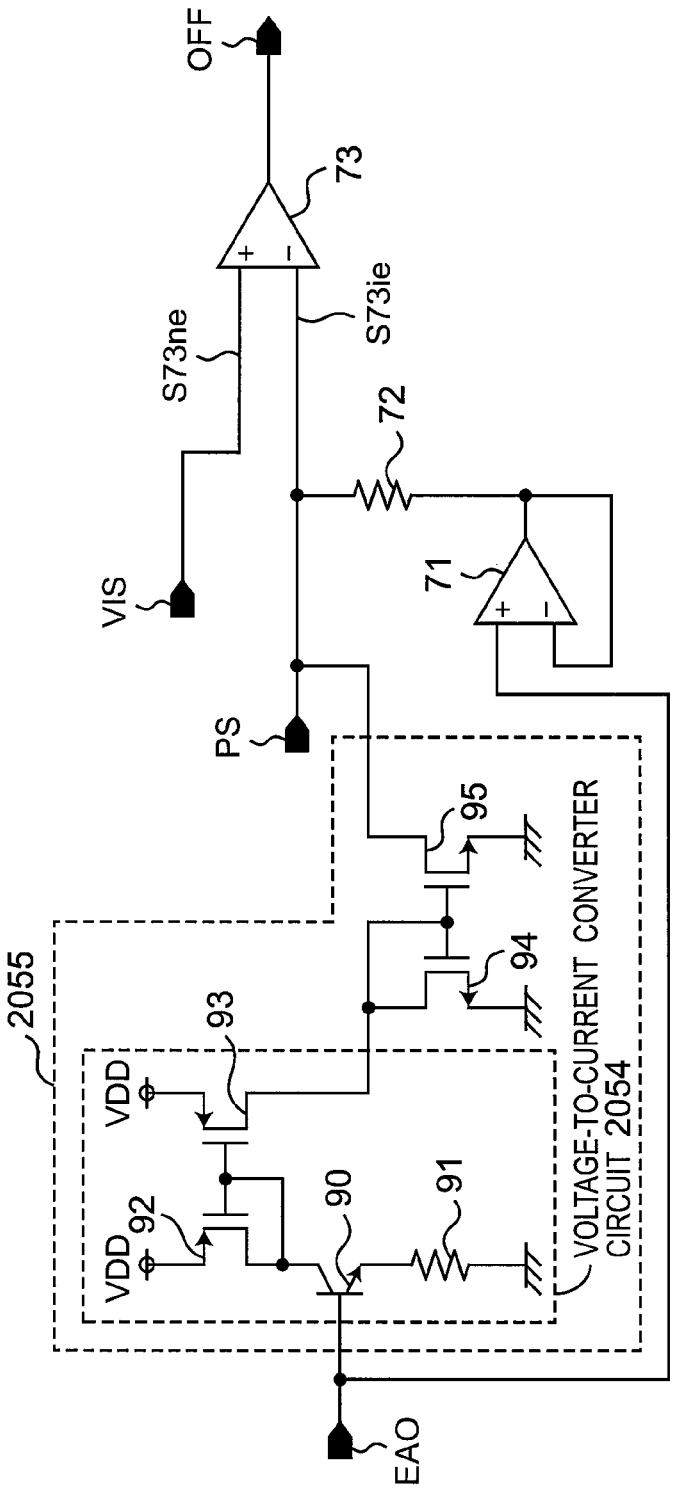
FIG. 16 is a circuit diagram of a turn-off control circuit 205e according to a fourth modified embodiment of the first embodiment of the present invention.

FIG. 16 is a circuit diagram of a turn-off control circuit 205e according to a fourth modified embodiment of the first embodiment of the present invention. The turn-off control circuit 205e of FIG. 16 is configured to further include a current subtraction circuit 2055 for subtracting a current according to the voltage level of the feedback control signal EAO from the period signal PS as compared with the turn-off control circuit 205a of FIG. 5. Referring to FIG. 16, in a manner similar to that of FIG. 5, the current detection signal VIS is inputted to the non-inverting input terminal of the comparator 73 as an input signal S73ne. In addition, the current subtraction circuit 2055 is configured to include a voltage-to-current converter circuit 2054, and nMOS transistors 94 and 95 for constituting the current mirror circuit. Further, the voltage-to-current converter circuit 2054 is configured to include pMOS transistors 92 and 93 for constituting the current mirror circuit, a npn bipolar transistor 90, and a resistor 91.

Referring to FIG. 16, the voltage-to-current converter circuit 2054 outputs a current corresponding to the voltage level of the feedback control signal EAO. The current outputted from the voltage-to-current converter circuit 2054 is returned by the current mirror circuit including the nMOS transistors 94 and 95, and thereafter, the returned current is subtracted from the period signal PS. Then, the subtracted period signal PS flows through the resistor 72 as a current signal. On the other hand, the feedback control signal EAO is impedance-converted by the operational amplifier 71 to be outputted to the resistor 72. Accordingly, the subtracted period signal PS is added to the signal corresponding to the feedback control signal EAO, and thereafter, the added signal is inputted to the inverting input terminal of the comparator 73 as an input signal S73ie.

Figure 17:
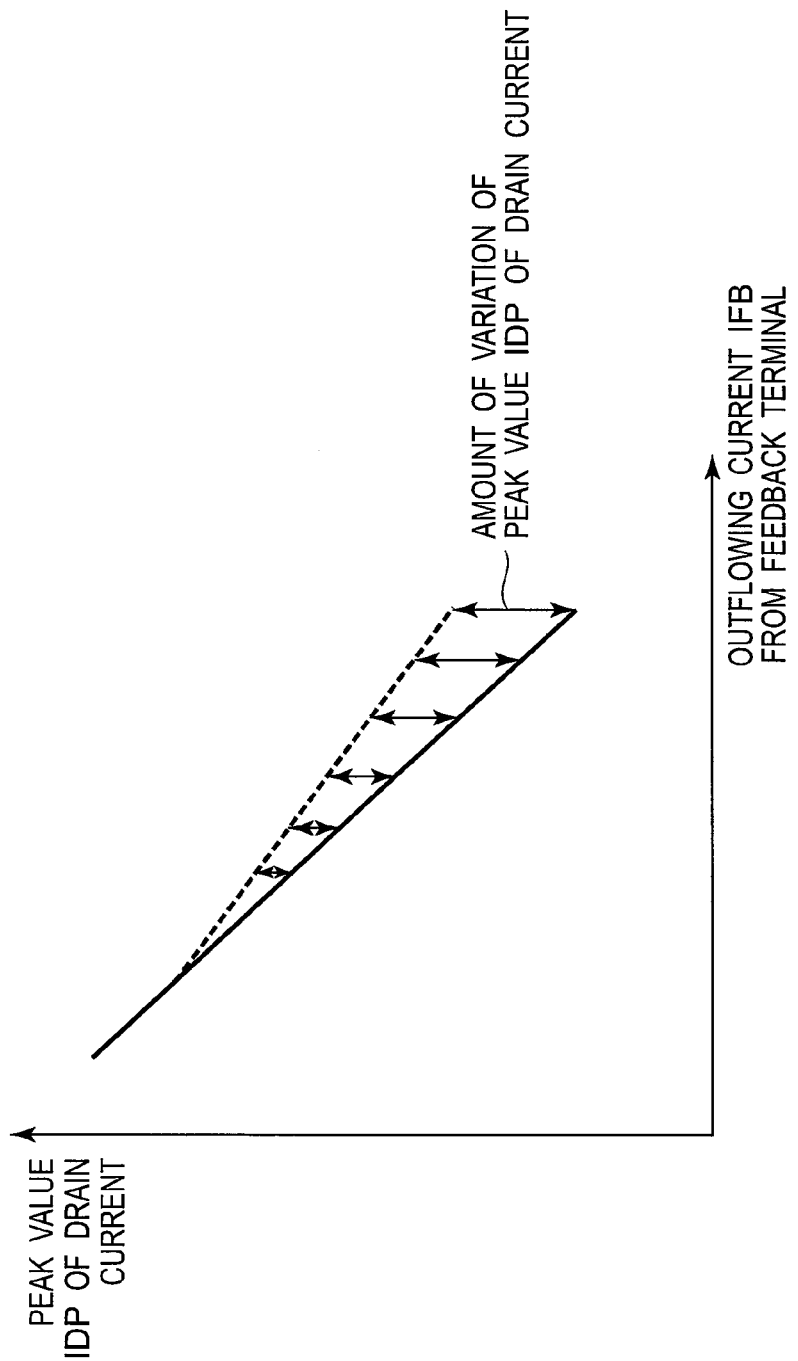
FIG. 17 is a graph showing a relationship between the feedback terminal outflowing current IFB and the drain current peak value IDP of the switching power supply device provided with the turn-off control circuit 205e of FIG. 16.

FIG. 17 is a graph showing a relationship between the feedback terminal outflowing current IFB and the drain current peak value IDP of a switching power supply device provided with the turn-off control circuit 205e of FIG. 16. According to the present modified embodiment, the current corresponding to the voltage level of the feedback control signal EAO is subtracted from the period signal PS. Accordingly, the level of the signal added to a signal according to the feedback control signal EAO becomes smaller as the load 6 becomes heavier, the output voltage Vout is lowered, the feedback terminal outflowing current IFB becomes smaller, and the voltage level of the feedback control signal EAO becomes higher. Accordingly, the amount of variation of the drain current peak value IDP becomes smaller. On the other hand, the level of the signal added to the signal according to the feedback control signal EAO becomes higher as the load 6 becomes lighter, the output voltage Vout becomes higher, the feedback terminal outflowing current IFB becomes lager, and the voltage level of the feedback control signal EAO is lowered. Accordingly, the amount of variation of the drain current peak value IDP becomes larger. That is, according to the present modified embodiment, the amount of variation of the peak value IDP flowing through the switching element 2 is controlled to be smaller as the output voltage becomes smaller (that is, the output power becomes larger).

The present modified embodiment can obtain the same effect as that of the first embodiment. Further, the amount of variation of the drain current peak value IDP becomes smaller as the load 6 becomes heavier, and the output voltage is lowered (that is, the output power becomes larger). Accordingly, as compared with the first embodiment, an affection of the period signal PS to the drain current peak value IDP during the normal operation is smaller than that of the period signal PS to the drain current peak value IDP upon controlling the intermittent oscillation. Therefore, there is no possibility that the feedback control becomes unstable.

Fifth Modified Embodiment of the First Embodiment

Figure 18:
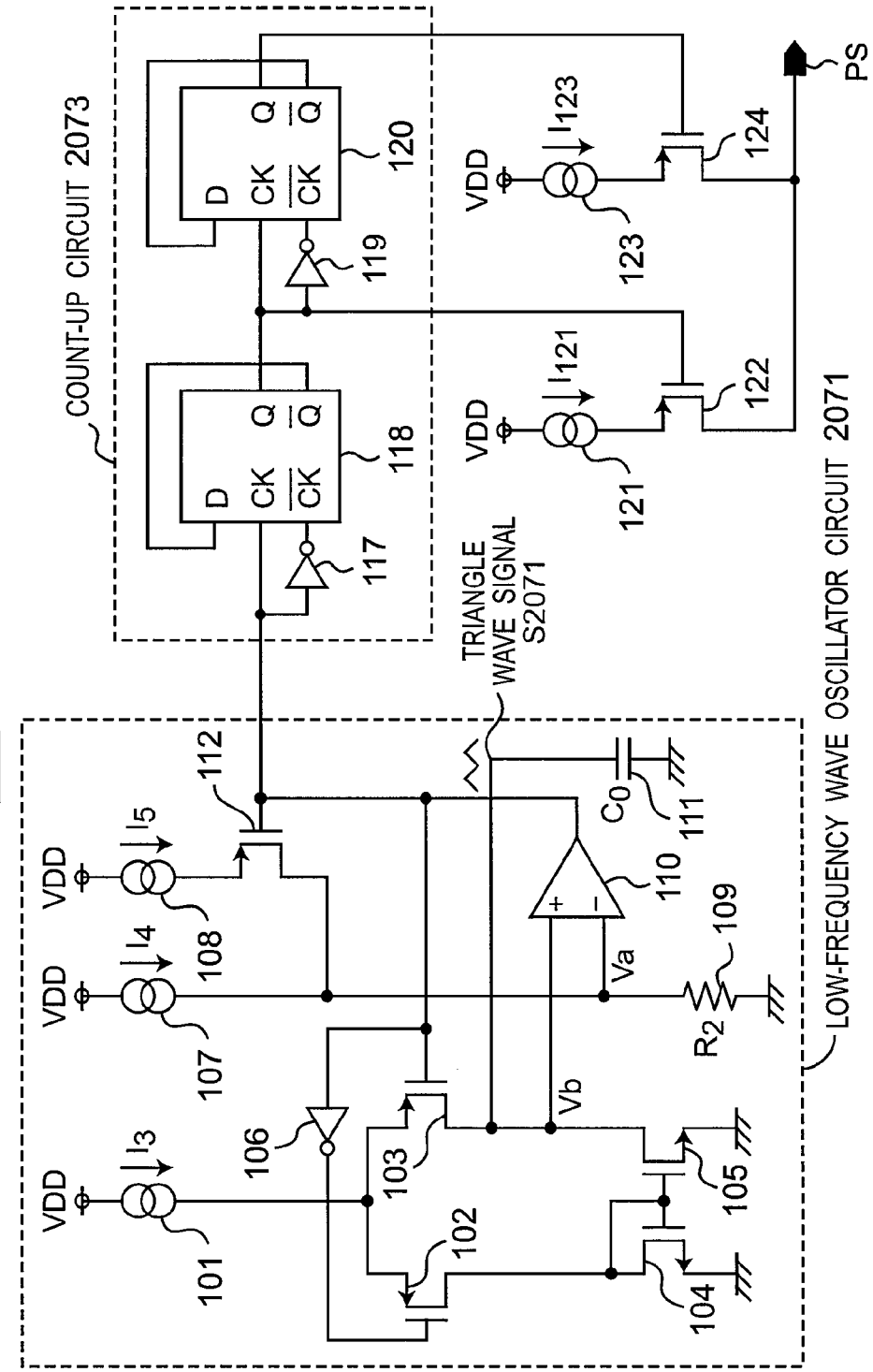
FIG. 18 is a circuit diagram of a period signal generator circuit 207b according to a fifth modified embodiment of the first embodiment of the present invention.
Figure 19:
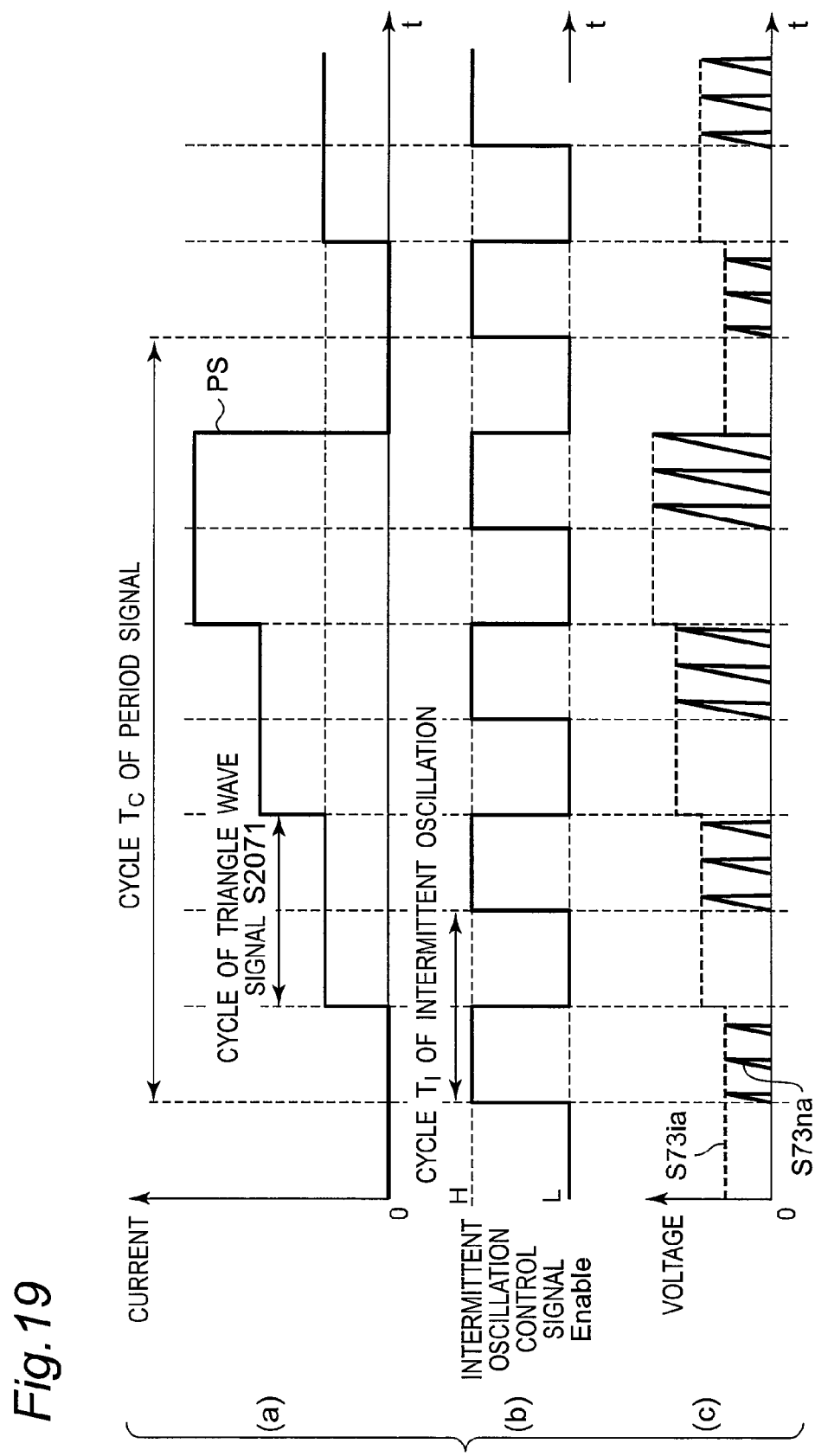
FIG. 19 is a graph, where

FIG. 18 is a circuit diagram of a period signal generator circuit 207b according to a fifth modified embodiment of the first embodiment of the present invention. In addition, FIG. 19 is a graph, where FIG. 19(a) is a graph showing the period signal PS generated by the period signal generator circuit 207b of FIG. 18, FIG. 19(b) is a graph showing the intermittent oscillation control signal Enable generated by the intermittent oscillation control circuit 202 of FIG. 3, and FIG. 19(c) is a graph showing the input signal S73na inputted to the non-inverting input terminal of the turn-off control circuit 205a of FIG. 5 and the input signal S73ia inputted to the inverting input terminal of the turn-off control circuit 205a of FIG. 5. Referring to FIG. 19, for the purpose of clarifying the variation of the current detection signal VIS, it is assumed that the feedback terminal outflowing current IFB and the intermittent oscillation period $T_I$ are constant, respectively.

Referring to FIG. 18, the period signal generator circuit 207b is configured to include the low-frequency wave oscillator circuit 2071, a count-up circuit 2073, constant current sources 121 and 123 for respectively outputting respective different predetermined constant currents $I_{121}$ and $I_{123}$ (for example, which are set by $I_{121}:I_{123}=1:2$), and pMOS transistors 122 and 124. In addition, the count-up circuit 2073 is configured to include D fip-flops 118 and 120, and inverters 117 and 119. An output signal from the comparator 110 is inputted to an clock input terminal of the D flip flop 118, and the output signal from the comparator 110 is inputted to an inverting clock input terminal of the D flip flop 118 via the inverter 117. In addition, an output signal from an inverting Q output terminal of the D flip flop 118 is inputted to a D input terminal. Further, an output signal from a Q output terminal of the D flip flop 118 is inputted to a clock input terminal of the D flip flop 120, and the output signal is inputted to an inverting clock input terminal of the D flip flop 120 via the inverter 119. Furthermore, an output signal from an inverting Q output terminal is inputted to a D input terminal.

In addition, referring to FIG. 18, the pMOS transistor 122 is configured to include a source connected to the power supply voltage VDD via the constant current source 121, and a gate connected to the Q output terminal of the D flip flop 118. The pMOS transistor 123 is configured to include the source connected to the power supply voltage VDD via the constant current source 123, and a gate connected to the Q output terminal of the D flip flop 120. Further, a current flowing through the pMOS transistors 122 is added to a current flowing through the pMOS transistors 124, and thereafter, the added current is outputted as the period signal PS.

The period signal generator circuit 207a of FIG. 6 voltage-to-current converts the triangle wave signal S2071 from the low-frequency wave oscillator circuit 2071 to the period signal PS, and the period signal generator circuit 207a outputs the period signal PS. Accordingly, the cycle $T_c$ of period signal of the period signal PS is identical with a cycle of the triangle wave signal S2071. In contrast, according to the period signal generator circuit 207b of the present modified embodiment, a count-up circuit 2073 counts up number of times when the triangle wave signal S2071 reaches an upper limit, and the period signal generator circuit 207b outputs a current corresponding to its count value as the period signal PS. That is, as illustrated in FIG. 19(a), the cycle $T_c$ of period signal of the period signal PS outputted from the period signal generator circuit 207b becomes an integral multiple of the cycle of the triangle wave signal S2071. The period signal generator circuit 207a generates the period signal PS so that the frequency, the local maximum value of the amplitude, and the local minimum value of the amplitude for each of the cycle intervals of the period signal PS are respectively constant by repeating a regular pattern signal for one cycle of FIG. 19(a) with the predetermined period signal frequency $f_c$. It is noted that, in a manner similar to that of the first embodiment, the period signal frequency $f_c$ is set to a frequency, which is lower than the intermittent oscillation frequency $f_I$, or which is higher than the intermittent oscillation frequency $f_I$ and other than integral multiples of the intermittent oscillation frequency $f_I$, and the phase difference of the period signal PS with respect to the intermittent oscillation control signal Enable is set so that the distribution of the intermittent oscillation frequency $f_I$ can be dispersed.

According to the present modified embodiment, the period signal PS having the cycle $T_c$ of period signal longer than the cycle of the triangle wave signal S2071 can be easily generated by using the count-up circuit 2073. Accordingly, the period signal PS having the cycle $T_c$ of period signal much longer than the cycle $T_I$ of intermittent oscillation can be easily generated. Further, the capacitance $C_0$ of the capacitor 111 of the low-frequency wave oscillator circuit 2071 can be set to be smaller than that of the first embodiment, and therefore, a semiconductor chip size of the control circuit 200 can become smaller than that of the first embodiment.

It is noted that the period signal generator circuit 207b according to present modified embodiment is configured to include the capacitor 111 within the low-frequency generator circuit 2071. However, the present invention is not limited thereto, and the capacitor 111 may be provided outside the control circuit 200. Accordingly, the cycle $T_c$ of period signal can be adjusted outside the control circuit 200 in accordance with specifications of the switching power supply device.

Second Embodiment

Figure 20:
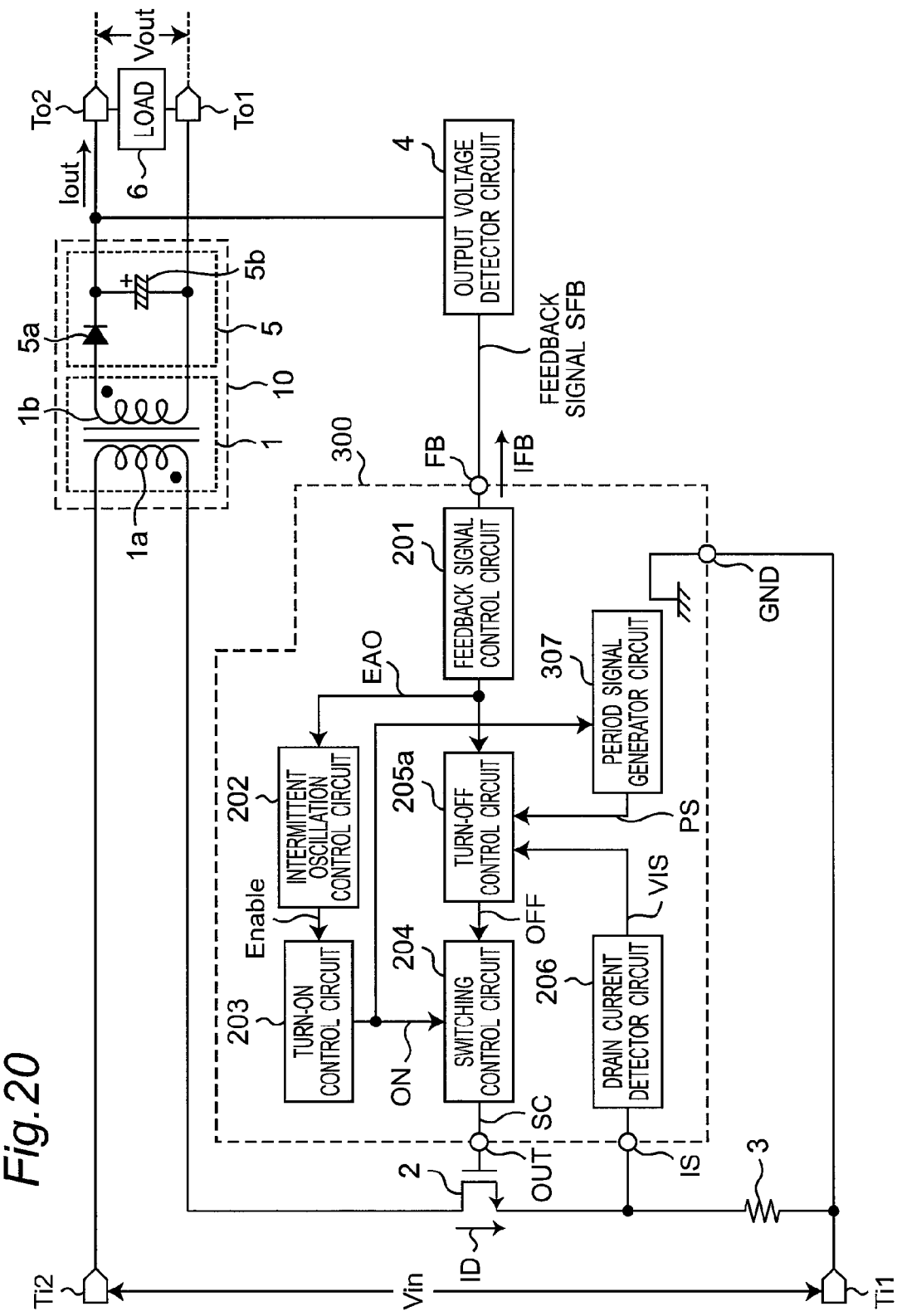
FIG. 20 is a block diagram showing a configuration of the switching power supply device provided with a control circuit 300 according to a second embodiment of the present invention.
Figure 21:
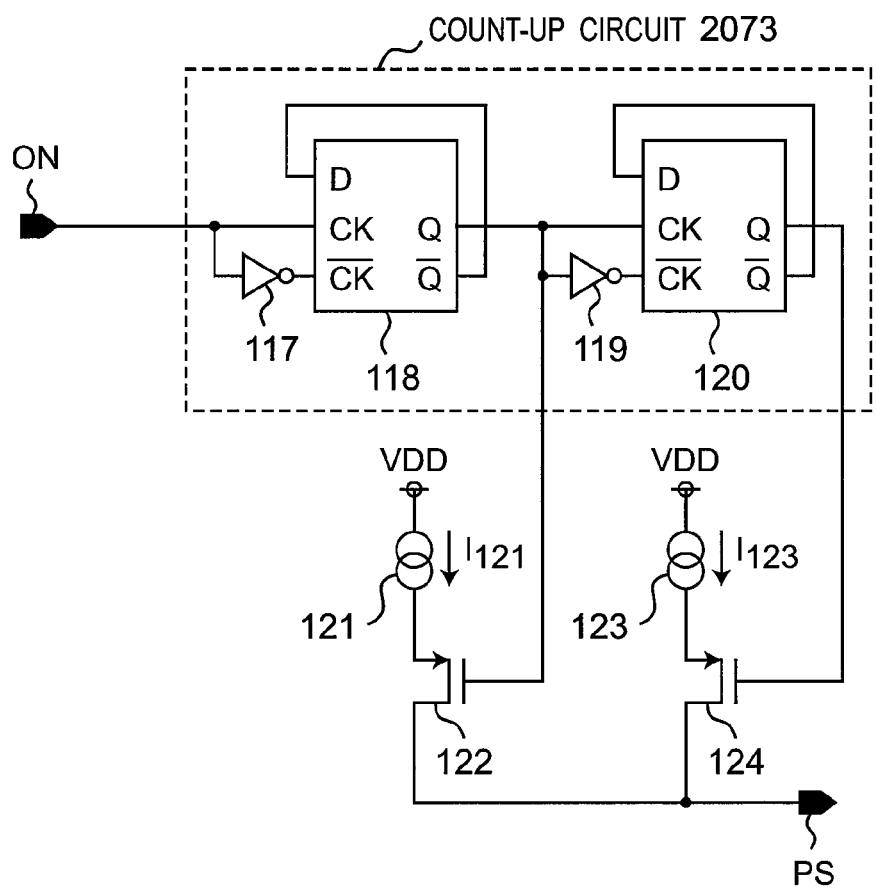
FIG. 21 is a circuit diagram of a period signal generator circuit 307 of FIG. 20.
Figure 22:
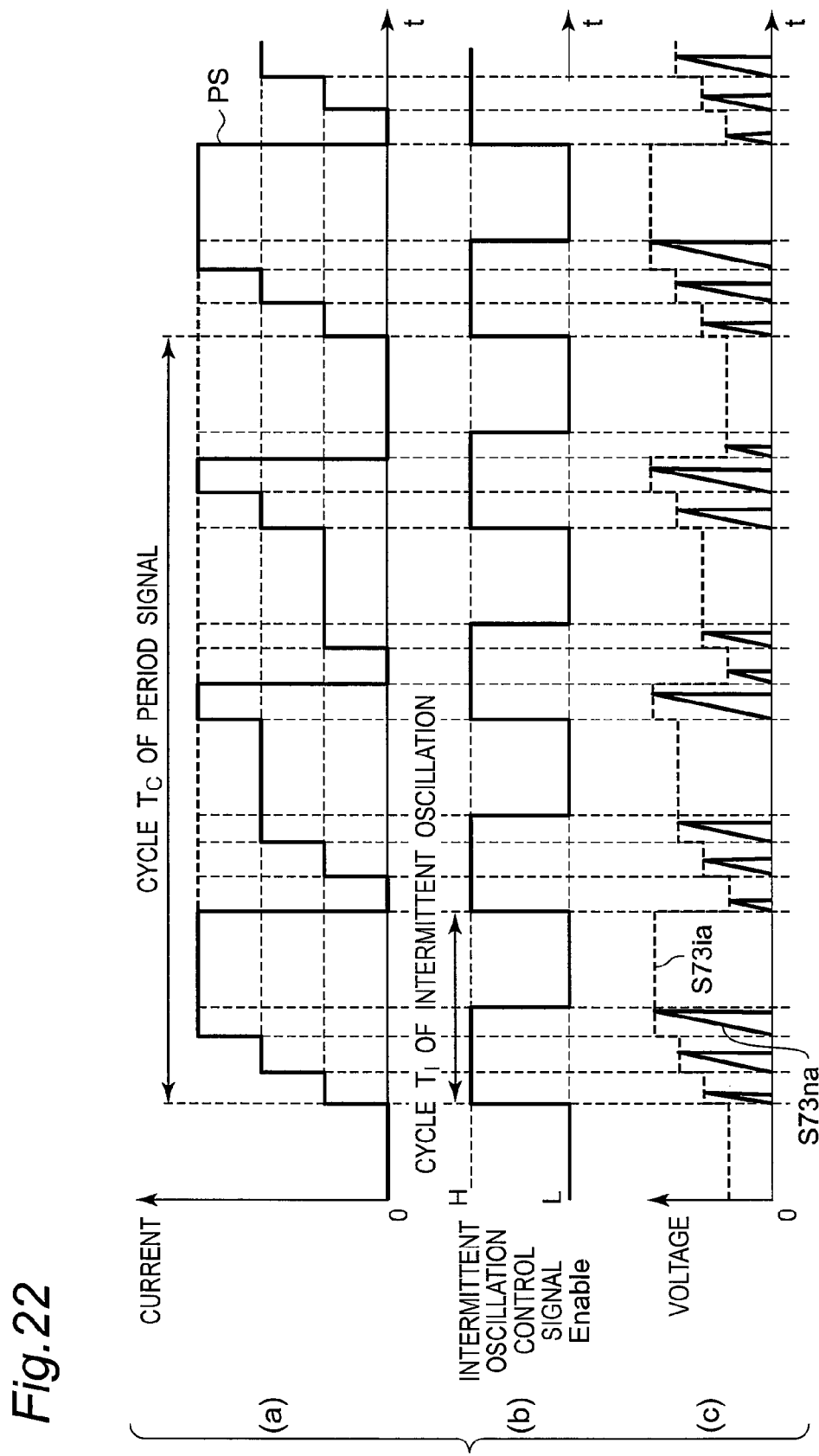
FIG. 22 is a graph, where

FIG. 20 is a block diagram showing a configuration of a switching power supply device provided with a control circuit 300 according to a second embodiment of the present invention, and FIG. 21 is a circuit diagram of a period signal generator circuit 307 of FIG. 20. In addition, FIG. 22 is a graph, where FIG. 22(a) is a graph showing the period signal PS generated by the period signal generator circuit 307 of FIG. 21, FIG. 22(b) is a graph showing the intermittent oscillation control signal Enable generated by the intermittent oscillation control circuit 202 of FIG. 20, and FIG. 22(c) is a graph showing the input signal S73na inputted to the non-inverting input terminal of the turn-off control circuit 205a of FIG. 20, and the input signal S73ia inputted to the inverting input terminal of the turn-off control circuit 205a of FIG. 20 (See FIG. 5). Referring to FIG. 22, it is noted that, for the purpose of clarifying the variation of the current detection signal VIS, it is assumed that the feedback terminal outflowing current IFB and the cycle $T_I$ of intermittent oscillation are constant, respectively.

Referring to FIG. 20, as compared with the switching power supply device according to the first embodiment, the switching power supply device according to the present embodiment is configured to include the control circuit 300 instead of the control circuit 200. In addition, as compared with the control circuit 200, there is such a difference that the control circuit 300 is configured to include the period signal generator circuit 307 instead of the period signal generator circuit 207a.

Referring to FIG. 21, the period signal generator circuit 307 is configured to include the count-up circuit 2073, the constant current sources 121 and 123 for respectively outputting the predetermined constant currents $I_{121}$ and $I_{123}$, and the pMOS transistors 122 and 124. As compared with the period signal generator circuit 207b of FIG. 18, the period signal generator circuit 307 differs from the period signal generator circuit 207b in that the turn-on control signal ON is inputted to the count-up circuit 2073. The period signal generator circuit 307 according to the present modified embodiment counts up the turn-on control signal ON by the count-up circuit 2073, and outputs the current corresponding to its count value as the period signal PS. The turn-on control signal ON is a periodical turn-on signal from the ON-pulse generator circuit 61 (See FIG. 4) during the normal operation, and therefore, the period signal PS becomes a periodic signal. However, as illustrated in FIG. 22(a), a level of the period signal PS does not vary during the stop interval when the intermittent oscillation control signal Enable from the intermittent oscillation control circuit 202 becomes the low level upon controlling the intermittent oscillation. The period signal generator circuit 307 generates the period signal PS so that the frequency, the local maximum value of the amplitude, and the local minimum value of the amplitude for each of the cycle intervals of the period signal PS are respectively constant by repeating a regular pattern signal for one cycle of FIG. 22(a) with the period signal frequency $f_c$. It is noted that, in a manner similar to that of the first embodiment, the period signal frequency $f_c$ is set to a frequency, which is lower than the intermittent oscillation frequency $f_I$, or which is higher than the intermittent oscillation frequency $f_I$ and other than integral multiples of the intermittent oscillation frequency $f_I$, and the phase difference of the period signal PS with respect to the intermittent oscillation control signal Enable is set so that the distribution of the intermittent oscillation frequency $f_I$ can be dispersed.

According to the present embodiment, the cycle $T_c$ of period signal of the period signal PS from the period signal generator circuit 307 becomes longer than the intermittent oscillation frequency $f_I$, and the cycle $T_c$ of period signal becomes approximately random, and therefore, the distribution of the intermittent oscillation frequency $f_I$ according to the present embodiment can be dispersed to be more than that of the first embodiment.

It is noted that, although the count-up circuit 2073 of FIG. 21 outputs a binary count value, it is preferable that a maximum value of the count value of the count-up circuit 2073 is set to a value larger than the number of times of switching of the switching element 2 for the oscillation interval upon controlling the intermittent oscillation. For example, in the example as illustrated in FIG. 22(c), the maximum value of the count value as described above is set to 4, and the number of times of switching of the switching element 2 for the oscillation interval upon controlling the intermittent oscillation is set to 3. Accordingly, the cycle $T_c$ of period signal can become longer than the cycle $T_I$ of intermittent oscillation. In addition, a dispersion degree of the distribution of the drain current peak value IDP can be larger as number of bits of the count value from the count-up circuit 2073 is set to be larger. Accordingly, since the peak of the transformer sound of the transformer 1 can be broader, the transformer sound can be further reduced.

In addition, the period signal generator circuit 307 according to the present embodiment generates the period signal PS by using the count value of the timing when the switching element 2 is turned on by using the turn-on control signal ON. However, the present invention is not limited thereto, for example, the period signal generator circuit 307 may generate the period signal PS by using a count value of a timing when the switching element 2 is turned off by the turn-off control signal OFF. Accordingly, the modified embodiment can obtain the same effect as that of the present embodiment.

Third Embodiment

Figure 23:
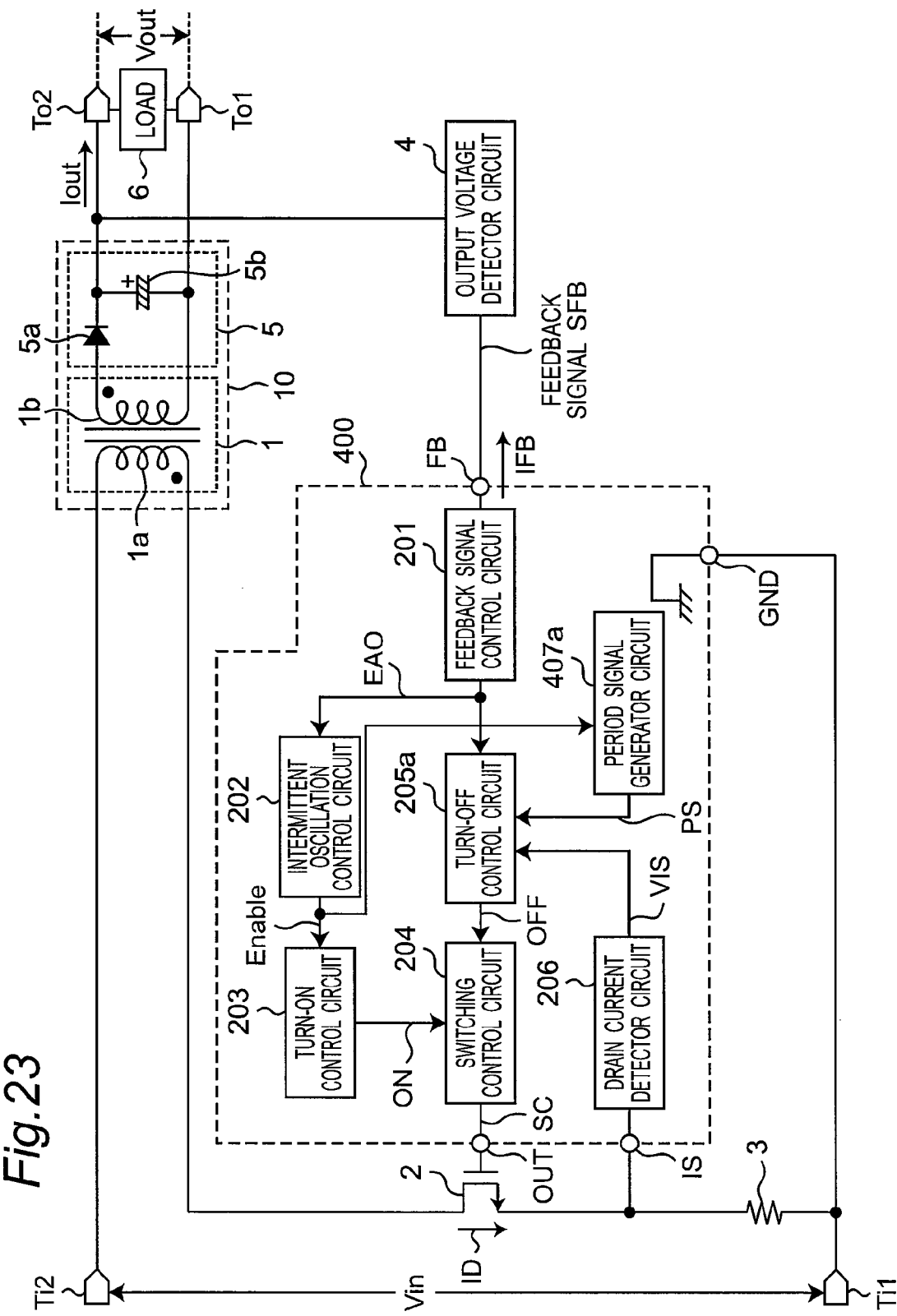
FIG. 23 is a block diagram showing a configuration of the switching power supply device provided with a control circuit 400 according to a third embodiment of the present invention.
Figure 24:
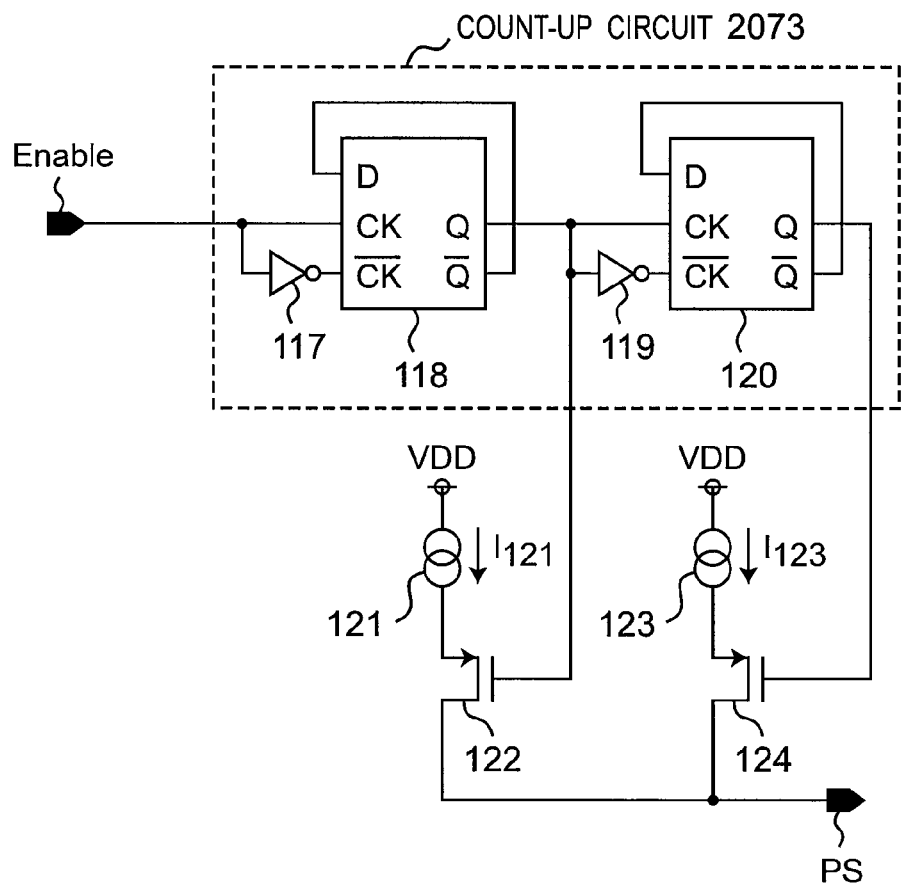
FIG. 24 is a circuit diagram of a period signal generator circuit 407a of FIG. 23.
Figure 25:
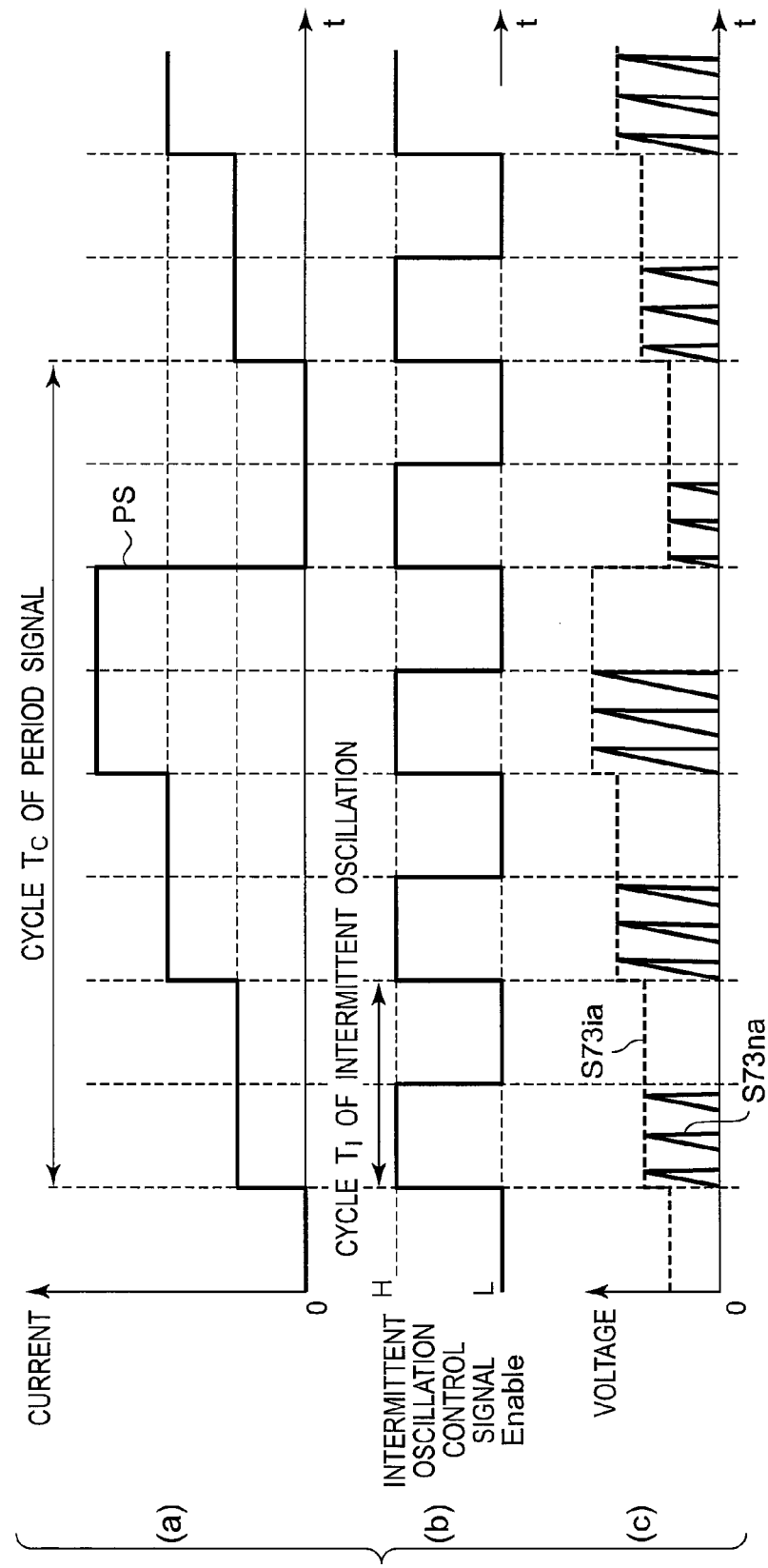
FIG. 25 is a graph, where

FIG. 23 is a block diagram showing a configuration of a switching power supply device provided with a control circuit 400 according to a third embodiment of the present invention, and FIG. 24 is a circuit diagram of a period signal generator circuit 407a of FIG. 23. In addition, FIG. 25 is a graph, where FIG. 25(a) is a graph showing the period signal PS generated by the period signal generator circuit 407a of FIG. 24, FIG. 25(b) is a graph showing the intermittent oscillation control signal Enable generated by the intermittent oscillation control circuit 202 of FIG. 23, and FIG. 25(c) is a graph showing the input signal S73na inputted to the non-inverting input terminal of the turn-off control circuit 205a of FIG. 23, and the input signal S73ia inputted to the inverting input terminal of the turn-off control circuit 205a of FIG. 23 (See FIG. 5). Referring to FIG. 25, it is noted that, for the purpose of clarifying the variation of the current detection signal VIS, it is assumed that the feedback terminal outflowing current IFB and the cycle $T_I$ of intermittent oscillation are constant, respectively.

Referring to FIG. 23, as compared with the switching power supply device according to the second embodiment, the switching power supply device according to the present embodiment is configured to include the control circuit 400 instead of the control circuit 300. In addition, as compared with the control circuit 300, there is such a difference that the control circuit 400 is configured to include the period signal generator circuit 407a instead of the period signal generator circuit 307. Further, referring to FIG. 24, as compared with the period signal generator circuit 307 of FIG. 21, the period signal generator circuit 407a differs from the period signal generator circuit 307 only in that the intermittent oscillation control signal Enable instead of the turn-on control signal ON is inputted. The period signal generator circuit 407a according to the present embodiment counts up the intermittent oscillation control signal Enable by the count-up circuit 2073, and outputs the current corresponding to its count value as the period signal PS.

As illustrated in FIG. 25(b), the voltage level of the intermittent oscillation control signal Enable changes from the low level to the high level at a timing when the oscillation interval is restarted. Accordingly, since the count-up circuit 2973 of FIG. 24 can generate the period signal PS by using a count value at a timing when the oscillation interval is started, the cycle $T_c$ of period signal of the period signal PS can be set to be much longer than the cycle $T_I$ of intermittent oscillation. In addition, as illustrated in FIG. 25(c), the voltage level of the input signal S73ia inputted to the inverting input terminal of the turn-off control circuit 205a (See FIG. 5) every the oscillation interval upon controlling the intermittent oscillation can be varied, and therefore, the intermittent oscillation frequency $f_I$ can be certainly varied. The period signal generator circuit 307 generates the period signal PS so that the frequency, the local maximum value of the amplitude, and the local minimum value of the amplitude for each of the cycle intervals of the period signal PS are respectively constant by repeating a regular pattern signal for one cycle of FIG. 25(a) with the period signal frequency $f_c$. According to the present embodiment, the period signal generator circuit 407a generates the period signal PS by using the count value at the timing when the oscillation interval is started, and therefore, the cycle $T_c$ of period signal becomes longer than the cycle $T_I$ of intermittent oscillation.

In addition, according to the present embodiment, as compared with the second embodiment, a relationship between a number of times of oscillation of the switching element 2 for the oscillation interval and the maximum value of count value of the count-up circuit 2073 of FIG. 24 is not constrained. However, in a manner similar to that of the second embodiment, the dispersion degree of the distribution of the drain current peak value IDP can be larger as number of bits of the count value from the count-up circuit 2073 is set to be larger. Accordingly, since the peak of the transformer sound of the transformer 1 can be broader, the transformer sound can be further reduced.

Further, in the present embodiment, the period signal PS can be generated by using a count value of a start timing of the oscillation interval. However, the present invention is not limited thereto. For example, the period signal PS may be generated using either of the count value of the start timing of the oscillation interval or a count value of a start timing of the stop interval.

First Modified Embodiment of the Third Embodiment

Figure 26:
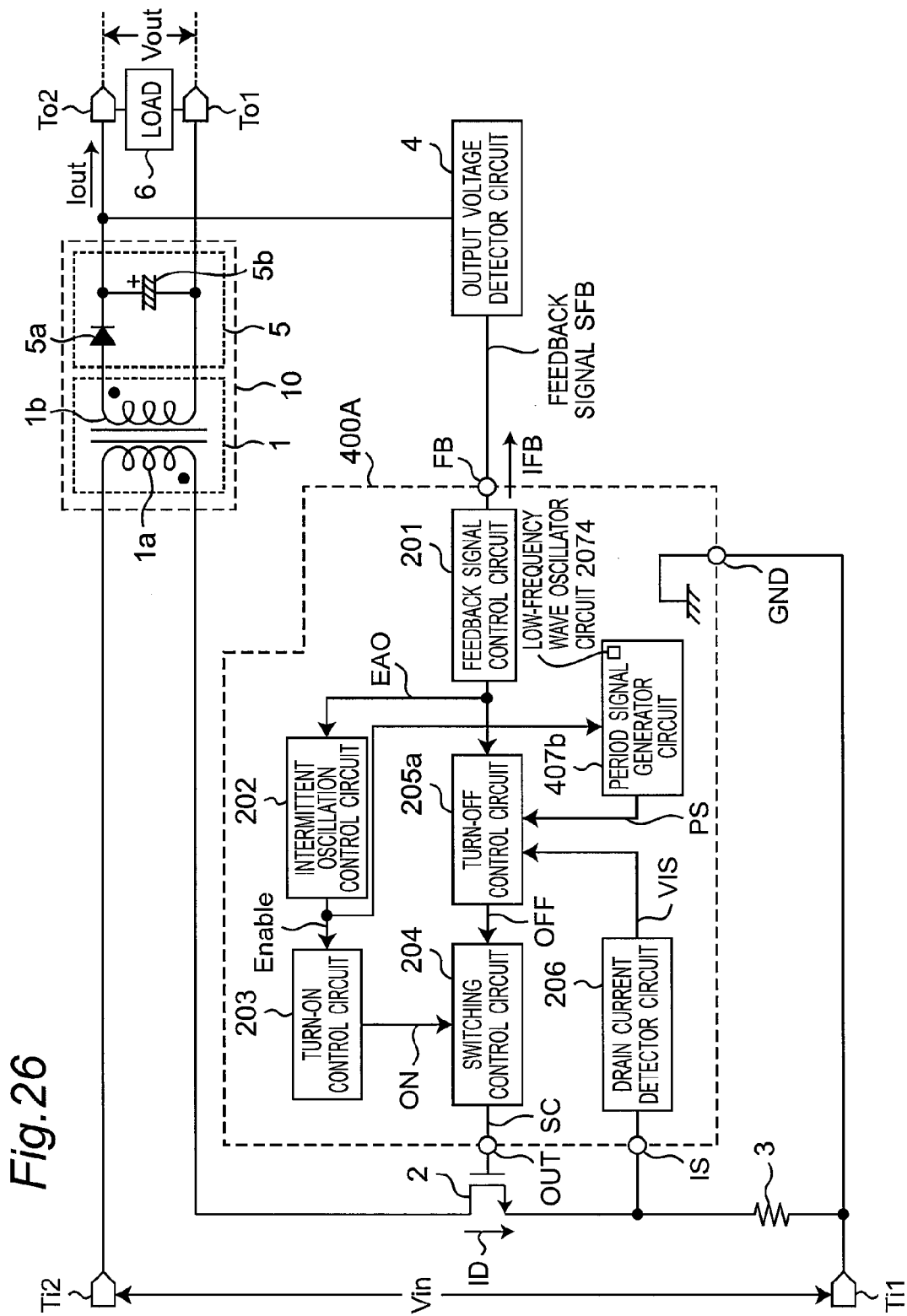
FIG. 26 is a block diagram showing a configuration of the switching power supply device provided with a control circuit 400a according to a first modified embodiment of the third embodiment of the present invention.
Figure 27:
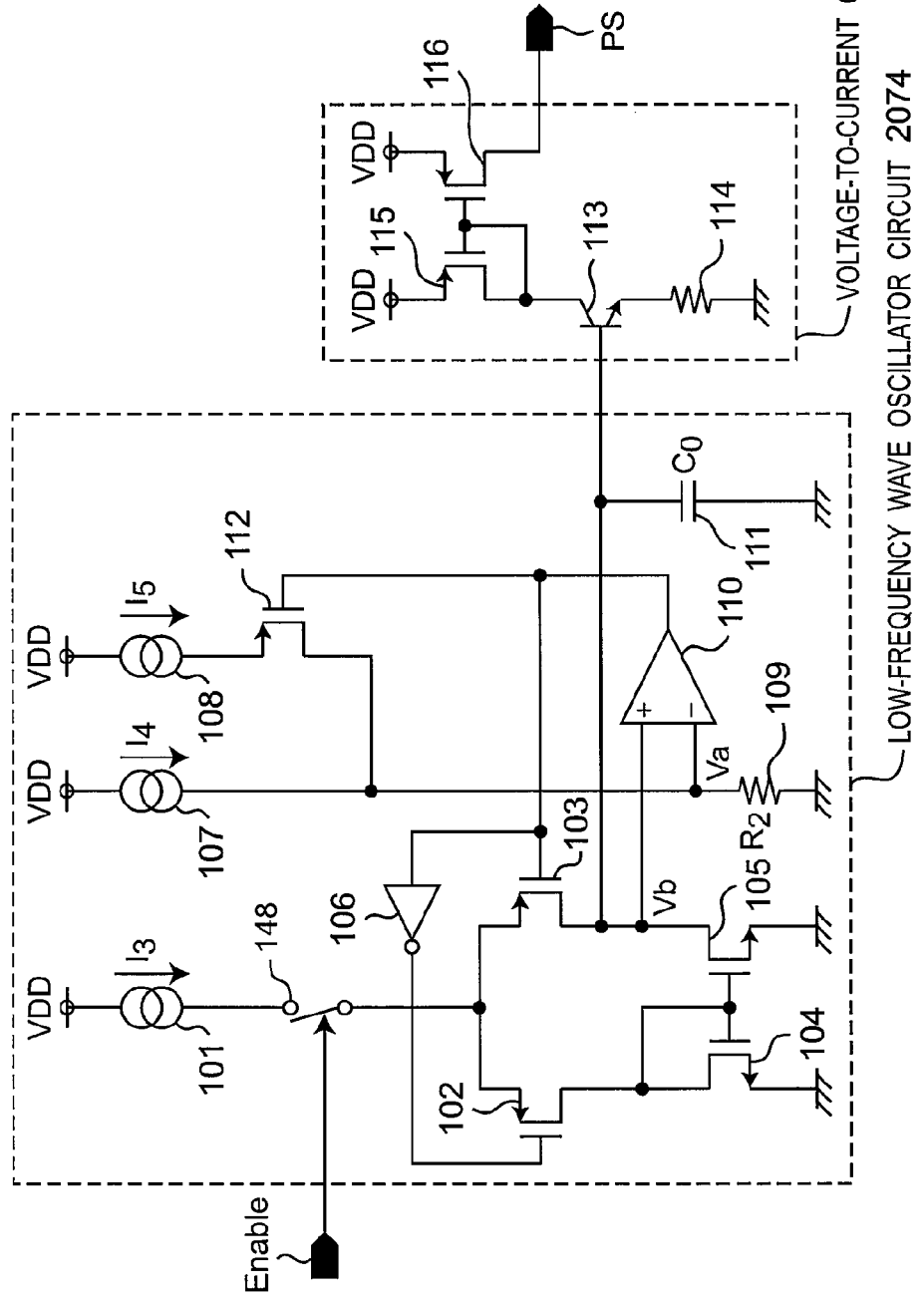
FIG. 27 is a circuit diagram of a period signal generator circuit 407b of FIG. 26.
Figure 28:
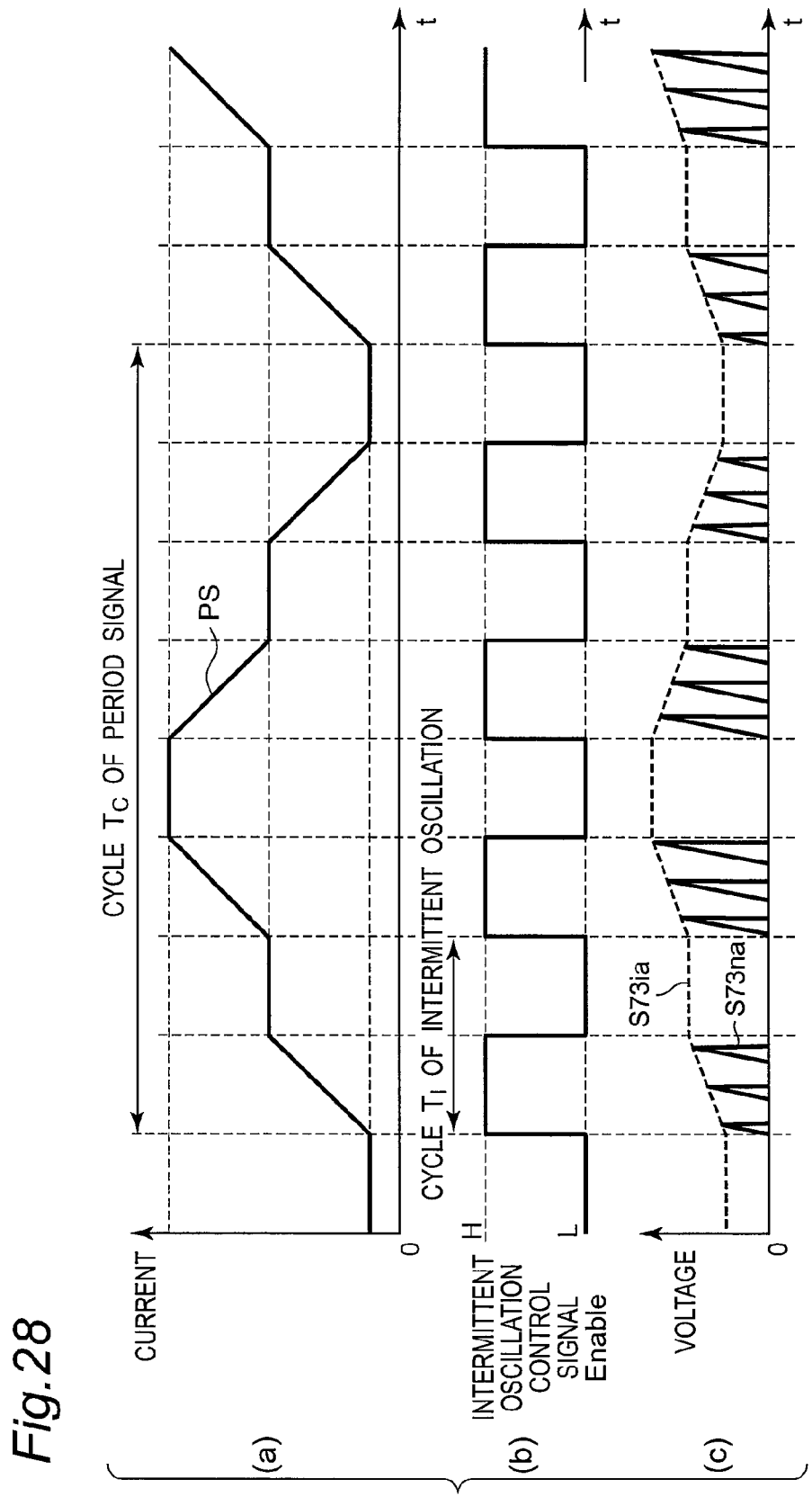
FIG. 28 is a graph, where

FIG. 26 is a block diagram showing a configuration of a switching power supply device provided with a control circuit 400A according to a first modified embodiment of the third embodiment of the present invention, and FIG. 27 is a circuit diagram of a period signal generator circuit 407b of FIG. 26. In addition, FIG. 28 is a graph, where FIG. 28(a) is a graph showing a period signal PS generated by the period signal generator circuit 407b of FIG. 27, FIG. 28(b) is a graph showing the intermittent oscillation control signal Enable generated by the intermittent oscillation control circuit 202 of FIG. 23, and FIG. 28(c) is a graph showing the input signal S73na inputted to the non-inverting input terminal of the turn-off control circuit 205a of FIG. 23, and the input signal S73ia inputted to the inverting input terminal of the turn-off control circuit 205a of FIG. 23 (See FIG. 5). Referring to FIG. 28, it is noted that, for the purpose of clarifying the variation of the current detection signal VIS, it is assumed that the feedback terminal outflowing current IFB and the cycle $T_I$ of intermittent oscillation are constant, respectively.

Referring to FIG. 26, as compared with the switching power supply device according to the third embodiment, the switching power supply device according to the present modified embodiment is configured to include a control circuit 400A instead of the control circuit 400. In addition, as compared with the control circuit 400, there is such a difference that the control circuit 400A is configured to include the period signal generator circuit 407b instead of the period signal generator circuit 407a. As compared with the period signal generator circuit 207a of FIG. 6, the period signal generator circuit 407b of FIG. 27 is configured to include a low-frequency wave oscillator circuit 2074 instead of the low-frequency wave oscillator circuit 2071. Further, as compared with the low-frequency wave oscillator circuit 2071, the low-frequency wave oscillator circuit 2074 is configured to further include a switch 148, which is inserted between a connection point of the pMOS transistors 102 and 103, and the constant current source 101. In this case, the switch 148 is turned on in response to the intermittent oscillation control signal Enable having the high level, while the switch 148 is turned off in response to the intermittent oscillation control signal Enable having the low level. It is noted that the number of times of oscillation of the switching element 2 for the oscillation interval can not be constrained.

Referring to FIG. 27, the period signal generator circuit 407b generates the period signal PS by frequency-modulating the triangle wave signal S2071 (See FIG. 6) according to the intermittent oscillation control signal Enable. The period signal generator circuit 307 generates the period signal PS so that the frequency, the local maximum value of the amplitude, and the local minimum value of the amplitude for each of the cycle intervals of the period signal PS are respectively constant by repeating a regular pattern signal for one cycle of FIG. 28(a) with the period signal frequency $f_c$. In a manner similar to that of the first embodiment, it is noted that the period signal frequency $f_c$ is set to a frequency, which is lower than the intermittent oscillation frequency $f_I$, or which is higher than the intermittent oscillation frequency $f_I$ and other than integral multiples of the intermittent oscillation frequency $f_I$, and the phase difference of the period signal PS with respect to the intermittent oscillation control signal Enable is set so that the distribution of the intermittent oscillation frequency $f_I$ can be dispersed.

The period signal generator circuit 207a of FIG. 6 generates the period signal PS having the cycle $T_c$ of period signal, which is set by using a charge or discharge current corresponding to the constant current $I_3$ from the constant current source 101, the capacitance $C_0$ of the capacitor 111, the constant current $I_5$ from the constant current source 108, and the resistance value $R_2$ of the resistor 109 (See the equation (4)). In contrast, in the period signal generator circuit 407b according to the present first modified embodiment, the capacitor 111 is not supplied with the constant current $I_3$ during the stop interval. Accordingly, as illustrated in FIG. 28(a), the cycle $T_c$ of period signal of the period signal PS from the period signal generator circuit 407b depends on an interval length of the stop interval, and therefore, the cycle $T_c$ of period signal of the period signal PS does not become constant.

According to the present modified embodiment, since the period signal generator circuit 407b generates the period signal PS by frequency-modulating the triangle wave signal S2071 (See FIG. 6) according to the intermittent oscillation control signal Enable, the cycle $T_c$ of period signal becomes longer than the cycle $T_I$ of intermittent oscillation and becomes approximately random. Accordingly, the dispersion degree of the distribution of the drain current peak value IDP can be larger than that of the first embodiment. Therefore, since the peak of the transformer sound of the transformer 1 can be much broader, the transformer sound can be further reduced. In this case, an element value of each of the elements configured to constitute the low-frequency wave oscillator circuit 2074 allows the dispersion degree of the distribution of the drain current peal value IDP to be controlled.

Fourth Embodiment

Figure 29:
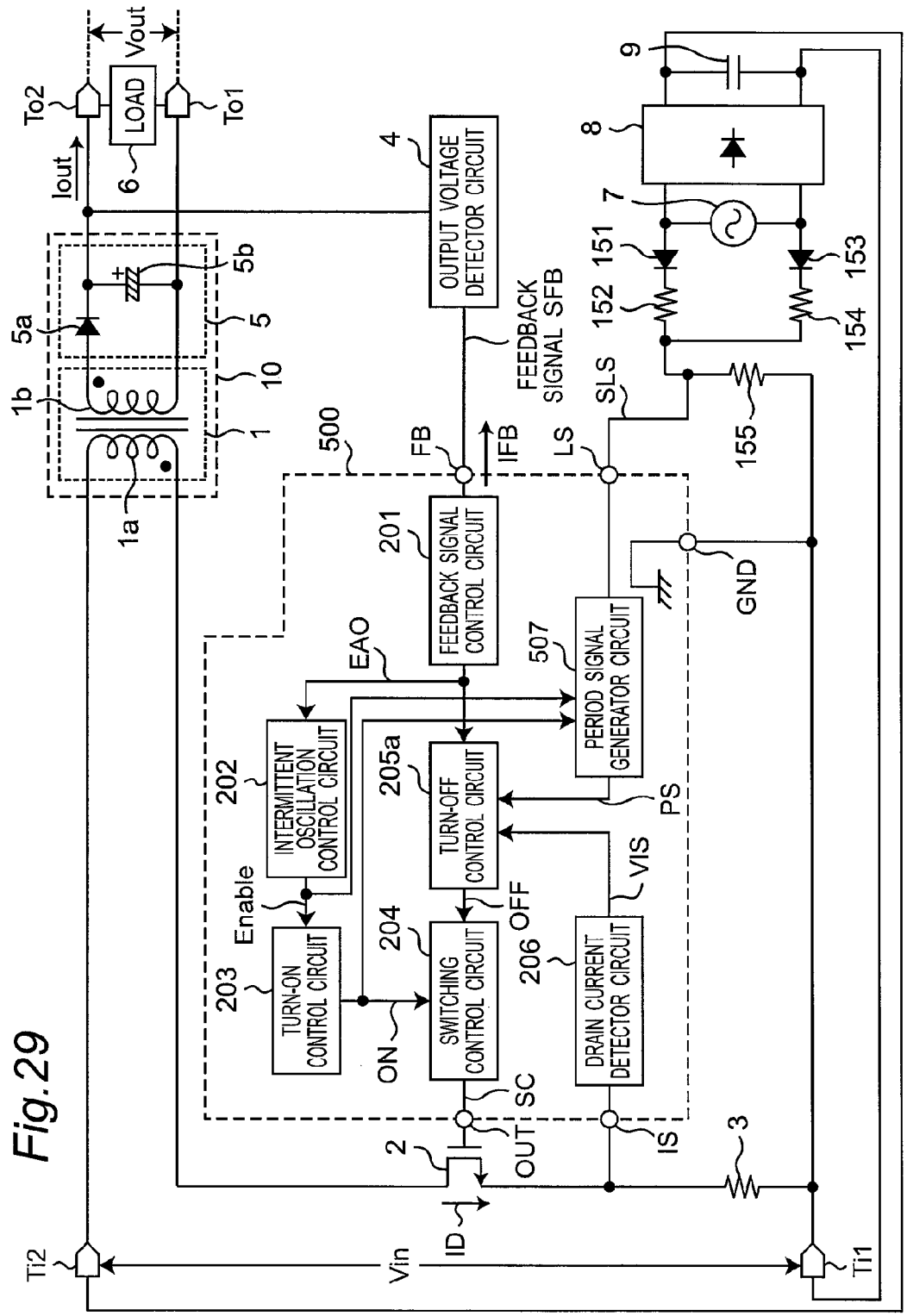
FIG. 29 is a block diagram showing a configuration of the switching power supply device provided with a control circuit 500 according to a fourth embodiment of the present invention.
Figure 30:
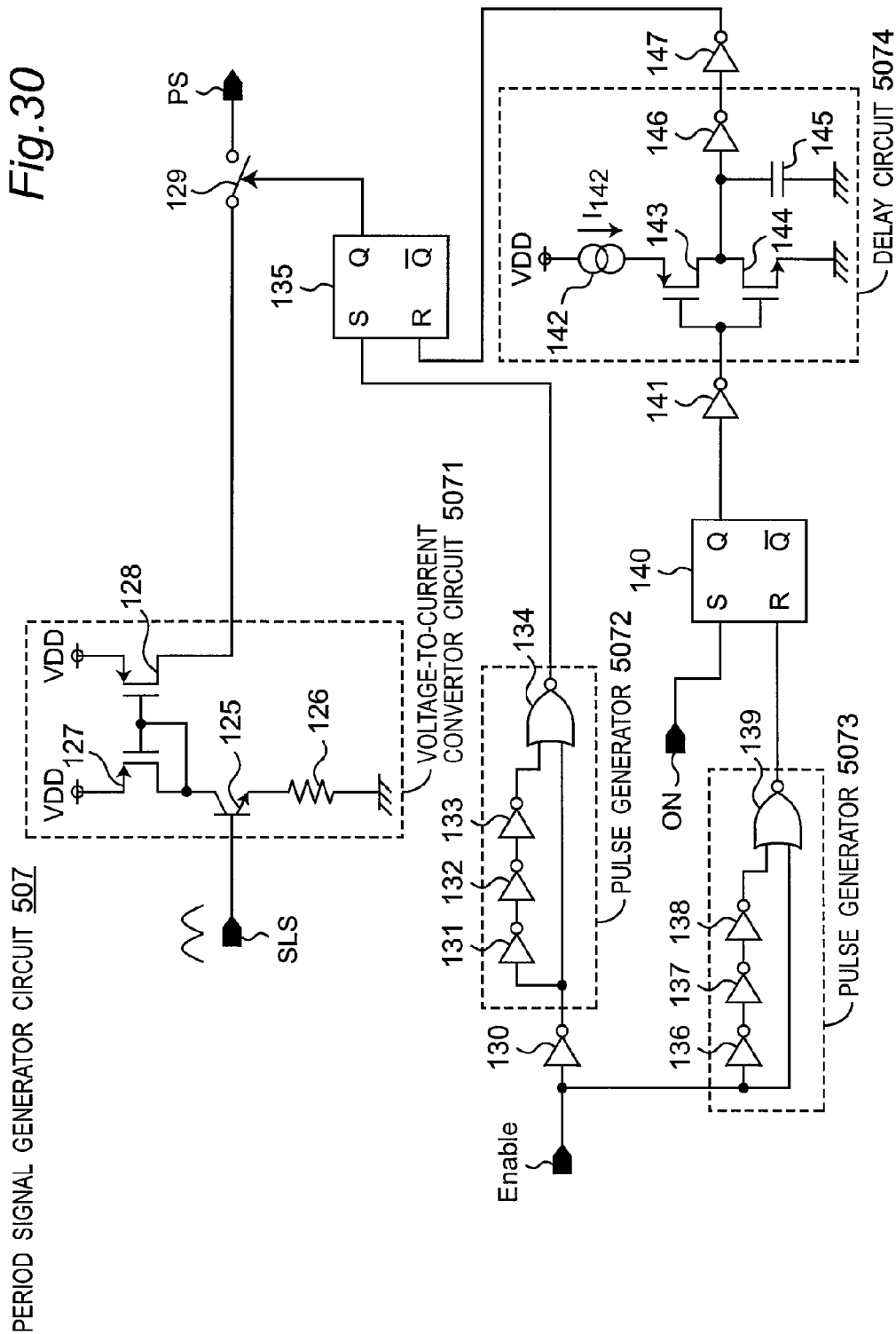
FIG. 30 is a circuit diagram of a period signal generator circuit 507 of FIG. 29.
Figure 31:
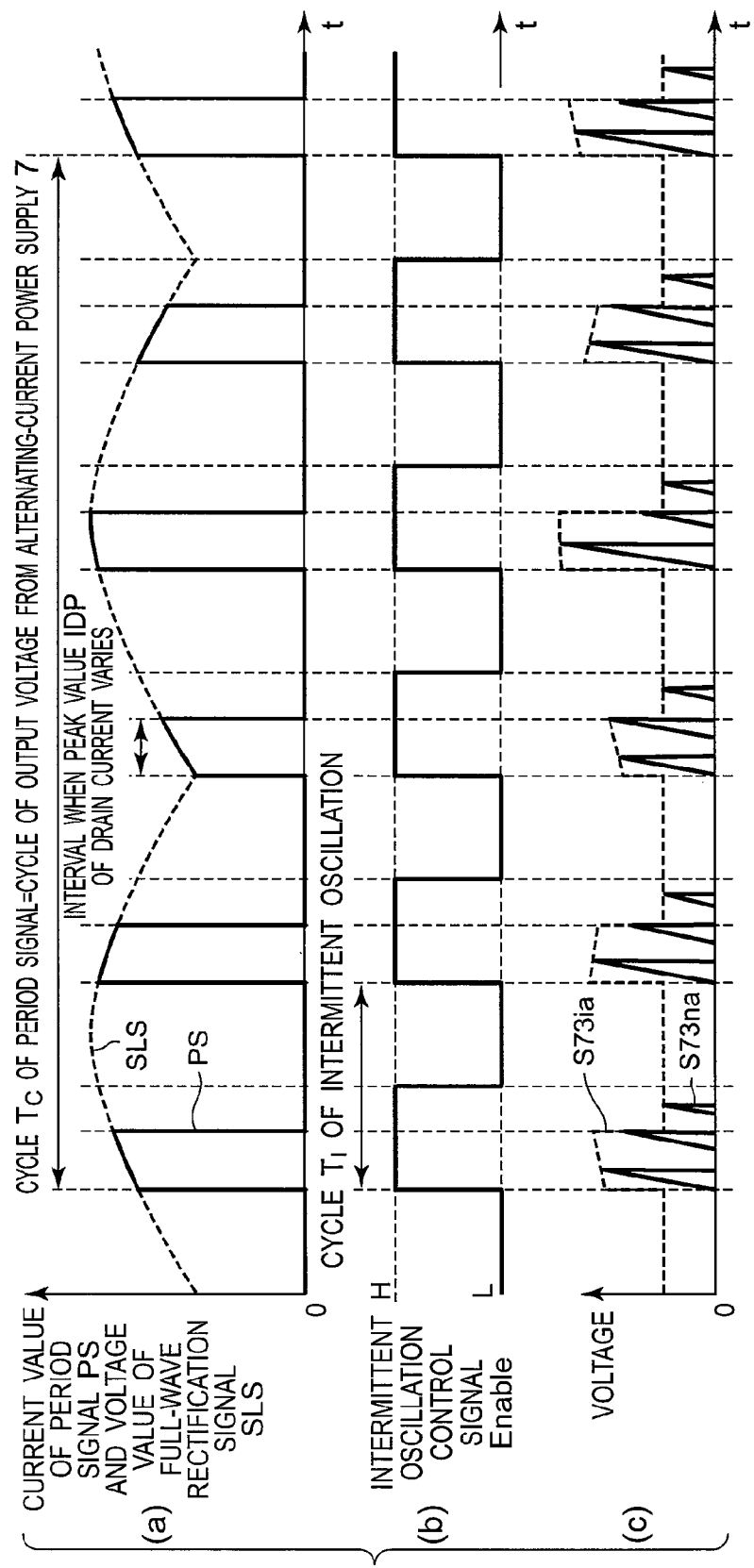
FIG. 31 is a graph, where

FIG. 29 is a block diagram showing a configuration of a switching power supply device provided with a control circuit 500 according to a fourth embodiment of the present invention, and FIG. 30 is a circuit diagram of a period signal generator circuit 507 of FIG. 29. In addition, FIG. 31 is a graph, where FIG. 31(a) is a graph showing a full-wave-rectification signal SLS inputted to a voltage-to-current converter circuit 5071 of FIG. 29, and the period signal PS generated by the period signal generator circuit 507 of FIG. 29, FIG. 31(b) is a graph showing the intermittent oscillation control signal Enable generated by the intermittent oscillation control circuit 202 of FIG. 28, and FIG. 31(c) is a graph showing the input signal S73na inputted to the non-inverting input terminal of the turn-off control circuit 205a of FIG. 28, and the input signal S73ia inputted to the inverting input terminal of the turn-off control circuit 205a of FIG. 28. Referring to FIG. 31, it is noted that, for the purpose of clarifying the variation of the current detection signal VIS, it is assumed that the feedback terminal outflowing current IFB and the cycle $T_I$ of intermittent oscillation are constant, respectively.

Referring to FIG. 29, as compared with the switching power supply device according to the first embodiment, the switching power supply device according to the present embodiment is configured to include the control circuit 500 instead of the control circuit 200. In addition, as compared with the control circuit 200, the control circuit 500 is configured to include the period signal generator circuit 507 instead of the period signal generator circuit 207a, and further a full-wave rectification signal input terminal LS. Referring to FIG. 29, an alternating-current voltage from a commercial alternating-current power supply 7 is rectified by a bridge diode 8 or the like, and thereafter, the rectified alternating-current voltage is smoothed by an input capacitor 9 to be outputted to the input terminals Ti1 and Ti2 as the direct current input voltage Vin. In addition, the alternating-current voltage from the alternating-current power supply 7 is full-wave rectified by diodes 151 and 153, and resistors 152, 154, and 155 to be outputted via the full-wave rectification signal input terminal LS to the period signal generator circuit 507 as the full-wave rectification signal SLS.

Referring to FIG. 30, the period signal generator circuit 507 is configured to include inverters 130, 141, and 147, pulse generators 5072 and 5073, RS flip flops 135 and 140, a delay circuit 5074, a voltage-to-current converter circuit 5071, and a switch 129. In this case, the pulse generator 5072 is configured to include cascade-connected inverters 131, 132, and 133, and a NOR gate 134. The pulse generator 5073 is configured to include cascade-connected inverters 136, 137, and 138, and a NOR gate 139. In addition, the voltage-to-current converter circuit 5071 is configured to include pMOS transistors 127 and 128 for constituting the current mirror circuit, a npn bipolar transistor 125, and a resistor 126, in a manner similar to that of the voltage-to-current converter circuit 2072 of FIG. 6. Further, the delay circuit 5074 is configured to include a constant current source 142 for outputting a predetermined constant current $I_{142}$, a pMOS transistor 143, a nMOS transistor 144, an inverter 146, and a capacitor 145, in a manner similar to that of the delay circuit 2053 of FIG. 15.

Referring to FIG. 30, the full-wave rectification signal SLS is converted to a current signal by the voltage-current converter circuit 5071, and the current signal is outputted to the switch 129. In addition, the intermittent oscillation control signal Enable is inputted via the inverter 130 to the inverter 131 and a first input terminal of the NOR gate 5072 of the pulse generator 5072, and the intermittent oscillation control signal Enable is inputted to the inverter 136 and a first input terminal of the NOR gate 139 of the pulse generator 5073. In the pulse generator 5072, a signal inputted to the inverter 131 is inputted to a second input terminal of the NOR gate 134 via the inverters 132 and 133, and an output signal from the NOR gate 134 is inputted to a set input terminal of the RS flip flop 135. In addition, in the pulse generator 5073, a signal inputted to the inverter 136 is inputted via the inverters 137 and 138 to a second input terminal of the NOR gate 139, and an output signal from the NOR gate 139 is inputted to a set input terminal of the RS flip flop 144.

Referring to FIG. 30, the turn-on control signal ON is inputted to a set input terminal of the RF flip flop 140, and an output signal from the RS flip flop 140 is inputted to the delay circuit 5074 via the inverter 141. Thereafter, the output signal from the RS flip flop 140 is delayed by a predetermined delay time corresponding to a capacitance of the capacitor 145 and the constant current $I_{142}$ by the delay circuit 5074. Thereafter, the delayed output signal is inputted to a reset input terminal of the RS flip flop 135 via the inverter 147 as a reset signal. Further, an output signal from the RF flip flop 135 is outputted to a control terminal of the switch 129.

Then, the operation of the period signal generator circuit 507 is described. Referring to FIG. 30, the period signal generator circuit 507 outputs a current signal corresponding to the full-wave rectification signal SLS as the period signal PS during the interval when the switch 129 is turned on.

In addition, referring to FIG. 30, the pulse generator 5073 generates a pulse signal at a timing when the voltage level of the intermittent oscillation control signal Enable is inverted from the high level to the low level, and the pulse generator 5073 outputs the pulse signal to the reset input terminal of the RS flip flop 140. Accordingly, the reset signal from the inverter 147 is delayed by a predetermined delay time from the restart every when the oscillation is restarted upon controlling the intermittent oscillation, and the delayed reset signal is inputted to the reset input terminal of the RS flip flop 135 is inputted. On the other hand, the pulse generator 5072 generates a pulse signal at a timing when the voltage level of the intermittent oscillation control signal Enable changes from the low level to the high level, and the pulse generator 5072 outputs the pulse signal to the set input terminal of the RS flip flop 135. Accordingly, a voltage level of an output signal from the RS flip flop 135 becomes the high level at a start timing of the oscillation interval upon controlling the intermittent oscillation, and therefore, the switch 129 is turned on. In addition, after a predetermined delay time has passed from the start timing of the oscillation interval, a voltage level of the output signal from the RS flip flop 135 changes to the low level, and therefore, the switch 129 is turned off.

In general, a cycle of the alternating-current voltage from the commercial alternating-current power supply 7 is much longer than the cycle $T_I$ of intermittent oscillation. Therefore, since the switching power supply device according to the present embodiment is not provided with an oscillator circuit or a counter circuit, the switching power supply device according to the present embodiment can have a relatively simple circuit configuration. Further, the switching power supply device according to the present embodiment can generate the period signal PS having the $T_c$ of period signal much longer than the cycle $T_I$ of intermittent oscillation. In this case, the period signal PS generated by the period signal generator circuit 507 is generated so that a regular pattern signal for one cycle of FIG. 31(a) is repeated with the predetermined period signal frequency $f_c$. A local maximum value and a local minimum value of an amplitude of a pattern signal for one cycle of FIG. 31(a) are not constant, respectively. Accordingly, when the period signal PS according to the present embodiment is used, the distribution of the intermittent oscillation frequency $f_I$ can be dispersed, and the transformer sound from the transformer 1 can be lowered as compared with that of the prior art, without any constraint of the period signal frequency $f_c$ and the phase difference of the period signal PS with respect to the intermittent oscillation control signal Enable.

In addition, according to the present embodiment, as illustrated in FIG. 31(a), the period signal PS is outputted only during a predetermined delay time, which is set by the delay circuit 5074, from the start timing of the oscillation interval upon controlling the intermittent oscillation. Accordingly, the peak value IDP of the current flowing through the switching element 2 varies only during the predetermined delay time from the start timing of the oscillation interval. That is, the period signal PS affects only the intermittent oscillation operation, and there is no possibility that the feedback control becomes unstable during the normal operation.

It is noted that, in the present embodiment, the peak value IDP of the current flowing through the switching element 2 varies during the predetermined time interval from the start timing of the oscillation interval. However, the present invention is not limited thereto. For example, the peak value IDP of the current flowing through the switching element 2 may vary during an interval from the start timing of the oscillation interval to a timing when the switching element 2 is controlled to be turned on and off a predetermined number of times. In particular, referring to FIG. 30, a count-up circuit, which counts-up the turn-on control signal ON, may be included instead of the delay circuit 5074, and therefore, the switch 129 may be controlled to be turned on during an interval from the start timing of the oscillation interval to a timing when the switching element 2 is controlled to be turned on and off by at least one time of predetermined number of times.

In addition, in the present embodiment, the period signal PS is generated by using the full-wave rectification signal SLS. However, the present invention is not limited thereto. For example, the period signal PS may be generated by using an alternating-current voltage signal having an alternating-current frequency from the alternating-current power supply 7 such as a signal, which is obtained by half-wave rectifying the alternating-current voltage from the alternating-current power supply 7.

Fifth Embodiment

Figure 32:
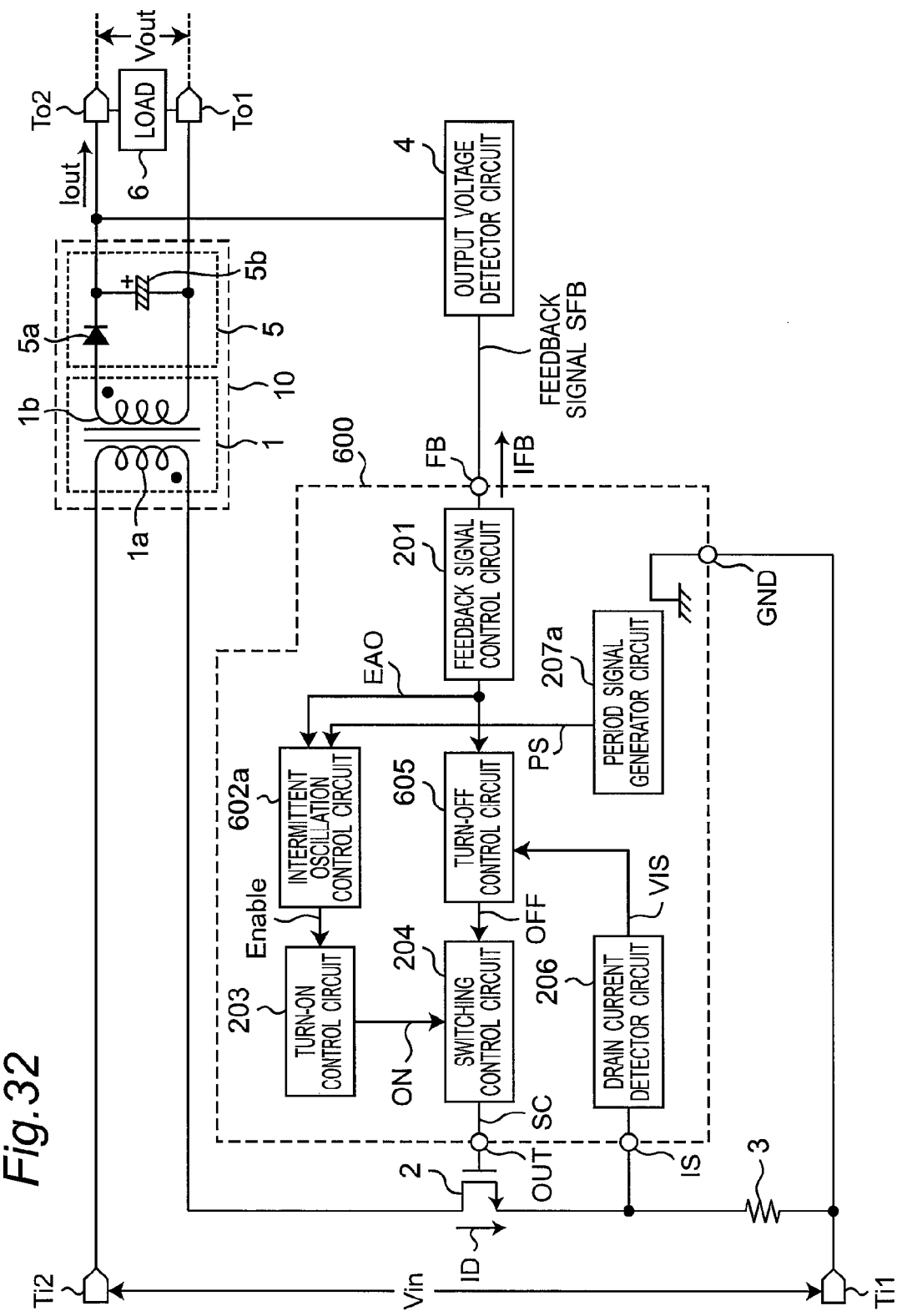
FIG. 32 is a block diagram showing a configuration of the switching power supply device provided with a control circuit 600 according to a fifth embodiment of the present invention.
Figure 33:
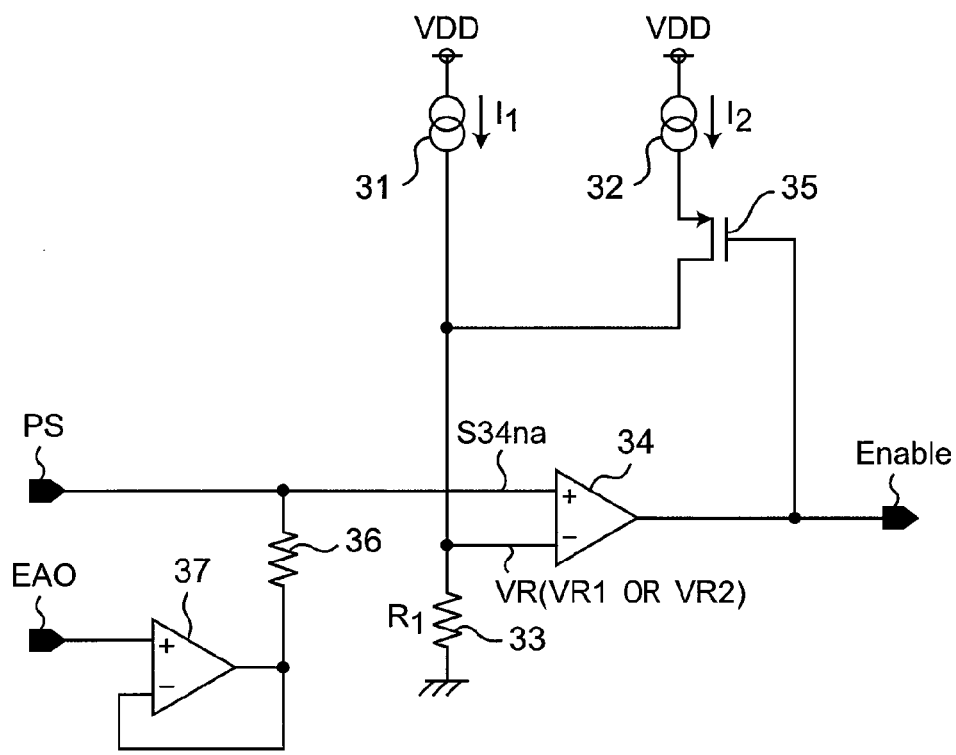
FIG. 33 is a circuit diagram of an intermittent oscillation control circuit 602a of FIG. 32.
Figure 34:
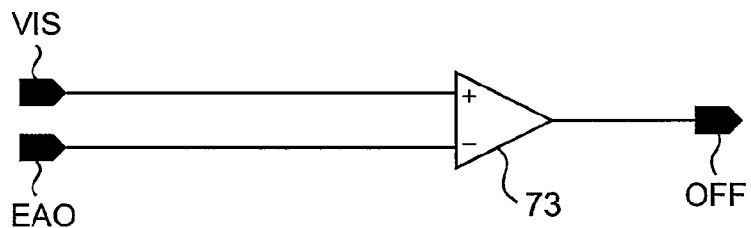
FIG. 34 is a circuit diagram of a turn-off control circuit 605 of FIG. 32.

FIG. 32 is a block diagram showing a configuration of a switching power supply device provided with a control circuit 600 according to a fifth embodiment of the present invention. In addition, FIG. 33 is a circuit diagram of an intermittent oscillation control circuit 602a of FIG. 32, and FIG. 34 is a circuit diagram of a turn-off control circuit 605 of FIG. 32. Referring to FIG. 32, as compared with the switching power supply device according to the first embodiment of FIG. 1, the switching power supply device according to the present embodiment is configured to include the control circuit 600 instead of the control circuit 200. In addition, as compared with the control circuit 200, the control circuit 600 is configured to include the intermittent oscillation control circuit 602a instead of the intermittent oscillation control circuit 202, and the turn-off control circuit 605 instead of the turn-off control circuit 205a.

Referring to FIG. 34, the turn-off control circuit 605 is configured to include the comparator 73. The current detection signal VIS is inputted to the non-inverting input terminal of the comparator 73, and the feedback control signal EAO is inputted to the inverting input terminal of the comparator 73. Then, the comparator 73 generates the turn-off control signal OFF, and outputs the turn-off control signal OFF to the switching control circuit 204.

Referring to FIG. 33, as compared with the intermittent oscillation control circuit 202 of FIG. 3, the intermittent oscillation control circuit 602a is configured to further include an operational amplifier 37, which operates as an impedance converter, and a resistor 36. The feedback control signal EAO is impedance-converted by the operational amplifier 37 to be outputted to the resistor 36. On the other hand, the period signal PS flows through the resistor 36 as a current signal. Accordingly, the period signal PS is added to the signal corresponding to the feedback control signal EAO, and thereafter, the added signal is inputted to the non-inverting input terminal of the comparator 34 as an input signal S34na. That is, the input signal S34na can be obtained by modulating the feedback control signal EAO according to the period signal PS.

Figure 35:
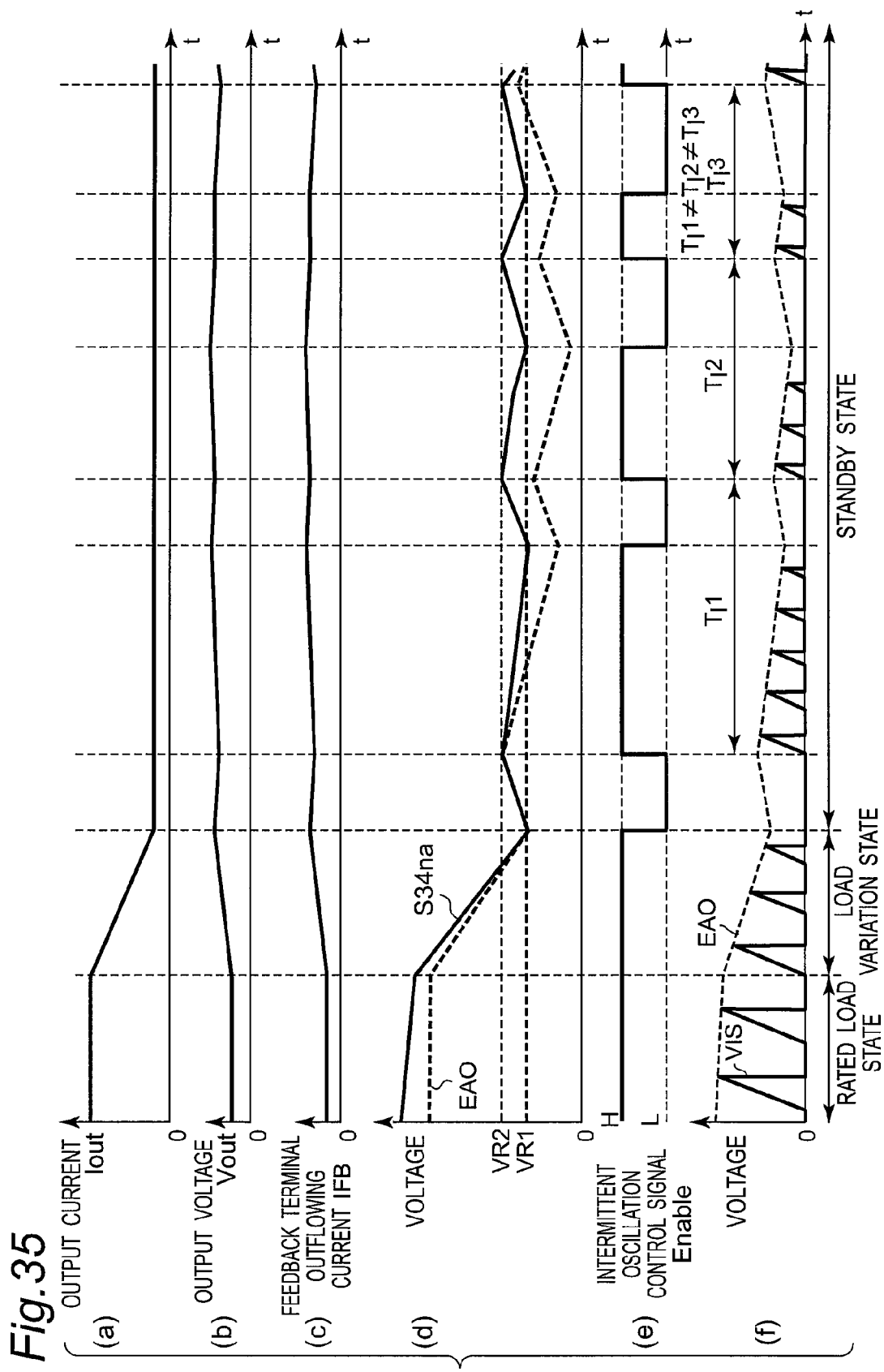
FIG. 35 is a graph, where

FIG. 35 is a graph, where FIG. 35(a) is a graph showing the output current Iout of FIG. 32, FIG. 35(b) is a graph showing the output voltage Vout of FIG. 32, FIG. 35(c) is a graph showing the feedback terminal outflowing current IFB of FIG. 32, FIG. 35(d) is a graph showing the feedback control signal EAO inputted to the operational amplifier 37 of FIG. 33, the threshold voltages VR1 and VR2 inputted to the inverting input terminal of the comparator 34 of FIG. 33, and the input signal S34na inputted to the non-inverting input terminal of the comparator 34 of FIG. 33, FIG. 35(e) is a graph showing the intermittent oscillation control signal Enable generated by the intermittent oscillation control circuit 602a of FIG. 33, and FIG. 35(f) is a graph showing the current detection signal VIS inputted to a non-inverting input terminal of the turn-off control circuit 605 of FIG. 34 and the feedback control signal EAO inputted to an inverting input terminal of the turn-off control circuit 605 of FIG. 34.

As illustrated in FIG. 35(e), according to the intermittent oscillation control circuit 602a of the present embodiment, as compared with the first embodiment, the timing varies according to the period signal PS, where the timing is a timing when the voltage level of the intermittent oscillation control signal Enable is inverted. Accordingly, since the start timing and the end timing of the oscillation interval vary according to the period signal PS upon controlling the intermittent oscillation, the cycle $T_I$ of intermittent oscillation varies according to the period signal PS (for example, referring to FIG. 35, the three cycles $T_I1$, $T_I2$ and $T_I3$ of intermittent oscillation differ from each other.). According to the present embodiment, in a manner similar to that of the first embodiment, the distribution of the intermittent oscillation frequency $f_I$ can be dispersed broader than that of the prior art, the peak value of the drain current ID can vary as compared with the prior art, and the peak value of the sound pressure intensity of the transformer 1 is lowered as compared with that of the prior art. Accordingly, the transformer sound is lowered as compared with that of the prior art.

Further, according to the present embodiment, since the intermittent oscillation control signal Enable varies by using the period signal PS, the period signal PS affects only the intermittent oscillation operation. Therefore, as compared with the first embodiment, there is no possibility that the feedback control becomes unstable during the normal operation.

First Modified Embodiment of the Fifth Embodiment

Figure 36:
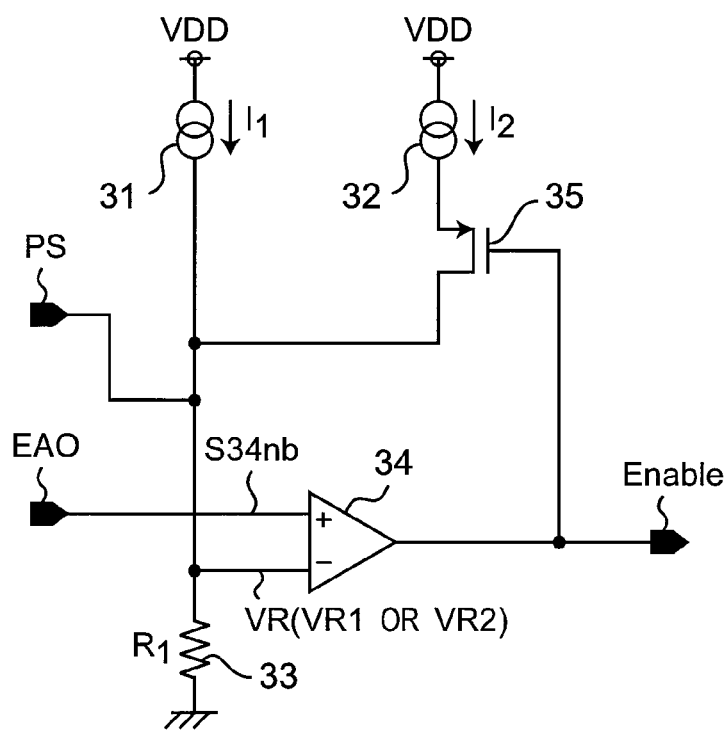
FIG. 36 is a circuit diagram of an intermittent oscillation control circuit 602b according to a first modified embodiment of the fifth embodiment of the present invention.

FIG. 36 is a circuit diagram of an intermittent oscillation control circuit 602b according to a first modified embodiment of the fifth embodiment of the present invention. Referring to FIG. 36, as compared with the intermittent oscillation control circuit 602a according to the fifth embodiment, the intermittent oscillation control circuit 602b according to the present embodiment differs from the intermittent oscillation control circuit 602a in that the feedback control signal EAO is inputted to the non-inverting input terminal of the comparator 34 as an input signal S34nb, and that the period signal PS is outputted to a connection point between the constant current source 31 and the pMOS transistor 35, and the resistor 33. Accordingly, since the period signal PS of the current signal is added to the current $I_I$ or the current $(I_1+I_2)$ flowing through the resistor 33, the threshold voltages VR1 and VR2 inputted to the inverting input terminal of the comparator 34 are modulated according to the period signal PS. Accordingly, since the start timing and the end timing of the oscillation interval vary according to the period signal PS upon controlling the intermittent oscillation, the cycle $T_I$ of intermittent oscillation varies according to the period signal PS. The present modified embodiment has the same effect as that of the fifth embodiment.

In the present modified embodiment, it is noted that the threshold voltages VR1 and VR2 inputted to the inverting input terminal of the comparator 34 are modulated according to the period signal PS. However, the present invention is not limited thereto. For example, only the threshold voltage VR1 may be modulated. In particular, a first series-connected circuit of a constant current source and a resistor for setting the threshold voltage VR1, a second series-connected circuit of a constant current source and a resistor for setting the threshold voltage VR2, and a switch circuit for inputting the threshold voltage VR1 or the threshold voltage VR2 to the inverting input terminal of the comparator 34 in response to the output signal from the comparator 34 may be included, and therefore, the period signal PS may be outputted to a connection point between the constant current source of the first series-connected circuit and the resistor (for example, a circuit connected to an inverting input terminal of a comparator 54 of FIG. 45 has the same configuration as the configuration described above.).

Second Modified Embodiment of the Fifth Embodiment

Figure 37:
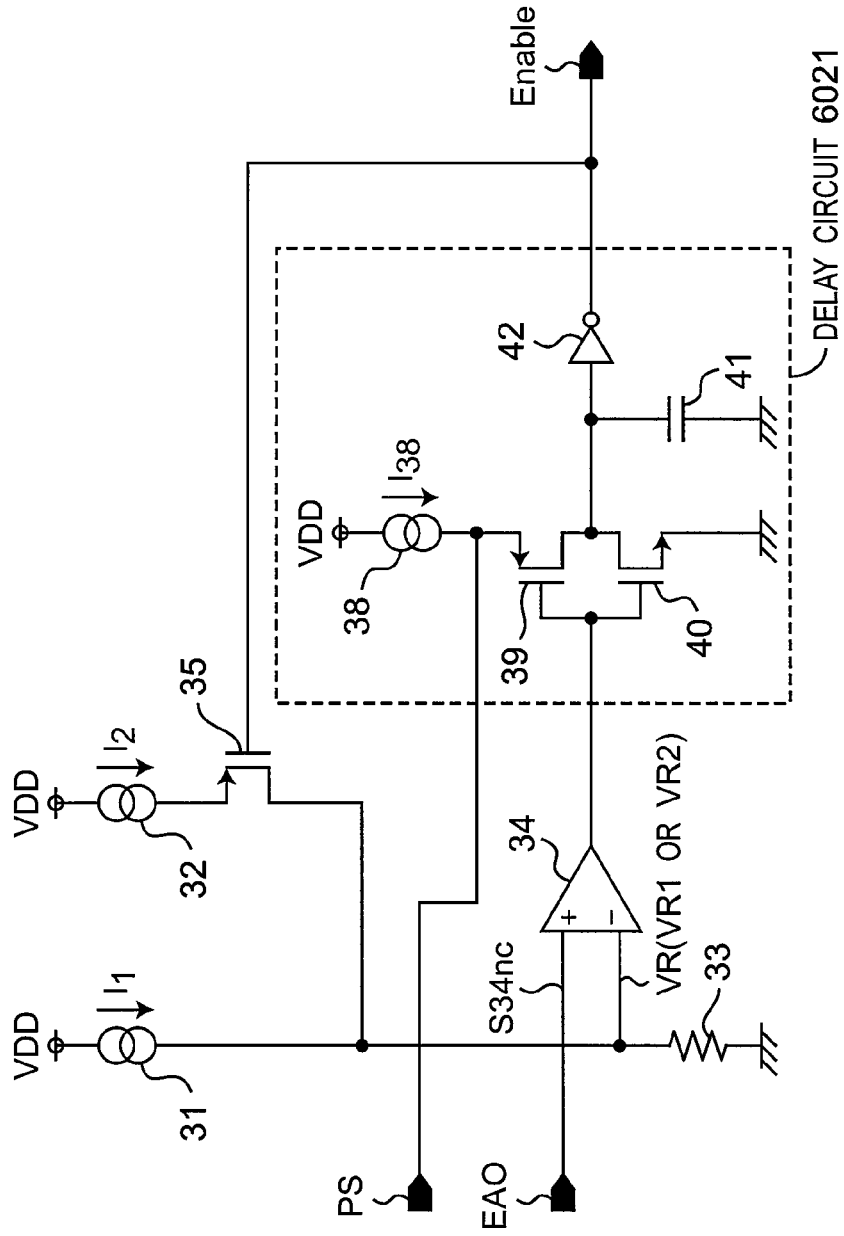
FIG. 37 is a circuit diagram of an intermittent oscillation control circuit 602c according to a second modified embodiment of the fifth embodiment of the present invention.

FIG. 37 is a circuit diagram of an intermittent oscillation control circuit 602c according to a second modified embodiment of the fifth embodiment of the present invention. Referring to FIG. 37, as compared with the intermittent oscillation control circuit 202 according to the first embodiment of FIG. 2, the intermittent oscillation control circuit 602c according to the present modified embodiment is configured to further include a delay circuit 6021, where the period signal PS is outputted to the delay circuit 6021. Referring to FIG. 37, the feedback control signal EAO is inputted to the non-inverting input terminal of the comparator 34 as an input signal S34nc. In addition, the delay circuit 6021 is configured to include a constant current source 38 for outputting a predetermined constant current $I_{38}$, a pMOS transistor 39, a nMOS transistor 40, an inverter 42, and a capacitor 41, in a manner similar to that of the delay circuit 2053 of FIG. 15. The output signal from the comparator 34 is outputted to each of gates of the pMOS transistor 39 and the nMOS transistor 40, an output signal from the inverter 42 is outputted as the intermittent oscillation control signal Enable. Further, the period signal PS is added to the constant current $I_{38}$ from the constant current source 38, and the added signal is outputted to a source of the pMOS transistor 39.

Then, the operation of the intermittent oscillation control circuit 602c is described. When the comparator 34 outputs the output signal having the low level for terminating the oscillation interval, the pMOS transistor 39 is turned on. Thereafter, a charge current obtained by adding the current corresponding to the period signal PS to the constant current $I_{82}$ flows through the capacitor 41. Then, when the output signal from the inverter 42 is inverted, the intermittent oscillation control signal Enable having the low level is outputted. That is, after the voltage level of the output signal from the comparator 34 has changed from the high level to the low level, the intermittent oscillation control signal Enable having the low level is delayed by a delay time corresponding to a capacitance of the capacitor 41 and the charge current, and the delayed intermittent oscillation control signal Enable having the low level is outputted. Accordingly, when the voltage level of the feedback control signal EAO falls below the reference voltage VR, the oscillation interval continues only during the delay time as described above, and thereafter, the switching operation of the switching element 2 is stopped.

Referring to FIG. 37, since the charge current of the capacitor 41 varies according to the period signal PS, a delay time of the delay circuit 6021 varies according to the period signal PS. That is, the delay time of the delay circuit 6021 is modulated according to the period signal PS. Accordingly, since the end timing of the oscillation interval varies according to the period signal PS, the cycle $T_I$ of intermittent oscillation varies according to the period signal PS. The present modified embodiment has the same effect as that of the fifth embodiment. Further, according to the present modified embodiment, since the start timing of the oscillation interval is not affected by the period signal PS, even if the load 6 changes rapidly upon controlling the intermittent oscillation, the output voltage Vout can change rapidly, and therefore, the switching operation of the switching element 2 can be restarted rapidly.

Third Modified Embodiment of the Fifth Embodiment

Figure 38:
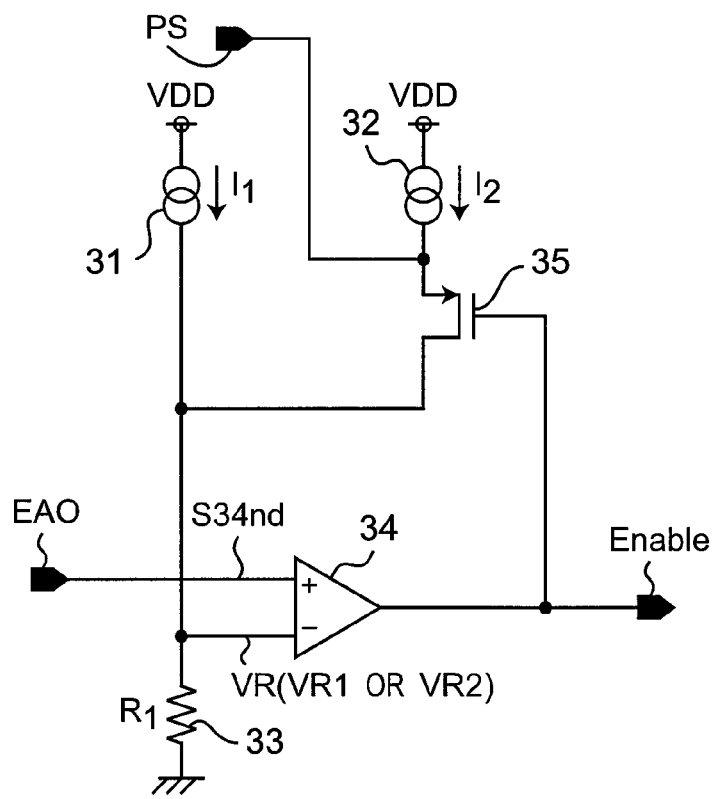
FIG. 38 is a circuit diagram of an intermittent oscillation control circuit 602d according to a third modified embodiment of the fifth embodiment of the present invention.

FIG. 38 is a circuit diagram of an intermittent oscillation control circuit 602d according to a third modified embodiment of the fifth embodiment of the present invention. As compared with the intermittent oscillation control circuit 602b (See FIG. 36) according to the second modified embodiment of the fifth embodiment, the intermittent oscillation control circuit 602d according to the present modified embodiment differs from the intermittent oscillation control circuit 602b in that the period signal PS is outputted to a connection point between the constant current source 32 and the pMOS transistor 35. Accordingly, since the period signal PS of the current signal is added to the current $(I_1+I_2)$ flowing through the resistor 33 upon turning on the pMOS transistor 35, only the threshold voltage VR2 of the threshold voltages VR1 and VR2 inputted to the inverting input terminal of the comparator 34 is modulated according to the period signal PS. Accordingly, since the start timing of the oscillation interval varies according to the period signal PS, the cycle $T_I$ of intermittent oscillation varies according to the period signal PS. The present modified embodiment has the same effect as that of the fifth embodiment.

Fourth Modified Embodiment of the Fifth Embodiment

Figure 39:
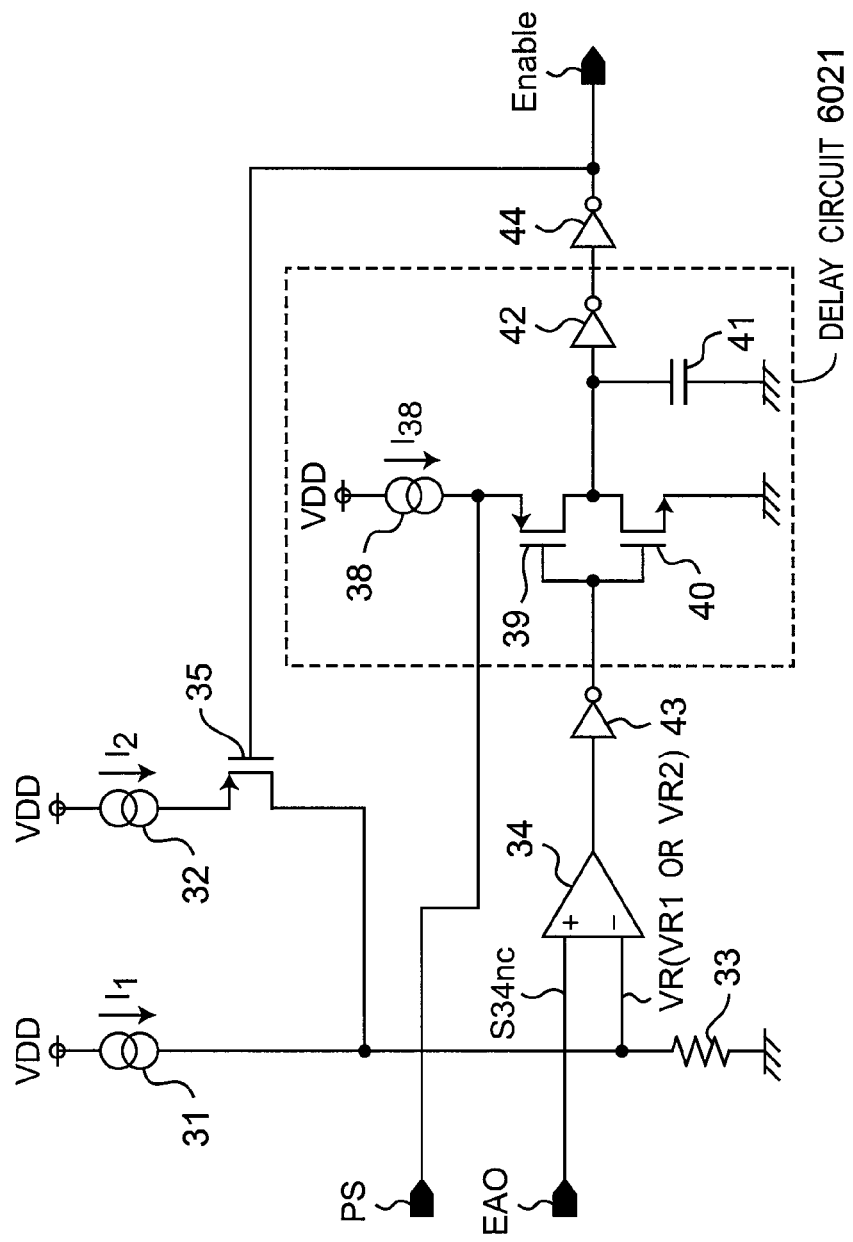
FIG. 39 is a circuit diagram of an intermittent oscillation control circuit 602e according to a fourth modified embodiment of the fifth embodiment of the present invention.

FIG. 39 is a circuit diagram of an intermittent oscillation control circuit 602e according to a fourth modified embodiment of the fifth embodiment of the present invention. As compared with the intermittent oscillation control circuit 602c (See FIG. 37) according to the second modified embodiment of the fifth embodiment, there is such a difference that an inverter 43 inserted between the comparator 34 and the delay circuit 6021 and an inverter 44 inserted between the delay circuit 6021 and the pMOS transistor 35 are further included.

Then, the operation of the intermittent oscillation control circuit 602e is described. When the comparator 34 outputs the output signal having the high level for starting the oscillation interval, the pMOS transistor 39 is turned on. Thereafter, the charge current obtained by adding the current corresponding to the period signal PS to the constant current $I_{82}$ flows through the capacitor 41, and thereafter, when the output signal from the inverter 42 is inverted, the intermittent oscillation control signal Enable having the low level is outputted. That is, after the voltage level of the output signal from the comparator 34 has changed from the low level to the high level, the intermittent oscillation control signal Enable having the low level is delayed by a delay time corresponding to the capacitance of the capacitor 41 and the charge current, and the delayed intermittent oscillation control signal Enable having the low level is outputted. Accordingly, when the voltage level of the feedback control signal EAO exceeds the reference voltage VR, the stop interval continues only during the delay time as described above, and thereafter, the switching operation of the switching element 2 is started.

Referring to FIG. 39, since the charge current of the capacitor 41 varies according to the period signal PS, the delay time of the delay circuit 6021 varies according to the period signal PS. That is, the delay time of the delay circuit 6021 is modulated according to the period signal PS. Accordingly, since the start timing of the oscillation interval varies according to the period signal PS, the cycle $T_I$ of intermittent oscillation varies according to the period signal PS. The present modified embodiment has the same effect as that of the fifth embodiment.

Sixth Embodiment

Figure 40:
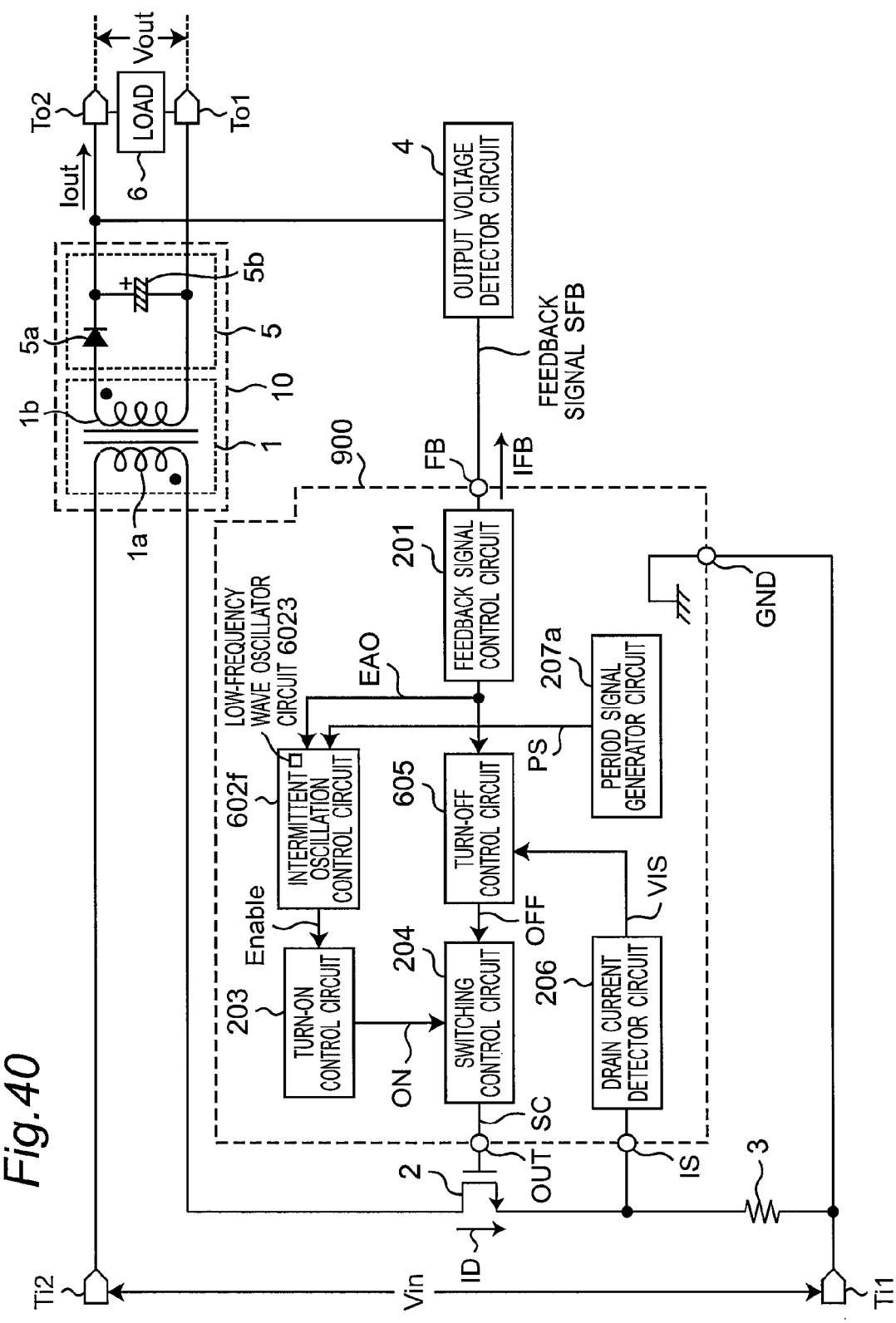
FIG. 40 is a block diagram showing a configuration of the switching power supply device provided with a control circuit 900 according to a sixth embodiment of the present invention.
Figure 41:
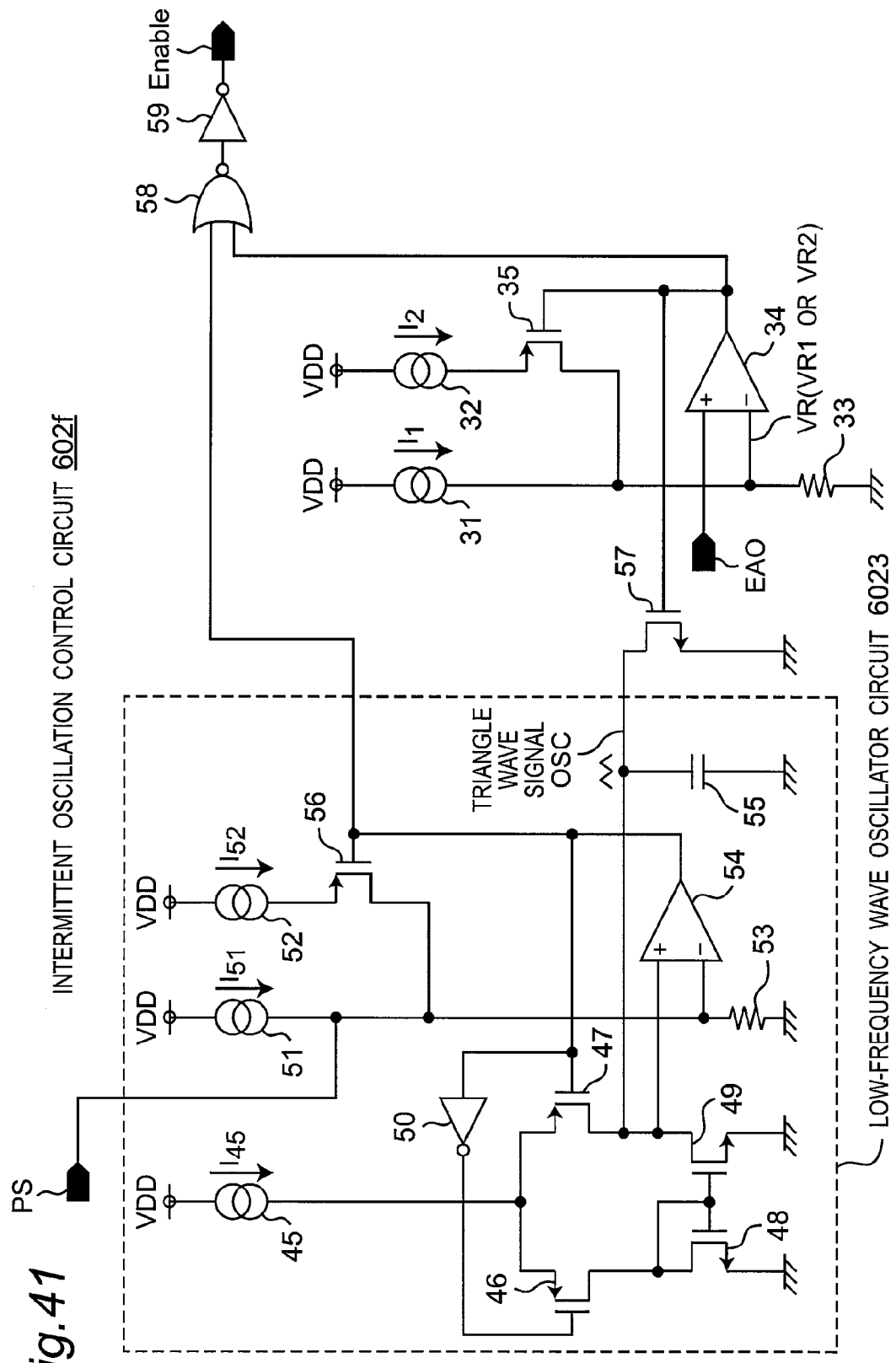
FIG. 41 is a circuit diagram of an intermittent oscillation control circuit 602f of FIG. 40.

FIG. 40 is a block diagram showing a configuration of a switching power supply device provided with a control circuit 900 according to a sixth embodiment of the present invention, and FIG. 41 is a circuit diagram of an intermittent oscillation control circuit 602f of FIG. 40. Referring to FIG. 40, as compared with the switching power supply device according to the fifth embodiment of FIG. 32, the switching power supply device according to the present embodiment is configured to include a control circuit 900 instead of the control circuit 600. In addition, as compared with the control circuit 200, the control circuit 900 is configured to include an intermittent oscillation control circuit 602f instead of the intermittent oscillation control circuit 602a.

Referring to FIG. 41, as compared with the intermittent oscillation control circuit 202 according to the first embodiment, there is such a difference that the intermittent oscillation control circuit 602f is configured to further include a low-frequency wave oscillator circuit 6023 for generating a triangle wave signal OSC, a nMOS transistor 57, a NOR gate 58, and an inverter 59. In this case, the low-frequency wave oscillator circuit 6023 is configured to include constant current sources 45, 51, and 52 for respectively outputting predetermined constant currents $I_{45}$, $I_{51}$, and $I_{52}$, an inverter 50, the comparator 54, a resistor 53, a capacitor 55, pMOS transistors 46, 47, and 56, and nMOS transistors 48 and 49 for constituting the current mirror circuit, in a manner similar to that of the low-frequency wave oscillator circuit 2071 of FIG. 6. In addition, the triangle wave signal OSC is outputted to a drain of the nMOS transistor 57. Further, a source of the nMOS transistor 57 is connected to the ground, and a gate of the nMOS transistor 57 is connected to the output terminal of the comparator 34.

Referring to FIG. 41, each of output signals from the comparator 54 and the comparator 34 is inputted to the NOR gate 58, and an output signal from the NOR gate 58 is inputted to the inverter 59. Then, an output signal from the inverter 59 is outputted as the intermittent oscillation control signal Enable. In addition, the period signal PS is added to the constant current $I_{51}$ from the constant current source 51.

The intermittent oscillation control circuits 202, 602a, 602b, 602c, 602d, and 602e according to each of the embodiments and the modified embodiment thereof as described above generate the intermittent oscillation control signal Enable, which terminates the oscillation interval when a voltage level of a predetermined signal generated by using the feedback control signal EAO falls below the threshold voltage VR1 and starts the oscillation interval when the voltage level of the predetermined signal as described above exceeds the threshold voltage VR2 during the stop interval. In contrast, when the voltage level of the feedback control signal EAO falls below the reference voltage VR, the intermittent oscillation control circuit 602f according to the present embodiment outputs the output signal from the comparator 54 of the low-frequency wave oscillator circuit 6023 as the intermittent oscillation control signal Enable. That is, the intermittent oscillation control circuit 602f generates the intermittent oscillation control signal Enable without the feedback control signal EAO, but with the triangle wave signal OSC, upon controlling the intermittent oscillation.

Referring to FIG. 41, since the period signal PS is added to the constant current $I_{51}$ from the constant current source 51, when the pMOS transistor 56 keeping turning on or keeping turning off, a voltage inputted to the inverting input terminal of the comparator 54 varies according to the period signal PS. As a result, the upper limit and the lower limit of the triangle wave signal OSC vary according to the period signal PS. That is, the upper limit and the lower limit of the triangle wave signal OSC are modulated according to the period signal PS.

Figure 42:
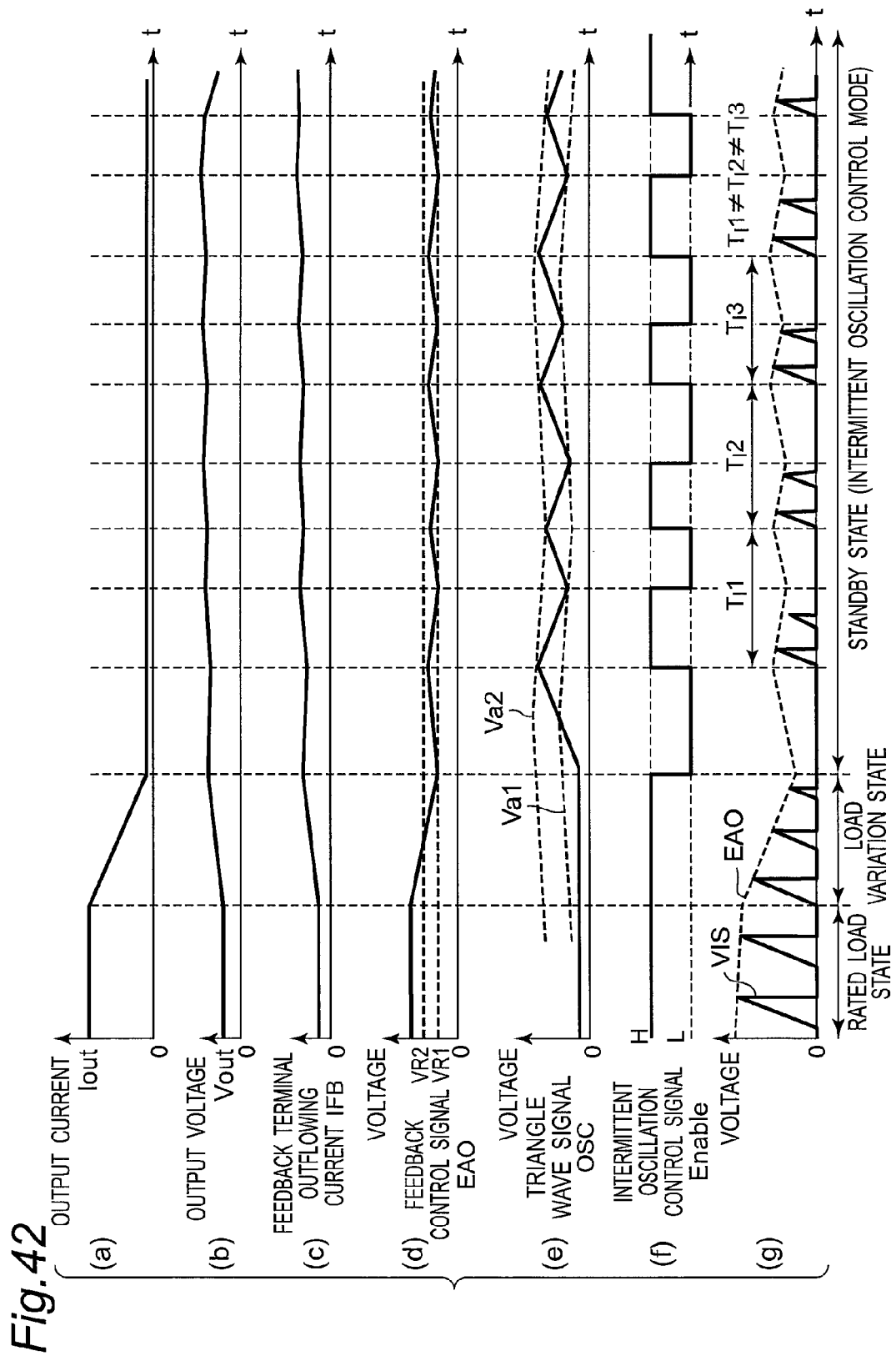
FIG. 42 is a graph, where

FIG. 42 is a graph, where FIG. 42(a) is a graph showing the output current Iout of FIG. 40, FIG. 42(b) is a graph showing the output voltage Vout of FIG. 40, FIG. 42(c) is a graph showing the feedback terminal outflowing current IFB of FIG. 40, FIG. 42(d) is a graph showing the feedback control signal EAO inputted to the non-inverting input terminal of the comparator 34 of the intermittent oscillation control circuit 602f of FIG. 41, and the threshold voltages VR1 and VR2 inputted to the inverting input terminal of the comparator 34 of FIG. 41, FIG. 42(e) is a graph showing the triangle wave signal OSC generated by the low-frequency wave oscillator circuit 6023 of FIG. 41, FIG. 42(f) is a graph showing the intermittent oscillation control signal Enable generated by the intermittent oscillation control circuit 602f of FIG. 41, and FIG. 42(g) is a graph showing the current detection signal VIS inputted to the non-inverting input terminal of the turn-off control circuit 605 of FIG. 40, and the feedback control signal EAO inputted to the inverting input terminal of the turn-off control circuit 605 of FIG. 40 (See FIG. 34). As illustrated in FIG. 42(*e*), an upper limit Va2 and a lower limit Va1 of the triangle wave signal OSC vary according to the period signal PS. Therefore, as illustrated in FIG. 42(*f*), a length of an interval when the intermittent oscillation control signal Enable is the high level (an interval length of the oscillation interval) and a length of an interval when the intermittent oscillation control signal Enable is the low level (an interval length of the stop interval) vary. Accordingly, the cycle $T_I$ of intermittent oscillation vary according to the period signal PS (for example, referring to FIG. 42, the three cycles $T_I1$, $T_I2$ and $T_I3$ of intermittent oscillation differ from each other.).

According to the present embodiment, in a manner similar to that of the fifth embodiment, the distribution of the intermittent oscillation frequency $f_I$ can be dispersed broader than that of the prior art, the peak value of the drain current ID varies as compared with the prior art, and the peak value of the sound pressure intensity of the transformer 1 is lowered as compared with that of the prior art. Accordingly, the transformer sound is lowered as compared with that of the prior art.

According to the present embodiment, it is noted that the capacitor 55 is included within the low-frequency wave oscillator circuit 6023. However, the present invention is not limited thereto. For example, the capacitor 55 may be provided outside the control circuit 900. Accordingly, the intermittent oscillation frequency $f_I$ can be adjusted outside the control circuit 900 in accordance with specifications of the switching power supply device.

In addition, the intermittent oscillation control signal Enable is generated by using the triangle wave signal OSC from the low-frequency wave oscillator circuit 6023 upon controlling the intermittent oscillation. However, the present invention is not limited thereto. For example, the intermittent oscillation control signal Enable may be generated by using any oscillation signal such as a discrete oscillation signal from a count-up circuit.

First Modified Embodiment of the Sixth Embodiment

Figure 43:
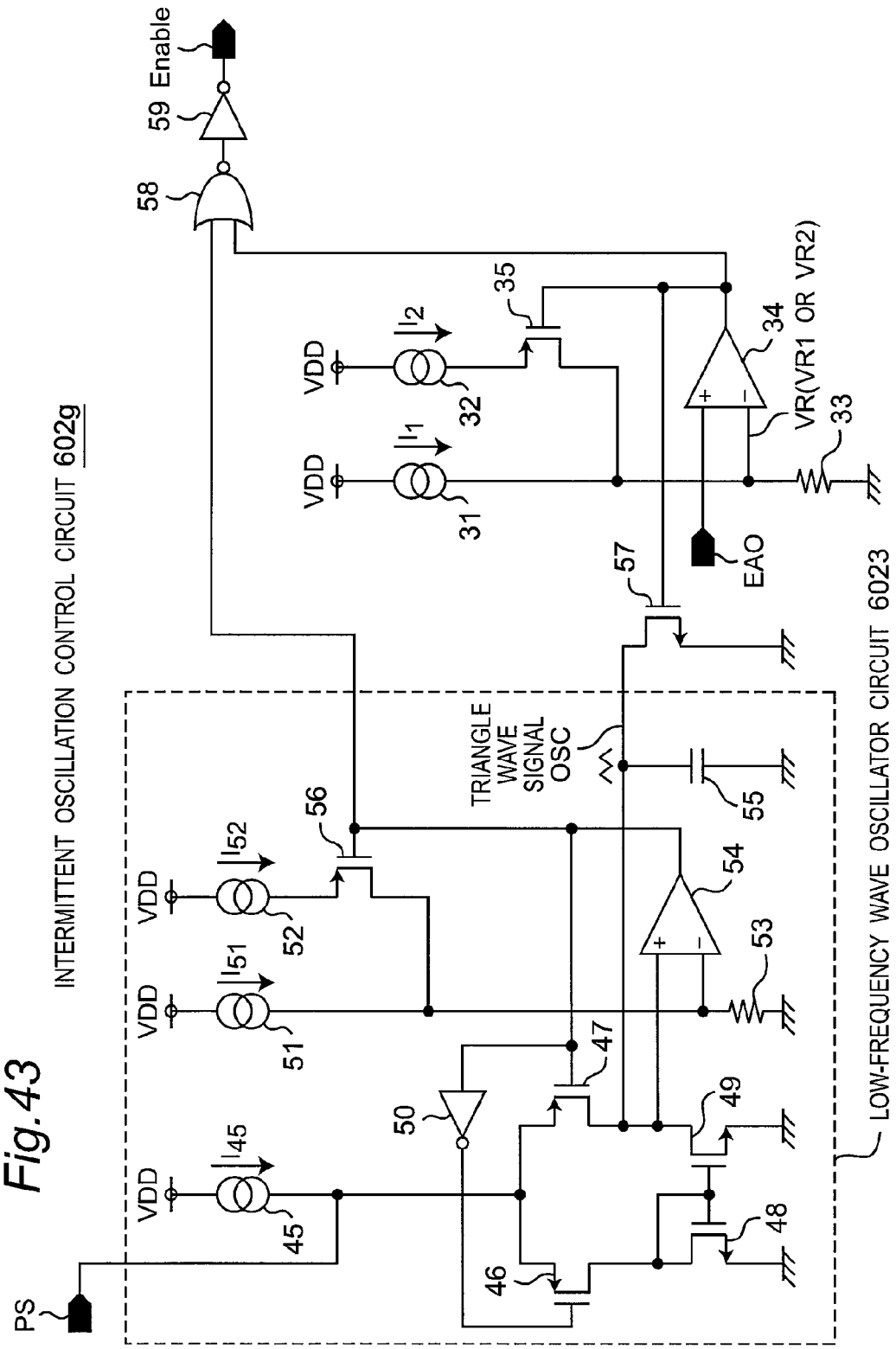
FIG. 43 is a circuit diagram of an intermittent oscillation control circuit 602g according to a first modified embodiment of the sixth embodiment of the present invention.

FIG. 43 is a circuit diagram of an intermittent oscillation control circuit 602*g* according to a first modified embodiment of the sixth embodiment of the present invention. Referring to FIG. 43, as compared with the intermittent oscillation control circuit 602*f* according to the sixth embodiment, the intermittent oscillation control circuit 602*g* is characterized in that the period signal PS is added to the constant current $I_{45}$. Accordingly, since a charge or discharge current of the capacitor 55 varies according to the period signal PS, a slope of the triangle wave signal OSC varies according to the period signal PS. That is, the intermittent oscillation control circuit 602*g* modulates a voltage change rate of triangle wave signal OSC with respect to time according to the period signal PS. Therefore, the length of the interval when the intermittent oscillation control signal Enable is the high level (the interval length of the oscillation interval) and the length of the interval when the intermittent oscillation control signal Enable is the low level (the interval length of the stop interval) vary. The present modified embodiment has the same effect as that of the sixth embodiment.

Second Modified Embodiment of the Sixth Embodiment

Figure 44:
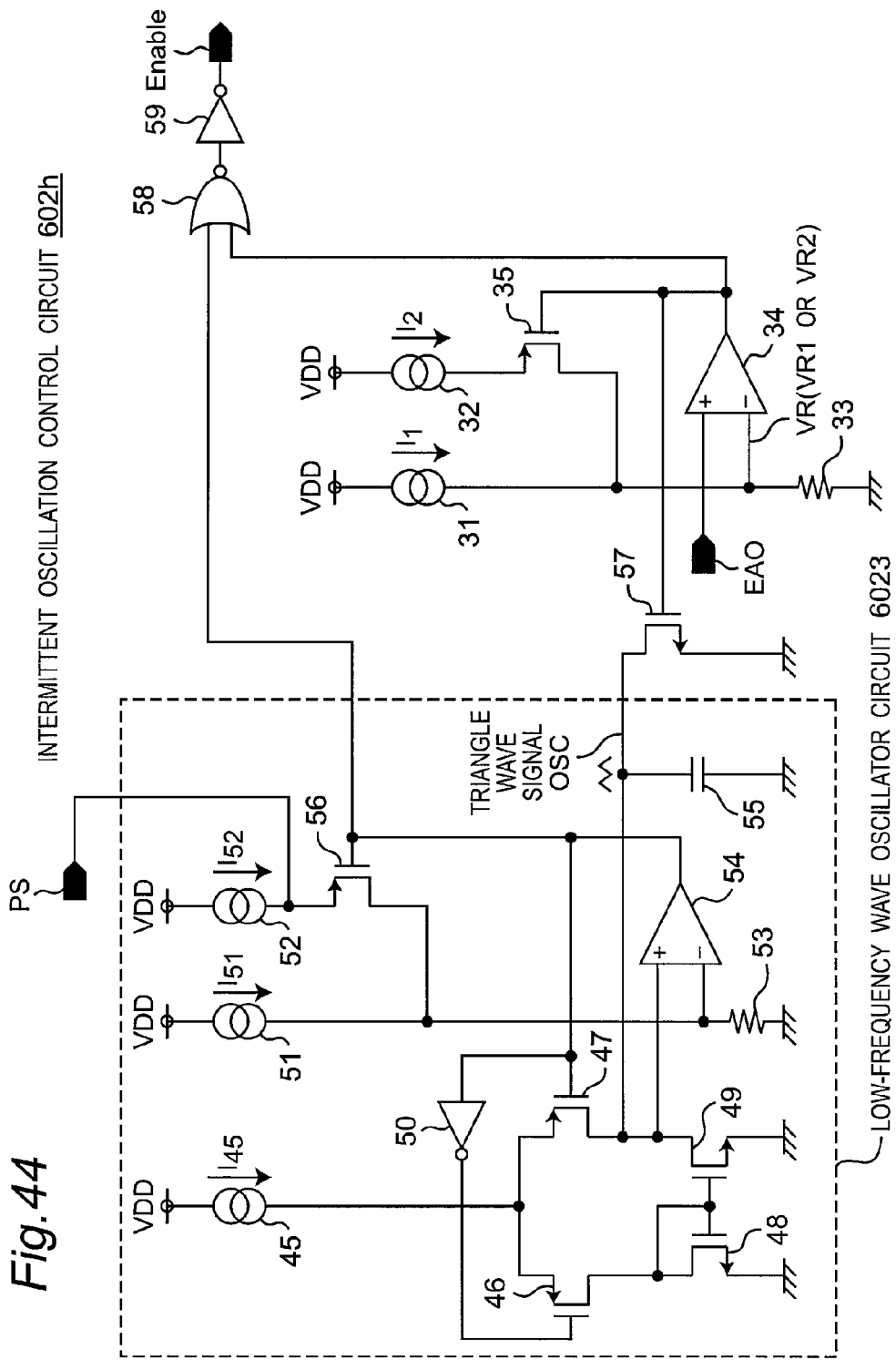
FIG. 44 is a circuit diagram of an intermittent oscillation control circuit 602h according to a second modified embodiment of the sixth embodiment of the present invention.

FIG. 44 is a circuit diagram of an intermittent oscillation control circuit 602*h* according to a second modified embodiment of the sixth embodiment of the present invention. Referring to FIG. 44, as compared with the intermittent oscillation control circuit 602*f* according to the sixth embodiment, the intermittent oscillation control circuit 602*h* according to the present modified embodiment is characterized in that the period signal PS is added to the constant current $I_{52}$. Accordingly, when the pMOS transistor 56 keeps turning on, the voltage inputted to the inverting input terminal of the comparator 54 varies according to the period signal PS. As a result, the upper limit of the triangle wave signal OSC varies according to the period signal PS. That is, the upper limit of the triangle wave signal OSC is modulated according to the period signal PS. The present modified embodiment has the same effect as that of the sixth embodiment.

Third Modified Embodiment of the Sixth Embodiment

Figure 45:
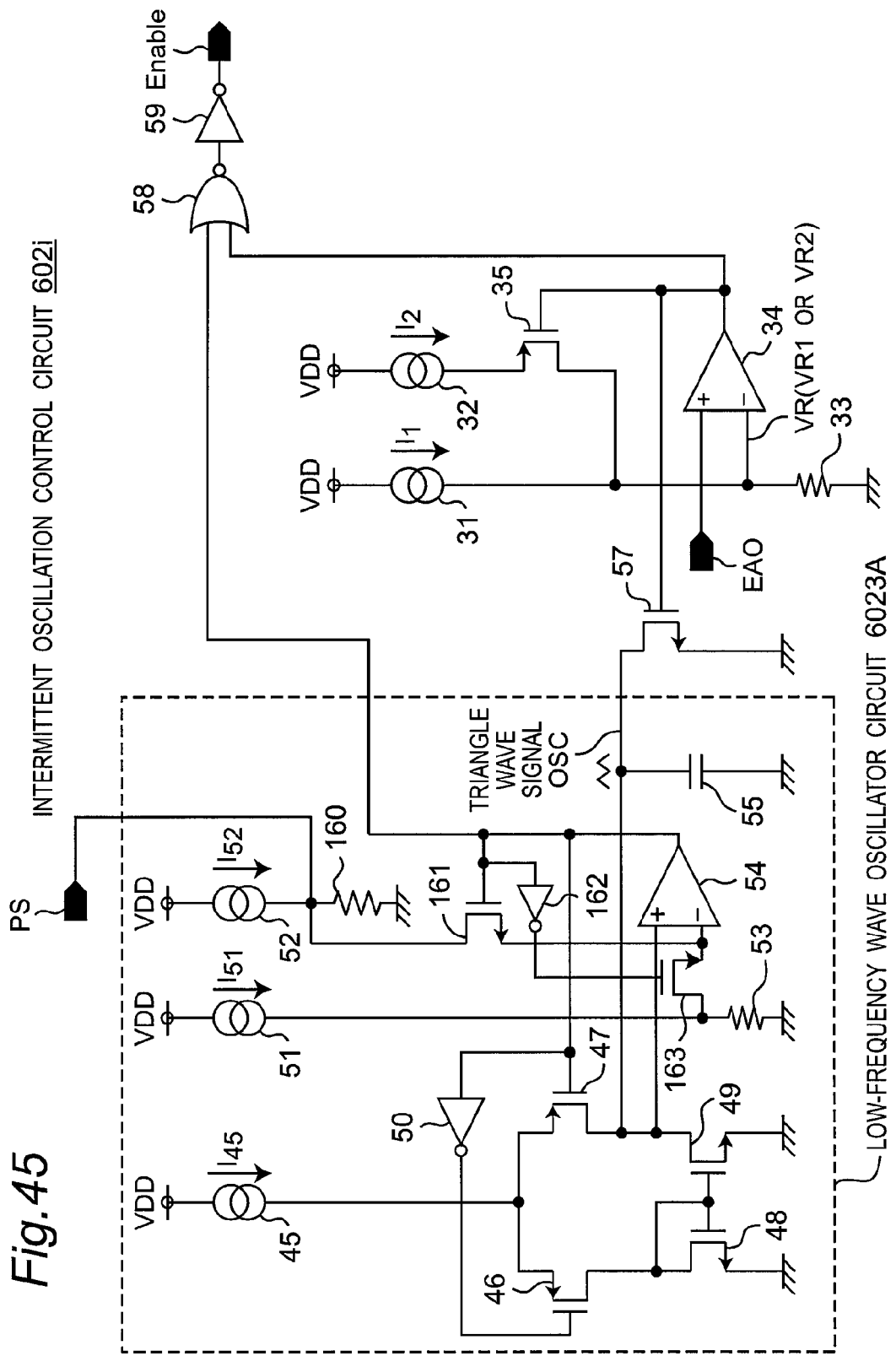
FIG. 45 is a circuit diagram of an intermittent oscillation control circuit 602i according to a third modified embodiment of the sixth embodiment of the present invention.

FIG. 45 is a circuit diagram of an intermittent oscillation control circuit 602*i* according to a third modified embodiment of the sixth embodiment of the present invention. Referring to FIG. 45, as compared with the intermittent oscillation control circuit 602*f* according to the sixth embodiment, there is such a difference that the intermittent oscillation control circuit 602*i* is included a low-frequency wave oscillator circuit 6023A instead of the low-frequency wave oscillator circuit 6023. As compared with the low-frequency wave oscillator circuit 6023, there is such a difference that the low-frequency wave oscillator circuit 6023A further includes nMOS transistors 161 and 163, an inverter 162, and a resistor 160, and that the low-frequency wave oscillator circuit 6023A does not include the pMOS transistor 56.

Referring to FIG. 45, the nMOS transistor 163 is connected to a connection point between the constant current source 51 and the resistor 53, and the inverting input terminal of the comparator 54. In addition, the nMOS transistor 161 is connected to a connection point between the constant current source 52 and the resistor 160 having one end connected to the ground, and the inverting input terminal of the comparator 54. Further, the output signal from the comparator 54 is outputted to the a gate of the nMOS transistor 161, and the output signal from the comparator 54 is outputted to a gate of the nMOS transistor 163 via the inverter 162. Then, the period signal PS is added to the constant current $I_{52}$. In this case, a voltage of the connection point between the constant current source 51 and the resistor 53 is set to be higher than a voltage of the connection point between the constant current source 52 and the resistor 160.

Therefore, according to the present modified embodiment, when the pMOS transistor 56 keeps turning on, the voltage inputted to the inverting input terminal of the comparator 54 varies according to the period signal PS. As a result, the lower limit of the triangle wave signal OSC varies according to the period signal PS. That is, the lower limit of the triangle wave signal OSC is modulated according to the period signal PS. The present modified embodiment has the same effect as that of the sixth embodiment.

Seventh Embodiment

Figure 46:
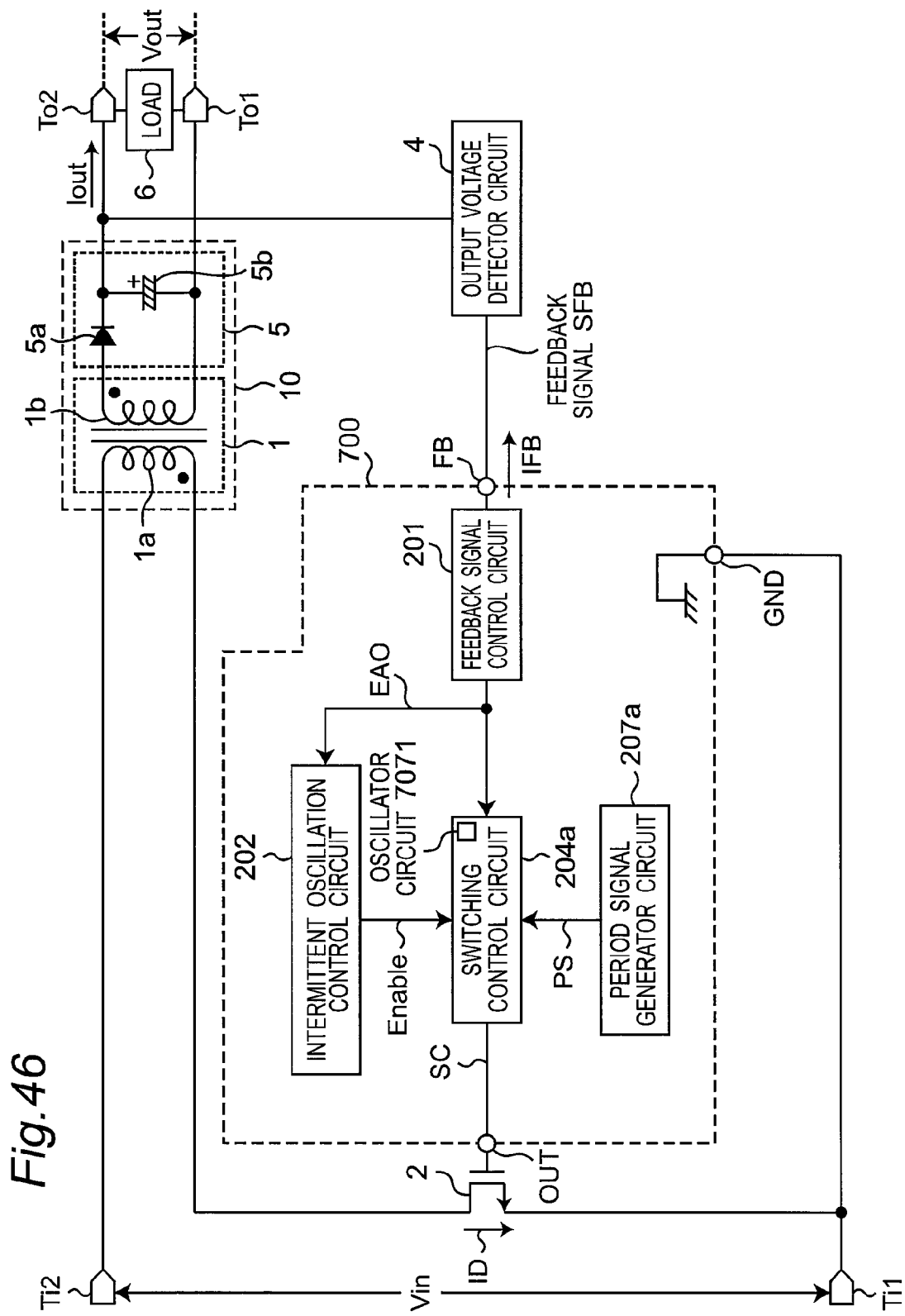
FIG. 46 is a block diagram showing a configuration of the switching power supply device provided with a control circuit 700 according to a seventh embodiment of the present invention.
Figure 47:
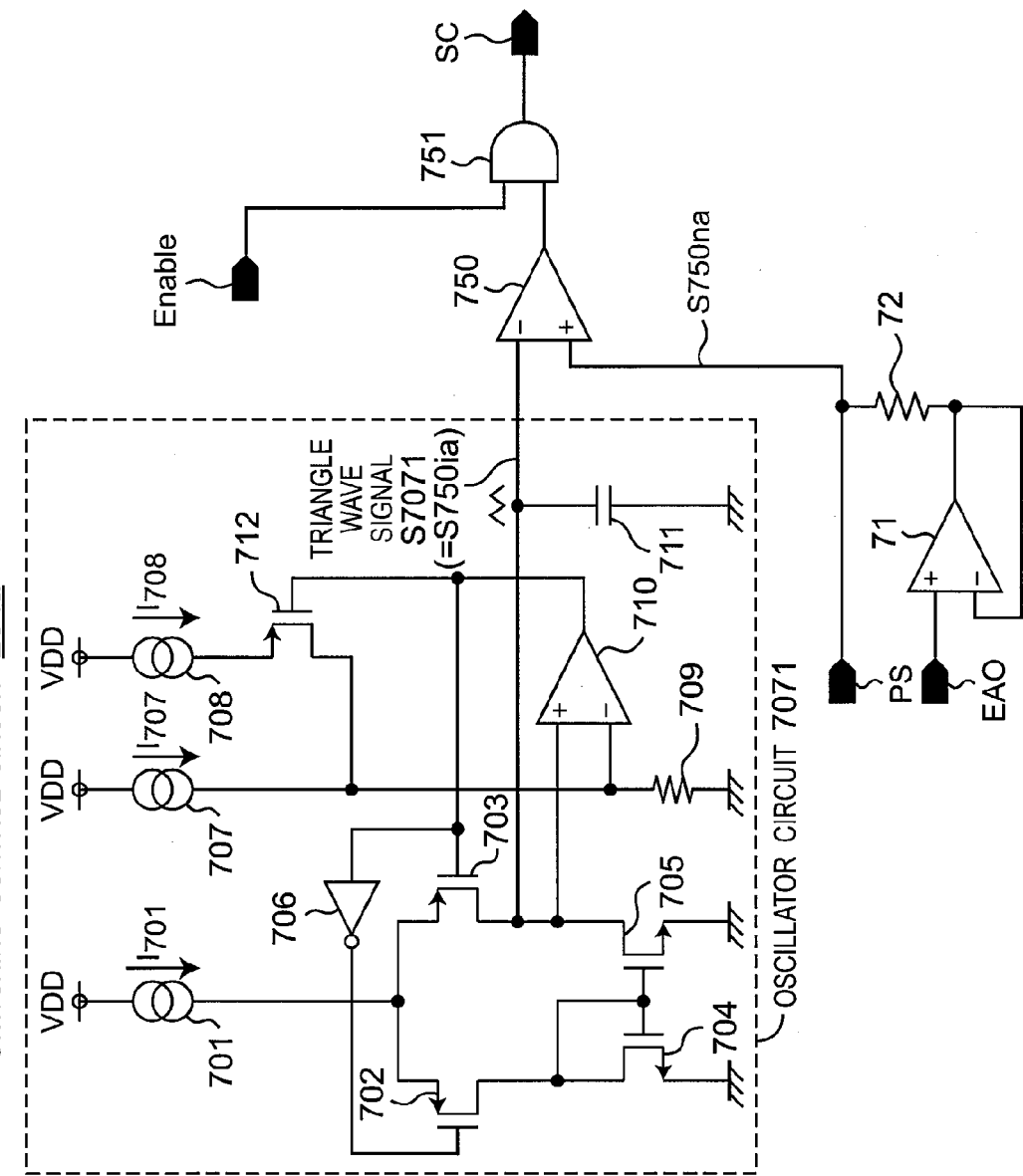
FIG. 47 is a circuit diagram of a switching control circuit 204a of FIG. 46.

FIG. 46 is a block diagram showing a configuration of a switching power supply device provided with a control circuit 700 according to a seventh embodiment of the present invention, and FIG. 47 is a circuit diagram of a switching control circuit 204*a* of FIG. 46. Referring to FIG. 46, as compared with the switching power supply according to the first embodiment, there is such a difference that the switching power supply device according to the present embodiment includes the control circuit 700 instead of the control circuit 200, and that the switching power supply device according to the present embodiment does not include the drain current detection resistor 3. In each of the embodiments as described above, the control circuits 200, 300, 400, 400A, 500, 600, and 900 perform the current mode Pulse Width Modulation control, which controls the switching operation of the switching element 2 based on the output voltage Vout and the drain current ID. In contrast, the control circuit 700 according to the present embodiment performs a voltage mode Pulse Width Modulation control, which controls the switching operation of the switching element 2 based on the output voltage Vout.

Referring to FIG. 46, the control circuit 700 is configured to include the feedback signal control circuit 201, the period signal generator circuit 207a, the intermittent oscillation control circuit 202, and the switching control circuit 204a. The feedback signal control circuit 201 generates the feedback control signal EAO, and the feedback signal control circuit 201 outputs the feedback control signal EAO to the intermittent oscillation control circuit 202 and the switching control circuit 204a, in a manner similar to that of the first embodiment. In addition, the intermittent oscillation control circuit 202 generates the intermittent oscillation control signal Enable, outputs the intermittent oscillation control signal Enable to the switching control circuit 204a, in a manner similar to that of the first embodiment. Further, the period signal generator circuit 207a generates the period signal PS, and outputs the period signal PS to the switching control circuit 204a, in a manner similar to that of the first embodiment.

In addition, referring to FIG. 47, the switching control circuit 204a is configured to include an oscillator circuit 7071 for generating a triangle wave signal S7071, the operational amplifier 71, the resistor 72, a comparator 750, and an AND gate 751. The oscillator circuit 7071 is configured to include constant current sources 701, 707, and 708 for respectively outputting predetermined constant currents $I_{701}$, $I_{707}$, and $I_{708}$, an inverter 706, a comparator 710, a resistor 709, a capacitor 711, pMOS transistors 702, 703, and 712, and nMOS transistors 704 and 705 for constituting the current mirror circuit, in a manner similar to that of the low-frequency wave oscillator circuit 2071 of FIG. 6. The triangle wave signal S7071 is inputted to an inverting input terminal of the comparator 750 as an input signal S750ia. In addition, the feedback control signal EAO is impedance-converted by the operational amplifier 71 to be outputted to the resistor 72. On the other hand, the period signal PS flows through the resistor 72 as a current signal. Accordingly, the period signal PS is added to the signal corresponding to the feedback control signal EAO, and the added signal is inputted to a non-inverting input terminal of the comparator 750 as an input signal S750na.

Further, referring to FIG. 47, the intermittent oscillation control signal Enable is inputted to a first input terminal of the AND gate 751, and an output signal from the comparator 750 is inputted to a second input terminal of the AND gate 751. Then, an output signal from the AND gate 751 is outputted to the gate of the switching element 2 via the output terminal OUT as the switching control signal SC.

Therefore, according to the present embodiment, the switching control circuit 204a varies the timing of generating the switching control signal SC by generating the input signal S750na by modulating the feedback control signal EAO according to the period signal PS. As a result, since the peak value IDP of the current flowing through the switching element 2 varies, the distribution of the intermittent oscillation frequency $f_I$ can be dispersed. Accordingly, even if the variation of the load 6 is relatively small upon controlling the intermittent oscillation, the distribution of the intermittent oscillation frequency $f_I$ can be dispersed, and therefore, the transformer sound from the transformer 1 can be lowered as compared with that of the prior art.

First Modified Embodiment of the Seventh Embodiment

Figure 48:
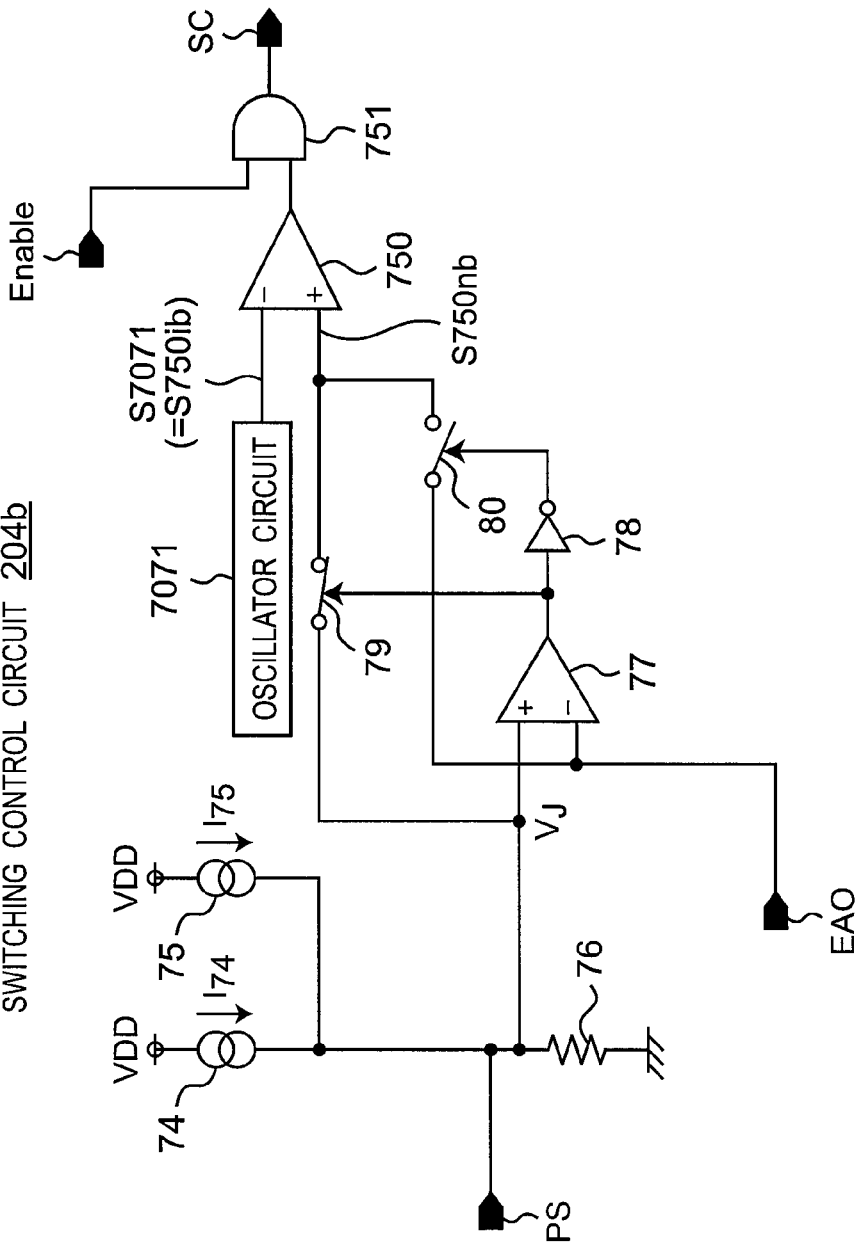
FIG. 48 is a circuit diagram of a switching control circuit 204b according to a first modified embodiment of the seventh embodiment of the present invention.

FIG. 48 is a circuit diagram of a switching control circuit 204b according to a first modified embodiment of the seventh embodiment of the present invention. Referring to FIG. 48, as compared with the switching control circuit 204a according to the seventh embodiment, a method for generating the input signal S705nb inputted to the non-inverting input terminal of the comparator 750 of the switching control circuit 204b according to the present modified embodiment is different from that of the switching control circuit 204a.

Referring to FIG. 48, the switching control circuit 204b is configured to include the oscillator circuit 7071, the comparator 750, the AND gate 751, the constant current sources 74 and 75 for respectively outputting the predetermined constant currents $I_{74}$ and $I_{75}$, the resistor 76, the comparator 77, the inverter 78, and the switches 79 and 80 such as the nMOS transistors or the transmission gate circuits. In this case, a circuit connected to the non-inverting input terminal of the comparator 750 is identical with a circuit connected to the inverting input terminal of the comparator 73 of FIG. 12, and an input signal S750nb, which is identical with the input signal S73ib inputted to the inverting input terminal of the comparator 73 of FIG. 12, is inputted to the non-inverting input terminal of the comparator 750.

According to present modified embodiment, during the normal operation, the switch 80 is turned on, and thereafter, the comparator 750 compares the triangle wave signal S7071 with the feedback control signal EAO. Therefore, the switching control circuit 204b generates the switching control signal SC without any affection by the period signal PS. Accordingly, as compared with the seventh embodiment, since the drain current peak value IDP during the normal operation is not affected by the period signal PS, there is no possibility that the feedback control becomes unstable.

In addition, during the intermittent oscillation control, the switch 79 is turned on, and thereafter, the comparator 750 compares the triangle wave signal S7071 with the voltage $V_J$, where the voltage $V_J$ is obtained by multiplying a current obtained by adding the constant currents $I_{74}$ and $I_{75}$ to the period signal PS by the resistance value of the resistor 76. Therefore, a lower limit (the limit value) of a voltage level of the input signal S750nb inputted to the non-inverting input terminal of the comparator 750 is set to the voltage $V_J$, and therefore, the drain current peak value IDP is set to a lower limit corresponding to the voltage $V_J$. Further, since the voltage $V_J$ varies in a manner similar to that of the period signal PS (that is, the voltage $V_J$ is modulated according to the period signal PS), the lower limit of the drain current peak value IDP is modulated according to the period signal PS.

Therefore, according to the present modified embodiment, since the lower limit of the drain current peak value IDP of the switching element 2 upon controlling the intermittent oscillation is modulated according to the period signal PS, for example, even if the variation of the load 6 is small during the standby state of the switching power supply device, the distribution of the intermittent oscillation frequency $f_I$ can be dispersed in a manner similar to that of the first embodiment, and the transformer sound from the transformer 1 can be reduced without making the power supply efficiency worse than that of the prior art. Further, as compared with the seventh embodiment, the drain current peak value IDP is not affected by the period signal PS during the normal operation, and therefore, there is no possibility that the feedback control becomes unstable.

Second Modified Embodiment of the Seventh Embodiment

Figure 49:
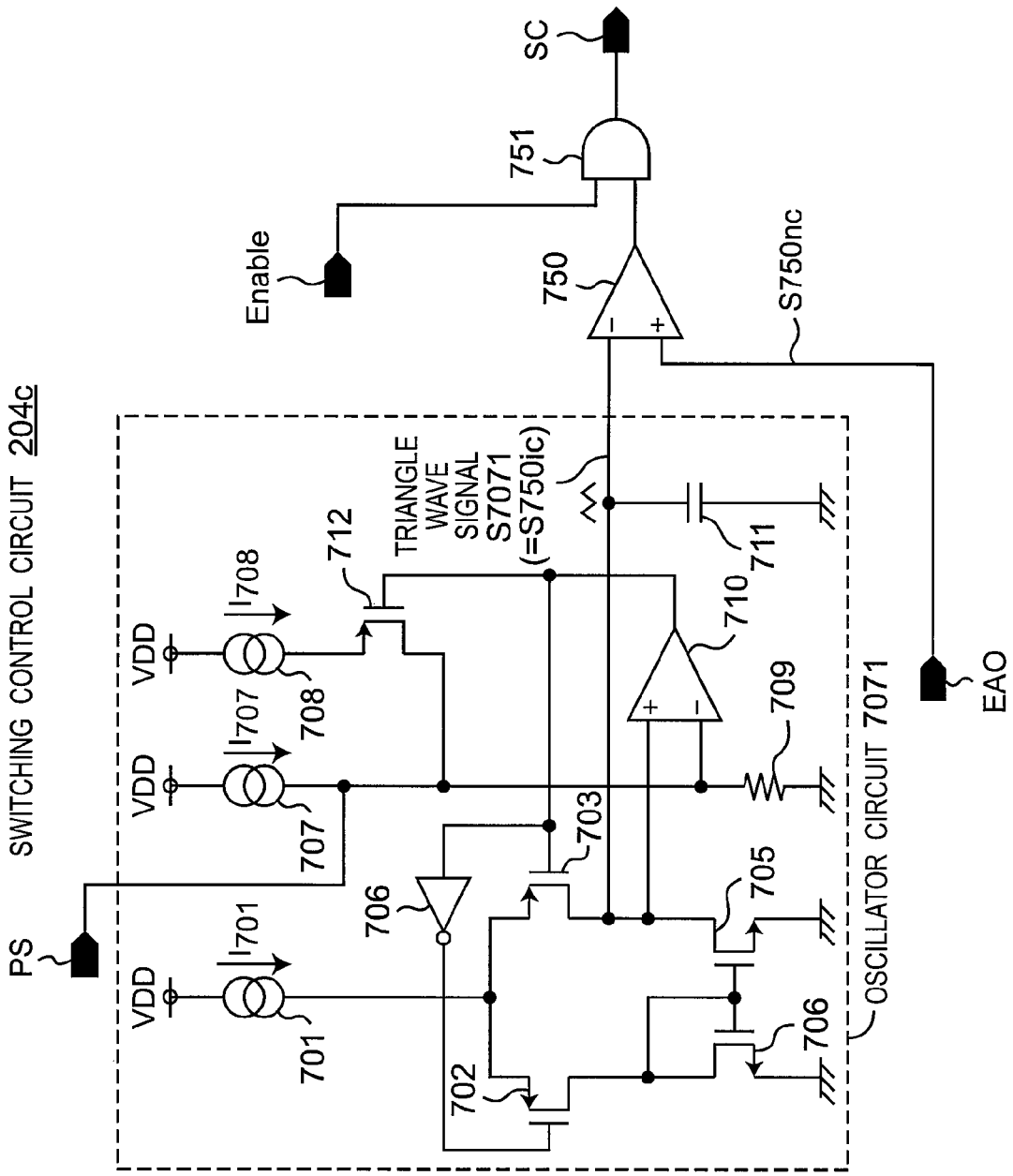
FIG. 49 is a circuit diagram of a switching control circuit 204c according to a second modified embodiment of the seventh embodiment of the present invention.

FIG. 49 is a circuit diagram of a switching control circuit 204c according to a second modified embodiment of the seventh embodiment of the present invention. Referring to FIG. 49, as compared with the switching control circuit 204a according to the seventh embodiment, the switching control circuit 204c differs from the switching control circuit 204a in that the feedback control signal EAO is inputted to the non-inverting input terminal of the comparator 750 as an input signal S750nc, and that the period signal PS is added to the constant current $I_{707}$.

Referring to FIG. 49, since the period signal PS is added to the constant current $I_{707}$ from a constant current source 707, when the pMOS transistor 712 keeps turning on or turning off, a voltage inputted to the inverting input terminal of the comparator 710 varies according to the period signal PS. As a result, an upper limit and a lower limit of the triangle wave signal S7071 vary according to the period signal PS. That is, the upper limit and the lower limit of the triangle wave signal S7071 are modulated according to the period signal PS. Therefore, a length of an interval when the switching control signal SC is the high level (a length of an interval when the switching element 2 is turned on.) and a length of an interval when the switching control signal SC is the low level (a length of an interval when the switching element 2 is turned off.) vary. Accordingly, the cycle $T_f$ of intermittent oscillation varies according to the period signal PS. The present modified embodiment has the same effect as that of the seventh embodiment.

It is noted that, in the present embodiment, the switching control circuit 204c modulates the upper limit and the lower limit of the triangle wave signal S7071 according to the period signal PS. However, the present invention is not limited thereto. For example, only the upper limit of the triangle wave signal S7071 may be modulated according to the period signal PS by adding the period signal PS to the constant current $I_{708}$. In addition, only the lower limit of the triangle wave signal S7071 may be modulated according to the period signal PS. In this case, a first series-connected circuit of a constant current source and a resistor for setting a first reference voltage inputted to the inverting input terminal of the comparator 710, a second series-connected circuit of a constant current source and a resistor for setting a second reference voltage higher than the first reference voltage, and a switch circuit for inputting the first reference voltage or the second reference voltage to the inverting input terminal of the comparator 710 in response to the output signal from the comparator 710 may be included, and therefore, the period signal PS may be outputted to a connection point between the constant current source of the first series-connected circuit and the resistor (for example, the circuit connected to the inverting input terminal of the comparator 54 of FIG. 45 has the same configuration as the configuration described above.).

Third Modified Embodiment of the Seventh Embodiment

Figure 50:
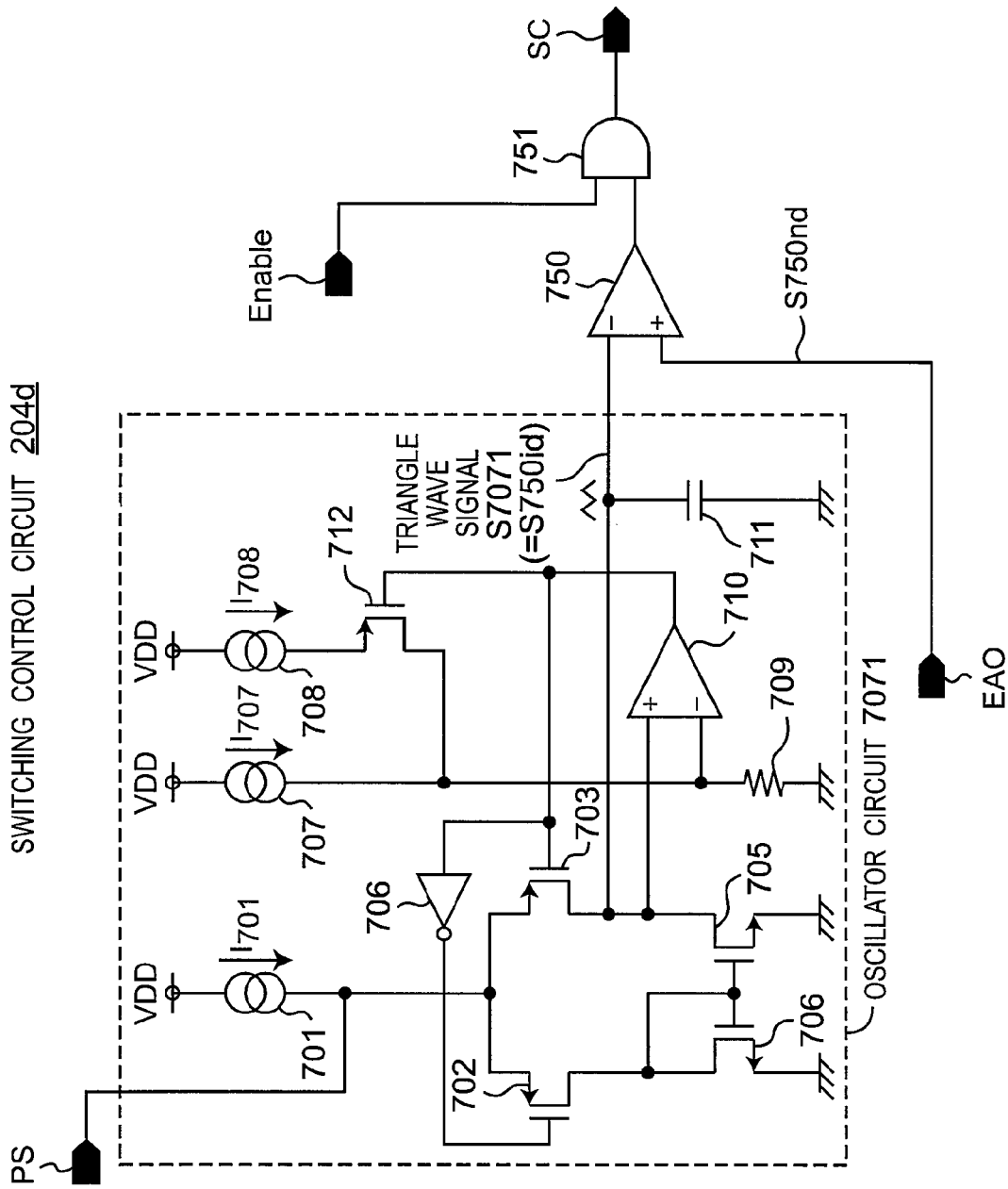
FIG. 50 is a circuit diagram of a switching control circuit 204d according to a third modified embodiment of the seventh embodiment of the present invention.

FIG. 50 is a circuit diagram of a switching control circuit 204d according to a third modified embodiment of the seventh embodiment of the present invention. Referring to FIG. 50, as compared with the switching control circuit 204a according to the seventh embodiment, the switching control circuit 204d according to the present modified embodiment differs from the switching control circuit 204a in that the feedback control signal EAO is inputted to the non-inverting input terminal of the comparator 750 as an input signal S750nd, and the period signal PS is added to the constant current $I_{701}$. Accordingly, since a charge or discharge current of the capacitor 711 varies according to the period signal PS, a slope of the triangle wave signal S7071 varies according to the period signal PS. That is, the switching control circuit 204d modulates a voltage change rate of triangle wave signal S7071 with respect to time according to the period signal PS. Therefore, the length of the interval when the switching control signal SC is the high level (the length of the interval when the switching element 2 is turned on.) and the length of the interval when the switching control signal SC is the low level (the length of the interval when the switching element 2 is turned off.) vary. Accordingly, the cycle $T_1$ of intermittent oscillation varies according to the period signal PS. The present embodiment has the same effect as that of the seventh embodiment.

Fourth Modified Embodiment of the Seventh Embodiment

Figure 51:
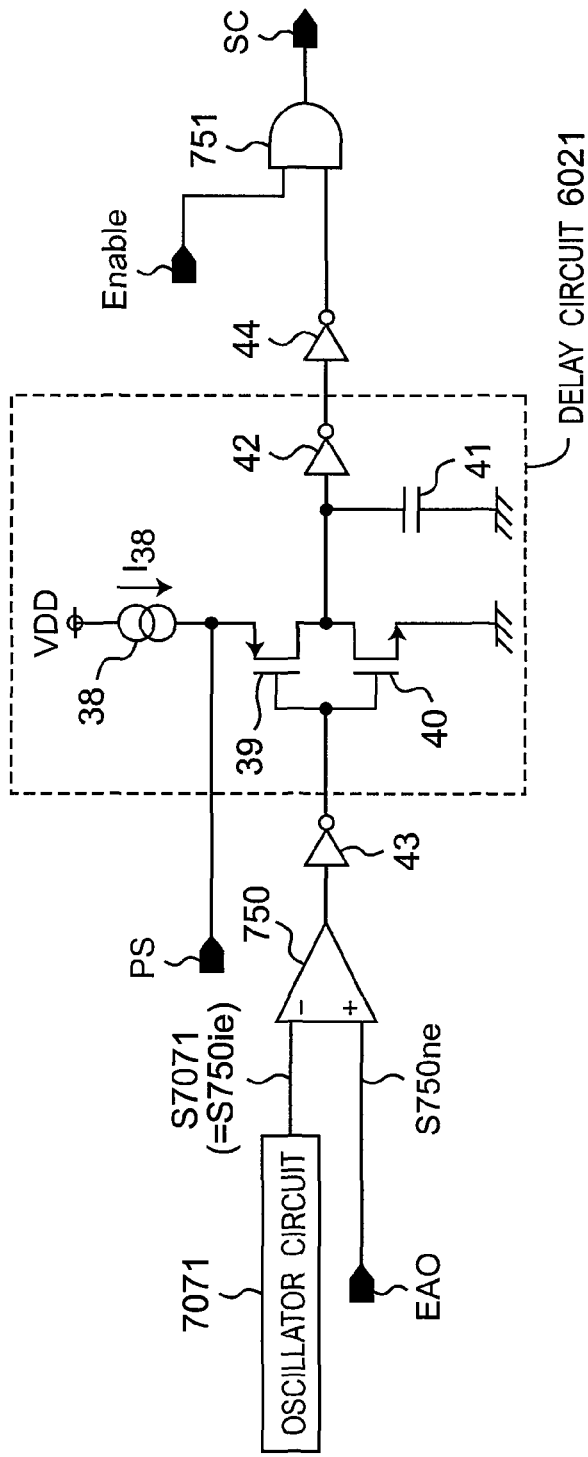
FIG. 51 is a circuit diagram of a switching control circuit 204e according to a fourth modified embodiment of the seventh embodiment of the present invention.

FIG. 51 is a circuit diagram of a switching control circuit 204e according to a fourth modified embodiment of the seventh embodiment of the present invention. As compared with the switching control circuit 204a according to the seventh embodiment, the switching control circuit 204e differs from the switching control circuit 204a in that the feedback control signal EAO is inputted to the non-inverting input terminal of the comparator 750 as an input signal S750ne, and that the delay circuit 6021 is inserted between the comparator 750 and the AND gate 751.

Referring to FIG. 51, the switching control circuit 204e is configured to include the oscillator circuit 7071, the comparator 750, the delay circuit 6021, the inverters 43 and 44, and the AND gate 751. In this case, the triangle wave signal S7071 from the oscillator circuit 7071 is inputted to the inverting input terminal of the comparator 750 as an input signal S750ie, and the feedback control signal EAO is inputted to the non-inverting input terminal of the comparator 750 as the input signal S750ne. The output signal from the comparator 750 is outputted to the AND gate 751 via the inverter 43, the delay circuit 6021, which has the same configurations as those of the delay circuit 6021 of FIG. 37, and inverter 44. In addition, the period signal PS is added to the constant current $I_{38}$ from the constant current source 38, and the added signal is outputted to the source of the pMOS transistor 39.

Then, an operation of the switching control circuit 204e is described. When the comparator 750 outputs the output signal having the high level for turning on the switching element 2, the pMOS transistor 39 is turned on. Thereafter, the charge current obtained by adding the current corresponding to the period signal PS to the constant current $I_{82}$ flows through the capacitor 41, and thereafter, when the output signal from the inverter 42 is inverted, the output signal having the high level is outputted from the inverter 74. That is, when the voltage level of the intermittent oscillation control signal Enable is the high level, after the voltage level of the output signal from the comparator 750 has changed from the low level to the high level, the high level switching control signal SC is delayed by the delay time corresponding to the capacitance of the capacitor 41 and the charge current, and the delayed switching control signal SC having the high level is outputted. Accordingly, when the voltage level of the triangle wave signal S7071 falls below the voltage level of the feedback control signal EAO, the OFF-state of the switching element 2 continues only during the delay time as described above, and thereafter, the switching element 2 is turned on.

Referring to FIG. 51, since the charge current of the capacitor 41 varies according to the period signal PS, the delay time of the delay circuit 6021 varies according to the period signal PS. That is, the delay time of the delay circuit 6021 is modulated according to the period signal PS. Accordingly, since a start timing of the ON-interval of the switching element 2 varies according to the period signal PS upon controlling the intermittent oscillation, the cycle $T_f$ of intermittent oscillation varies according to the period signal PS. The present modified embodiment has the same effect as that of the seventh embodiment.

Fifth Modified Embodiment of the Seventh Embodiment

Figure 52:
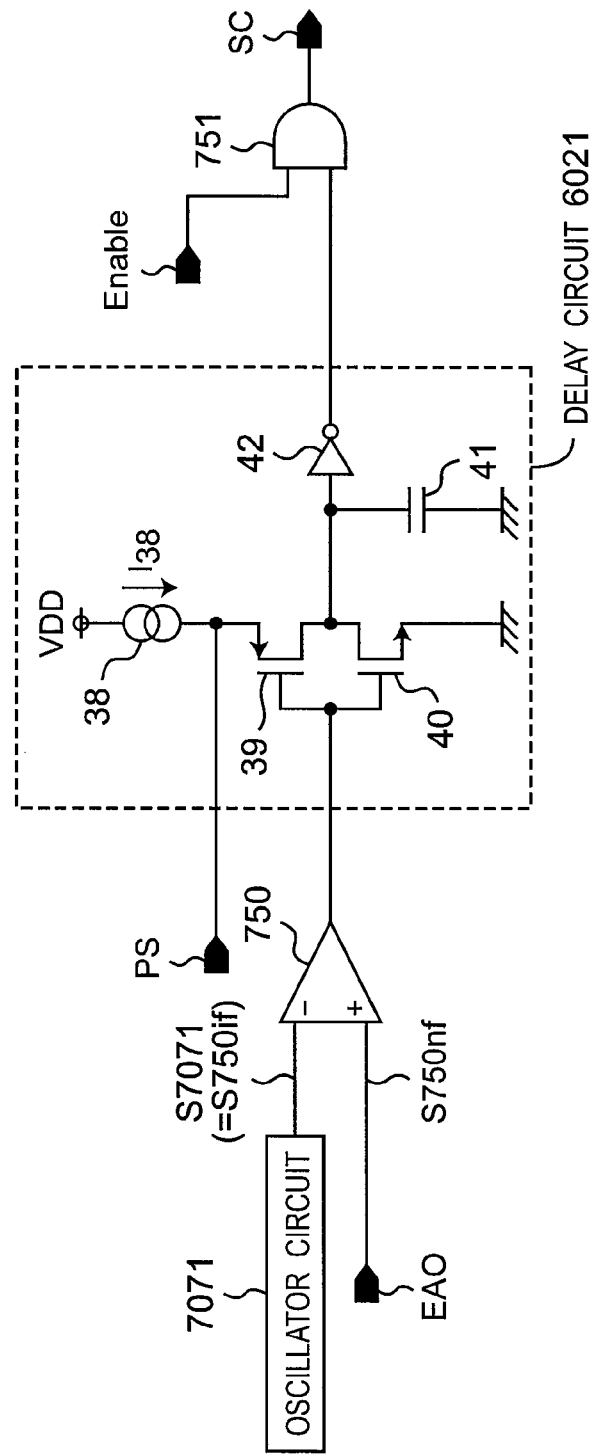
FIG. 52 is a circuit diagram of a switching control circuit 204f according to a fifth modified embodiment of the seventh embodiment of the present invention.

FIG. 52 is a circuit diagram of a switching control circuit 204f according to a fifth modified embodiment of the seventh embodiment of the present invention. Referring to FIG. 52, as compared with the switching control circuit 204e according to the fourth modified embodiment of the seventh embodiment, there is such a difference that the switching control circuit 204f does not include the inverters 43 and 44.

Referring to FIG. 52, when the comparator 750 outputs an output signal having the low level for turning off the switching element 2, the pMOS transistor 39 is turned on. Thereafter, the charge current obtained by adding the current corresponding to the period signal PS to the constant current $I_{38}$ flows through the capacitor 41, and thereafter, when the output signal from the inverter 42 is inverted, the output signal having the high level is outputted from the inverter 74. That is, when the voltage level of the intermittent oscillation control signal Enable is the high level, after the voltage level of the output signal from the comparator 750 has changed from the high level to the low level, the low level switching control signal SC is delayed by the delay time corresponding to the capacitance of the capacitor 41 and the charge current, the delayed switching control signal SC having the low level is outputted. Accordingly, when the voltage level of the triangle wave signal S7071 becomes higher than the voltage level of the feedback control signal EAO, an ON-state of the switching element 2 continues only during the delay time as described above, and thereafter, the switching element 2 is turned off.

Referring to FIG. 52, since the charge current of the capacitor 41 varies according to the period signal PS, the delay time of the delay circuit 6021 also varies according to the period signal PS. That is, the delay time of the delay circuit 6021 is modulated according to the period signal PS. Accordingly, since the end timing of the ON-interval of the switching element 2 varies according to the period signal PS upon controlling the intermittent oscillation, the cycle $T_I$ of intermittent oscillation varies according to the period signal PS. The present modified embodiment has the same effect as that of the seventh embodiment.

Eighth Embodiment

Figure 53:
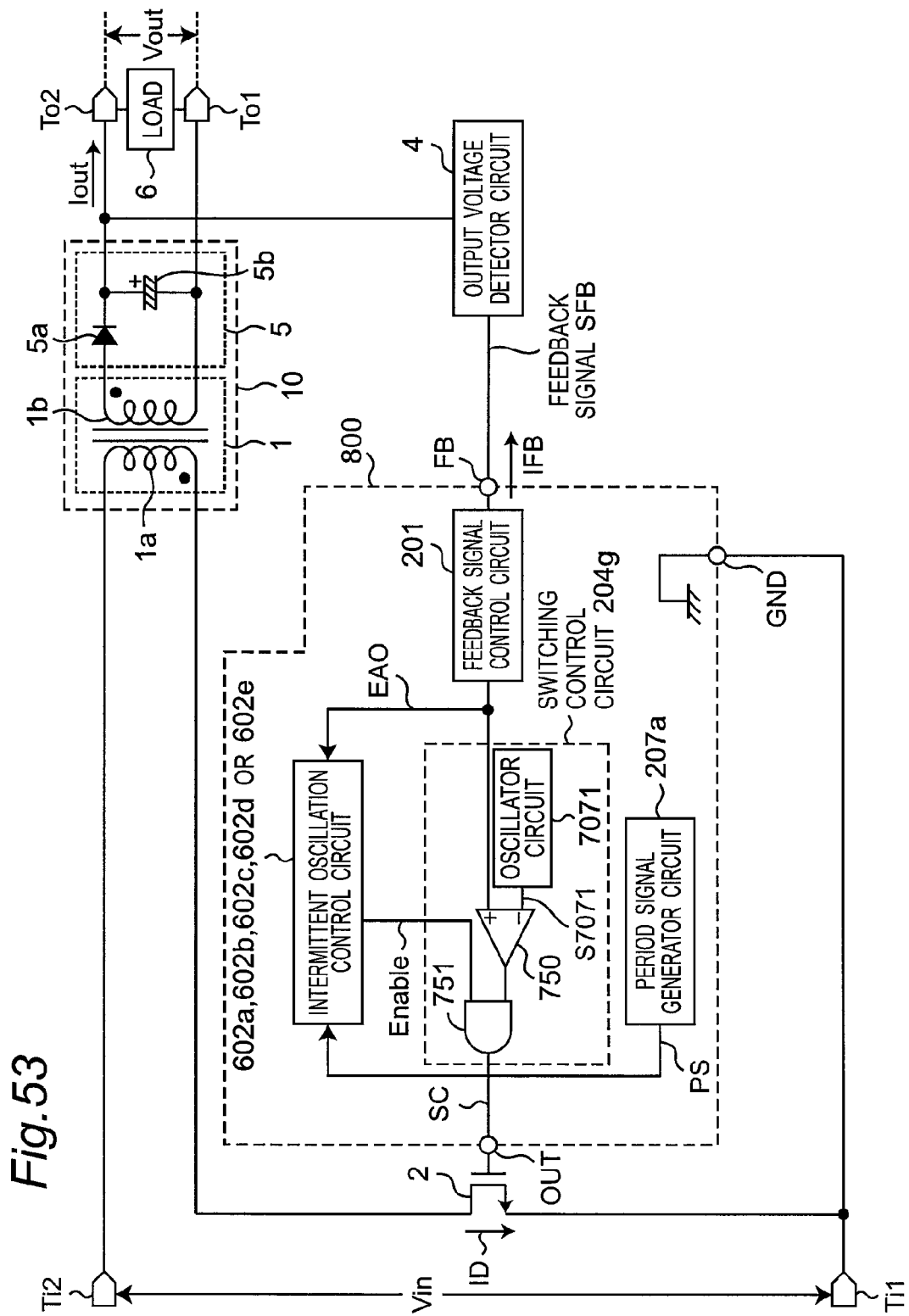
FIG. 53 is a block diagram showing a configuration of the switching power supply device provided with a control circuit 800 according to the eighth embodiment of the present invention.

FIG. 53 is a block diagram showing a configuration of a switching power supply device provided with a control circuit 800 according to the eighth embodiment of the present invention. Referring to FIG. 53, as compared with the switching power supply device according to the seventh embodiment (See FIG. 46), there is such a difference that the switching power supply device according to the present embodiment is provided with the control circuit 800 instead of the control circuit 700. In addition, as compared with the control circuit 700, the control circuit 800 is configured to include a switching control circuit 204g instead of the switching control circuit 204a, and the intermittent oscillation control circuit 602a, 602b, 602c, 602d, or 602e according to the fifth embodiment and the modified embodiment thereof, instead of the intermittent oscillation control circuit 202.

Referring to FIG. 53, the switching control circuit 204g is configured to include the oscillator circuit 7071 for generating the triangle wave signal S7071, the comparator 750, and the AND gate 751. The feedback control circuit 201 generates the feedback control signal EAO, and the feedback control circuit 201 outputs the feedback control signal EAO to the intermittent oscillation control circuit 602a, 602b, 602c, 602d, or 602e, and the non-inverting input terminal of the comparator 750. In addition, the oscillator circuit 7071 outputs the triangle wave signal S7071 to the inverting input terminal of the comparator 750. The output signal from the comparator 750 is outputted to the first input terminal of the AND gate 751. On the other hand, the period signal generator circuit 207a generates the period signal PS, and the period signal generator circuit 207a outputs the period signal PS to the intermittent oscillation control circuit 602a, 602b, 602c, 602d, or 602e. Then, the intermittent oscillation control circuit 602a, 602b, 602c, 602d, or 602e generates the intermittent oscillation control signal Enable, and outputs the intermittent oscillation control signal Enable to the second input terminal of the AND gate 751. The output signal from the AND gate 751 is outputted to the gate of the switching element 2 via the output terminal OUT as the switching control signal SC. The present embodiment has the same effect as that of the fifth embodiment and each of the modified embodiments thereof.

In the fourth modified embodiment of the first embodiment, it is noted that the amount of variation of the peak value IDP of the current flowing through the switching element 2 is controlled to be smaller as the output voltage is lowered (that is, the output power becomes larger). However, the present invention is not limited thereto. For example, in the other modified embodiments of the first embodiment, the second to fourth embodiments and the modified embodiment thereof, and the seventh embodiment and the modified embodiments thereof, the amount of variation of the peak value IDP of the current flowing through the switching element 2 may be controlled to be smaller as the output voltage is lowered (that is, the output power becomes larger).

In addition, in the fourth embodiment, the peak value IDP of the current flowing through the switching element 2 varies only during the predetermined delay time from the start timing of the oscillation interval. However, the present invention is not limited thereto. For example, in the first to third, and seventh embodiments and the modified embodiments thereof, the peak value IDP of the current flowing through the switching element 2 may vary only during the predetermined delay time from the start timing of the oscillation interval, or in the first to third, seventh embodiments, and the modified embodiments thereof, the peak value IDP of the current flowing through the switching element 2 may vary during the interval from the start timing of the oscillation interval to the timing when the switching element 2 is controlled to be turned on and off the predetermined number of times.

Further, in the first to third embodiments and each of the modified embodiments thereof, and the fifth to eighth embodiments and each of the modified embodiments thereof as described above, the period signal generator circuit 207a, 207b, 307, 407a, or 407b, which generates the period signal PS so that the frequency, the local maximum value of the amplitude, and the local minimum value of the amplitude for each of cycle intervals of the period signal are respectively constant by repeating the predetermined pattern signal with the period signal frequency $f_c$, is used. However, the present invention is not limited thereto, for example, either of the period signal generator circuit 207a, 207b, 307, 407a, 407b, or 507 may be used. In this case, as described in the first embodiment, when the period signal generator circuit 207a, 207b, 307, 407a, or 407b is used, the period signal frequency $f_c$ is set to a frequency lower than the intermittent oscillation frequency $f_I$, or the period signal frequency $f_c$ is set to a frequency, which is higher than the intermittent oscillation frequency $f_I$ and other than integral multiples of the intermittent oscillation frequency $f_I$, and the phase difference of the period signal PS with respect to the intermittent oscillation control signal Enable is set so that the distribution of the intermittent oscillation frequency $f_I$ can be dispersed. In addition, when the period signal generator circuit 507 according to the fourth embodiment is used, the period signal frequency $f_c$ and the phase difference of the period signal PS with respect to the intermittent oscillation control signal Enable are not constrained.

Ninth Embodiment

Figure 54:
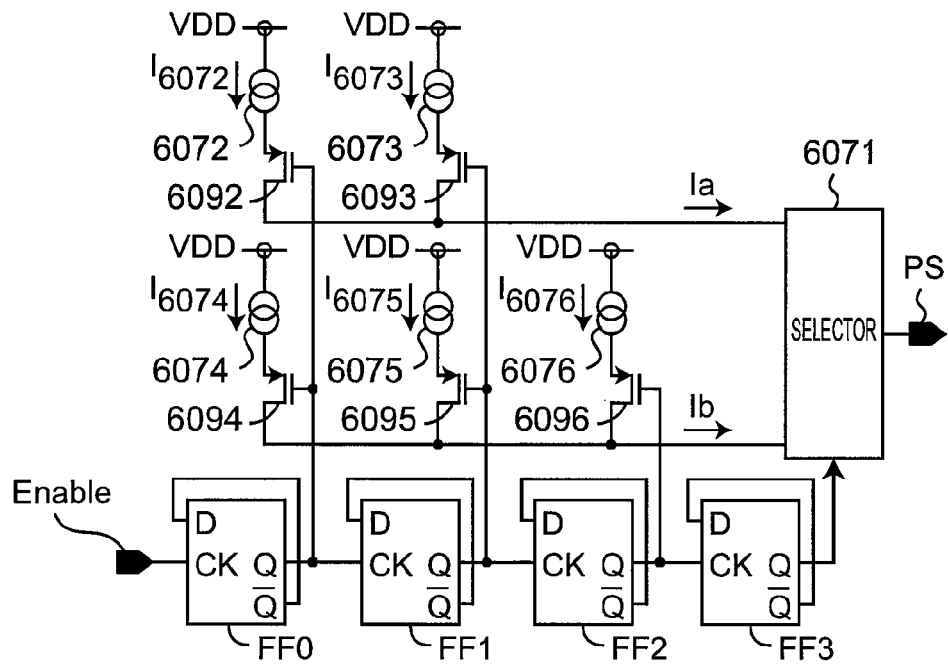
FIG. 54 is a circuit diagram of a period signal generator circuit 607a according to a ninth embodiment of the present invention.

FIG. 54 is a circuit diagram of a period signal generator circuit 607a according to a ninth embodiment of the present invention. As described above, in the first to eighth embodiments and each of the modified embodiments thereof, the period signal generator circuit 607a may be used instead of the period signal generator circuit 207a, 207b, 307, 407a, 407b, or 507. Referring to FIG. 54, the period signal generator circuit 607a is configured to include constant current sources 6072, 6073, 6074, 6075, and 6076 for respectively outputting predetermined currents $I_{6072}$, $I_{6073}$, $I_{6074}$, $I_{6075}$, and $I_{6076}$, pMOS transistors 6092, 6093, 6094, 6095, and 6096, which have sources respectively connected to the constant current sources 6072, 6073, 6074, 6075, and 6076, D flip flops FF0, FF1, FF2, and FF3 connected in series to each other, and a selector 6071.

Referring to FIG. 54, the intermittent oscillation control signal Enable is inputted to a clock input terminal of the D flip flop FF0, and an output signal from the D flip flop FF0 is outputted to a clock input terminal of the D flip flop FF1 and each of gates of the pMOS transistors 6092 and 6094. In addition, an output signal from the D flip flop FF1 is outputted to a clock input terminal of the D flip flop FF2 and each of gates of the pMOS transistors 6093 and 6095. Further, an output signal from the D flip flop FF2 is outputted to a clock input terminal of the D flip flop FF3 and a gate of the pMOS transistor 6096. Furthermore, the output signal from the D flip flop FF2 is outputted to the selector 6071. A current flowing through the pMOS transistors 6092 and a current flowing through the pMOS transistors 6093 are added, and thereafter, the added current is outputted to the selector 6071 as a current signal Ia. In addition, a current flowing through the pMOS transistors 6094, a current flowing through the pMOS transistors 6095, and a current flowing through the pMOS transistors 6096 are added, and thereafter, the added current is outputted to the selector 6072 as a current signal Ib. The selector 6071 selects at least one of the current signal Ia and the current signal Ib according to an output signal from the D flip flop FF3, the selected current signal Ia or Ib is outputted as the period signal PS. It is noted that the current ratio $I_{6072}:I_{6073}:I_{6074}:I_{6075}:I_{6076}$ is set so that a frequency of each of the current signals Ia and Ib becomes one-half of the intermittent oscillation frequency $f_I$ and other than integer multiples of the intermittent oscillation frequency $f_I$.

Accordingly, the period signal generator circuit 607a generates the period signal PS so that the local minimum value and the local minimum value of the amplitude are respectively constant by repeating the predetermined regular pattern signal with the predetermined period signal frequency $f_c$. In particular, the pattern signal as described above includes a first period pattern corresponding to the increasing and decreasing current signal Ia, and a second period pattern corresponding to the increasing and decreasing current signal Ib, and an interval length of the first period pattern is different from that of the second period pattern. That is, the frequency for each of the cycle intervals of the period signal PS varies. Therefore, according to the present embodiment, the distribution of the intermittent oscillation frequency $f_I$ can be dispersed by using a signal corresponding to the first period pattern, and the distribution of the intermittent oscillation frequency $f_I$ can be dispersed by using a signal corresponding to the second period pattern. Accordingly, the distribution of the intermittent oscillation frequency $f_I$ can be dispersed, and the transformer sound from the transformer 1 can be lowered as compared with that of the prior art, without any constraint of the period signal frequency $f_c$ and the phase difference of the period signal PS with respect to the intermittent oscillation control signal Enable.

When both of the frequency of the current signal Ia and the frequency of the current signal Ib are one-half of the intermittent oscillation frequency $f_I$ or integer multiples of the intermittent oscillation frequency $f_I$, and the phase difference between the current signal Ia and the current signal Ib can not disperse the distribution of the intermittent oscillation frequency $f_I$, the distribution of the intermittent oscillation frequency $f_I$ can not be dispersed. Therefore, the current ratio $I_{6072}:I_{6073}:I_{6074}:I_{6075}:I_{6076}$ is set so that each of the frequencies of the current signals Ia and Ib, and the phase difference do not correspond to this case. For example, in the present embodiment, the current ratio $I_{6072}:I_{6073}:I_{6074}:I_{6075}:I_{6076}$ is set to 1:2:0.5:1:2.

In addition, in the present embodiment, the period signal generator circuit 607a generates the period signal PS by using the intermittent oscillation control signal Enable. However, the present invention is not limited thereto, for example, the period signal PS may be generated by using a frequency division signal of the intermittent oscillation control signal Enable, the turn-on control signal ON, a frequency division signal of the turn-on control signal ON, an output voltage Vb from the low-frequency wave oscillator circuit 2074 of FIG. 27, a frequency division signal of the output voltage Vb, the full-wave rectification signal SLS of FIG. 29, or a frequency division signal of the full-wave rectification signal SLS. However, when the output voltage Vb, the frequency division signal of the output voltage Vb, the full-wave rectification signal SLS of FIG. 29, or the frequency division signal of the full-wave rectification signal SLS is used, for example, as illustrated in the circuit configuration of FIG. 64, the output voltage Vb, the frequency division signal of the output voltage Vb, the full-wave rectification signal SLS of FIG. 29, or the frequency division signal of the full-wave rectification signal SLS is converted to a digital signal by using inverters 8091 and 8092, and the digital signal is inputted to the period signal generator circuit 607a.

Tenth Embodiment

Figure 55:
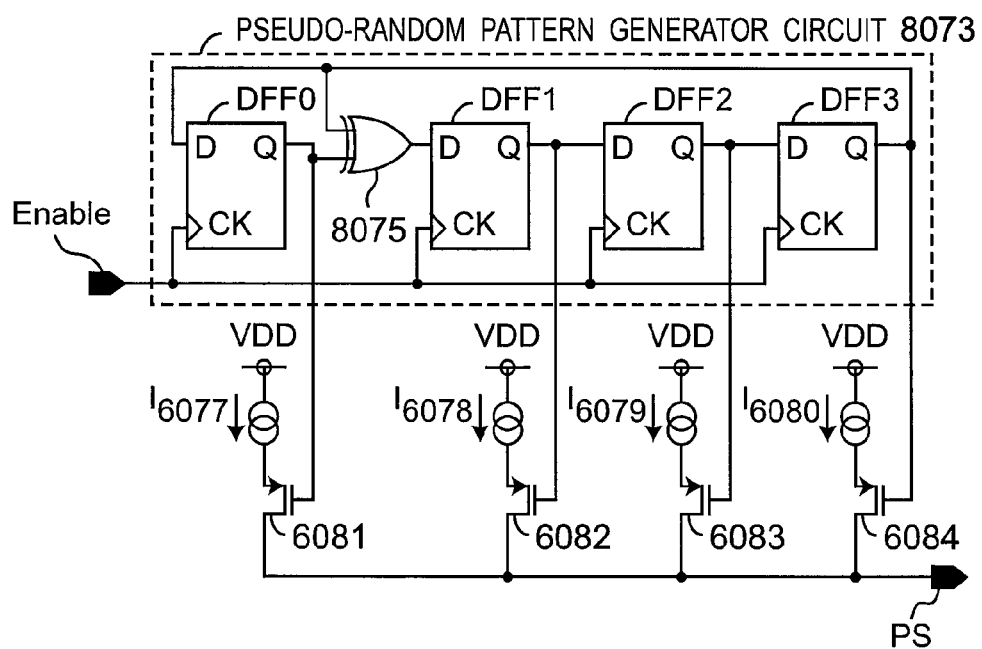
FIG. 55 is a circuit diagram of a period signal generator circuit 607b according to a tenth embodiment of the present invention.

FIG. 55 is a circuit diagram of a period signal generator circuit 607b according to a tenth embodiment of the present invention. In the first to eighth embodiments and each of the modified embodiments thereof as described above, the period signal generator circuit 607b according to the present embodiment may be used instead of the period signal generator circuit 207a, 207b, 307, 407a, 407b, or 507, Referring to FIG. 55, the period signal generator circuit 607b is configured to include a pseudo-random pattern generator circuit 8073, constant current sources 6077, 6078, 6079, and 6080 for respectively outputting predetermined currents $I_{6077}$, $I_{6078}$, $I_{6079}$, and $I_{6080}$, and pMOS transistors 6081, 6082, 6083, and 6084, which have sources respectively connected to the constant current sources 6077, 6078, 6079, and 6080. In this case, for example, the current ratio $I_{6077}:I_{6078}:I_{6079}:I_{6080}$ is set to 1:2:4:8. In addition, the pseudo-random pattern generator circuit 8073 is configured to include D flip flops DFF0, DFF1, DFF2, and DFF3, and an EXCLUSIVE-OR gate 8075. The intermittent oscillation control signal Enable is inputted to the pseudo-random pattern generator circuit 8073, and the pseudo-random pattern generator circuit 8073 generates a 4-bit pseudo-random pattern, which has fifteen times the cycle of the inputted intermittent oscillation control signal Enable.

In addition, referring to FIG. 55, a signal corresponding to each of the bits of the pseudo-random pattern from the pseudo-random pattern generator circuit 8073 is outputted to each of gates of the pMOS transistors 6081, 6082, 6083, and 6084, and thereafter, each of currents flowing through the pMOS transistors 6081, 6082, 6083, and 6084 is added, and the added current is outputted as the period signal PS. Accordingly, the period signal PS generated by the period signal generator circuit 607b is a pseudo-random pattern signal, which has the cycle $T_c$ of period signal of fifteen times the cycle of the inputted signal. That is, the period signal generator circuit 607b generates the period signal PS so that each of the local maximum value and the local minimum value of the amplitude are not constant and varies by repeating the predetermined random pattern generated by the pseudo-random pattern generator circuit 8073 with the predetermined period signal frequency $f_c$.

Accordingly, since the distribution of the intermittent oscillation frequency $f_I$ can be dispersed by using the predetermined random pattern generated by the pseudo-random pattern generator circuit 8073, the distribution of the intermittent oscillation frequency $f_I$ can be dispersed, and the transformer sound from the transformer 1 can be lowered as compared with that of the prior art, without any constraint of the period signal frequency $f_c$ and the phase difference of the period signal PS with respect to the intermittent oscillation control signal Enable.

In the present embodiment, it is noted that the period signal generator circuit 607b generates the period signal PS by using the intermittent oscillation control signal Enable. However, the present invention is not limited thereto, for example, the period signal PS may be generated by using the frequency division signal of the intermittent oscillation control signal Enable, the turn-on control signal ON, the frequency division signal of the turn-on control signal ON, the output voltage Vb from the low-frequency wave oscillator circuit 2074 of FIG. 27, a frequency division signal of the output voltage Vb, the full-wave rectification signal SLS of FIG. 29, or the frequency division signal of the full-wave rectification signal SLS. However, when the output voltage Vb, the frequency division signal of the output voltage Vb, the full-wave rectification signal SLS of FIG. 29, or the frequency division signal of the full-wave rectification signal SLS is used, for example, as illustrated in the circuit configuration of FIG. 64, the output voltage Vb, the frequency division signal of the output voltage Vb, the full-wave rectification signal SLS of FIG. 29, or the frequency division signal of the full-wave rectification signal SLS is converted to a digital signal by using inverters 8091 and 8092, and the digital signal is inputted to the period signal generator circuit 607a.

In the present embodiment, it is noted that the turn-on control signal ON, the intermittent oscillation control signal Enable, the frequency division signal of the turn-on control signal ON, or the frequency division signal of the intermittent oscillation control signal Enable is inputted to the pseudo-random pattern generator circuit 8073. However, the present invention is not limited thereto. For example, an output signal from an oscillator circuit such as the period signal generator circuit 307 of FIG. 21, or the period signal generator circuit 407a of FIG. 24 may be inputted to the pseudo-random pattern generator circuit 8073.

Eleventh Embodiment

In the first to eighth embodiments and the modified embodiments thereof as described above, instead of the period signal PS from the period signal generator circuit 207a, 207b, 307, 407a, 407b, and 507, a changing signal Jitter from a changing signal generator circuit 807a, 807b, 807c, 807d, 807e, or 807f according to the present embodiment and the modified embodiments thereof as described below may be used. In this case, as described in detail below, the distribution of the intermittent oscillation frequency $f_I$ can be dispersed, and the transformer sound from the transformer 1 can be lowered as compared with that of the prior art, without any constraint of the period signal frequency $f_c$ and the phase difference of the period signal PS with respect to the intermittent oscillation control signal Enable.

Figure 56:
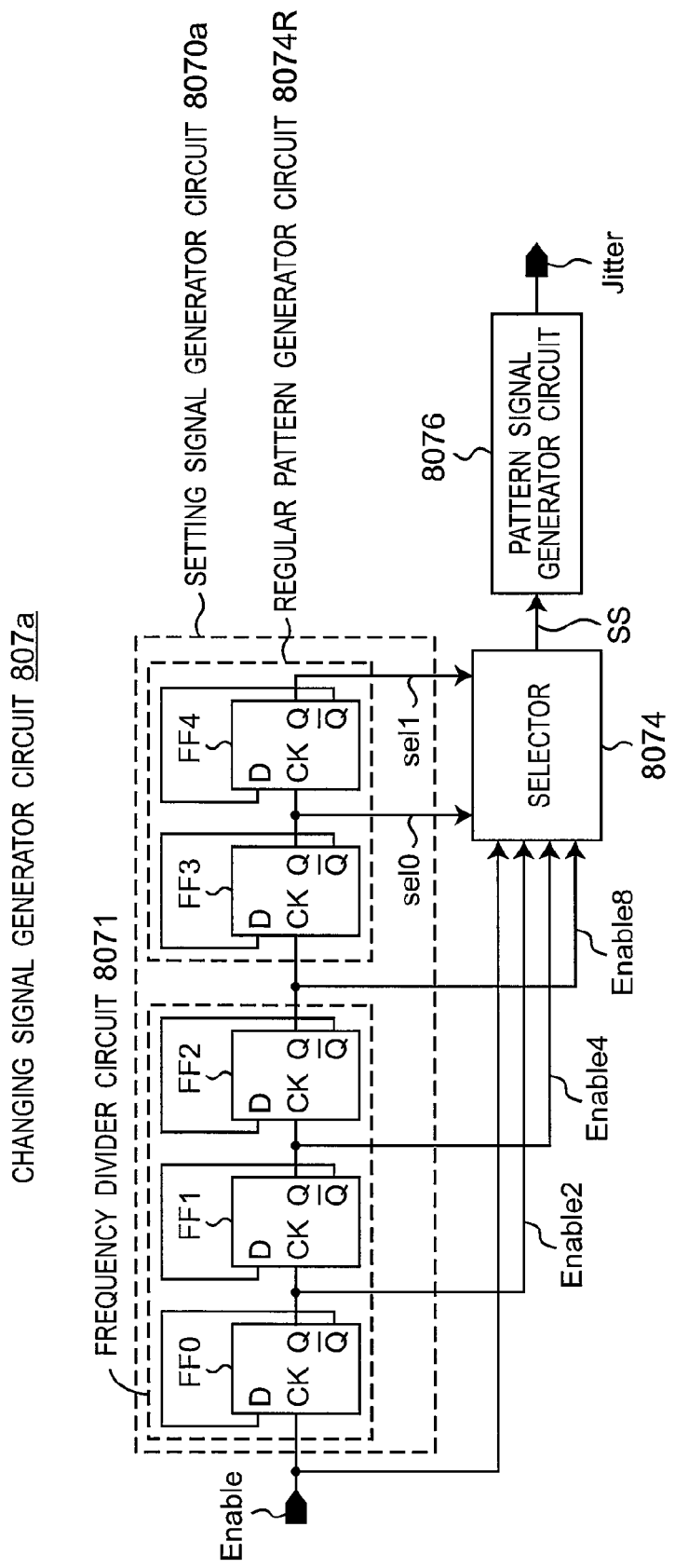
FIG. 56 is a circuit diagram of a changing signal generator circuit 807a according to an eleventh embodiment of the present invention.
Figure 57:
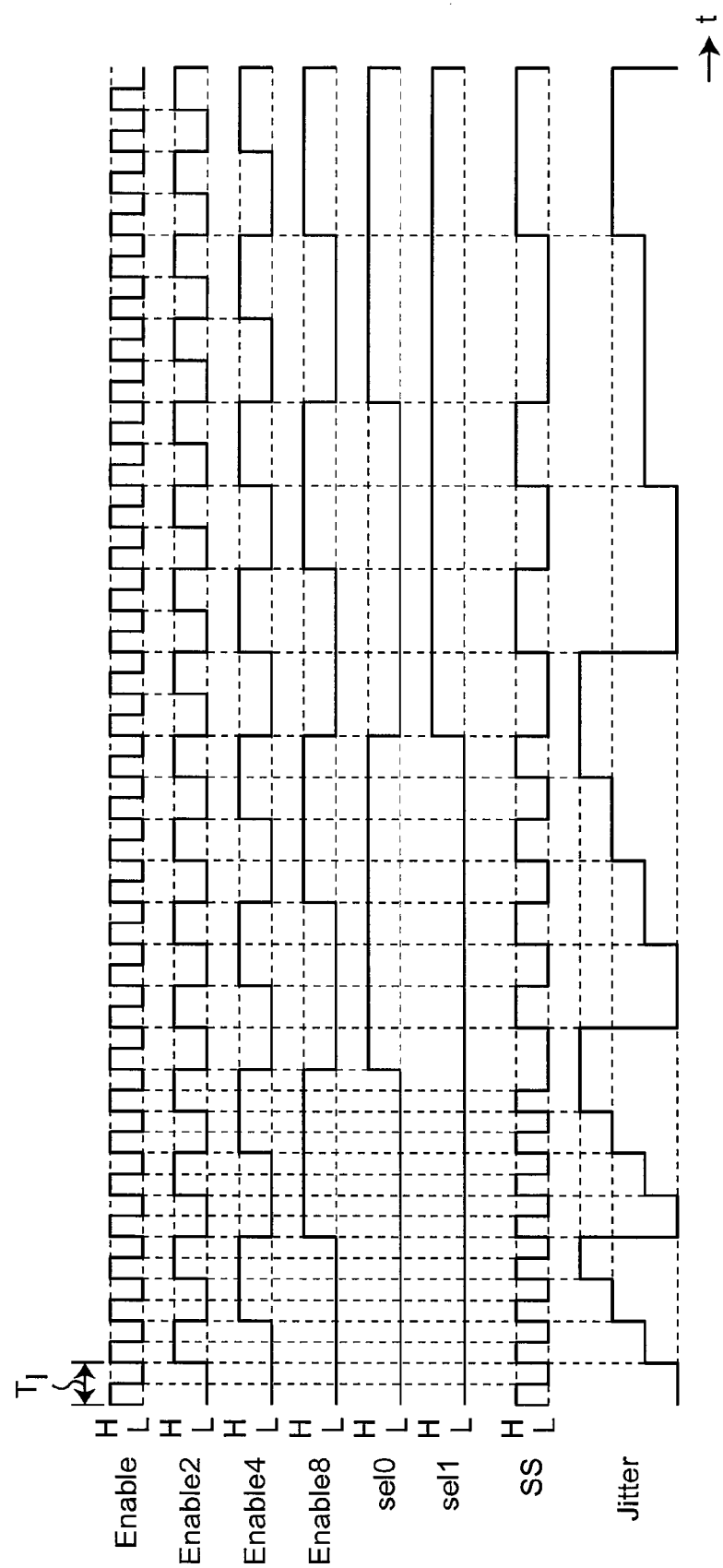
FIG. 57 is a timing chart showing an operation of the changing signal generator circuit 807a of FIG. 56.

FIG. 56 is a circuit diagram of the changing signal generator circuit 807a according to an eleventh embodiment of the present invention, and FIG. 57 is a timing chart showing an operation of the changing signal generator circuit 807a of FIG. 56. Referring to FIG. 56, the changing signal generator circuit 807a is configured to include a setting signal generator circuit 8070a, a selector 8074, and a pattern signal generator circuit 8076. In this case, the pattern signal generator circuit 8076 has the same configuration as that of the period signal generator circuit 407a of FIG. 24. In addition, the setting signal generator circuit 8070a is configured to include a frequency divider circuit 8071 provided with the D flip flops FF0 to FF2, and a regular pattern generator circuit 8074R provided with the D flip flops FF3 and FF4. In this case, the D flip flops FF0 to FF4 are connected in series to each other.

Referring to FIG. 56, the intermittent oscillation control signal Enable is outputted to the frequency divider circuit 8071 and the selector 8074. In addition, the frequency divider circuit 8071 frequency-divides the inputted intermittent oscillation control signal Enable, and generates a frequency division signal Enable2 having two times the cycle of the intermittent oscillation control signal Enable, a frequency division signal Enable4 having four times the cycle of the intermittent oscillation control signal Enable, and a frequency division signal Enable8 having eight times the cycle of the intermittent oscillation control signal Enable. Then, the frequency divider circuit 8071 outputs the frequency division signals Enable2, Enable4, and Enable8 to the selector 8074, and outputs the frequency division signals Enable8 to the pseudo-random pattern generator circuit 8073. In addition, the regular pattern generator circuit 8074R frequency-divides the frequency division signals Enable8, and generates a modulation pattern setting signal sel0 having sixteen times the cycle of the intermittent oscillation control signal Enable, and a modulation pattern setting signal sel1 having thirty-two times the cycle of the intermittent oscillation control signal Enable to output to the selector 8074. The selector 8074 selects one signal of the intermittent oscillation control signal Enable, and the frequency division signals Enable2, Enable4, and Enable8, according to the modulation pattern setting signals sel0 and sel1, and thereafter, the selected signal is outputted to the pattern signal generator circuit 8076 as a frequency control signal SS. Then, the pattern signal generator circuit 8076 generates the changing signal Jitter by using the frequency control signal SS.

As described in FIG. 57, a pair of modulation pattern setting signals sel0 and sel1 are periodic setting signals having thirty-two times the cycle $T_I$ of intermittent oscillation control. Accordingly, the changing signal generator circuit 807a according to the present embodiment generates the changing signal Jitter by modulating a frequency of the regular pattern signal (corresponding to the period signal PS of FIG. 25(a)) generated by the pattern signal generator circuit 8076 according to the pair of periodic modulation pattern setting signals sel0 and sel1. According to the present embodiment, the frequency of the changing signal Jitter varies for each of intervals of thirty-two times the cycle $T_I$ of intermittent oscillation control according to the modulation pattern setting signals sel0 and sel1, and an amplitude of the changing signal Jitter varies every oscillation intervals (when the voltage level of the intermittent oscillation control signal Enable of FIG. 57 is high), and therefore, the distribution of the intermittent oscillation frequency $f_I$ can be dispersed, and the transformer sound from the transformer 1 can be lowered as compared with that of the prior art.

First Modified Embodiment of the Eleventh Embodiment

Figure 58:
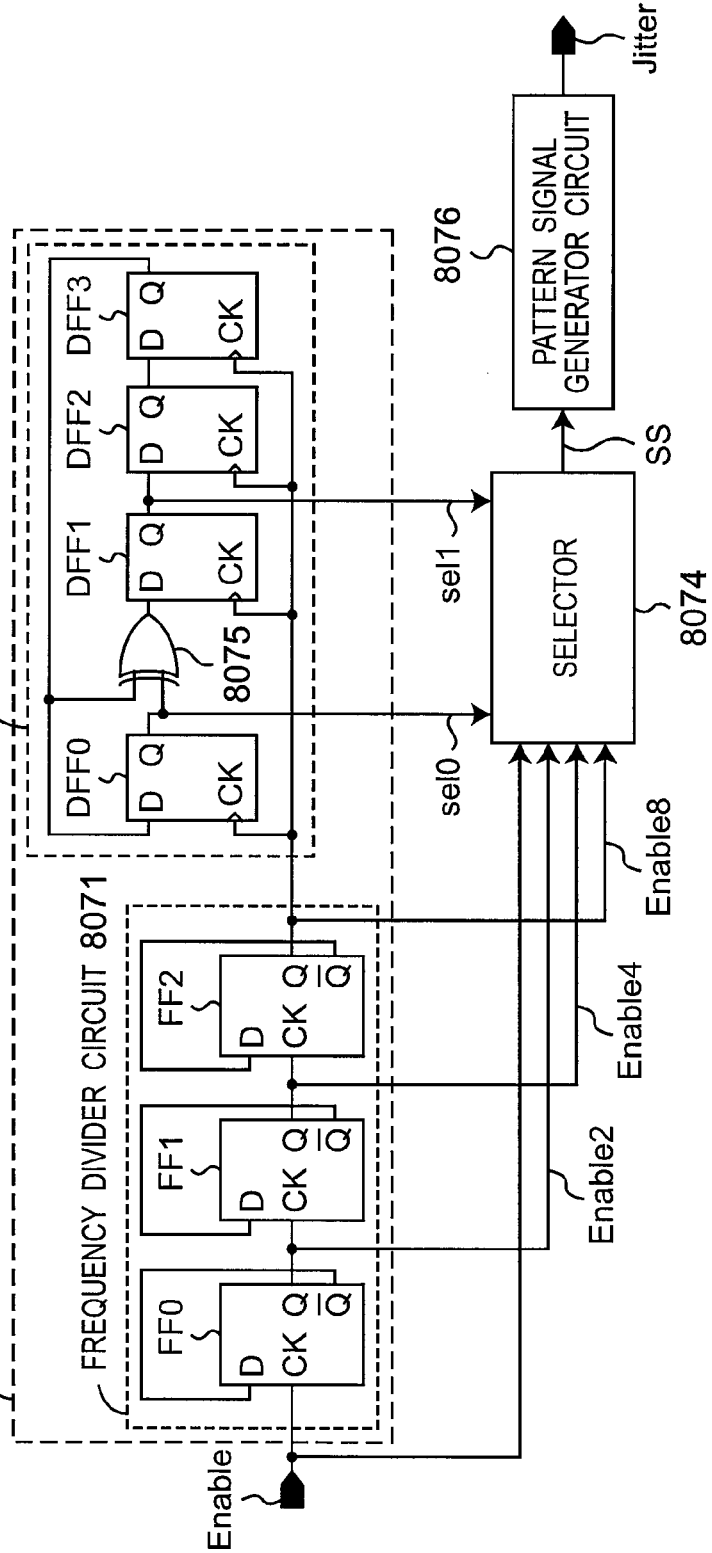
FIG. 58 is a circuit diagram of a changing signal generator circuit 807b according to a first modified embodiment of the eleventh embodiment of the present invention.
Figure 59:
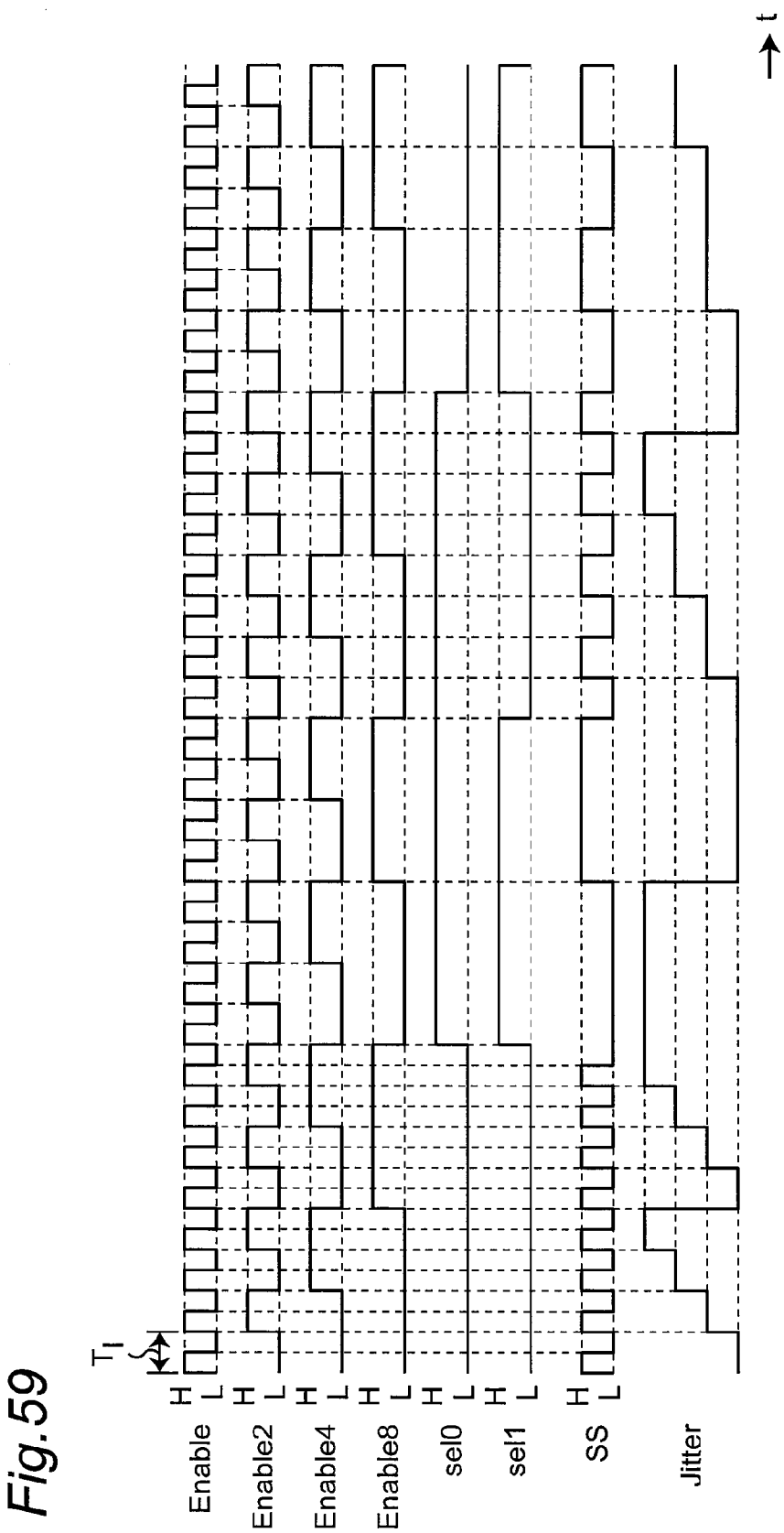
FIG. 59 is a timing chart showing an operation of the changing signal generator circuit 807b of FIG. 58.

FIG. 58 is a circuit diagram of the changing signal generator circuit 807b according to a first modified embodiment of the eleventh embodiment of the present invention, and FIG. 59 is a timing chart showing an operation of the changing signal generator circuit 807b of FIG. 58. Referring to FIG. 58, as compared with the changing signal generator circuit 807a, the changing signal generator circuit 807b is configured to include a setting signal generator circuit 8070b instead of the setting signal generator circuit 8070a. Referring to FIG. 58, the setting signal generator circuit 8070b is configured to include the frequency divider circuit 8071 and the pseudo-random pattern generator circuit 8073.

Referring to FIG. 58, the intermittent oscillation control signal Enable is outputted to the frequency divider circuit 8071 and the selector 8074. The frequency divider circuit 8071 frequency-divides the inputted intermittent oscillation control signal Enable, and generates the frequency division signal Enable2 having two times the cycle of the intermittent oscillation control signal Enable, the frequency division signal Enable4 having four times the cycle of the intermittent oscillation control signal Enable, and the frequency division signal Enable8 having eight times the cycle of the intermittent oscillation control signal Enable. Then, the frequency divider circuit 8071 outputs the frequency division signals Enable2, Enable4, and Enable8 to the selector 8074, and outputs the frequency division signals Enable8 to the pseudo-random pattern generator circuit 8073. In addition, the pseudo-random pattern generator circuit 8073 generates the 4-bit pseudo-random pattern having fifteen times the cycle of the inputted frequency division signal Enable8, and thereafter, the pseudo-random pattern generator circuit 8073 outputs an output signal from a D flip flop DFF0 to the selector 8074 as the modulation pattern setting signal sel0, and outputs an output signal from a D flip flop DFF1 to the selector 8074 as the modulation pattern setting signal sel1. The selector 8074 selects one signal of the intermittent oscillation control signal Enable, and the frequency division signals Enable 2, Enable4, and Enable8, according to the modulation pattern setting signals sel0 and sel1, and thereafter, the selected signal is outputted to the pattern signal generator circuit 8076 as the frequency control signal SS. Then, the pattern signal generator circuit 8076 generates the changing signal Jitter by using the frequency control signal SS.

As illustrated in FIG. 59, the pair of modulation pattern setting signals sel0 and sel1 are pseudo-random setting signals. That is, the changing signal generator circuit 807b according to the present modified embodiment generates the changing signal Jitter by modulating a frequency of a regular pattern signal generated by the pattern signal generator circuit 8076 according to the pair of pseudo-random modulation pattern setting signals sel0 and sel1. According to the present modified embodiment, the amplitude of the changing signal Jitter varies every oscillation intervals (when the voltage level of the intermittent oscillation control signal Enable of FIG. 59 is the high level), and therefore, the distribution of the intermittent oscillation frequency $f_I$ can be dispersed, and the transformer sound from the transformer 1 can be lowered as compared with that of the prior art.

Second Modified Embodiment of the Eleventh Embodiment

Figure 60:
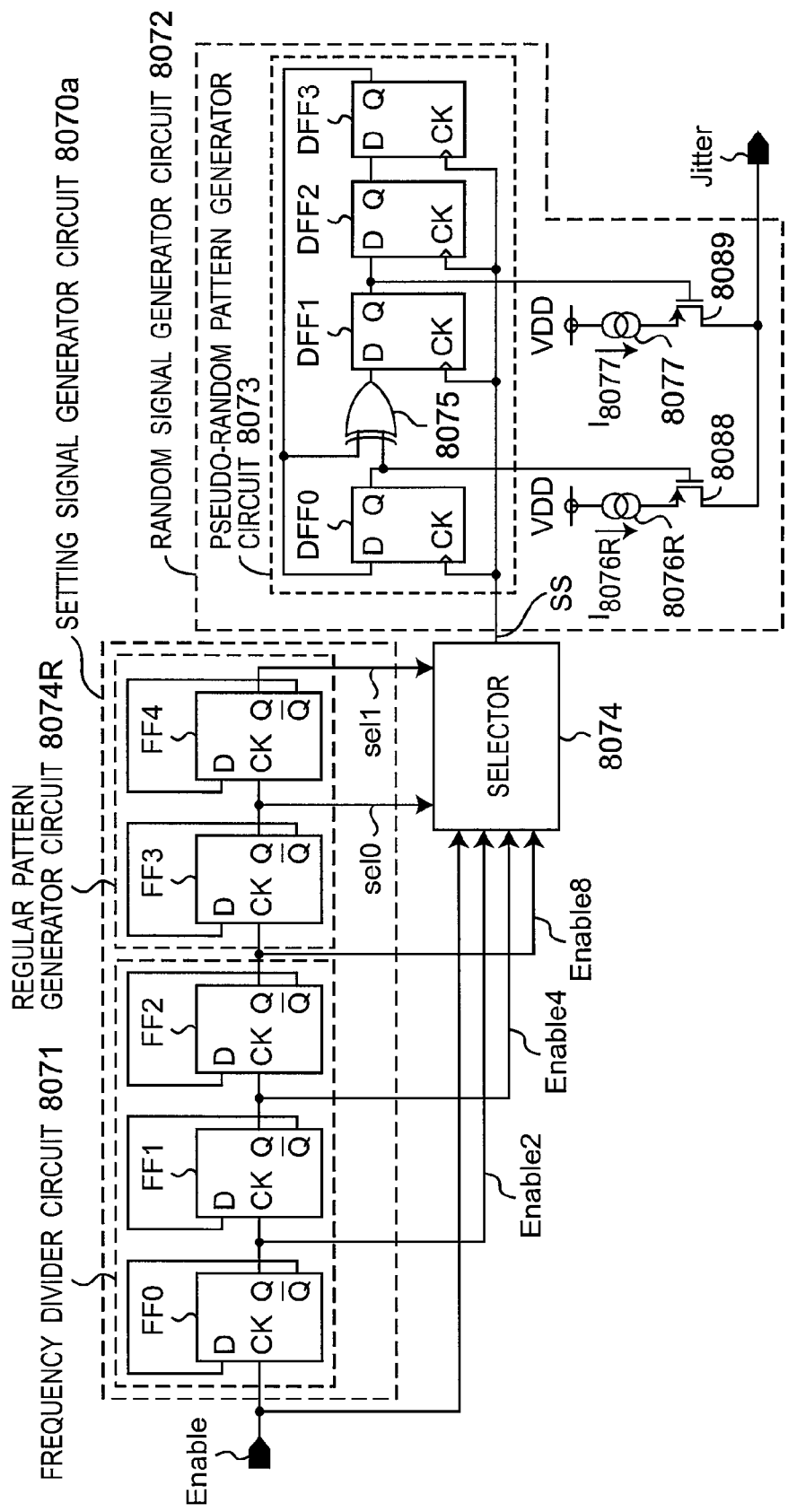
FIG. 60 is a circuit diagram of a changing signal generator circuit 807c according to a second modified embodiment of the eleventh embodiment of the present invention.
Figure 61:
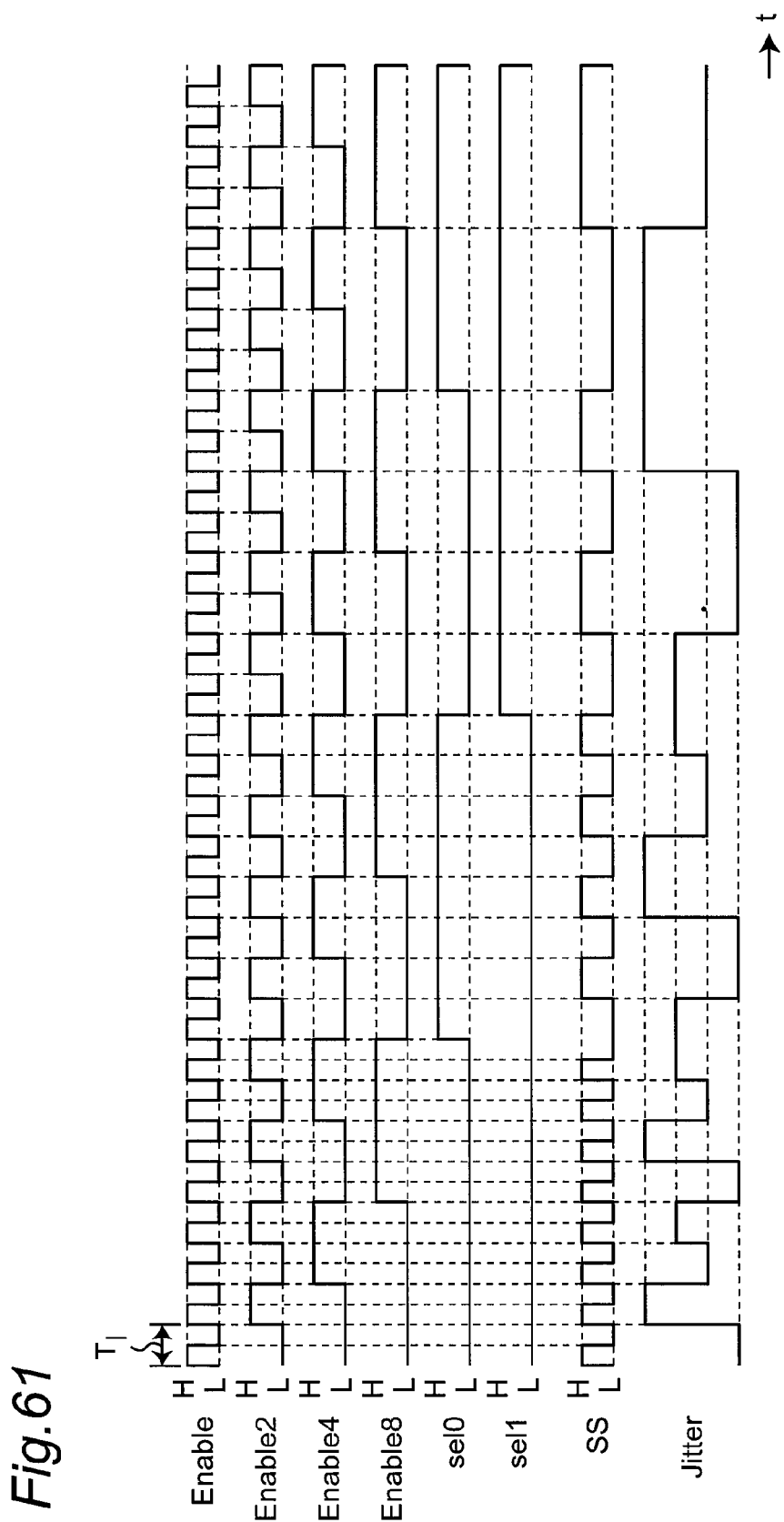
FIG. 61 is a timing chart showing an operation of the changing signal generator circuit 807c of FIG. 60.

FIG. 60 is a circuit diagram of the changing signal generator circuit 807c according to a second modified embodiment of the eleventh embodiment of the present invention, and FIG. 61 is a timing chart showing an operation of the changing signal generator circuit 807c of FIG. 60. Referring to FIG. 60, as compared with the changing signal generator circuit 807a, the changing signal generator circuit 807c is configured to include a random signal generator circuit 8072 instead of the pattern signal generator circuit 8076.

Referring to FIG. 60, the random signal generator circuit 8072 is configured to include the pseudo-random pattern generator circuit 8073, constant current sources 8076R and 8077 for respectively outputting predetermined constant currents $I_{8076R}$ and $I_{8077}$, pMOS transistors 8088 and 8099 having sources connected to the constant current sources 8076R and 8077, respectively. In this case, for example, a current ratio $I_{8076R}:I_{8077}$ is set to 1:2. The pseudo-random pattern generator circuit 8073 generates the 4-bit pseudo-random pattern by using the frequency setting signal SS from the selector 8074, and thereafter, the pseudo-random pattern generator circuit 8073 outputs an output signal from the D flip flop DFF0 to a gate of the pMOS transistors 8088, and outputs an output signal from the D flip flop DFF1 to a gate of a pMOS transistor 8089. Each of currents flowing through the pMOS transistors 8088 and 8099 is added, and the added current is outputted as the changing signal Jitter.

As described in FIG. 61, the pair of modulation pattern setting signals sel0 and sel1 are the periodic setting signal having thirty-two times the cycle $T_I$ of intermittent oscillation control. Accordingly, the changing signal generator circuit 807c according to the present modified embodiment generates the changing signal Jitter by modulating a frequency of the random signal generated by the random signal generator circuit 8072 according to the pair of periodic modulation pattern setting signals sel0 and sel1. According to the present modified embodiment, the frequency of the changing signal Jitter varies every oscillation intervals (when the voltage level of the intermittent oscillation control signal Enable of FIG. 61 is the high level) for each of intervals of thirty-two times the cycle $T_I$ of intermittent oscillation control, and therefore, the distribution of the intermittent oscillation frequency $f_I$ can be dispersed, and the transformer sound from the transformer 1 can be lowered as compared with that of the prior art.

Third Modified Embodiment of the Eleventh Embodiment

Figure 62:
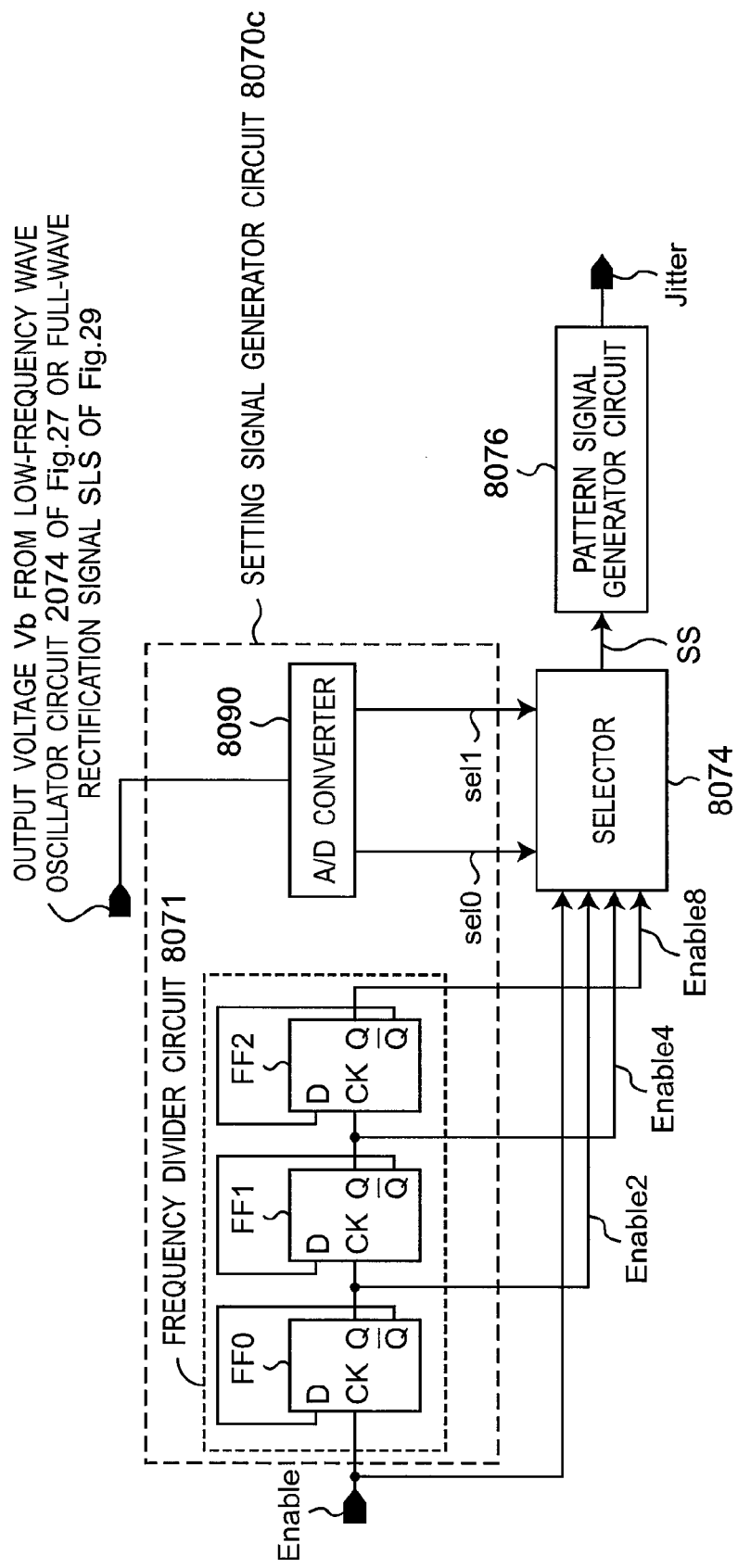
FIG. 62 is a circuit diagram of a changing signal generator circuit 807d according to a third modified embodiment of the eleventh embodiment of the present invention.

FIG. 62 is a circuit diagram of the changing signal generator circuit 807d according to a third modified embodiment of the eleventh embodiment of the present invention. Referring to FIG. 62, as compared with the changing signal generator circuit 807a, the changing signal generator circuit 807d is configured to include a setting signal generator circuit 8070c instead of the setting signal generator circuit 8070a.

Referring to FIG. 62, the setting signal generator circuit 8070c is configured to include the frequency divider circuit 8071 and an A/D converter 8090. The intermittent oscillation control signal Enable, and the frequency division signals Enable2, Enable4, and Enable8 from the frequency divider circuit 8071 are outputted to the selector 8074. In addition, the A/D converter 8090 converts the output voltage Vb from the low-frequency wave oscillator circuit 2074 of FIG. 27 or the full-wave rectification signal SLS of FIG. 29 to a 2-bits digital signal, and the A/D converter 8090 outputs a value of each of bits of the digital signal to the selector 8074 as the modulation pattern setting signals sel0 and sel1. Accordingly, the pair of modulation pattern setting signals sel0 and sel1 are periodic setting signals having the same cycle as that of the output voltage Vb or the full-wave rectification signal SLS. Accordingly, the changing signal generator circuit 807d according to the present modified embodiment generates the changing signal Jitter by modulating the frequency of the regular pattern signal generated by the pattern signal generator circuit 8076 according to the pair of periodic modulation pattern setting signals sel0 and sel1. According to the present modified embodiment, the amplitude of the changing signal Jitter varies every oscillation intervals for each of intervals of thirty-two times the cycle $T_I$ of intermittent oscillation control, and therefore, the distribution of the intermittent oscillation frequency $f_I$ can be dispersed, and the transformer sound from the transformer 1 can be lowered as compared with that of the prior art.

Fourth Embodiment of the Eleventh Embodiment

Figure 63:
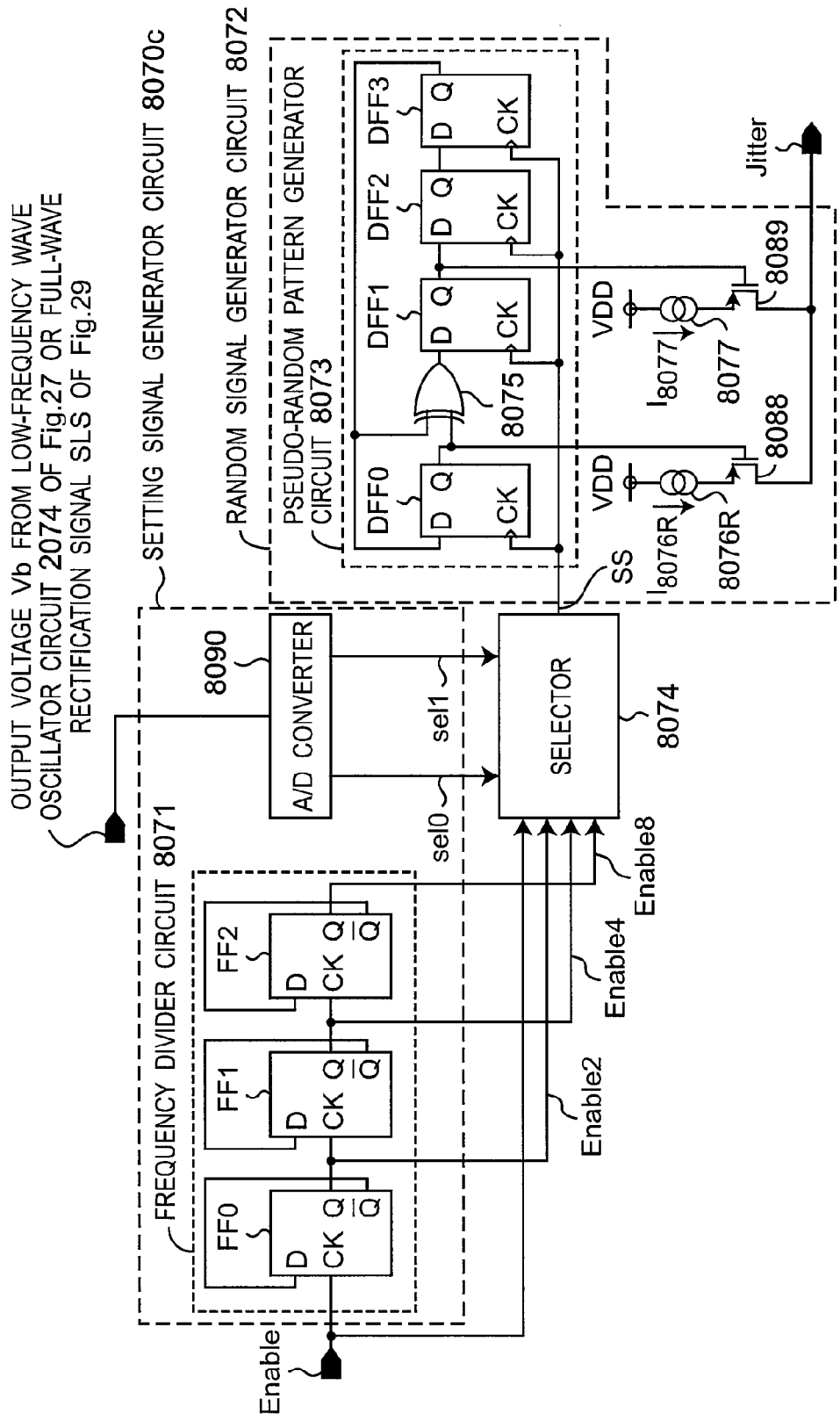
FIG. 63 is a circuit diagram of a changing signal generator circuit 807e according to a fourth modified embodiment of the eleventh embodiment of the present invention.

FIG. 63 is a circuit diagram of the changing signal generator circuit 807e according to a fourth modified embodiment of the eleventh embodiment of the present invention. Referring to FIG. 63, as compared with the changing signal generator circuit 807d, the changing signal generator circuit 807e is configured to include the random signal generator circuit 8072 instead of the pattern signal generator circuit 8076.

Accordingly, the changing signal generator circuit 807e according to the present modified embodiment generates the changing signal Jitter by modulating the frequency of the random signal generated by the random signal generator circuit 8072 according to the pair of periodic modulation pattern setting signals sel0 and sel1. According to the present modified embodiment, the amplitude of the changing signal Jitter varies every oscillation intervals, and therefore, the distribution of the intermittent oscillation frequency $f_I$ can be dispersed, and the transformer sound from the transformer 1 can be lowered as compared with that of the prior art.

Fifth Embodiment of the Eleventh Embodiment

Figure 64:
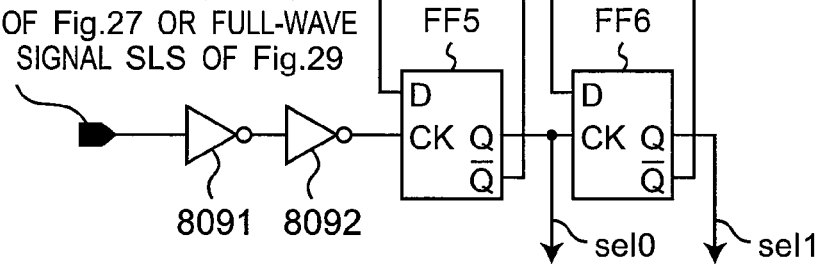
FIG. 64 is a circuit diagram of a setting signal generator circuit 8070d according to a fifth modified embodiment of the eleventh embodiment of the present invention.

FIG. 64 is a circuit diagram of a setting signal generator circuit 8070d according to a fifth modified embodiment of the eleventh embodiment of the present invention. Referring to FIG. 64, the setting signal generator circuit 8070d is configured to include the inverters 8091 and 8092, and D flip flops FF5 and FF6 connected in series to each other. The output voltage Vb from the low-frequency wave oscillator circuit 2074 of FIG. 27 or the full-wave rectification signal SLS of FIG. 29 is outputted to an clock input terminal of the D flip flop FF5 via the inverters 8091 and 8092. Then, an output signal from the D flip flop FF5 is outputted as the modulation pattern setting signal sel0 to a clock input terminal of the D flip flop FF6. Further, an output signal from the D flip flop FF6 is outputted as the modulation pattern setting signal sel1. According to the present modified embodiment, the pair of modulation pattern setting signals sel0 and sel1, which vary periodically, can be generated by using the output voltage Vb from the low-frequency wave oscillator circuit 2074 of FIG. 27 or the full-wave rectification signal SLS of FIG. 29.

It is noted that the setting signal generator circuit 8070d may be configured so that the output signals from the D flip flops FF5 and FF6 are outputted to each of gates of the pMOS transistors 8088 and 8089 in a manner similar to those of the output signals from the D flip flops DFF0 and DFF1 of FIG. 63. Therefore, the pair of pseudo-random modulation pattern setting signals sel0 and sel1 can be generated.

Sixth Embodiment of the Eleventh Embodiment

Figure 65:
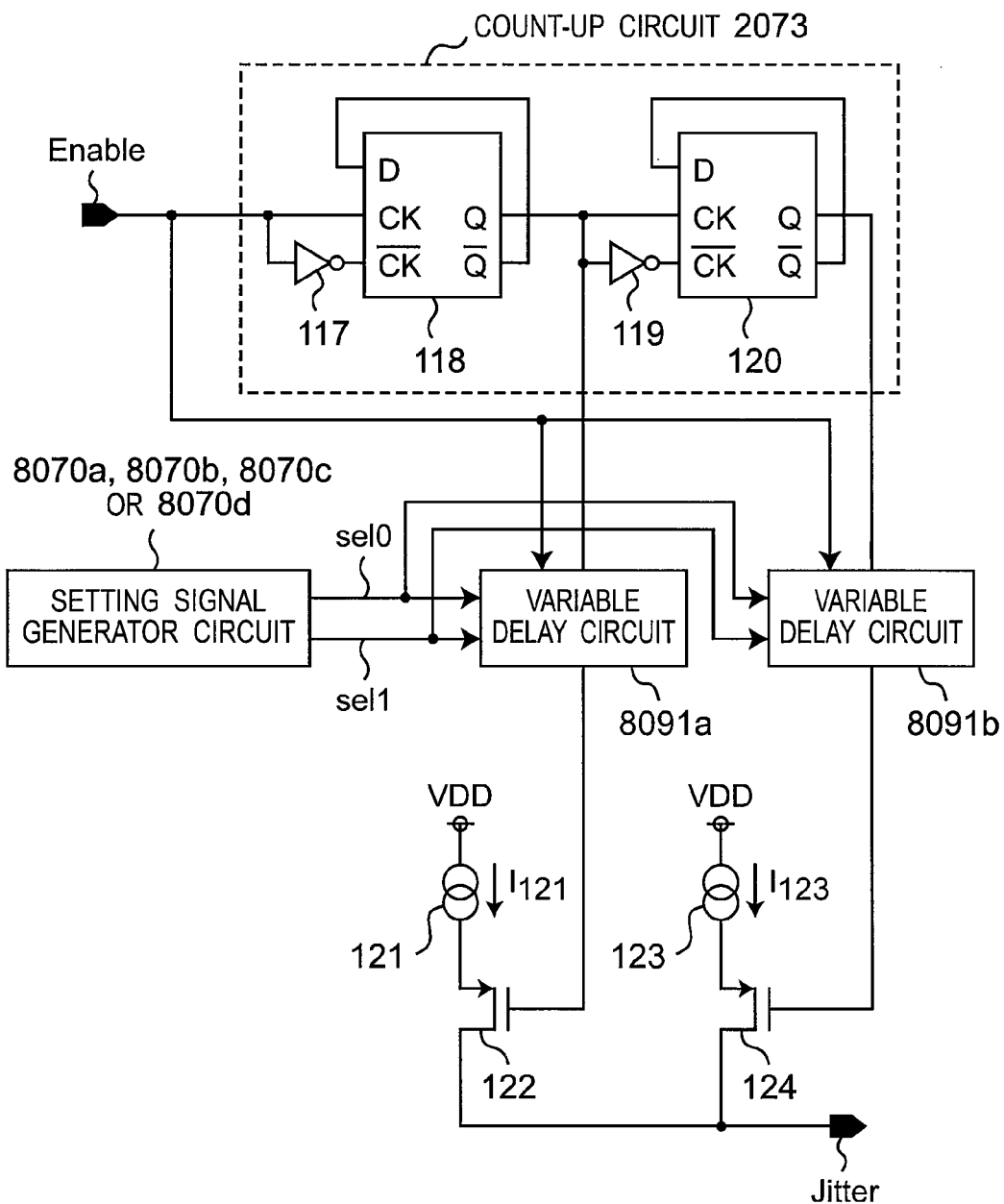
FIG. 65 is a circuit diagram of a changing signal generator circuit 807f according to a sixth modified embodiment of the eleventh embodiment of the present invention.
Figure 66:
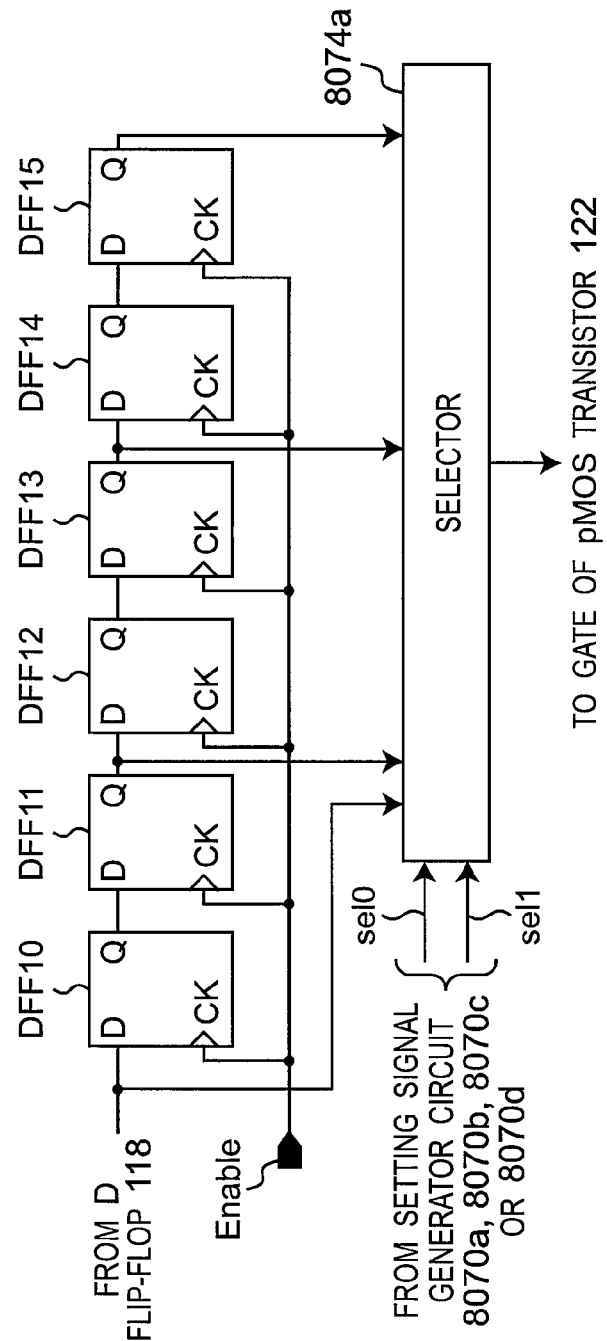
FIG. 66 is a circuit diagram of a variable delay circuit 8091a of FIG. 65.

FIG. 65 is a circuit diagram of the changing signal generator circuit 807f according to a sixth modified embodiment of the eleventh embodiment of the present invention, and FIG. 66 is a circuit diagram of a variable delay circuit 8091a of FIG. 65. Referring to FIG. 65, as compared with the period signal generator circuit 407a of FIG. 24, the changing signal generator circuit 807f according to the present modified embodiment is configured to include the setting signal generator circuit 8070a, 8070b, 8070c, or 8070d, the variable delay circuit 8091a inserted between the D flip flop 118 and a gate of the pMOS transistor 122, and a variable delay circuit 8091b inserted between the D flip flop 120 and a gate of the pMOS transistor 124.

Referring to FIG. 66, the variable delay circuit 8091a is configured to include D flip flops DFF10 to DFF15 connected in series to each other, and a selector 8074a. The intermittent oscillation control signal Enable is inputted to each of clock input terminals of the D flip flops DFF10 to DFF15. In addition, an output signal from the D flip flop 118 is inputted to a data input terminal of the D flip flop DFF10 and the selector 8074a. Then, each of output signals from the D flip flops DFF10 to DFF14 is inputted to a data input terminal of the subsequent D flip flops DFF11 to DFF15. Further, each of the output signals from the D flip flop DFF11, DFF13, and DFF15 is outputted to the selector 8074a. In this case, each of the output signals from the D flip flops DFF11, DFF13, and DFF15 is a delayed signal, where the delayed signal is obtained by delaying the output signal from the D flip flop 118 by an each different predetermined delay time. The selector 8074a selects one signal of the output signal from the D flip flop 118, and each of the output signal from D flip flops DFF11, DFF13, and DFF15 according to the modulation pattern setting signals sel0 and sel1 from the setting signal generator circuit 8070a, 8070b, 8070c, or 8070d. Thereafter, the selector 8074a outputs the selected signal to the gate of the pMOS transistor 122. It is noted that the variable delay circuit 8091b has the same configuration as that of the variable delay circuit 8091a as described above.

Accordingly, the changing signal generator circuit 807f according to the present modified embodiment generates the changing signal Jitter by modulating the phase of period signal (See the period signal PS of FIG. 25(a)) from the period signal generator circuit included with the count-up circuit 2073, the constant current sources 121 and 123, and the pMOS transistors 122 and 124 according to the pair of modulation pattern setting signals sel0 and sel1 from the setting signal generator circuit 8070a, 8070b, 8070c, or 8070d. The present modified embodiment has the same effect as that of each of the modified embodiments of the eleventh embodiment as described above.

It is noted that generator circuits for generating the changing signal Jitter is not limited to the changing signal generator circuits 807a to 807f as described above. For example, the changing signal Jitter may be generated by modulating a phase of a predetermined random signal according to the pair of modulation pattern setting signals sel0 and sel1 from the setting signal generator circuit 8070a, 8070b, 8070c, or 8070d. In addition, in the period signal generator circuit 607a of FIG. 54, the variable delay circuit 8091a of FIG. 66 is inserted between the D flip flop FF0 and the pMOS transistor 6094, between the D flip flop FF1 and the pMOS transistor 6095, and between the D flip flop FF2 and the pMOS transistor 6096, respectively. Therefore, the changing signal Jitter can be generated by modulating the phase of the period signal PS generated by the period signal generator circuit 607a according to the pair of modulation pattern setting signals sel0 and sel1 from the setting signal generator circuit 8070a, 8070b, 8070c, or 8070d.

Further, in the period signal generator circuit 607b of FIG. 55, the variable delay circuit 8091a of FIG. 66 may be inserted between the D flip flop DFF0 and the pMOS transistor 6081, between the D flip flop DFF1 and the pMOS transistor 6082, between the D flip flop DFF2 and the pMOS transistor 6083, and between the D flip flop DFF3 and the pMOS transistor 6084, respectively. Therefore, the changing signal Jitter can be generated by modulating the phase of the period signal PS generated by the period signal generator circuit 607b according to the pair of modulation pattern setting signals sel0 and sel1 from the setting signal generator circuit 8070a, 8070b, 8070c, or 8070d.

Furthermore, the changing signal generator circuits 807a, 807b, 807c, 807d, 807e, and 807f according to the eleventh embodiment and the modified embodiment thereof as described above generate the changing signal Jitter by using the intermittent oscillation control signal Enable. However, the present invention is not limited thereto, for example, the changing signal Jitter may be generated by using the turn-on control signal ON.

In addition, in the first to third embodiments and each of the modified embodiments thereof, and the fifth to eighth embodiments and each of the modified embodiments thereof, the variable delay circuit 8091a of FIG. 66 may be used for controlling the phase difference of the period signal PS with respect to the intermittent oscillation control signal Enable.

Twelfth Embodiment

Figure 67:
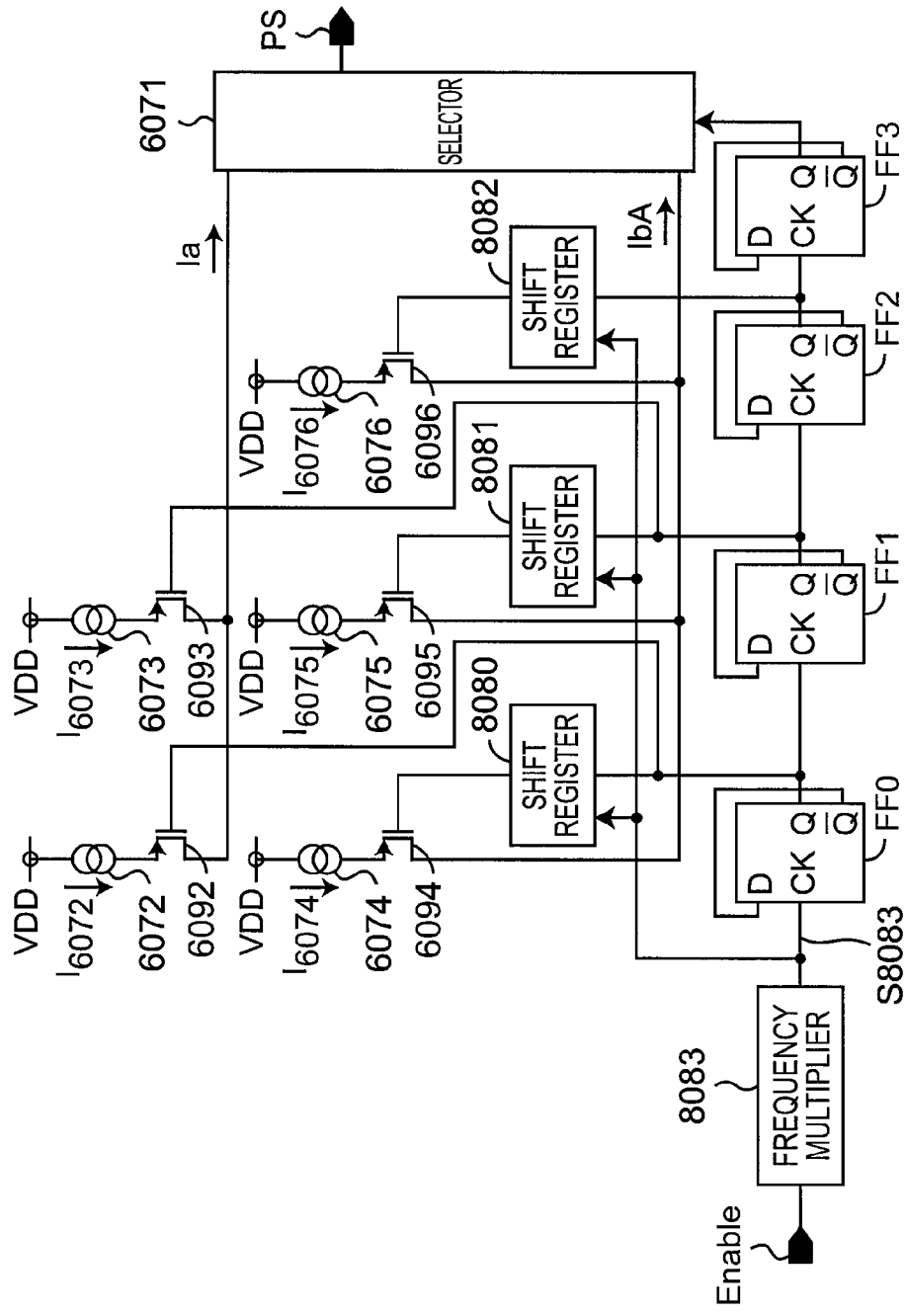
FIG. 67 is a circuit diagram of a period signal generator circuit 907 according to a twelfth embodiment of the present invention.

FIG. 67 is a circuit diagram of a period signal generator circuit 907 according to a twelfth embodiment of the present invention. In the first to eighth embodiments and the modified embodiments thereof as described above, instead of the period signal generator circuit 207a, 207b, 307, 407a, 407b, or 507, the period signal generator circuit 907 according to the present embodiment may be used.

Referring to FIG. 67, as compared with the period signal generator circuit 607a of FIG. 54, there is such a difference that the period signal generator circuit 907 is further included with a frequency multiplier 8083, and shift registers 8080, 8081, and 8082. In this case, for example, the current ratio $I_{6072}:I_{6073}:I_{6074}:I_{6075}:I_{6076}$ is set to 1:2:0.5:1:2. The frequency multiplier 8083 generates a clock signal S8083 by multiplying a frequency of the intermittent oscillation control signal Enable by 8, and thereafter, the clock signal S8083 is outputted to the clock input terminal of the D flip flop FF0 and each of the clock input terminals of the shift registers 8080 to 8082.

Referring to FIG. 67, the output signal from the D flip flop FF0 is outputted to the clock input terminal of the D flip flop FF1, the gate of the pMOS transistor 6092, and the shift register 8080. In addition, the output signal from the D flip flop FF1 is outputted to the clock input terminal of the D flip flop FF2, the gate of the pMOS transistor 6093, and the shift register 8081. Further, the output signal from the D flip flop FF2 is outputted to the clock input terminal of the D flip flop FF3, and the shift register 8082. Furthermore, the output signal from the D flip flop FF2 is outputted to the selector 6071. Each of the shift registers 8080, 8081, and 8082 shifts a phase of a signal inputted from each of the D flip flops FF0, FF1, and FF2 by a predetermined shift amount according to the clock signal S8083, and each of the shift registers 8080, 8081, and 8082 outputs the phase-shifted signal to each of gates of the pMOS transistors 6094, 6095, and 6096. In this case, each of the phase amounts at the shift registers 8080, 8081, and 8082 corresponds to a signal for four clocks of the clock signal S8083. Each of currents flowing through the pMOS transistors 6092 and 6093 is added, and thereafter, the current signal Ia of the added current is outputted to the selector 6071. In addition, each of currents flowing through the pMOS transistors 6094, 6095, and 6095 is added, and thereafter, the current signal IbA of the added current is outputted to the selector 6071. The selector 6071 selects at least one of the current signal Ia and the current signal IbA according to the output signal from the D flip flop FF3, and the selector 6071 outputs the selected current signal Ia or IbA as the period signal PS.

Figure 68:
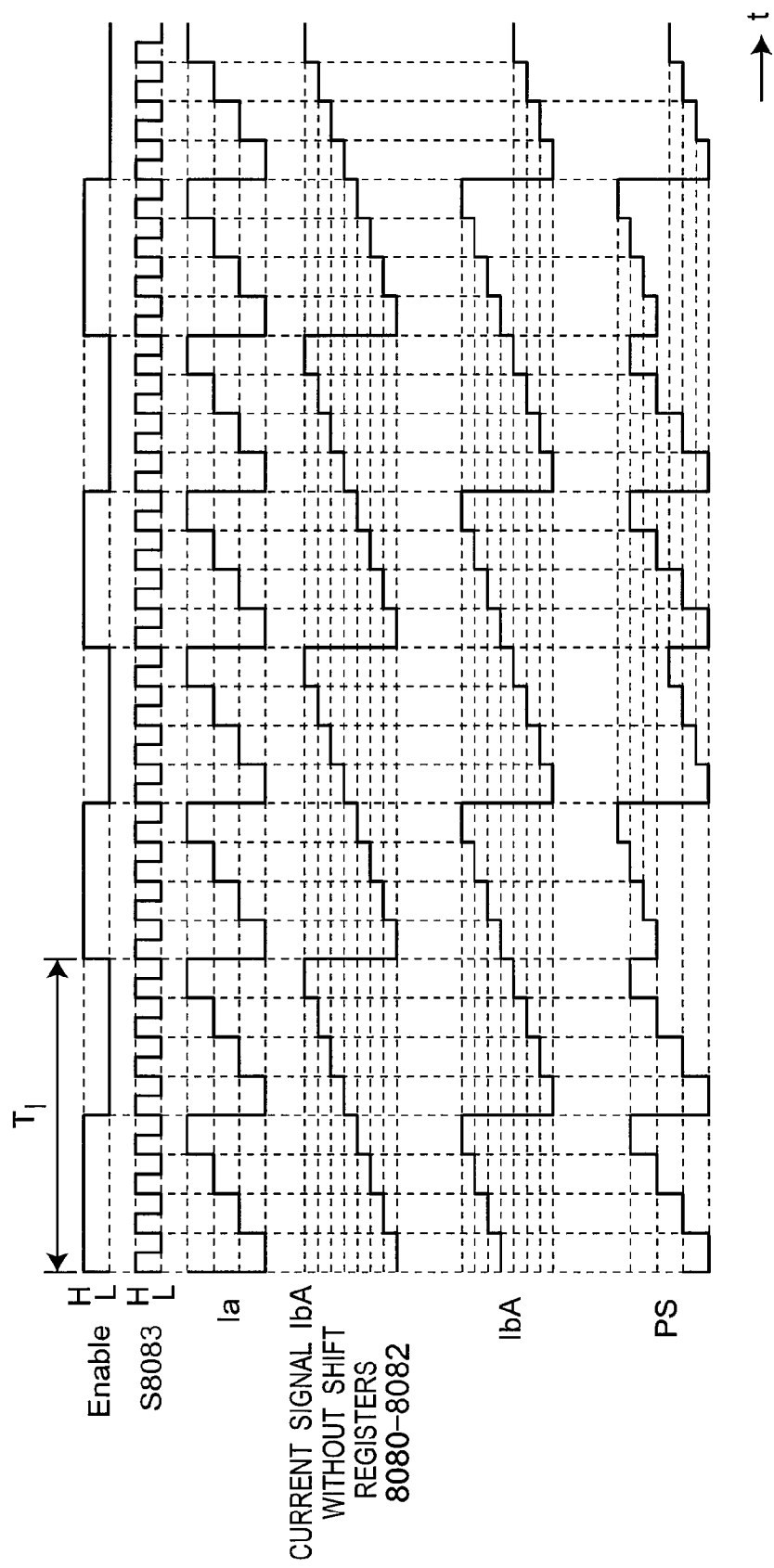
FIG. 68 is a timing chart showing an operation of the period signal generator circuit 907 of FIG. 67.

FIG. 68 is a timing chart showing an operation of the period signal generator circuit 907 of FIG. 67. Referring to FIG. 68, for the purpose of reference, the current signal IbA is also illustrated without the shift registers 8080 to 8082. As described in FIG. 68, the current signal Ia has two times the cycle $T_I$ of intermittent oscillation, and the current signal IbA has the same frequency as that of the cycle $T_I$ of intermittent oscillation. As described with reference to FIGS. 11B and 11D of the first embodiment, when the period signal PS is generated so that the frequency of each of cycle intervals of the period signal PS, the local maximum value of the amplitude, and the local minimum value of the amplitude are respectively constant, if the period signal frequency $f_c$ is set to an integer multiple of the intermittent oscillation frequency $f_I$, then the distribution of the intermittent oscillation frequency $f_I$ can not be dispersed. For example, when the current signal Ia or IbA of FIG. 68 is used as the period signal PS, each of amplitudes of the period signal PS at each of rising timings of intermittent oscillation control signal Enable is constant, and therefore, the intermittent oscillation frequency $f_I$ is constant, and the intermittent oscillation frequency $f_I$ can not be dispersed. Similarly, when the current signal IbA without the shift registers 8080 to 8082 of FIG. 67 is used as the period signal PS, each of amplitudes of the period signal PS at each of rising timings of intermittent oscillation control signal Enable is constant, and therefore, the intermittent oscillation frequency $f_I$ is constant, and the intermittent oscillation frequency $f_I$ can not be dispersed. On the other hand, according to the present embodiment, a phase difference between the current signal Ia and the current signal IbA is adjusted by using the shift registers 8080 to 8082, and therefore, each of amplitudes of the period signal PS at each of rising timings of intermittent oscillation control signal Enable varies. As a result, the drain current peak value IDP varies, and the distribution of the intermittent oscillation frequency $f_I$ can be dispersed.

In the present embodiment, it is noted that the period signal PS is generated so that the local maximum value of the amplitude, and the local minimum value of the amplitude for each of cycle intervals of the period signal PS are respectively constant, and the current signal IbA having the same frequency as that of the intermittent oscillation frequency $f_I$ and the current signal Ia having two times the intermittent oscillation frequency $f_I$ are sequentially generated for each of the cycle intervals of the period signal PS. However, the present invention is not limited thereto. For example, when the period signal PS is generated so that the local maximum value of the amplitude, and the local minimum value of the amplitude for each of cycle intervals of the period signal PS are respectively constant, and the plurality of signals having respective different frequencies that are one-half or the integer multiples of the intermittent oscillation frequency $f_I$ for each of the cycle intervals of the period signal PS are sequentially generated, the phase difference between the plurality of signals for each of the cycle intervals may be set so that the distribution of the intermittent oscillation frequency $f_I$ can be dispersed.

Thirteenth Embodiment

Figure 69:
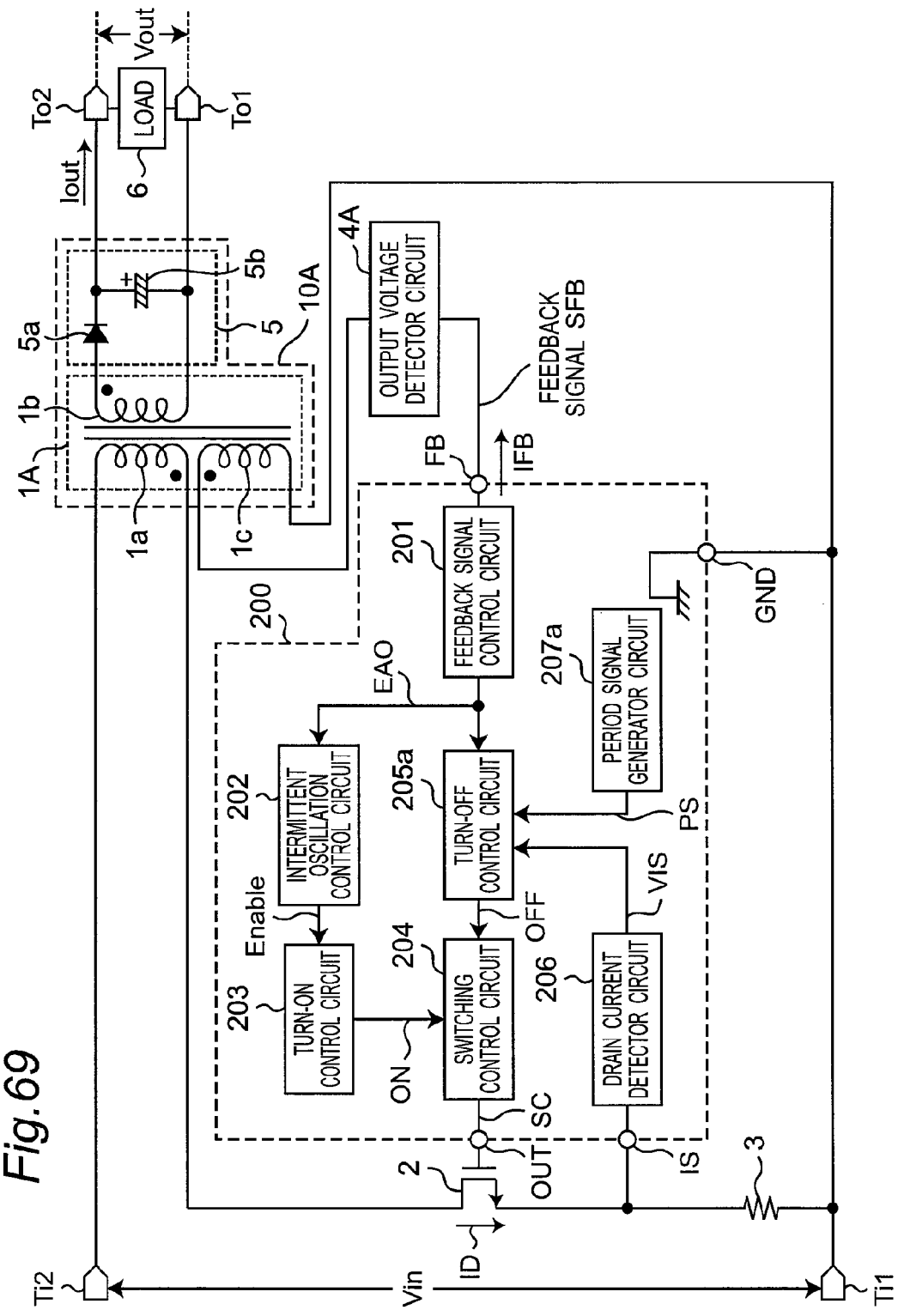
FIG. 69 is a block diagram showing a configuration of the switching power supply device according to a thirteenth embodiment of the present invention.

FIG. 69 is a block diagram showing a configuration of a switching power supply device according to a thirteenth embodiment of the present invention. Referring to FIG. 69, as the switching power supply device according to the first switching power supply device of FIG. 1, the switching power supply device according to the present embodiment is configured to include input-to-output converter circuit 10A instead of the input-to-output converter circuit 10, and an output voltage detector circuit 4A instead of the output voltage detector circuit 4.

Referring to FIG. 69, the input-to-output converter circuit 10A is configured to include a transformer 1A, and the output voltage generator circuit 5. In addition, the transformer 1A is configured to include the primary winding 1a, the second winding 1b, and an auxiliary winding 1c. An alternating-current voltage induced by the auxiliary winding 1c is rectified and smoothed by the output voltage detector circuit 4A. In this case, the smoothed voltage varies corresponding to the output voltage Vout. When the output voltage detector circuit 4A detects the output voltage Vout equal to or more than a predetermined threshold voltage based on the smoothed voltage, the output voltage detector circuit 4A generates the feedback signal SFB. Thereafter, the output voltage detector circuit 4A outputs the feedback signal SFB to the feedback signal input terminal FB, so that the feedback terminal outflowing current IFB outflows from the feedback signal input terminal FB of the control circuit 200.

The switching power supply according to the present embodiment has the same effect as that of the switching power supply device according to the first embodiment. It is noted that, referring to FIG. 69, the control circuits 300, 400, 400A, 500, 600, 700, 800, and 900 according to the other embodiments and the modified embodiments thereof may be used instead of the control circuit 200.

Figure 70:
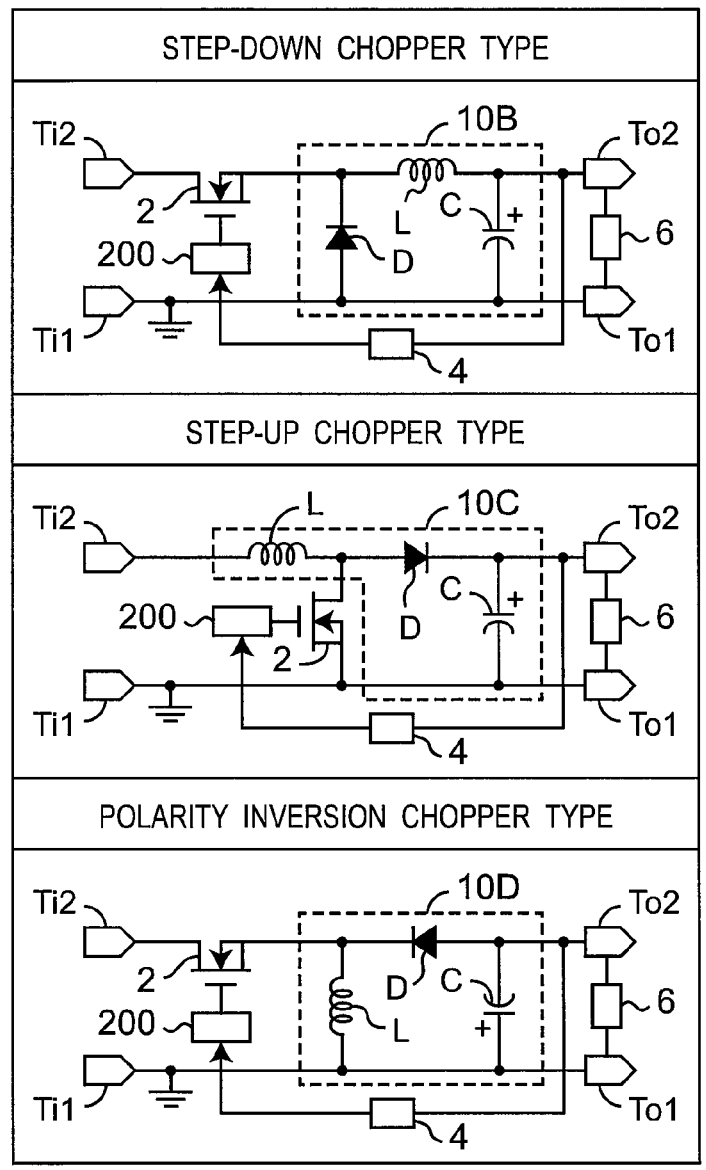
FIG. 70 is a table showing respective configurations when the control circuit 200 according to the first embodiment of the present invention is applied to a step-down chopper type switching power supply device, a step-up chopper type switching power supply device, and a polarity inversion chopper type, respectively.

Each of the switching power supplies according to the embodiments and the modified embodiments thereof as described above is included with a flyback type input-to-output converter circuit 10 or 10A. However, the present invention is not limited thereto. FIG. 70 is a table showing respective configurations when the control circuit 200 according to the first embodiment of the present invention is applied to a step-down chopper type switching power supply device, a step-up chopper type switching power supply device, and a polarity inversion chopper type, respectively. Referring to FIG. 70, each of the switching power supply devices is configured to include a step-down chopper type input-to-output converter circuit 10B including an inductor L, a capacitor C, and a diode D, a step-up chopper type input-to-output converter circuit 10C including an inductor L, a capacitor C, and a diode D, or a polarity inversion chopper type input-to-output converter circuit 10D including an inductor L, a capacitor C, and each of the switching power supply devices of FIG. 70 has the same effect as that of the switching power supply device according to the first embodiment.

It is noted that, in each of the switching power supply devices of FIG. 70, the control circuits 300, 400, 400A, 500, 600, 700, 800, or 900 according to the other embodiments and the modified embodiments thereof may be used instead of the control circuit 200.

In addition, in each of the embodiments and the modified embodiments thereof as described above, the switching element 2 is provided outside the control circuits 200, 400, 400A, 500, 600, 700, 800, and 900. However, the present invention is not limited thereto. For example, the switching element 2 may be provided inside the control circuits 200, 400, 400A, 500, 600, 700, 800, and 900, and the switching element 2 may be integrated on a semiconductor substrate of the control circuit 200, 400, 400A, 500, 600, 700, 800, or 900.

Further, the switching power supply according to each of the embodiments and the modified embodiments thereof as described above performs the intermittent oscillation operation by alternately repeating the oscillation interval and the stop interval during the light load. However, the present invention is not limited thereto, for example, the present invention is applied to switching control methods such as pulse modulation methods, pulse frequency modulation methods and pseudo-resonance methods, and switching power supply devices, which can perform the intermittent oscillation operation without depending on the load conditions.

The switching power supply devices according to the present invention are described based on the embodiments and the modified embodiments thereof as described above. However, the present invention is not limited thereto. Various kinds of variations and aspects made by combining the configurations of the different embodiments can be made by those skilled in the art without departing from the spirit and the scope of the present invention.

As described above, according to the semiconductor device and switching power supply device of the present invention, the control circuit varies the intermittent oscillation frequency by using the changing signal generated using the period signal having the predetermined period signal frequency, and therefore, the switching power supply device for performing the intermittent oscillation control without using control methods such as pulse modulation control methods, pulse frequency modulation control methods or pseudo-resonance control methods can reduce a sound generated from components such as transformers or ceramic capacitors without making a power supply efficiency worse than that of the prior art.

The semiconductor device and switching power supply device of the present invention can be available for switching power supply devices such as AC-DC converters and DC-DC converters.

What is claimed is:

1. A semiconductor device for a switching power supply device configured to convert a predetermined input voltage to an output voltage by controlling a switching element to be turned on and off, and supply a load with an output power corresponding to the output voltage, the semiconductor device comprises:
a control circuit configured to control an operation of the switching element by using an intermittent oscillation control signal representing a start timing and an end timing of an oscillation interval, so that the oscillation interval when the switching element is turned on and off and a stop interval when turning on and off of the switching element is stopped are alternately repeated with a predetermined intermittent oscillation frequency,
wherein the control circuit varies the intermittent oscillation frequency by using a changing signal generated by using a period signal having a predetermined period signal frequency,
wherein, when the changing signal is the period signal and the period signal is generated so that a frequency, a local maximum value of an amplitude, and a local minimum value of the amplitude for each of cycle intervals of the period signal are constant respectively, the period signal frequency is set to a frequency lower than the intermittent oscillation frequency, or the period signal frequency is set to a frequency higher than the intermittent oscillation frequency and other than integer multiples of the intermittent oscillation frequency, and a phase difference of the changing signal with respect to the intermittent oscillation control signal is set so that a distribution of the intermittent oscillation frequency is dispersed, and wherein, when the changing signal is the period signal and the period signal is generated so that (a) the local maximum value of the amplitude and the local minimum value of the amplitude for each of the cycle intervals of the period signal are constant respectively, and (b) a plurality of signals having respective different frequencies that are one-half or the integer multiples of the intermittent oscillation frequency for each of the cycle intervals of the period signal are sequentially generated, the phase difference between the plurality of signals for each of the cycle intervals is set so that the distribution of the intermittent oscillation frequency is dispersed.

2. The semiconductor device as claimed in claim 1, wherein the control circuit varies the intermittent oscillation frequency by varying a peak value of a current flowing through the switching element using the changing signal.

3. The semiconductor device as claimed in claim 2, wherein an amount of variation of the peak value of the current flowing through the switching element is controlled to be smaller as the output power becomes larger.

4. The semiconductor device as claimed in claim 2, wherein the peak value of the current flowing through the switching element varies for an interval from the start timing of the oscillation interval to a timing when the switching element is controlled to be turned on and off a predetermined number of times.

5. The semiconductor device as claimed in claim 1, wherein the control circuit varies the intermittent oscillation frequency by varying the intermittent oscillation control signal using the changing signal.

6. The semiconductor device as claimed in claim 1, wherein the changing signal is generated by modulating one of a frequency and a phase of the period signal according to a predetermined modulation pattern setting signal.

7. A semiconductor device for a switching power supply device configured to convert a predetermined input voltage to an output voltage by controlling a switching element to be turned on and off, and supply a load with an output power corresponding to the output voltage, the semiconductor device comprising:

a control circuit configured to control an operation of the switching element by using an intermittent oscillation control signal representing a start timing and an end timing of an oscillation interval, so that the oscillation interval when the switching element is turned on and off and a stop interval when turning on and off of the switching element is stopped are alternately repeated with a predetermined intermittent oscillation frequency, wherein the control circuit varies the intermittent oscillation frequency by using a changing signal generated by using a period signal having a predetermined period signal frequency, and wherein one of the following setting states is set:

(1) a first setting state in which a frequency for each of cycle intervals of the period signal is constant respectively, and an amplitude for each of the cycle intervals of the period signal is varied, so that a distribution of the intermittent oscillation frequency is dispersed;

(2) a second setting state in which the frequency, a local maximum and a local minimum of the amplitude for each of the cycle intervals of the period signal are constant respectively, and the period signal frequency is set to a frequency other than half the intermittent oscillation frequency and integer multiples of the intermittent oscillation frequency, so that the distribution of the intermittent oscillation frequency is dispersed;

(3) a third setting state in which the frequency, the local maximum and the local minimum of the amplitude for each of the cycle intervals of the period signal are constant respectively, and the period signal frequency is set to half the intermittent oscillation frequency or the integer multiples of the intermittent oscillation frequency, so that a phase difference of the changing signal to the intermittent oscillation control signal is set such that the distribution of the intermittent oscillation frequency is dispersed;

(4) a fourth setting state in which a plurality of different signals is generated that respectively have frequencies different from each other, which are other than half the intermittent oscillation frequency and the integer multiples of the intermittent oscillation frequency, and the period signal is configured by sequentially selecting respective signals from among the different signals for each of the cycle intervals of the period signal, so that the distribution of the intermittent oscillation frequency is dispersed; and (5) a fifth setting state in which a plurality of different signals is generated that respectively have frequencies different from each other, which are half the intermittent oscillation frequency or the integer multiples of the intermittent oscillation frequency, and the period signal is configured by sequentially selecting respective signals from among the different signals for each of the cycle intervals of the period signal, so that a phase difference between generated different signals is set such that the distribution of the intermittent oscillation frequency is dispersed.

8. The semiconductor device as claimed in claim 7, wherein the control circuit varies the intermittent oscillation frequency by varying a peak value of a current flowing through the switching element using the changing signal.

9. The semiconductor device as claimed in claim 8, wherein the control circuit comprises a turn-off control circuit configured to generate a turn-off control signal, that turns off the switching element when a voltage level of a first signal generated by using a current detection signal corresponding to the current flowing through the switching element exceeds a voltage level of a second signal generated by using a feedback control signal corresponding to the output power, and wherein the turn-off control circuit varies the peak value of the current flowing through the switching element by varying a timing of generating the turn-off control signal by using the changing signal.

10. The semiconductor device as claimed in claim 9,
wherein the second signal is generated by modulating the feedback control signal according to the changing signal.

11. The semiconductor device as claimed in claim 9,
wherein the feedback control signal has a predetermined limit value for setting a lower limit of the peak value, and
wherein the second signal is generated by modulating the limit value according to the changing signal.

12. The semiconductor device as claimed in claim 9, wherein the first signal is generated by modulating the current detection signal according to the changing signal.

13. The semiconductor device as claimed in claim 9,
wherein the turn-off control circuit comprises a delay circuit configured to delay the turn-off control signal by a predetermined delay time and output a delayed turn-off control signal, and
wherein the turn-off control circuit varies the timing of generating the turn-off control signal by modulating the delay time according to the changing signal.

14. The semiconductor device as claimed in claim 5, wherein the control circuit comprises a switching control circuit configured to generate a switching control signal representing a start timing and an end timing of an ON-interval of the switching element during the oscillation interval by using the intermittent oscillation control signal, a third signal generated by using a first triangle wave signal having a predetermined triangle wave frequency, and a fourth signal generated by using the feedback control signal corresponding to the output power, and
wherein the switching control circuit varies the peak value of the current flowing through the switching element by varying a timing of generating the switching control signal using the changing signal.

15. The semiconductor device as claimed in claim 14, wherein the fourth signal is generated by modulating the feedback control signal according to the changing signal.

16. The semiconductor device as claimed in claim 14,
wherein the feedback control signal has a predetermined limit value for setting the lower limit of the peak value, and
wherein the fourth signal is generated by modulating the limit value according to the changing signal.

17. The semiconductor device as claimed in claim 14,
wherein the switching control circuit varies the timing of generating the switching control signal by modulating at least one of an upper limit and a lower limit of the first triangle wave signal according to the changing signal.

18. The semiconductor device as claimed in claim 14,
wherein the switching control circuit varies the timing of generating the switching control signal by modulating a voltage change rate of first triangle wave signal with respect to time according to the changing signal.

19. The semiconductor device as claimed in claim 14,
wherein the switching control circuit comprises a delay circuit configured to delay a start timing of the ON-interval of the switching element in the switching control signal by a predetermined delay time and output a delayed start timing, and
wherein the switching control circuit varies the timing of generating the switching control signal by modulating the delay time according to the changing signal.

20. The semiconductor device as claimed in claim 14,
wherein the switching control circuit comprises a delay circuit configured to delay an end timing of the ON-interval of the switching element in the switching control signal by a predetermined delay time and output a delayed end timing, and
wherein the switching control circuit varies the timing of generating the switching control signal by modulating the delay time according to the changing signal.

21. The semiconductor device as claimed in claim 8,
wherein an amount of variation of the peak value of the current flowing through the switching element is controlled to be smaller as the output power becomes larger.

22. The semiconductor device as claimed in claim 8,
wherein the peak value of the current flowing through the switching element varies for an interval from the start timing of the oscillation interval to a timing when the switching element is controlled to be turned on and off a predetermined number of times.

23. The semiconductor device as claimed in claim 7,
wherein the control circuit varies the intermittent oscillation frequency by varying the intermittent oscillation control signal using the changing signal.

24. The semiconductor device as claimed in claim 23,
wherein the control circuit comprises an intermittent oscillation control circuit, and
wherein the intermittent oscillation control circuit generates the intermittent oscillation control signal for terminating the oscillation interval when a voltage level of a fifth signal generated by using the feedback control signal corresponding to the output power falls below a predetermined first threshold voltage, and for starting the oscillation interval when the voltage level of the fifth signal exceeds a predetermined second threshold voltage higher than the first threshold voltage for the stop interval.

25. The semiconductor device as claimed in claim 24,
wherein the fifth signal is generated by modulating the feedback control signal according to the changing signal.

26. The semiconductor device as claimed in claim 24,
wherein the intermittent oscillation control circuit varies the intermittent oscillation control signal by modulating the first threshold voltage according to the changing signal.

27. The semiconductor device as claimed in claim 24,
wherein the intermittent oscillation control circuit comprises a delay circuit configured to delay the end timing of the oscillation interval in the intermittent oscillation control signal by a predetermined delay time and output a delayed end timing, and
wherein the intermittent oscillation control circuit varies the intermittent oscillation control signal by modulating the delay time according to the changing signal.

28. The semiconductor device as claimed in claim 24,
wherein the intermittent oscillation control circuit varies the intermittent oscillation control signal by modulating the second threshold voltage according to the changing signal.

29. The semiconductor device as claimed in claim 24,
wherein the intermittent oscillation control circuit comprises a delay circuit configured to delay the start timing of the oscillation interval in the intermittent oscillation control signal by a predetermined delay time and output a delayed start timing, and
wherein the intermittent oscillation control circuit varies the intermittent oscillation control signal by modulating the delay time according to the changing signal.

30. The semiconductor device as claimed in claim 23,
wherein the intermittent oscillation control signal is generated by using a predetermined first oscillation signal.

31. The semiconductor device as claimed in claim 30,
wherein the first oscillation signal is a second triangle wave signal, and
wherein the control circuit comprises an intermittent oscillation control circuit configured to vary the intermittent oscillation control signal by modulating at least one of an upper limit and a lower limit of the second triangle wave signal according to the changing signal.

32. The semiconductor device as claimed in claim 30,
wherein the first oscillation signal is a second triangle wave signal, and
wherein the control circuit comprises an intermittent oscillation control circuit configured to vary the intermittent oscillation control signal by modulating a voltage change rate of second triangle wave signal with respect to time according to the changing signal.

33. The semiconductor device as claimed in claim 7,
wherein the changing signal is generated by modulating one of a frequency and a phase of the period signal according to a predetermined modulation pattern setting signal.

34. The semiconductor device as claimed in claim 33,
wherein the modulation pattern setting signal is generated by using a count value of a timing when the switching element is turned on.

35. The semiconductor device as claimed in claim 33,
wherein the modulation pattern setting signal is generated by using at least one of a count value of the start timing of the oscillation interval and a count value of a start timing of the stop interval.

36. The semiconductor device as claimed in claim 33,
wherein the modulation pattern setting signal is generated by frequency-modulating a predetermined second oscillation signal according to the intermittent oscillation control signal.

37. The semiconductor device as claimed in claim 33,
wherein the modulation pattern setting signal is generated by using an alternating-current voltage signal having a predetermined alternating-current frequency from an alternating-current power supply.

38. The semiconductor device as claimed in claim 7,
wherein the changing signal is generated by using a count value of a timing when the switching element is turned on.

39. The semiconductor device as claimed in claim 7,
wherein the changing signal is generated by using at least one of a count value of the start timing of the oscillation interval and a count value of a start timing of the stop interval.

40. The semiconductor device as claimed in claim 7,
wherein the changing signal is generated by frequency-modulating a predetermined second oscillation signal according to the intermittent oscillation control signal.

41. The semiconductor device as claimed in claim 7,
wherein the changing signal is generated by using an alternating-current voltage signal having a predetermined alternating-current frequency from an alternating-current power supply.

42. A semiconductor device for a switching power supply device configured to convert a predetermined input voltage to an output voltage by controlling a switching element to be turned on and off, and supply a load with an output power corresponding to the output voltage, the semiconductor device comprising:
the switching element; and
a control circuit configured to control an operation of the switching element by using an intermittent oscillation control signal representing a start timing and an end timing of an oscillation interval, so that the oscillation interval when the switching element is turned on and off and a stop interval when turning on and off of the switching element is stopped are alternately repeated with a predetermined intermittent oscillation frequency,
wherein the control circuit varies the intermittent oscillation frequency by using a changing signal generated by using a period signal having a predetermined period signal frequency,
wherein the changing signal is the period signal, and
wherein one of the following setting states is set:
(1) a first setting state in which a frequency for each of cycle intervals of the period signal is constant respectively, and an amplitude for each of the cycle intervals of the period signal is varied, so that a distribution of the intermittent oscillation frequency is dispersed;
(2) a second setting state in which the frequency, a local maximum and a local minimum of the amplitude for each of the cycle intervals of the period signal are constant respectively, and the period signal frequency is set to a frequency other than half the intermittent oscillation frequency and integer multiples of the intermittent oscillation frequency, so that the distribution of the intermittent oscillation frequency is dispersed;
(3) a third setting state in which the frequency, the local maximum and the local minimum of the amplitude for each of the cycle intervals of the period signal are constant respectively, and the period signal frequency is set to half the intermittent oscillation frequency or the integer multiples of the intermittent oscillation frequency, so that a phase difference of the changing signal to the intermittent oscillation control signal is set such that the distribution of the intermittent oscillation frequency is dispersed;
(4) a fourth setting state in which a plurality of different signals is generated that respectively have frequencies different from each other, which are other than half the intermittent oscillation frequency and the integer multiples of the intermittent oscillation frequency, and the period signal is configured by sequentially selecting respective signals from among the different signals for each of the cycle intervals of the period signal, so that the distribution of the intermittent oscillation frequency is dispersed; and
(5) a fifth setting state in which a plurality of different signals is generated that respectively have frequencies different from each other, which are half the intermittent oscillation frequency or the integer multiples of the intermittent oscillation frequency, and the period signal is configured by sequentially selecting respective signals from among the different signals for each of the cycle intervals of the period signal, so that a phase difference between generated different signals is set such that the distribution of the intermittent oscillation frequency is dispersed.

43. A switching power supply device comprising a semiconductor device for a switching power supply device, that is configured to convert a predetermined input voltage to an output voltage by controlling a switching element to be turned on and off, and supply a load with an output power corresponding to the output voltage, wherein the semiconductor device comprises:

a control circuit configured to control an operation of the switching element by using an intermittent oscillation control signal representing a start timing and an end timing of an oscillation interval, so that the oscillation interval when the switching element is turned on and off and a stop interval when turning on and off of the switching element is stopped are alternately repeated with a predetermined intermittent oscillation frequency, wherein the control circuit varies the intermittent oscillation frequency by using a changing signal generated by using a period signal having a predetermined period signal frequency, wherein the changing signal is the period signal, and wherein one of the following setting states is set:

(1) a first setting state in which a frequency for each of cycle intervals of the period signal is constant respectively, and an amplitude for each of the cycle intervals of the period signal is varied, so that a distribution of the intermittent oscillation frequency is dispersed;

(2) a second setting state in which the frequency, a local maximum and a local minimum of the amplitude for each of the cycle intervals of the period signal are constant respectively, and the period signal frequency is set to a frequency other than half the intermittent oscillation frequency and integer multiples of the intermittent oscillation frequency, so that the distribution of the intermittent oscillation frequency is dispersed;

(3) a third setting state in which the frequency, the local maximum and the local minimum of the amplitude for each of the cycle intervals of the period signal are constant respectively, and the period signal frequency is set to half the intermittent oscillation frequency or the integer multiples of the intermittent oscillation frequency, so that a phase difference of the changing signal to the intermittent oscillation control signal is set such that the distribution of the intermittent oscillation frequency is dispersed;

(4) a fourth setting state in which a plurality of different signals is generated that respectively have frequencies different from each other, which are other than half the intermittent oscillation frequency and the integer multiples of the intermittent oscillation frequency, and the period signal is configured by sequentially selecting respective signals from among the different signals for each of the cycle intervals of the period signal, so that the distribution of the intermittent oscillation frequency is dispersed; and (5) a fifth setting state in which a plurality of different signals is generated that respectively have frequencies different from each other, which are half the intermittent oscillation frequency or the integer multiples of the intermittent oscillation frequency, and the period signal is configured by sequentially selecting respective signals from among the different signals for each of the cycle intervals of the period signal, so that a phase difference between generated different signals is set such that the distribution of the intermittent oscillation frequency is dispersed.

* * * * *